(12) United States Patent
Takeda et al.

(10) Patent No.: US 9,663,711 B2
(45) Date of Patent: May 30, 2017

(54) LIGHT-EMITTING ELEMENT, LIGHT-EMITTING DEVICE, ELECTRONIC DEVICE, LIGHTING DEVICE, AND NOVEL ORGANIC COMPOUND

(75) Inventors: Kyoko Takeda, Kanagawa (JP); Harue Osaka, Kanagawa (JP); Satoko Shitagaki, Kanagawa (JP); Nobuharu Ohsawa, Tochigi (JP); Satoshi Seo, Kanagawa (JP); Hiromi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 823 days.

(21) Appl. No.: 13/590,388

(22) Filed: Aug. 21, 2012

(65) Prior Publication Data
US 2013/0048964 A1    Feb. 28, 2013

(30) Foreign Application Priority Data

Aug. 25, 2011 (JP) ................... 2011-183538
Aug. 25, 2011 (JP) ................... 2011-183541
Jun. 27, 2012 (JP) ................... 2012-144355

(51) Int. Cl.
| | | |
|---|---|---|
| *H01L 51/50* | (2006.01) | |
| *C09K 11/06* | (2006.01) | |
| *H01L 51/00* | (2006.01) | |

(52) U.S. Cl.
CPC .......... *C09K 11/06* (2013.01); *H01L 51/0058* (2013.01); *H01L 51/0067* (2013.01);
(Continued)

(58) Field of Classification Search
None
See application file for complete search history.

(56) References Cited

U.S. PATENT DOCUMENTS

| | | |
|---|---|---|
| 6,821,646 B2 | 11/2004 | Tsuboyama et al. |
| 6,838,818 B2 | 1/2005 | Furugori et al. |
| (Continued) | | |

FOREIGN PATENT DOCUMENTS

| | | |
|---|---|---|
| CN | 001708485 A | 12/2005 |
| CN | 001934213 A | 3/2007 |
| (Continued) | | |

OTHER PUBLICATIONS

Achelle, S. et al., "Star-and Banana-Shaped Oligomers with a Pyrimidine Core: Synthesis and Light-Emitting Properties," European Journal of Organic Chemistry, 2008, pp. 3129-3140.
(Continued)

*Primary Examiner* — Gregory Clark
(74) *Attorney, Agent, or Firm* — Husch Blackwell LLP

(57) ABSTRACT

A light-emitting element includes an EL layer between a pair of electrodes. The EL layer contains a first compound and a second compound. The first compound is a phosphorescent iridium metal complex having a LUMO level of greater than or equal to −3.5 eV and less than or equal to −2.5 eV, and the second compound is an organic compound having a pyrimidine skeleton. The light-emitting element includes an EL layer between a pair of electrodes. The EL layer contains a first compound and a second compound. The first compound is a phosphorescent iridium metal complex having a diazine skeleton, and the second compound is an organic compound having a pyrimidine skeleton.

21 Claims, 83 Drawing Sheets

(52) U.S. Cl.
CPC ............. C09K 2211/1007 (2013.01); C09K 2211/1011 (2013.01); C09K 2211/1044 (2013.01); C09K 2211/1088 (2013.01); C09K 2211/1092 (2013.01); C09K 2211/1096 (2013.01); C09K 2211/185 (2013.01); H01L 51/0085 (2013.01); H01L 51/5016 (2013.01); H01L 51/5072 (2013.01); H01L 2251/552 (2013.01)

(56) References Cited

U.S. PATENT DOCUMENTS

| | | | |
|---|---|---|---|
| 7,166,958 | B2 | 1/2007 | Furugori et al. |
| 7,332,233 | B2 | 2/2008 | Park et al. |
| 7,446,471 | B2 | 11/2008 | Furugori et al. |
| 7,649,077 | B2 | 1/2010 | Craig et al. |
| 7,651,791 | B2 | 1/2010 | Nakano et al. |
| 7,736,758 | B2 | 6/2010 | Furugori et al. |
| 7,790,299 | B2 | 9/2010 | Furugori et al. |
| 7,846,560 | B2 | 12/2010 | Nakano et al. |
| 7,910,227 | B2 | 3/2011 | Furugori et al. |
| 8,012,602 | B2 | 9/2011 | Schäfer et al. |
| 8,128,727 | B2 | 3/2012 | Nomura et al. |
| 8,142,911 | B2 | 3/2012 | Kadoma et al. |
| 2002/0063516 | A1* | 5/2002 | Tsuboyama et al. .......... 313/504 |
| 2006/0008670 | A1 | 1/2006 | Lin et al. |
| 2007/0141387 | A1 | 6/2007 | Nakano et al. |
| 2007/0190355 | A1* | 8/2007 | Ikeda et al. .................. 428/690 |
| 2010/0019203 | A1 | 1/2010 | Akino et al. |
| 2010/0045170 | A1 | 2/2010 | Lee et al. |
| 2010/0084971 | A1 | 4/2010 | Nakano et al. |
| 2010/0240892 | A1 | 9/2010 | Schäfer et al. |
| 2011/0089821 | A1 | 4/2011 | Furugori et al. |
| 2012/0098417 | A1 | 4/2012 | Inoue et al. |
| 2012/0126217 | A1 | 5/2012 | Yoshida et al. |
| 2012/0133273 | A1 | 5/2012 | Inoue et al. |
| 2012/0214993 | A1 | 8/2012 | Aihara et al. |
| 2012/0274201 | A1 | 11/2012 | Seo et al. |
| 2012/0277427 | A1 | 11/2012 | Inoue et al. |
| 2013/0079517 | A1 | 3/2013 | Schafer et al. |
| 2016/0043325 | A1 | 2/2016 | Gorohmaru et al. |

FOREIGN PATENT DOCUMENTS

| | | |
|---|---|---|
| CN | 101560136 A | 10/2009 |
| CN | 101616986 A | 12/2009 |
| EP | 1 724 323 A1 | 11/2006 |
| EP | 1 962 354 A1 | 8/2008 |
| EP | 2 108 689 A2 | 10/2009 |
| EP | 2 116 574 A1 | 11/2009 |
| EP | 2 468 731 A1 | 6/2012 |
| EP | 2 665 342 A1 | 11/2013 |
| JP | 2002-324677 | 11/2002 |
| JP | 2003-45662 | 2/2003 |
| JP | 2003-68465 | 3/2003 |
| JP | 2005-53912 | 3/2005 |
| JP | 2006-510732 | 3/2006 |
| JP | 2007-123392 | 5/2007 |
| JP | 2008-214615 | 9/2008 |
| JP | 2009-158848 | 7/2009 |
| JP | 2009-246097 A | 10/2009 |
| JP | 2011-63584 | 3/2011 |
| JP | 2011-84553 | 4/2011 |
| JP | 2011-121877 | 6/2011 |
| JP | 2011-121934 | 6/2011 |
| JP | 2011-126851 | 6/2011 |
| JP | 2011-219442 | 11/2011 |
| JP | 2011-219443 | 11/2011 |
| JP | 2012-97006 | 5/2012 |
| JP | 5163837 B2 | 3/2013 |
| KR | 10-2009-0118921 | 11/2009 |
| KR | 10-2011-0130904 | 12/2011 |
| TW | 200730027 | 8/2007 |
| TW | 200848410 | 12/2008 |
| WO | WO 2004/039786 A1 | 5/2004 |
| WO | WO 2004/039864 A1 | 5/2004 |
| WO | WO 2005/085387 A1 | 9/2005 |
| WO | WO 2007/069569 A1 | 6/2007 |
| WO | WO 2008/096735 A1 | 8/2008 |
| WO | WO 2011/021689 A1 | 2/2011 |
| WO | WO 2011/046182 | 4/2011 |
| WO | WO 2011/070992 A1 | 6/2011 |
| WO | WO 2011/149240 A2 | 12/2011 |
| WO | WO 2012/096263 A1 | 7/2012 |

OTHER PUBLICATIONS

Su, S.-J. et al., "RGB Phosphorescent Organic Light-Emitting Diodes by Using Host Materials with Heterocyclic Cores: Effect of Nitrogen Atom Orientations," Chemistry of Materials, vol. 23, No. 2, 2011, pp. 274-284.

International Search Report re Application No. PCT/JP2012/071532, dated Oct. 16, 2012.

Written Opinion re Application No. PCT/JP2012/071532, dated Oct. 16, 2012.

Goldsmith et al., "C—H Bond Activation By A Ferric Methoxide Complex: Modeling The Rate-Determining Step In The Mechanism Of Lipoxygenase," *J. Am. Chem. Soc.*, 2002, vol. 124, No. 1, pp. 83-96.

Onishi et al., "A Method of Measuring An Energy Level High Molecular El Materials—Development Of Light-Emitting High Molecular Compounds," *Kyoritsu Shuppan*, Dec. 25, 2004, pp. 64-67 (English translation).

Taiwanese Office Action re Application No. TW 101129207, dated Feb. 17, 2016.

Chinese Office Action re Application No. CN 201280001907.9, dated May 24, 2016.

\* cited by examiner

LIGHT-EMITTING ELEMENT, LIGHT-EMITTING DEVICE, ELECTRONIC DEVICE, LIGHTING DEVICE, AND NOVEL ORGANIC COMPOUND

TECHNICAL FIELD

The present invention relates to a light-emitting element, a light-emitting device, an electronic device, a lighting device, and a novel organic compound.

BACKGROUND ART

In recent years, research and development have been extensively conducted on light-emitting elements using electroluminescence (EL). In a basic structure of such a light-emitting element, a layer containing a light-emitting material is interposed between a pair of electrodes. By voltage application to this element, light emission can be obtained from the light-emitting substance.

Such a light-emitting element is self-luminous elements and have advantages over liquid crystal displays, such as high visibility of the pixels and no need of backlight; thus, the light-emitting elements are thought to be suitable as flat panel display elements. Besides, such a light-emitting element has advantages in that it can be manufactured to be thin and lightweight, and has very fast response speed.

Furthermore, since such a light-emitting element can be formed in a film form, the light-emitting element makes it possible to provide planar light emission; thus, a large-area element can be easily formed. This feature is difficult to obtain with point light sources typified by incandescent lamps and LEDs or linear light sources typified by fluorescent lamps. Thus, the light-emitting element also has great potential as a planar light source applicable to a lighting device and the like.

Such light-emitting elements utilizing electroluminescence can be broadly classified according to whether a light-emitting substance is an organic compound or an inorganic compound. In the case of an organic EL element in which a layer containing an organic compound used as a light-emitting substance is provided between a pair of electrodes, application of a voltage to the light-emitting element causes injection of electrons from a cathode and holes from an anode into the layer containing the organic compound having a light-emitting property and thus a current flows. The injected electrons and holes then lead the organic compound to its excited state, so that light emission is obtained from the excited organic compound.

The excited state formed by an organic compound can be a singlet excited state or a triplet excited state. Light emission from the singlet excited state (S*) is called fluorescence, and emission from the triplet excited state (T*) is called phosphorescence. Further, the statistical generation ratio of S* to T* in a light-emitting element is thought to be 1:3.

With a compound that can convert energy of a singlet excited state into light emission (hereinafter, called a fluorescent compound), only light emission from the singlet excited state (fluorescence) is observed and that from the triplet excited state (phosphorescence) is not observed, at room temperature. Accordingly, the internal quantum efficiency (the ratio of the number of generated photons to the number of injected carriers) of a light-emitting element including the fluorescent compound is assumed to have a theoretical limit of 25%, on the basis of S*:T*=1:3.

In contrast, an observation on a compound that can convert energy of a triplet excited state into light emission (hereinafter, called a phosphorescent compound) shows light emission from the triplet excited state (phosphorescence). Further, since intersystem crossing (i.e., transition from a singlet excited state to a triplet excited state) easily occurs in a phosphorescent compound, the internal quantum efficiency can be theoretically increased to 100%. In other words, higher emission efficiency can be obtained than using a fluorescent compound. For this reason, light-emitting elements using a phosphorescent compound have been under active development recently in order that highly efficient light-emitting elements can be obtained.

When formed using the above-described phosphorescent compound, a light-emitting layer of a light-emitting element is often formed such that the phosphorescent compound is dispersed in a matrix containing another compound in order to suppress concentration quenching or quenching due to triplet-triplet annihilation in the phosphorescent compound. Here, the compound as the matrix is called a host material, and the compound dispersed in the matrix, such as a phosphorescent compound, is called a guest material (dopant).

In the case where a phosphorescent compound is a guest material, a host material needs to have higher triplet excitation energy (energy difference between a ground state and a triplet excited state) than the phosphorescent compound.

Furthermore, since singlet excitation energy (energy difference between a ground state and a singlet excited state) is higher than triplet excitation energy, a substance that has high triplet excitation energy also has high singlet excitation energy. Therefore the above substance that has high triplet excitation energy is also effective in a light-emitting element using a fluorescent compound as a light-emitting substance.

A compound including pyrimidine or the like as a partial structure has been studied as an electron-transport material or as a host material in the case where a phosphorescent compound is used as a guest material (e.g., Patent Document 1).

A compound in which a carbazole skeleton and a nitrogen-containing hetero aromatic ring are combined is disclosed as a host material in the case where a phosphorescent compound is used as a guest material (e.g., Patent Document 2).

REFERENCE

[Patent Document 1] Japanese Published Patent Application No. 2003-45662
[Patent Document 2] PCT International Publication No. 2011-046182

DISCLOSURE OF INVENTION

As disclosed in Patent Document 1 or Patent Document 2, a host material for a phosphorescent compound or a guest material of a phosphorescent compound has been actively developed. However, a light-emitting element still needs to be improved in terms of emission efficiency, reliability, emission characteristics, synthesis efficiency, and cost, and a light-emitting element with better characteristics is expected to be developed.

In view of the above problem, an object of one embodiment of the present invention is to provide a light-emitting element which includes novel organic compounds which can be used as a light-emitting substance for a light-emitting layer and as a host material in which the light-emitting substance is dispersed. In particular, an object of one embodiment of the present invention is to provide a novel organic compound which can be suitably used as a host material in the case where a phosphorescent iridium metal complex is used as a light-emitting substance.

Another object of one embodiment of the present invention is to provide a light-emitting device, an electronic device, and a lighting device each of which includes the light-emitting element.

One embodiment of the present invention is a light-emitting element which includes an EL layer (an electroluminescent layer) between a pair of electrodes. The EL layer contains a first compound and a second compound. The first compound is a phosphorescent iridium metal complex whose LUMO (lowest unoccupied molecular orbital) level is greater than or equal to −3.5 eV and less than or equal to −2.5 eV. The second compound is an organic compound having a pyrimidine skeleton.

Another embodiment of the present invention is a light-emitting element which includes an EL layer between a pair of electrodes. The EL layer contains a first compound and a second compound. The first compound is a phosphorescent iridium metal complex having a diazine skeleton. The second compound is an organic compound having a pyrimidine skeleton.

Another embodiment of the present invention is a light-emitting element which includes an EL layer between a pair of electrodes. The EL layer contains a first compound and a second compound. The first compound is a phosphorescent iridium metal complex which has a diazine skeleton and whose LUMO level is greater than or equal to −3.5 eV and less than or equal to −2.5 eV. The second compound is an organic compound having a pyrimidine skeleton.

Another embodiment of the present invention is a light-emitting element which includes a plurality of EL layers between a pair of electrodes. At least one of the plurality of EL layers contains a first compound and a second compound. The first compound is a phosphorescent iridium metal complex which has a diazine skeleton and whose LUMO level is greater than or equal to −3.5 eV and less than or equal to −2.5 eV. The second compound is an organic compound having a pyrimidine skeleton.

In each of the above-described structures, the diazine skeleton preferably forms a coordinate bond to iridium. Further, the diazine skeleton is preferably a pyrimidine skeleton.

In a light-emitting element including a guest material that is a first compound and a host material that is a second compound, the guest material and the host material has the same sort of pyrimidine skeleton, so that favorable carrier transfer from the host material to the guest material can be obtained.

The second compound of one embodiment of the present invention is a heterocyclic compound and has a high electron-transport property, and thus can be used for an electron-transport layer, an electron-injection layer, or the like as well as an EL layer of a light-emitting element.

In the case of a light-emitting element including a plurality of EL layers between a pair of electrodes, a charge-generation layer is provided between the EL layers, so that the light-emitting element can emit light in a high luminance region while the current density is kept low. Since the current density can be kept low, the element can have a long lifetime.

In each of the above-described structures, the first compound is preferably a phosphorescent iridium metal complex whose HOMO (highest occupied molecular orbital) level is greater than or equal to −6.0 eV and less than or equal to −5.0 eV. This structure makes it easy for holes to be trapped by the phosphorescent iridium metal complex, which results in suppression of change in hole mobility in a light-emitting element over time. As a result, an increase in the lifetime of the element can be expected.

In each of the above-described structures, the second compound preferably has a molecular weight of less than or equal to 2000. For example, in the case where the second compound is deposited with an evaporation apparatus, the molecular weight of less than or equal to 2000 (preferably less than or equal to 1000) enables an improvement in the evaporation efficiency. Further, in order to form a film having stable quality, the molecular weight is preferably greater than or equal to 500, which indicates that the second compound has a somewhat high glass transition temperature (Tg).

In each of the above-described structures, the second compound preferably has, as a substituent, at least one of a benzene skeleton, a biphenyl skeleton, a naphthalene skeleton, a carbazole skeleton, a phenanthrene skeleton, a triphenylene skeleton, a dibenzothiophene skeleton, and a dibenzofuran skeleton. When the second compound has any of the substituents given above, the second compound can achieve a high phosphorescent level (also referred to as a triplet level).

In each of the above-described structures, the second compound can be represented by General Formula (G1).

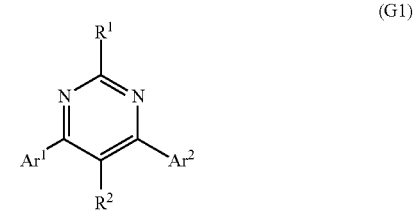

(G1)

In General Formula (G1), $R^1$ and $R^2$ separately represent hydrogen, an alkyl group having 1 to 4 carbon atoms, a substituted or unsubstituted phenyl group, or a substituted or unsubstituted biphenyl group. In addition, $Ar^1$ has at least one of a naphthalene skeleton, a phenanthrene skeleton, and a triphenylene skeleton as a substituent. In addition, $Ar^2$ has at least one of hydrogen, a naphthalene skeleton, a phenanthrene skeleton, and a triphenylene skeleton as a substituent.

In each of the above-described structures, the second compound can be represented by General Formula (G2). Note that the compound represented by General Formula (G2) is a useful novel compound as the second compound and is one embodiment of the present invention.

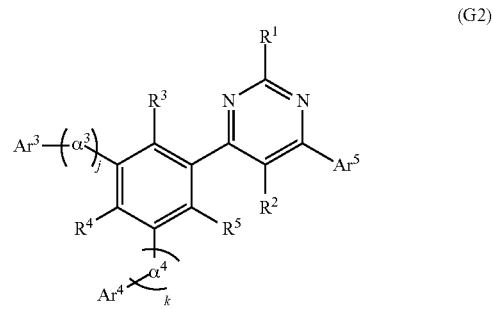

(G2)

In General Formula (G2), $R^1$ to $R^5$ separately represent any of hydrogen, an alkyl group having 1 to 4 carbon atoms, a substituted or unsubstituted phenyl group, and a substituted or unsubstituted biphenyl group. In addition, $Ar^3$ represents any of a substituted or unsubstituted naphthyl group, a substituted or unsubstituted phenanthryl group, and a substituted or unsubstituted triphenylyl group. In addition, $Ar^4$ represents any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group. In addition, $Ar^5$ represents any one of hydrogen, an alkyl group having 1 to 4 carbon atoms, a substituted or unsubstituted phenyl group, and a substituted or unsubstituted biphenyl group. In addition, $\alpha^3$ and $\alpha^4$ separately represent a substituted or unsubstituted phenylene group. In addition, j and k separately represent 0 or 1.

In each of the above-described structures, the second compound can be represented by General Formula (G2-1). Note that the compound represented by General Formula (G2-1) is a useful novel compound as the second compound and is one embodiment of the present invention.

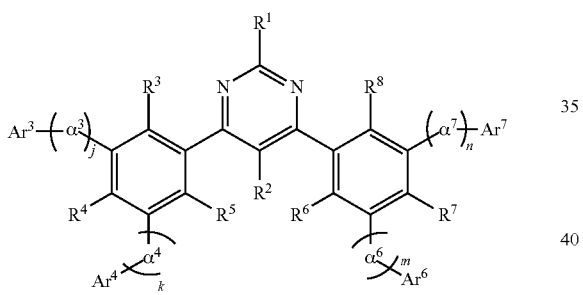

(G2-1)

In General Formula (G2-1), $R^1$ to $R^8$ separately represent any of hydrogen, an alkyl group having 1 to 4 carbon atoms, a substituted or unsubstituted phenyl group, and a substituted or unsubstituted biphenyl group. In addition, $Ar^3$ represents a substituted or unsubstituted naphthyl group, a substituted or unsubstituted phenanthryl group, or a substituted or unsubstituted triphenylyl group. In addition, $Ar^4$, $Ar^6$, and $Ar^7$ separately represent any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group. In addition, $\alpha^3$, $\alpha^4$, $\alpha^6$, and $\alpha^7$ separately represent a substituted or unsubstituted phenylene group. In addition, j, k, m, and n separately represent 0 or 1.

In each of the above-described structures, the second compound can be represented by General Formula (G3). Note that the compound represented by General Formula (G3) is a useful novel compound as the second compound and is one embodiment of the present invention.

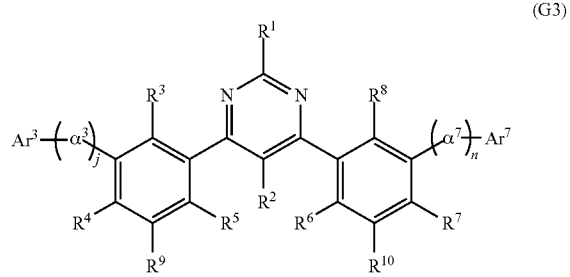

(G3)

In General Formula (G3), $R^1$ to $R^{10}$ separately represent any of hydrogen, an alkyl group having 1 to 4 carbon atoms, a substituted or unsubstituted phenyl group, and a substituted or unsubstituted biphenyl group. In addition, $Ar^3$ represents a substituted or unsubstituted naphthyl group, a substituted or unsubstituted phenanthryl group, or a substituted or unsubstituted triphenylyl group. In addition, $Ar^7$ represents any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group. In addition, $\alpha^3$ and $\alpha^7$ separately represent a substituted or unsubstituted phenylene group. In addition, j and n separately represent 0 or 1.

In each of the above-described structures, the second compound can be represented by Structural Formula (300).

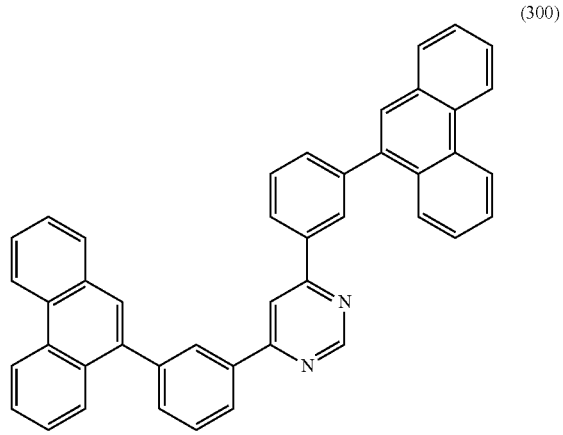

(300)

4,6mPnP2Pm

In each of the above-described structures, the proportion of the second compound by weight is preferably higher than that of the first compound. In other words, in the light-emitting element, the second compound is a host material and the first compound is a guest material.

Another embodiment of the present invention is an organic compound represented by General Formula (G4).

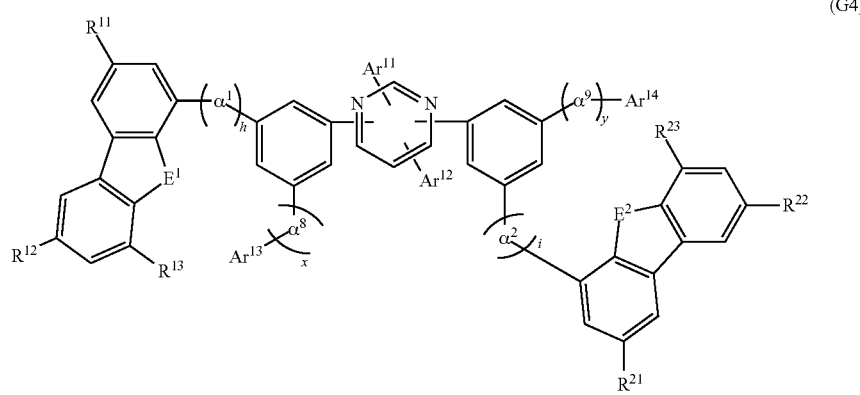

(G4)

In General Formula (G4), $Ar^1$, $Ar^{12}$, $R^{11}$ to $R^{13}$, and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $Ar^{13}$ and $Ar^{14}$ separately represent any of hydrogen, an alkyl group having 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group. In addition, $\alpha^1$, $\alpha^2$, $\alpha^8$, and $\alpha^9$ separately represent a substituted or unsubstituted phenylene group. In addition, h, i, x, and y separately represent 0 or 1. In addition, $E^1$ and $E^2$ separately represent sulfur or oxygen.

Another embodiment of the present invention is an organic compound represented by General Formula (G5).

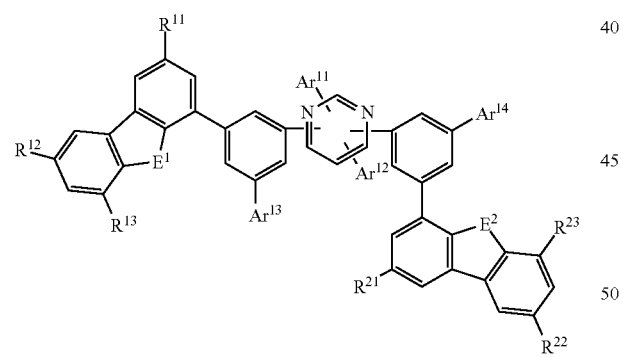

(G5)

In General Formula (G5), $Ar^{11}$, $Ar^{12}$, $R^{11}$ to $R^{13}$, and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $Ar^{13}$ and $Ar^{14}$ separately represent any of hydrogen, an alkyl group having 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group. In addition, $E^1$ and $E^2$ separately represent sulfur or oxygen.

Another embodiment of the present invention is an organic compound represented by General Formula (G6).

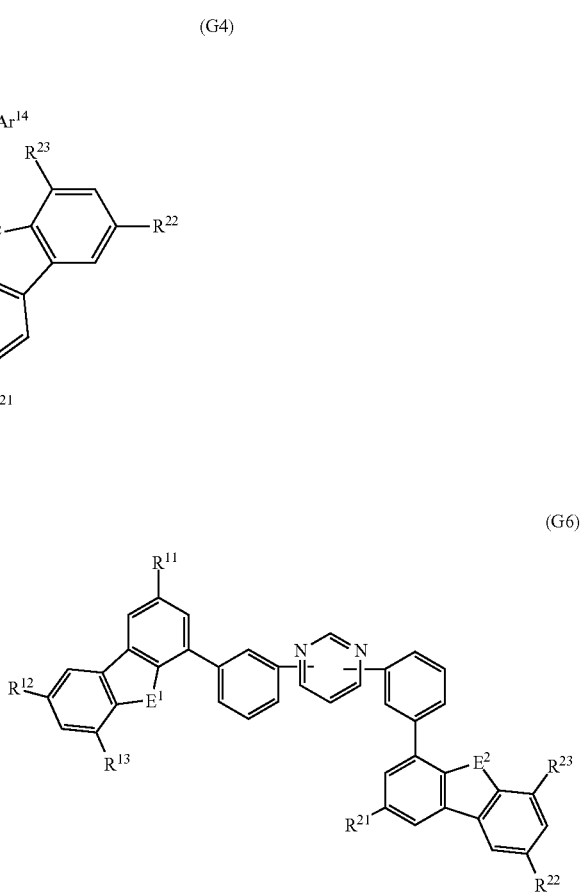

(G6)

In General Formula (G6), $R^{11}$ to $R^{13}$ and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $E^1$ and $E^2$ separately represent sulfur or oxygen.

Another embodiment of the present invention is an organic compound represented by General Formula (G7).

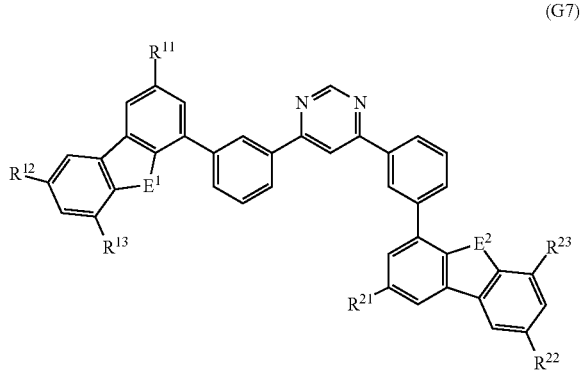

(G7)

In General Formula (G7), $R^{11}$ to $R^{13}$ and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $E^1$ and $E^2$ separately represent sulfur or oxygen.

Another embodiment of the present invention is an organic compound represented by Structural Formula (400).

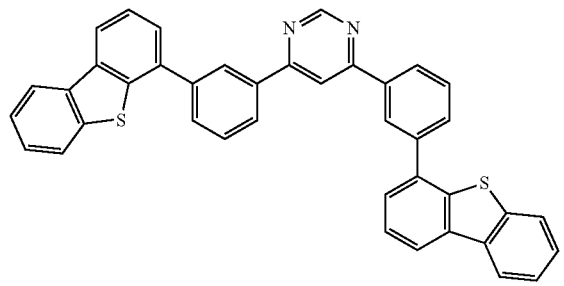

(400)

Another embodiment of the present invention is a light-emitting element including any of the above-described organic compounds between a pair of electrodes. In particular, any of the organic compounds is preferably contained in a light-emitting layer.

A light-emitting device, an electronic device, and a lighting device each using the above light-emitting element are also included in the category of the present invention. Note that the light-emitting device in this specification includes an image display device and a light source in its category. In addition, the light-emitting device includes, in its category, all of a module in which a connector such as a flexible printed circuit (FPC), a tape automated bonding (TAB) tape or a tape carrier package (TCP) is connected to a panel, a module in which a printed wiring board is provided on the tip of a TAB tape or a TCP, and a module in which an integrated circuit (IC) is directly mounted on a light-emitting element by a chip on glass (COG) method.

According to one embodiment of the present invention, a light-emitting element including novel organic compounds which can be used as a light-emitting substance for a light-emitting layer and as a host material in which the light-emitting substance is dispersed can be provided. In particular, a novel organic compound which can be suitably used as a host material in the case where a phosphorescent iridium metal complex is used as a light-emitting substance can be provided. Further, according to one embodiment of the present invention, a light-emitting element which has low driving voltage and high current efficiency can be provided. According to one embodiment of the present invention, the use of the light-emitting element makes it possible to provide a light-emitting device, an electronic device, and a lighting device which have lower power consumption.

BEST MODE FOR CARRYING OUT THE INVENTION

Hereinafter, embodiments of the present invention will be described in detail with reference to the accompanying drawings. Note that the present invention is not limited to the following description, and it will be easily understood by those skilled in the art that the mode and detail can be modified in various ways without departing from the spirit and scope of the present invention. Therefore, the present invention should not be construed as being limited to the description in the following embodiments.

(Embodiment 1)

In this embodiment, a light-emitting element which includes a phosphorescent iridium metal complex, which is a first compound, and an organic compound having a pyrimidine skeleton, which is a second compound, will be described with reference to FIG. 1.

Figure 1:
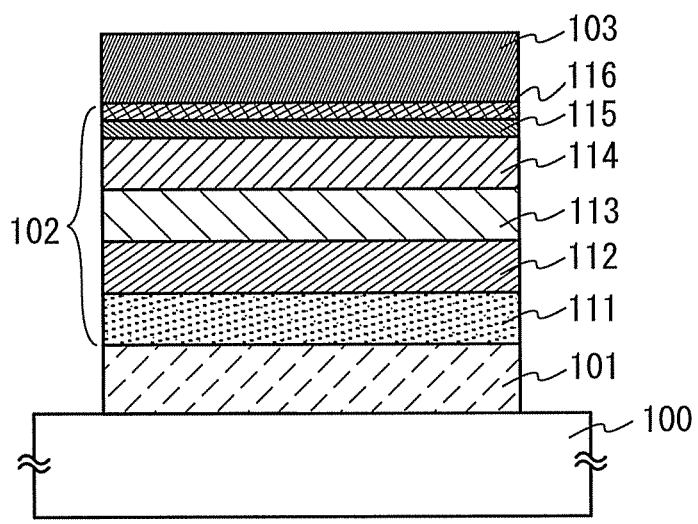
FIG. 1 illustrates a light-emitting element of one embodiment of the present invention.

In the light-emitting element described in this embodiment, as illustrated in FIG. 1, an EL layer 102 including a light-emitting layer 113 is provided between a pair of electrodes (a first electrode 101 and a second electrode 103), and the EL layer 102 includes a hole-injection layer 111, a hole-transport layer 112, an electron-transport layer 114, an electron-injection layer 115, a charge-generation layer 116, and the like in addition to the light-emitting layer 113. Note that in this embodiment, the first electrode 101 is used as an anode and the second electrode 103 is used as a cathode. The first electrode 101 is formed over a substrate 100. A glass substrate or the like can be used as the substrate 100.

By application of voltage to such a light-emitting element, holes injected from the first electrode 101 side and electrons injected from the second electrode 103 side recombine in the light-emitting layer 113 to raise the phosphorescent iridium metal complex, which is the first compound, to an excited state. Then, light is emitted when the phosphorescent iridium metal complex, which is the first compound, in the excited state returns to the ground state. Thus, in one embodiment of the present invention, the phosphorescent iridium metal complex, which is the first compound, functions as a light-emitting substance in the light-emitting element.

The hole-injection layer 111 included in the EL layer 102 is a layer containing a substance having a high hole-transport property and an acceptor substance. When electrons are extracted from the substance having a high hole-transport property owing to the acceptor substance, holes are generated. Thus, holes are injected from the hole-injection layer 111 into the light-emitting layer 113 through the hole-transport layer 112.

The charge-generation layer 116 is a layer containing a substance having a high hole-transport property and an acceptor substance. Electrons are extracted from the substance having a high hole-transport property owing to the acceptor substance, and the extracted electrons are injected from the electron-injection layer 115 having an electron-injection property into the light-emitting layer 113 through the electron-transport layer 114.

A specific example in which the light-emitting element described in this embodiment is manufactured is described.

As the first electrode 101 and the second electrode 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The first electrode 101 and the second electrode 103 can be formed by, for example, a sputtering method, an evaporation method (including a vacuum evaporation method), or the like.

Examples of the substance having a high hole-transport property that is used for the hole-injection layer 111, the hole-transport layer 112, and the charge-generation layer 116 include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Other examples include carbazole compounds such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA), dibenzothiophene compounds such as 1,3,5-tri(dibenzothiophen-4-yl)-benzene (abbreviation: DBT3P-II), dibenzofuran compounds such as 1,3,5-tri(dibenzofuran-4-yl)-benzene (abbreviation: DBF3P-II), and condensed-ring compounds such as 9-[3,5-di(phenanthren-9-yl)-phenyl]-phenanthrene (abbreviation: Pn3P). The substances given here are mainly ones that have a hole mobility of $10^{-6}$ cm$^2$/Vs or higher. Note that any other substance may be used as long as the substance has a hole-transport property higher than an electron-transport property.

Further, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacryla mide](abbreviation: PTPDMA), or poly[N,N'-bis(4-butylphenyl)-N,N'-bis(phenyl)benzidine] (abbreviation: Poly-TPD) can be used.

As each of the hole-injection layer 111 and the charge-generation layer 116, a layer in which any of the substances having high hole-transport properties given above and a substance having an acceptor property are mixed is preferably used, in which case a favorable carrier-injection property is obtained. As the acceptor substance to be used, a transition metal oxide and an oxide of a metal belonging to any of Groups 4 to 8 of the periodic table can be given. Specifically, molybdenum oxide is particularly preferable.

The light-emitting layer 113 contains, as a guest material serving as a light-emitting substance, a phosphorescent iridium metal complex, which is the first compound, and contains, as a host material, a substance having higher triplet excitation energy than the phosphorescent iridium metal complex, which is the first compound.

Here, the phosphorescent iridium metal complex which is the first compound and whose LUMO level is greater than or equal to −3.5 eV and less than or equal to −2.5 eV is used as the guest material. Meanwhile, the organic compound having a pyrimidine skeleton, which is the second compound, is used as the host material.

The LUMO level of the organic compound having a pyrimidine skeleton is located at around −3.0 eV because the LUMO level is influenced by the pyrimidine skeleton (the LUMO level exists near the pyrimidine skeleton). Thus, when the first organic compound and the second organic compound are used in combination as described above, carriers (electrons) are favorably transferred from the host material to the guest material, which results in efficient light emission from the guest material and an increase in lifetime. In addition, it is difficult for the guest material to trap electrons; thus, a high electron-transport property attributed to the pyrimidine skeleton of the host material is not impaired, and the driving voltage of the element can be reduced. In view of the above, the LUMO level of the host material is also preferably greater than or equal to −3.5 eV and less than or equal to −2.5 eV.

The organic compound having a pyrimidine skeleton, which is the second compound, preferably has, as a substituent, at least one of a benzene skeleton, a biphenyl skeleton, a naphthalene skeleton, a carbazole skeleton, a phenanthrene skeleton, a triphenylene skeleton, a dibenzothiophene skeleton, and a dibenzofuran skeleton. In such a structure, the LUMO level of the second compound is strongly influenced by a pyrimidine skeleton (the LUMO level exists near the pyrimidine skeleton); thus, the above-described effect becomes more significant.

In particular, a carbazole skeleton is preferably included in the organic compound having a pyrimidine skeleton, which is the second compound, in which case holes also flow easily and a bipolar property is obtained. A condensed ring such as a naphthalene skeleton, a phenanthrene skeleton, or a triphenylene skeleton is preferably included, in which case an excellent carrier-transport property is obtained. A dibenzothiophene skeleton or a dibenzofuran skeleton is preferably included, in which case a steric structure and stable film quality are obtained (the dibenzothiophene skeleton and the dibenzofuran skeleton, which are 4-position substituted skeletons, are especially preferable because they are electrochemically stable).

In other words, the second compound is an organic compound represented by General Formula (G1).

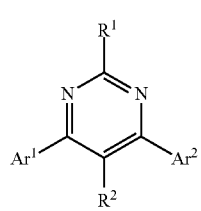

(G1)

In General Formula (G1), $R^1$ and $R^2$ separately represent hydrogen, an alkyl group having 1 to 4 carbon atoms, a substituted or unsubstituted phenyl group, or a substituted or unsubstituted biphenyl group. In addition, $Ar^1$ has at least one of a naphthalene skeleton, a phenanthrene skeleton, and a triphenylene skeleton as a substituent. In addition, $Ar^2$ has at least one of hydrogen, a naphthalene skeleton, a phenanthrene skeleton, and a triphenylene skeleton as a substituent.

In that case, the substituents $Ar^1$ and $Ar^2$ are preferably the same, in which case synthesis is performed easily. On the other hand, the substituents $Ar^1$ and $Ar^2$ are preferably different, in which case a more steric structure is obtained.

Specifically, a compound represented by General Formula (G2) is preferable as the second compound represented by General Formula (G1). The compound represented by General Formula (G2) is a useful novel compound as the second compound and is one embodiment of the present invention.

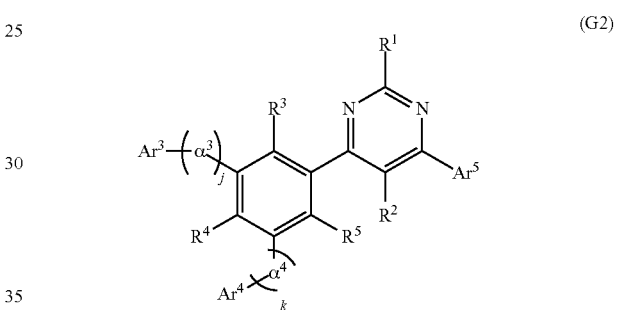

(G2)

In General Formula (G2), $R^1$ to $R^5$ separately represent any of hydrogen, an alkyl group having 1 to 4 carbon atoms, a substituted or unsubstituted phenyl group, and a substituted or unsubstituted biphenyl group. In addition, $Ar^3$ represents any of a substituted or unsubstituted naphthyl group, a substituted or unsubstituted phenanthryl group, and a substituted or unsubstituted triphenylyl group. In addition, $Ar^4$ represents any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group. In addition, $Ar^5$ represents any of hydrogen, an alkyl group having 1 to 4 carbon atoms, a substituted or unsubstituted phenyl group, and a substituted or unsubstituted biphenyl group. In addition, $\alpha^3$ and $\alpha^4$ separately represent a substituted or unsubstituted phenylene group. In addition, j and k separately represent 0 or 1.

Specifically, a compound represented by General Formula (G2-1) is preferable as the second compounds represented by General Formula (G1) and General Formula (G2). The compound represented by General Formula (G2-1) is a useful novel compound as the second compound and is one embodiment of the present invention.

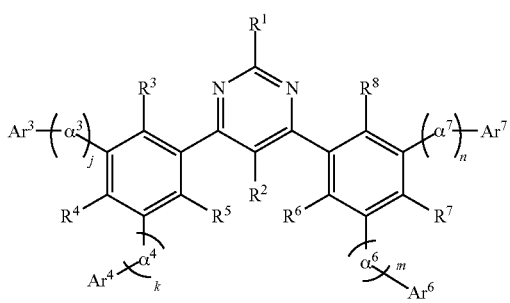

(G2-1)

In General Formula (G2-1), $R^1$ to $R^8$ separately represent any of hydrogen, an alkyl group having 1 to 4 carbon atoms, a substituted or unsubstituted phenyl group, and a substituted or unsubstituted biphenyl group. In addition, $Ar^3$ represents a substituted or unsubstituted naphthyl group, a substituted or unsubstituted phenanthryl group, or a substituted or unsubstituted triphenylyl group. In addition, $Ar^4$, $Ar^6$, and $Ar^7$ separately represent any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group. In addition, $\alpha^3$, $\alpha^4$, $\alpha^6$, and $\alpha^7$ separately represent a substituted or unsubstituted phenylene group. In addition, j, k, m, and n separately represent 0 or 1.

Specifically, a compound represented by General Formula (G3) is preferable as the second compounds represented by General Formulae (G1), (G2), and (G2-1). The compound represented by General Formula (G3) is a useful novel compound as the second compound and is one embodiment of the present invention.

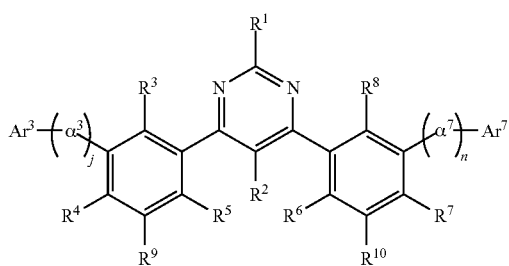

(G3)

In General Formula (G3), $R^1$ to $R^{10}$ separately represent any of hydrogen, an alkyl group having 1 to 4 carbon atoms, a substituted or unsubstituted phenyl group, and a substituted or unsubstituted biphenyl group. In addition, $Ar^3$ represents a substituted or unsubstituted naphthyl group, a substituted or unsubstituted phenanthryl group, or a substituted or unsubstituted triphenylyl group. In addition, $Ar^7$ represents any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group. In addition, $\alpha^3$ and $\alpha^7$ separately represent a substituted or unsubstituted phenylene group. In addition, j and n separately represent 0 or 1.

In the case where $Ar^1$ to $Ar^7$ in General Formulae (G2), (G2-1), and (G3) each have a substituent, the substituent is any of an alkyl group having 1 to 4 carbon atoms, a substituted or unsubstituted phenyl group, and a substituted or unsubstituted biphenyl group. The substituent is preferably an alkyl group, in which case solubility in an organic solvent is increased and synthesis or film formation by a wet process is performed easily. The substituent is preferably a substituted or unsubstituted phenyl group or a substituted or unsubstituted biphenyl group, in which case a favorable carrier-transport property is obtained. Further, such a substituent is preferably included, in which case a more steric structure and stable film quality are obtained. However, it is preferable that such a substituent be not included if the number of synthesis steps is increased due to such a substituent.

Note that both $R^1$ and $R^2$ in General Formulae (G1), (G2-1), and (G3), and any two of $R^1$, $R^2$, and $Ar^5$ in General Formula (G2) are preferably hydrogen, in which case synthesis is performed easily. Both $R^1$ and $R^2$ in General Formulae (G1), (G2-1), and (G3), and any two of $R^1$, $R^2$, and $Ar^5$ in General Formula (G2) are preferably hydrogen, in which case carrier (electron)-injection property can be improved and a reduction in driving voltage can be expected. Further, both $R^1$ and $R^2$ in General Formulae (G1), (G2-1), and (G3), and any two of $R^1$, $R^2$, and $Ar^5$ in General Formula (G2) are preferably separately an alkyl group having 1 to 4 carbon atoms, a substituted or unsubstituted phenyl group, or a substituted or unsubstituted biphenyl group, in which case an amorphous property is improved and the film quality is stabilized.

In General Formulae (G2), (G2-1), and (G3), aryl groups ($Ar^3$ to $Ar^7$) are each bonded to the 4-position or the 6-position of pyrimidine through a benzene skeleton. This is for preventing extension of conjugation between the pyrimidine skeleton and the aryl group. Further, the aryl group is bonded to the benzene skeleton at the meta position; thus, the conjugation is more difficult to extend and the HOMO level is deep. Thus, a band gap (Bg) between the HOMO level and the LUMO level is likely to be wide and the S1 level and the T1 level are likely to be high. The above makes it possible for the compound to be used as a host material for a dopant emitting light with a shorter wavelength, thereby expanding the range of use of the compound as a host material, which is preferable. Specifically, the compound is suitable as a host material for a material emitting phosphorescence in the visible light region (blue to red) or a material emitting fluorescence in the visible light region (blue to red). Moreover, the compound has a relatively deep HOMO level, and thus is suitable as a host material for a light-emitting material having a deep HOMO level.

Specific examples of $Ar^1$ to $Ar^7$ in General Formulae (G1), (G2), (G2-1), and (G3) are substituents represented by Structural Formulae (Ar-1) to (Ar-5).

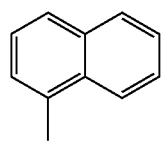

(Ar-1)

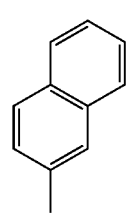

(Ar-2)

(Ar-3)
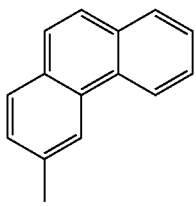

(Ar-4)
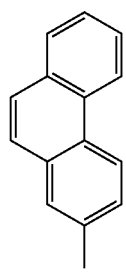

(Ar-5)
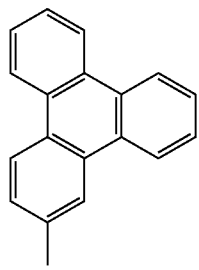

Specific examples of $\alpha^3$, $\alpha^4$, $\alpha^6$, and $\alpha^7$ in General Formulae (G2), (G2-1), and (G3) are substituents represented by Structural Formulae (α-1) to (α-3).

(α-1)
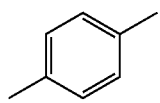

(α-2)
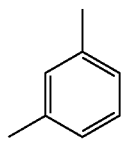

(α-3)
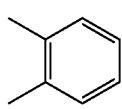

Bonding at the para position as in Structural Formula (α-1) is preferably employed, in which case a favorable carrier-transport property is obtained. Bonding at the meta position as in Structural Formula (α-2) or bonding at the ortho position as in Structural Formula (α-3) is preferably employed, in which case the T1 level or the S1 level is high.

Specific examples of the second compounds represented by General Formulae (G1), (G2), (G2-1), and (G3) are organic compounds represented by Structural Formulae (100) to (107), Structural Formulae (110) to (123), Structural Formulae (130) to (135), Structural Formulae (140) to (145), Structural Formulae (150) to (161), and Structural Formulae (300) to (321). In addition, specific examples of the second compound represented by General Formula (G2) are the organic compounds represented by Structural Formulae (306) to (309), Structural Formula (318), and Structural Formula (320). In addition, specific examples of the second compounds represented by General Formulae (G2-1) and (G3) are the organic compounds represented by Structural Formulae (300) to (305), Structural Formulae (310) to (317), Structural Formula (319), and Structural Formula (321). However, the present invention is not limited thereto (100)
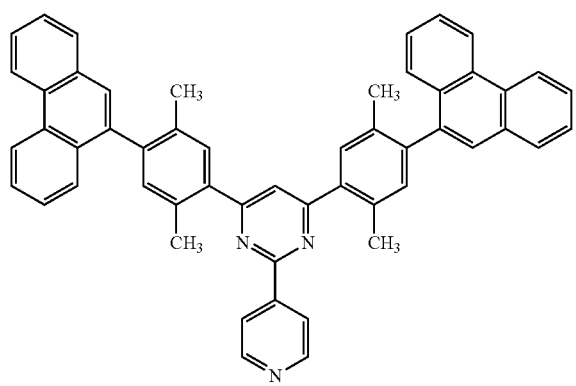

(101)
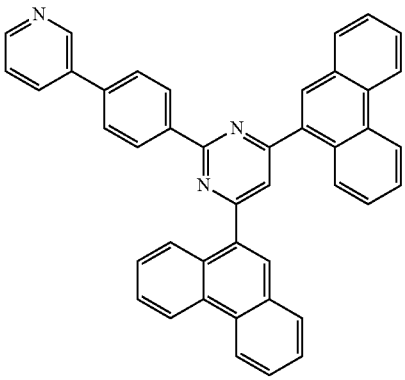

-continued
(102)
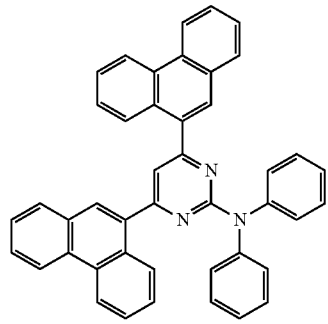
(103)
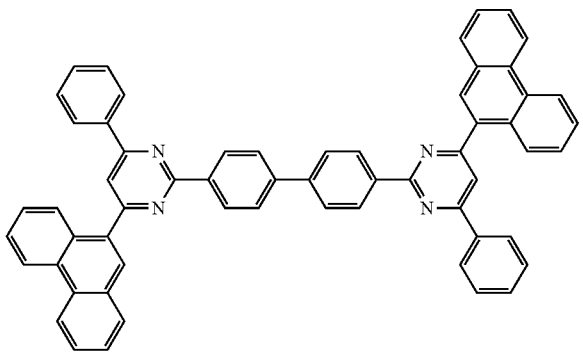
(104)
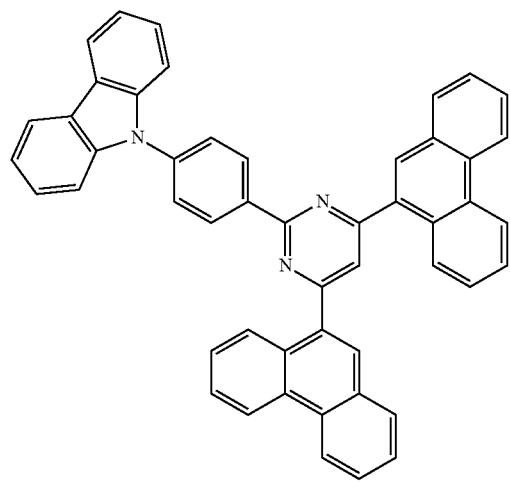
(105)
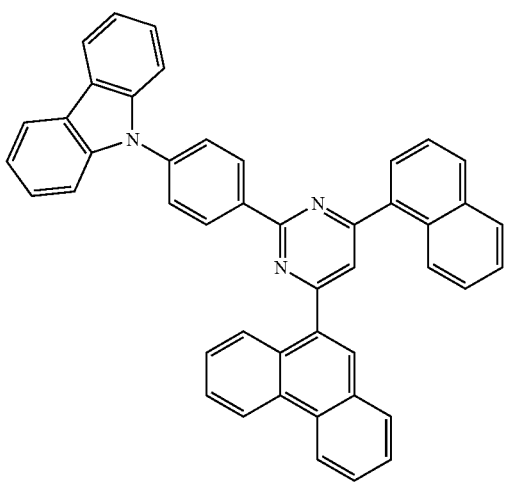
(106)
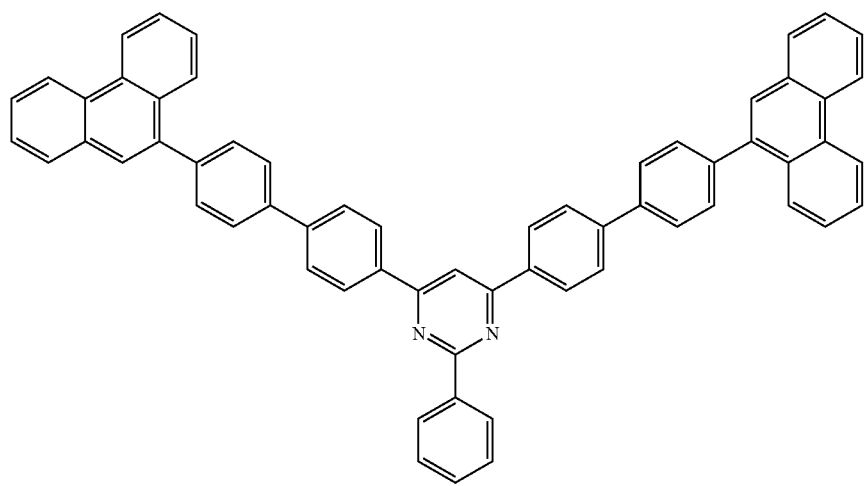

-continued
(107)
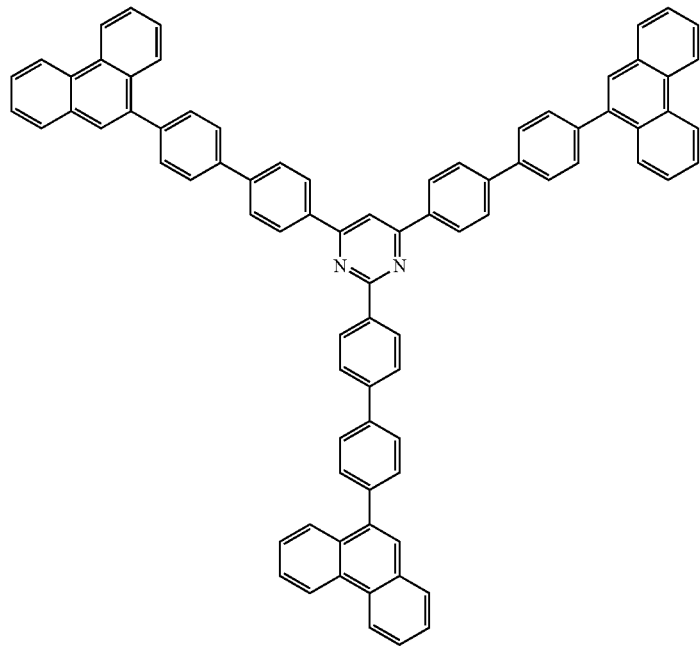
(110)
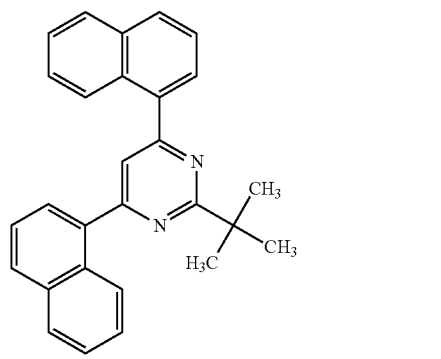
(111)
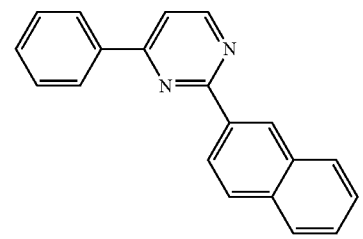
(112)
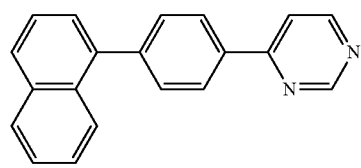
(113)
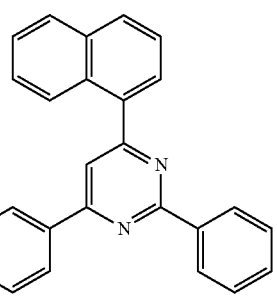
(114)
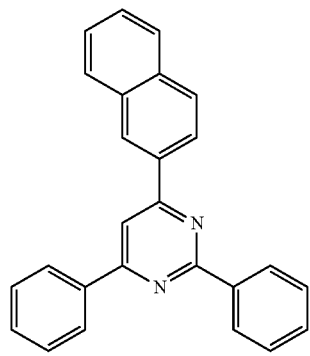
(115)
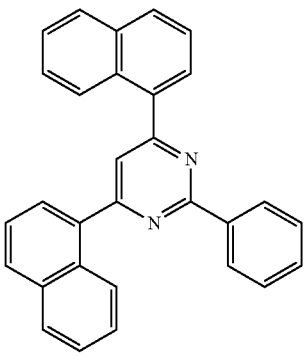

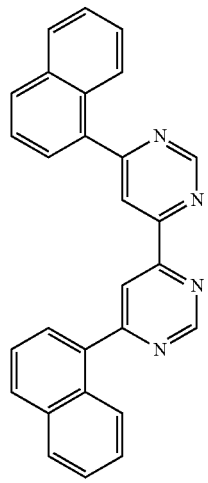
(116)
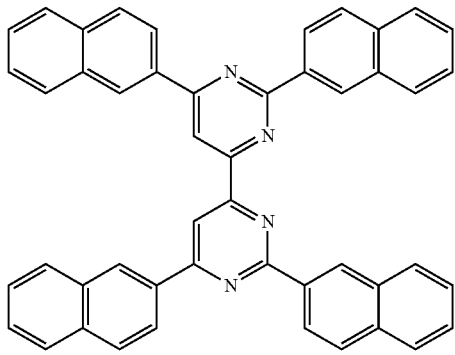
(117)
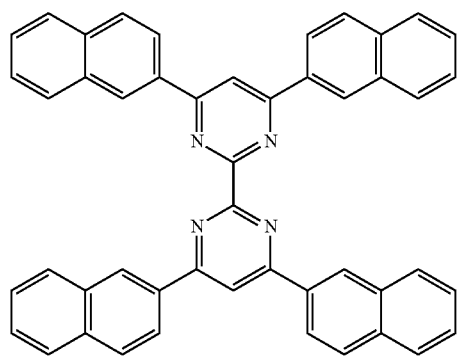
(118)
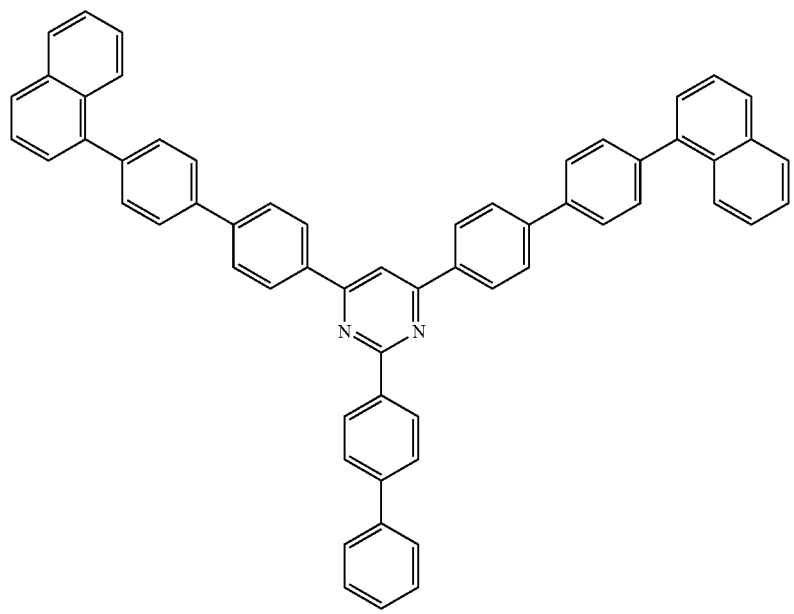
(119)

-continued
(120)
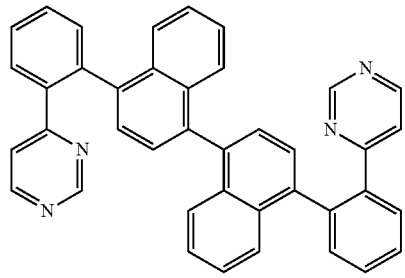
(121)
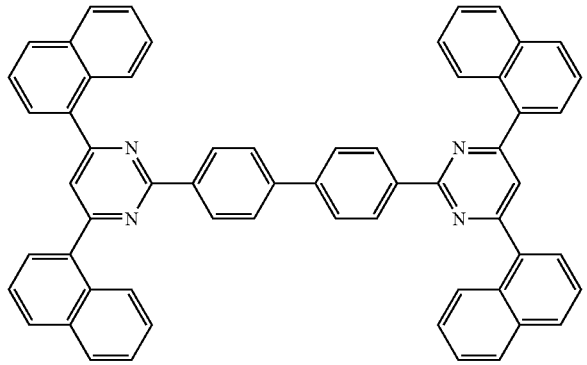
(122)
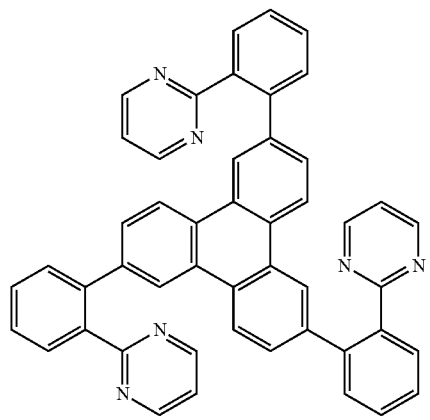
(123)
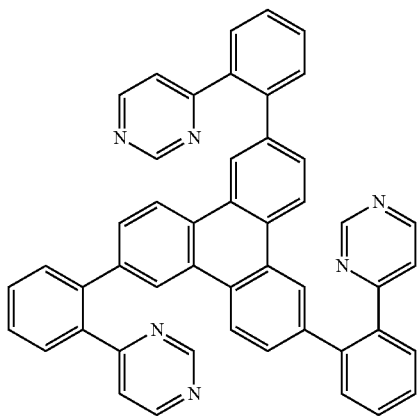
(130)
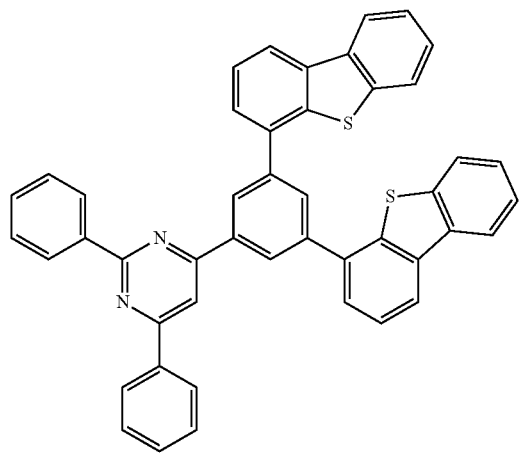
(131)
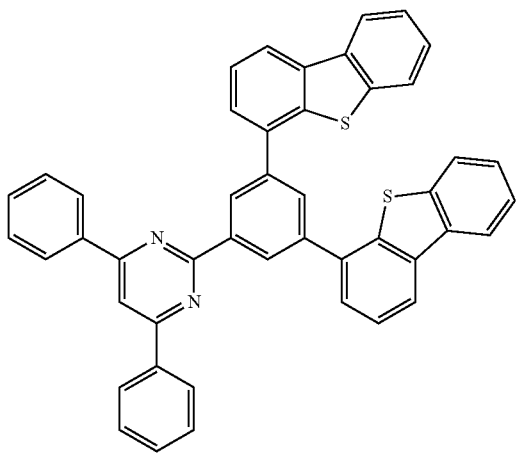

-continued
(132) 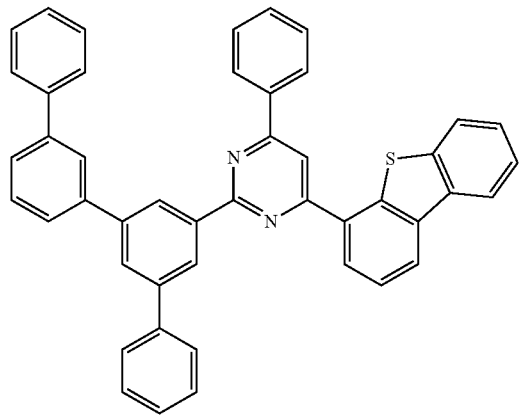
(133) 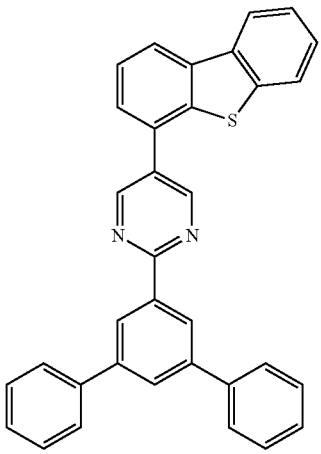
(134) 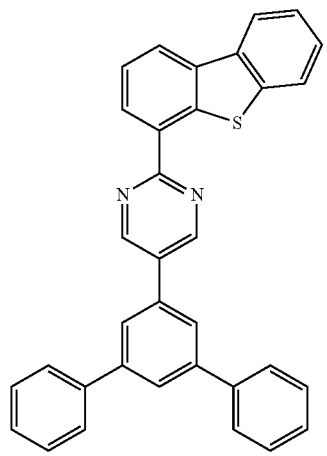
(135) 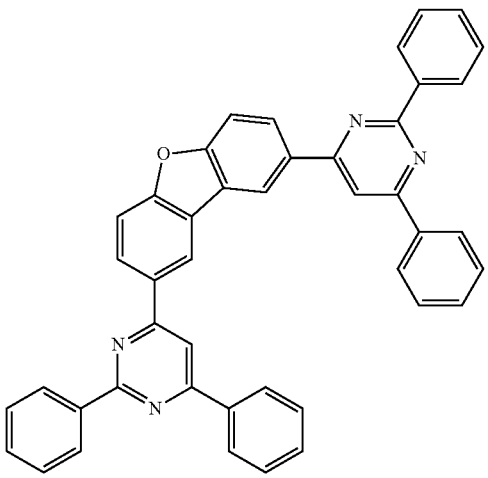
(140) 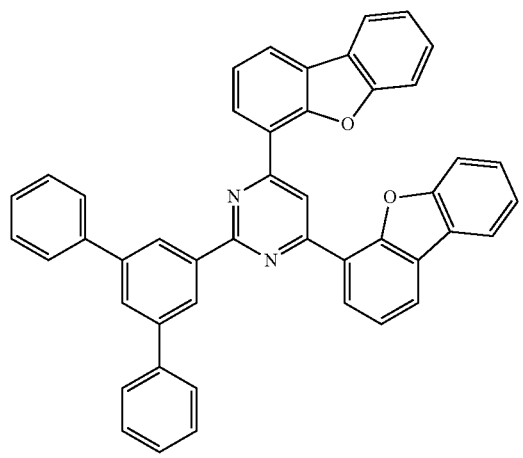
(141) 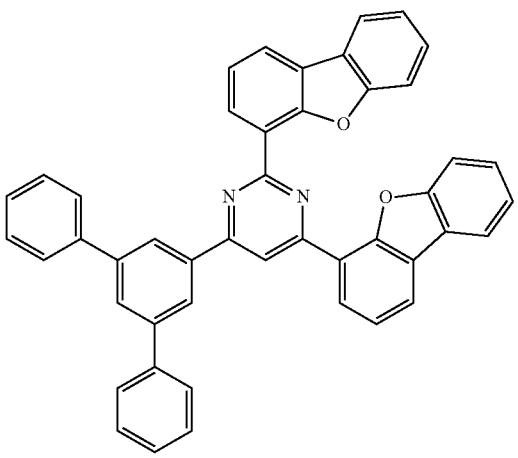

-continued
(142)
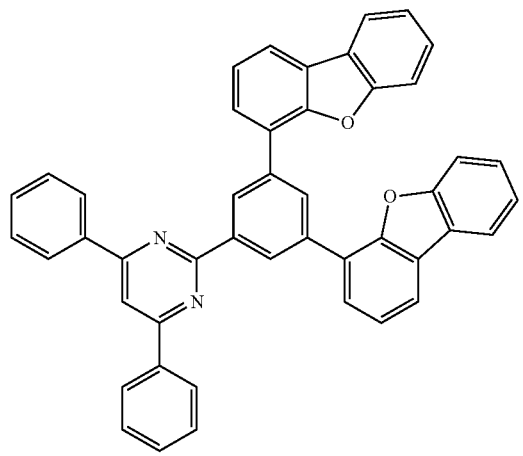
(143)
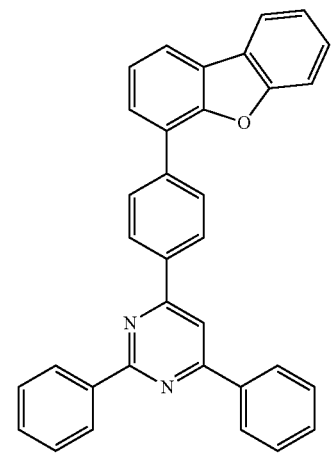
(144)
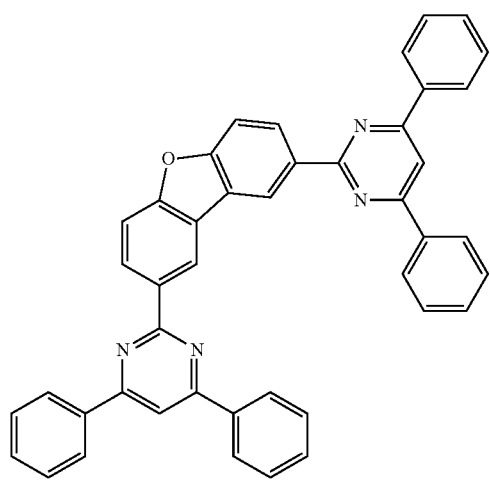
(145)
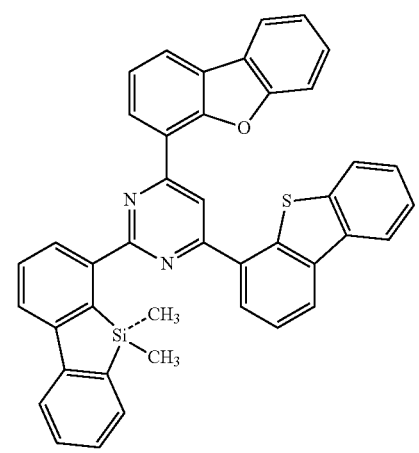
(150)
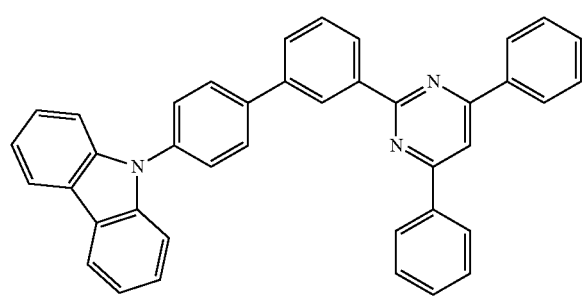
(151)
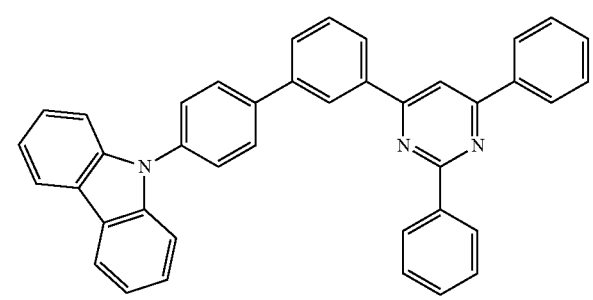
(152)
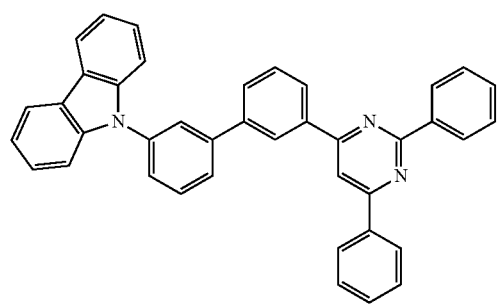
(153)
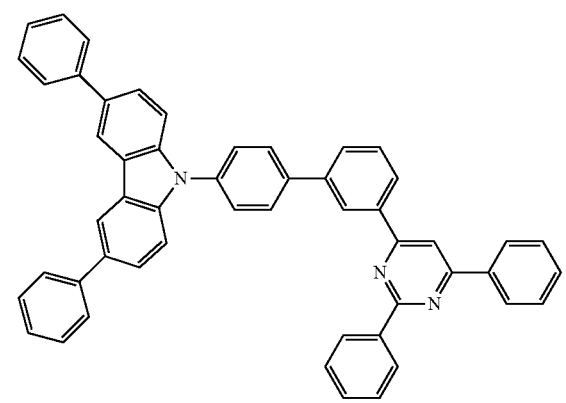

(154)
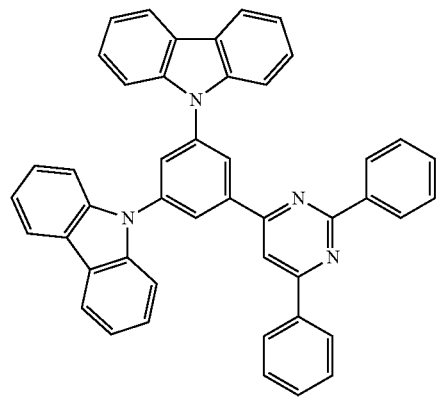
(155)
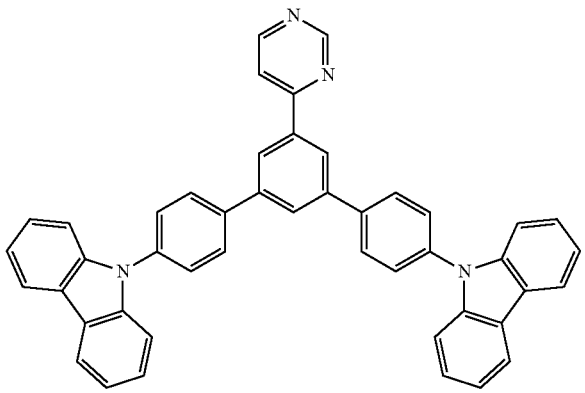
(156)
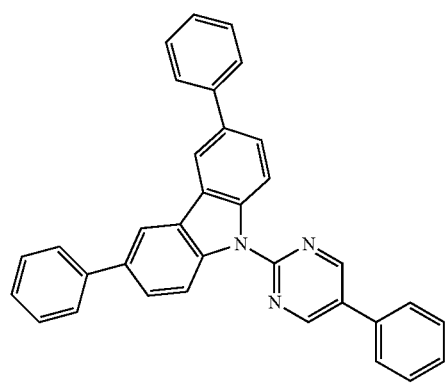
(157)
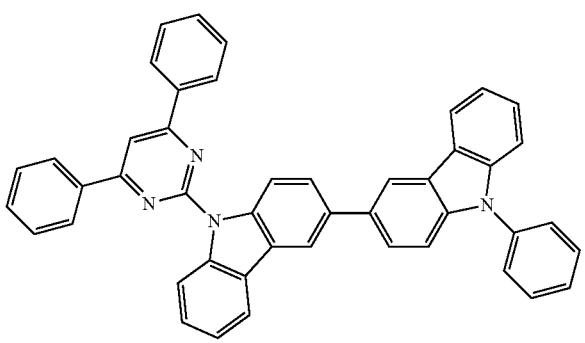
(158)
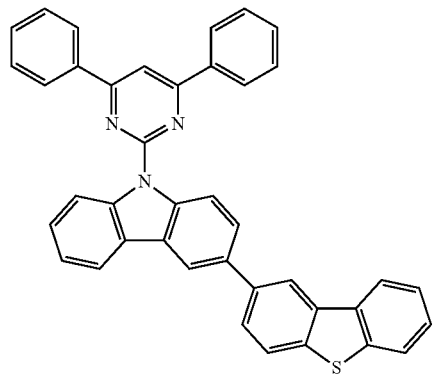
(159)
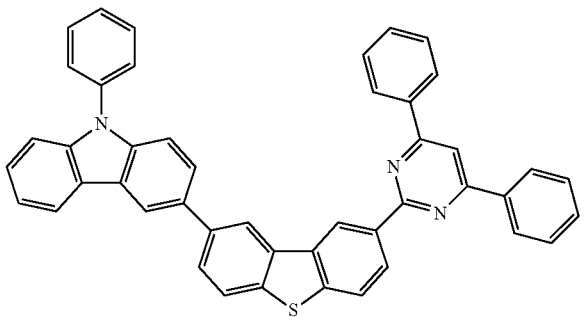

(160)
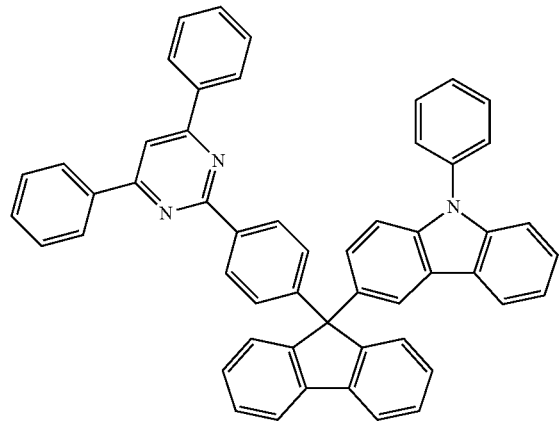
(161)
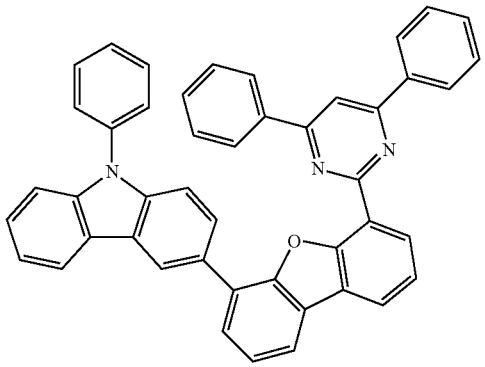
(300)
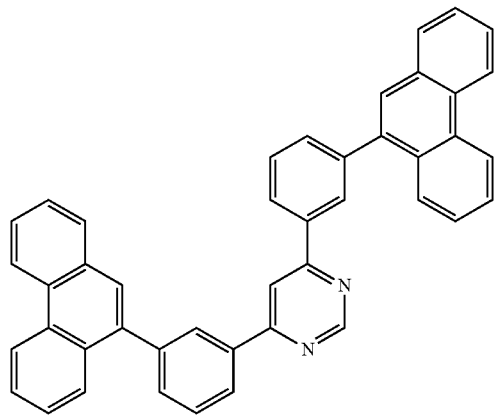
(301)
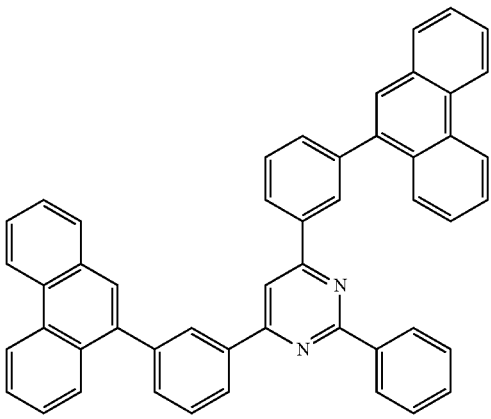
(302)
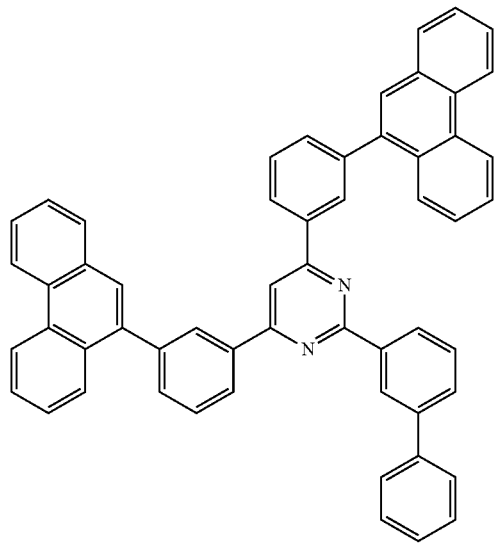
(303)
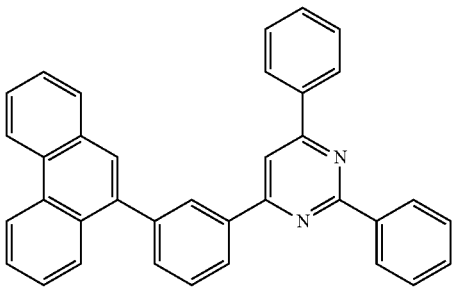

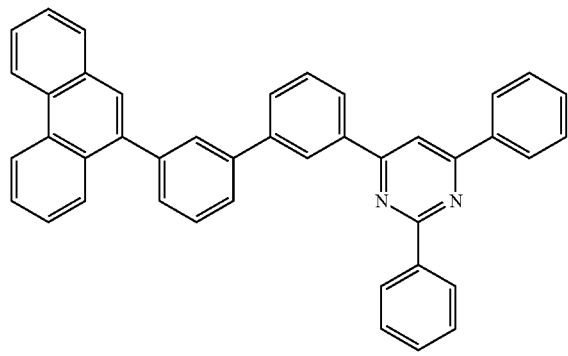
(304)
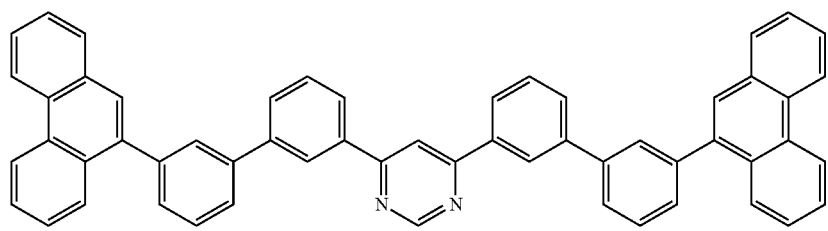
(305)
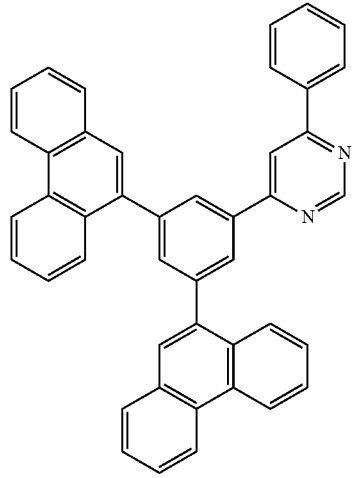
(306)
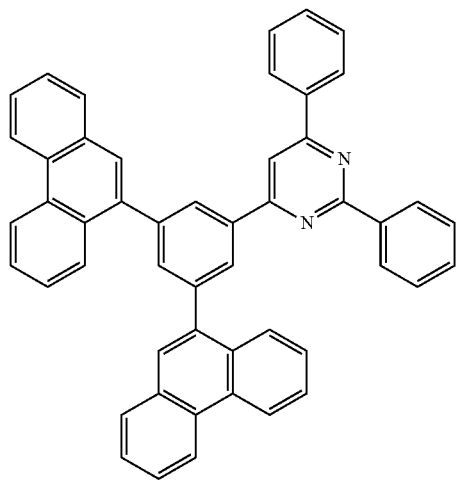
(307)
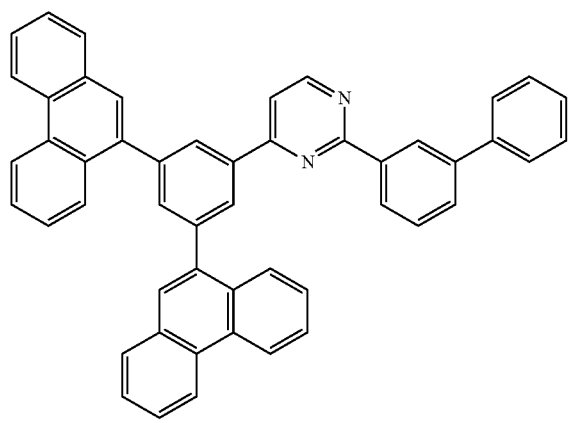
(308)
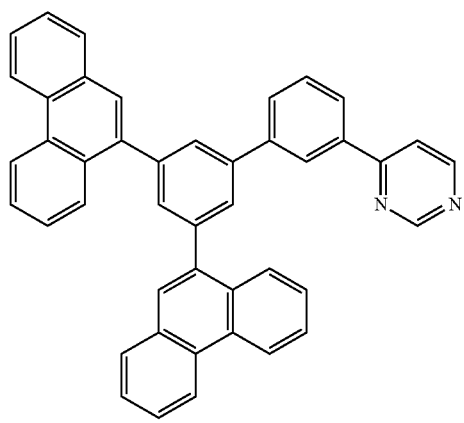
(309)

-continued
(310) 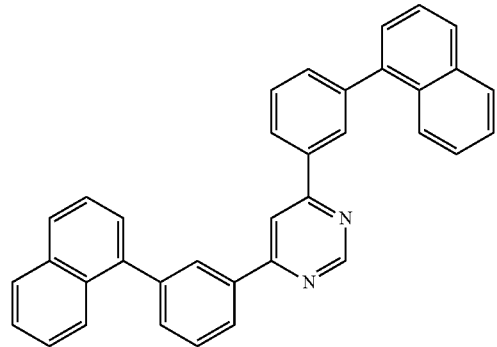
(311) 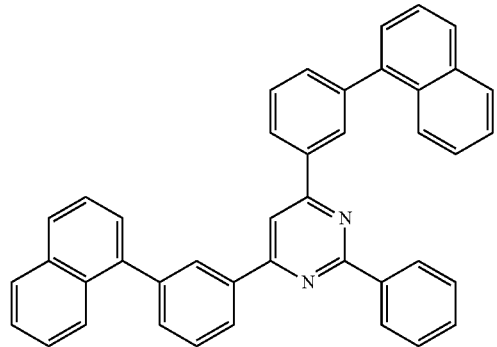
(312) 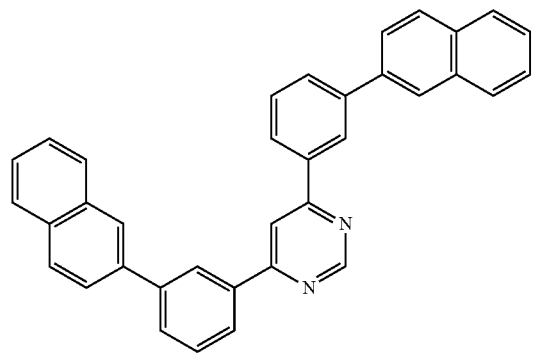
(313) 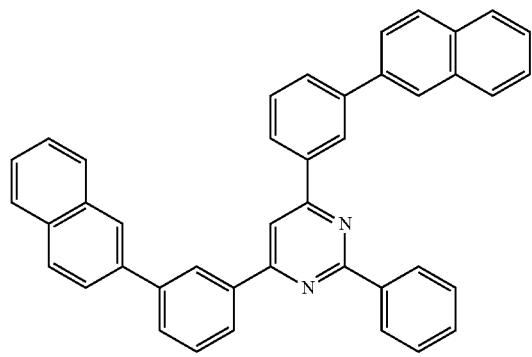
(314) 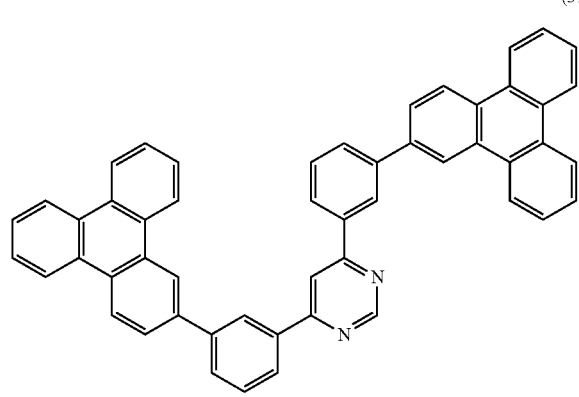
(315) 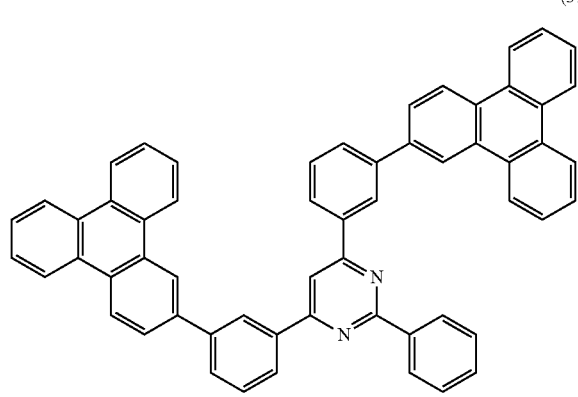
(316) 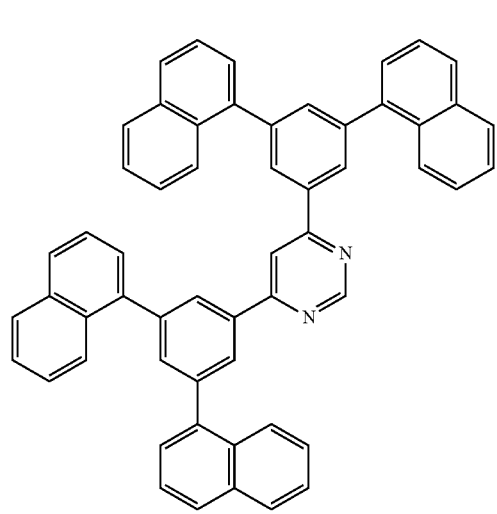
(317) 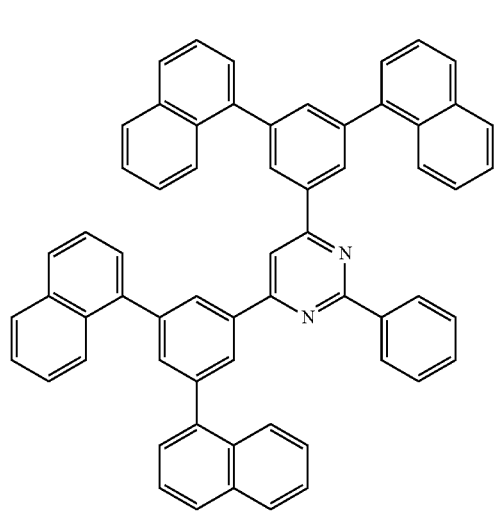

(318) 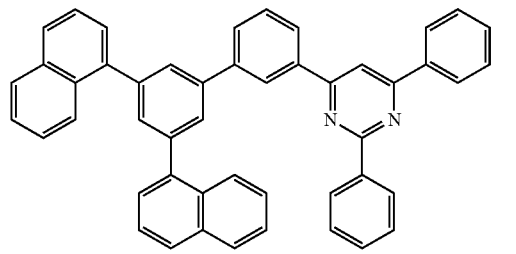

(319) 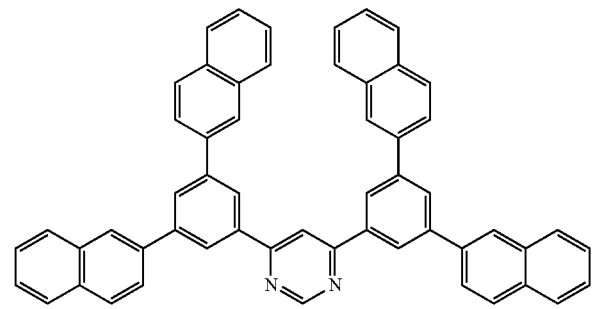

(320) 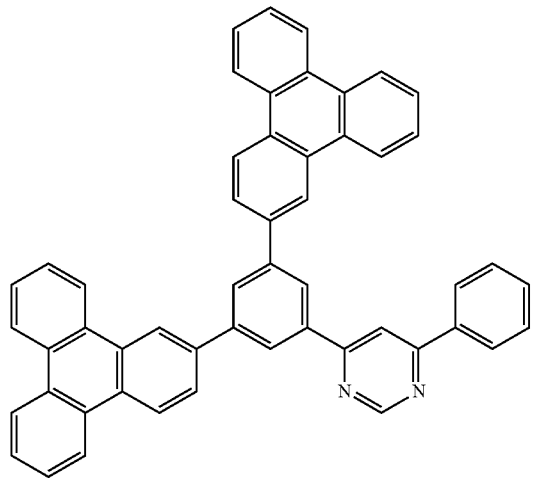

(321) 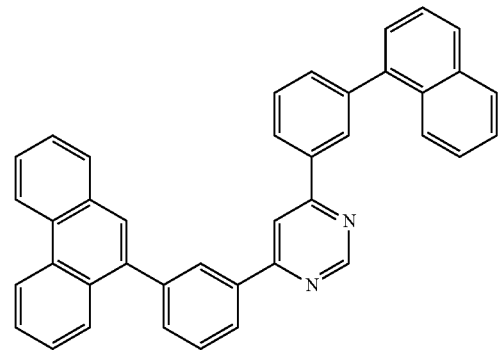

A variety of reactions can be employed as a synthesis method of the second compound. For example, synthesis reactions described below enable the synthesis of the second compound represented by General Formula (G1). Note that the synthesis method of the second compound is not limited to the following synthesis method.

Synthesis Method of Second Compound Represented by General Formula (G1)

First, Synthesis Scheme (A-1) is shown below. As shown in Synthesis Scheme (A-1), a dihalogenated pyrimidine organic compound (a1) and an arylboron organic compound (a2) are coupled, so that a halogenated pyrimidine organic compound (a3) can be synthesized.

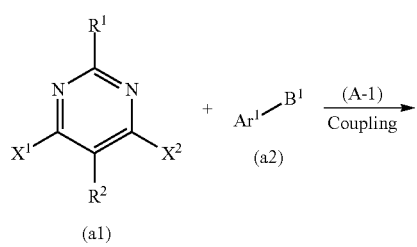

(a1)

-continued

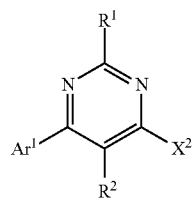

(a3)

In Synthesis Scheme (A-1), $X^1$ and $X^2$ each represent hydrogen or a halogen. In the case where $X^1$ and $X^2$ each represent a halogen, $X^1$ and $X^2$ are each preferably bromine, more preferably iodine, which have high reactivity. In addition, $B^1$ represents boronic acid or dialkoxyboron. In addition, $R^1$ and $R^2$ separately represent hydrogen, an alkyl group having 1 to 4 carbon atoms, a substituted or unsubstituted phenyl group, or a substituted or unsubstituted biphenyl group. In addition, $Ar^1$ has, as a substituent, at least one of a substituted or unsubstituted naphthyl group, a substituted or unsubstituted phenanthryl group, and a substituted or unsubstituted triphenylyl group.

Note that a variety of reaction conditions can be employed for the coupling reaction in Synthesis Scheme (A-1). As an example thereof, a synthesis method using a metal catalyst in the presence of a base can be employed.

The case where the Suzuki-Miyaura Reaction is used in Synthesis Scheme (A-1) will be described. A palladium catalyst can be used as the metal catalyst, and a mixture of a palladium complex and a ligand thereof can be used as the palladium catalyst. As examples of the palladium complex, palladium(II) acetate, tetrakis(triphenylphosphine)palladium(0), bis(triphenylphosphine)palladium(II)dichloride, and the like are given. As examples of the ligand, tri(ortho-tolyl)phosphine, triphenylphosphine, tricyclohexylphosphine, and the like are given. In addition, as examples of the substance that can be used as the base, an organic base such as sodium tert-butoxide, an inorganic base such as sodium carbonate or potassium carbonate, and the like are given. The reaction is preferably caused in a solution. As examples of the solvent that can be used in the reaction, the following are given: a mixed solvent of acetonitrile and water; a mixed solvent of thinner such as toluene or xylene and water; a mixed solvent of toluene or xylene, alcohol such as ethanol, and water; a mixed solvent of 1,3-dimethyl-3,4,5,6-tetrahydro-2(1H)-pyrimidinone (abbreviation: DMPU) and water; a mixed solvent of water and ether such as ethylene glycol dimethyl ether; and the like. However, the catalyst, ligand, base, and solvent that can be used are not limited thereto. Further, in Synthesis Scheme (A-1), an aryl aluminum compound, an aryl zirconium compound, an aryl zinc compound, an aryl tin compound, or the like may be used instead of the arylboronic compound (a2). The reaction is preferably caused under an inert atmosphere of nitrogen, argon, or the like. Heating may be performed using electromagnetic waves.

Then, as shown in Synthesis Scheme (A-2), the halogenated pyrimidine organic compound (a3) and an arylboron organic compound (a4) are coupled, so that the second compound represented by General Formula (G1) can be synthesized.

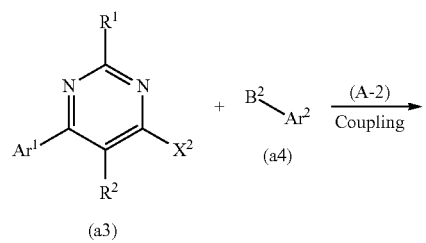

Note that $X^2$ represents hydrogen or a halogen. In the case where $X^2$ represents a halogen, $X^2$ is preferably bromine, more preferably iodine, which have high reactivity. In addition, $B^2$ represents boronic acid or dialkoxyboron. In addition, $R^1$ and $R^2$ separately represent any of hydrogen, an alkyl group having 1 to 4 carbon atoms, a substituted or unsubstituted phenyl group, or a substituted or unsubstituted biphenyl group. In addition, $Ar^1$ has, as a substituent, at least one of a substituted or unsubstituted naphthyl group, a substituted or unsubstituted phenanthryl group, and a substituted or unsubstituted triphenylyl group.

Note that a variety of reaction conditions can be employed for the coupling reaction in Synthesis Scheme (A-2). As an example thereof, a synthesis method using a metal catalyst in the presence of a base can be employed.

The Suzuki-Miyaura Reaction can be employed in Synthesis Scheme (A-2). Synthesis Scheme (A-1) can be referred to for the detail so that the synthesis can be performed.

Note that in the case where $Ar^1$ and $Ar^2$ are the same, reactions of Synthesis Scheme (A-1) and Synthesis Scheme (A-2) can be performed at the same time. In other words, (a2) and (a4) can be added to the organic compound (a1) at the same time to cause a reaction; thus, the synthesis can be performed easily.

Thus, the second compound of one embodiment of the present invention can be synthesized.

Note that when the light-emitting layer 113 contains the above-described second compound (host material) and the first compound (guest material), phosphorescence with high emission efficiency can be obtained from the light-emitting layer 113.

Specific examples of the first compound are phosphorescent iridium metal complexes represented by Structural Formulae (200) to (206), Structural Formulae (210) to (213), Structural Formulae (220) to (222), Structural Formulae (230) and (231), and Structural Formula (240). However, the present invention is not limited thereto.

Structural Formulae (200) to (206) represent phosphorescent iridium metal complexes each having a pyrimidine skeleton; Structural Formulae (210) to (213) represent phosphorescent iridium metal complexes each having a pyrazine skeleton; Structural Formulae (220) to (222) represent phosphorescent iridium metal complexes each having a pyridine skeleton or a quinoline skeleton; Structural Formulae (230) and (231) represent phosphorescent iridium metal complexes each having a quinoxaline skeleton; and Structural Formula (240) represents a phosphorescent iridium metal complex having a triazine skeleton.

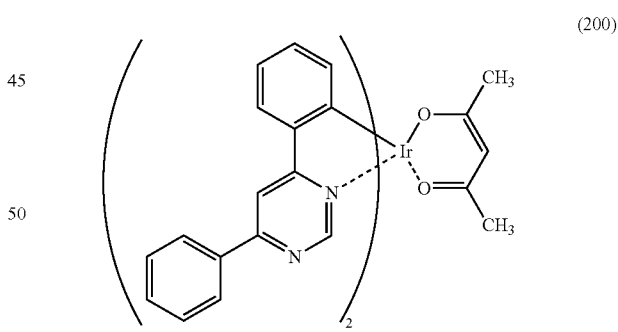

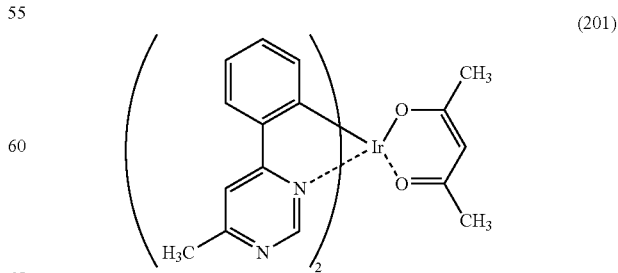

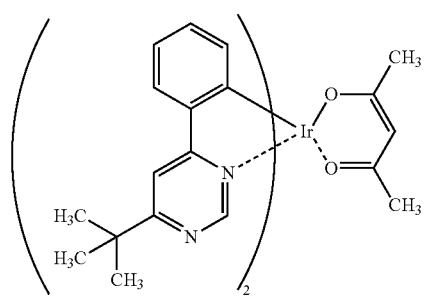 (202)
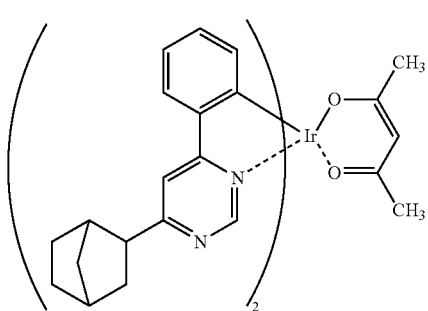 (203)
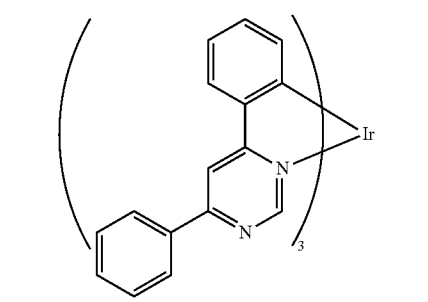 (204)
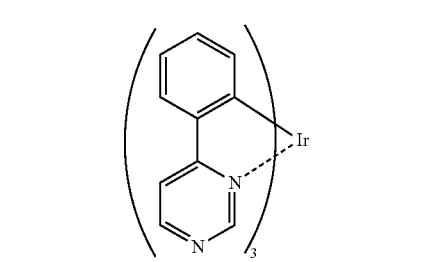 (205)
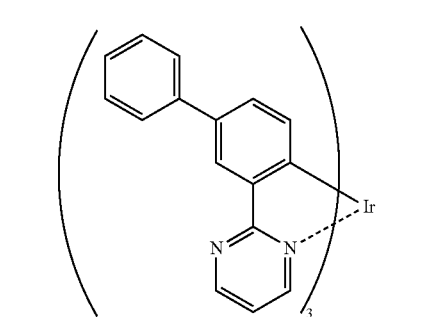 (206)
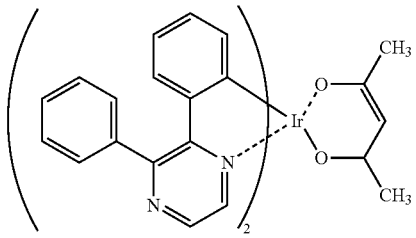 (210)
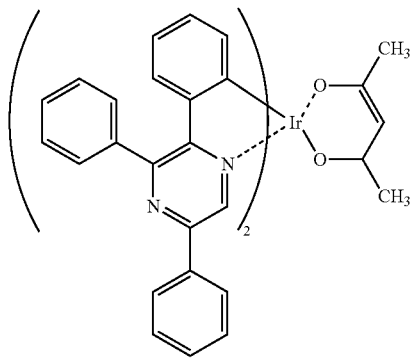 (211)
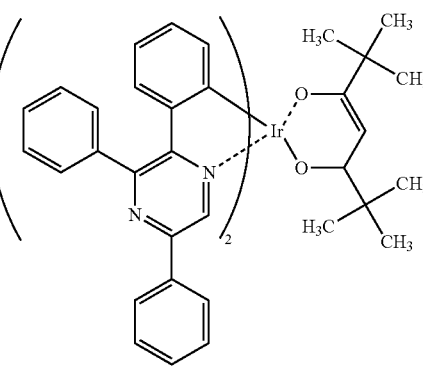 (212)
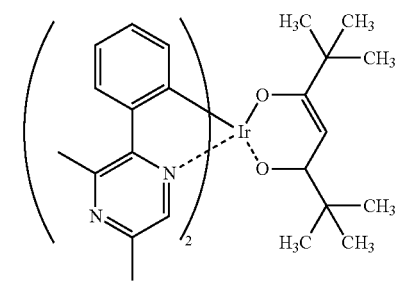 (213)
(220)

-continued (221)
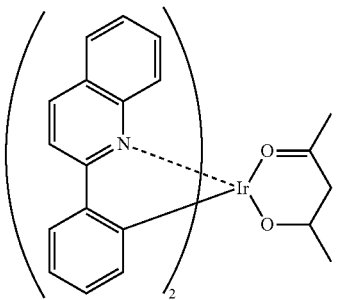

(222)
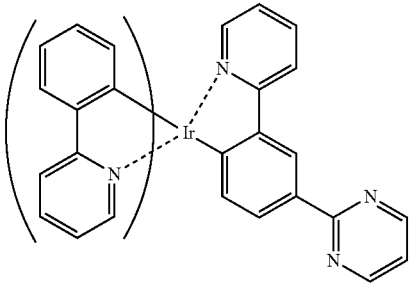

(230)
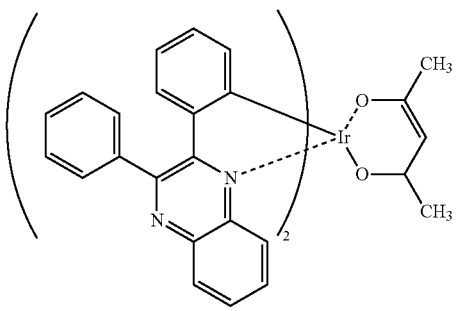

(231)
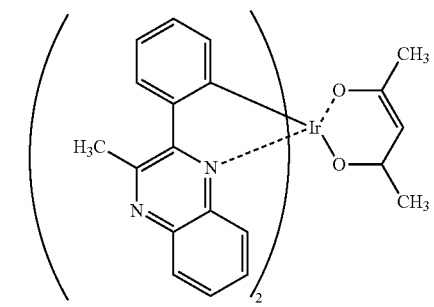

(240)
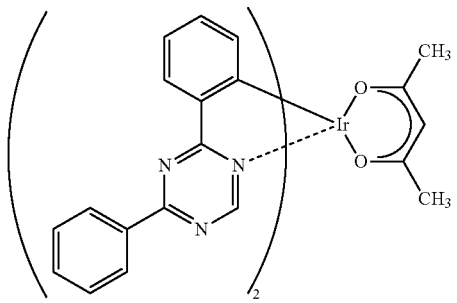

Note that the phosphorescent iridium metal complex is not limited to the structures given above. The organic compound having a pyrimidine skeleton, which is the second compound, has a high T1 level, and thus can be used as a host material for a material emitting phosphorescence with a wavelength of blue-green light or a wavelength longer than that of blue-green light. Note that as described above, the LUMO level of the phosphorescent iridium metal complex is preferably greater than or equal to −3.5 eV and less than or equal to −2.5 eV.

The HOMO level of the phosphorescent iridium metal complex is preferably greater than or equal to −6.0 eV and less than or equal to −5.0 eV. This structure makes it easy for holes to be trapped by the phosphorescent iridium metal complex, which results in suppression of change in hole mobility in a light-emitting element over time. As a result, an increase in the lifetime of the element can be expected.

In particular, in the case where the organic compound having a pyrimidine skeleton, which is the second compound, has at least one of a benzene skeleton, a biphenyl skeleton, a naphthalene skeleton, a phenanthrene skeleton, a triphenylene skeleton, a dibenzothiophene skeleton, and a dibenzofuran skeleton as a substituent, the HOMO level of the organic compound having a pyrimidine skeleton, which is the second compound, is less than or equal to −6.0 eV; thus, the above-described hole-trapping effect becomes more significant.

In another embodiment of the present invention, it is preferable that a host material have a pyrimidine skeleton and a guest material have a diazine skeleton. It is more preferable that both the host material and the guest material have a pyrimidine skeleton. With such a structure, materials having LUMO levels close to each other can be selected for the host material and the guest material. As a result, carriers (electrons) are favorably transferred from the host material to the guest material, which results in efficient light emission from the guest material and an increase in lifetime. When the LUMO levels are close to each other, it is difficult for the guest material to trap electrons; thus, a high electron-transport property attributed to the pyrimidine skeleton of the host material is not impaired, and the driving voltage of the element can be reduced. Accordingly, a light-emitting element with high efficiency, a long lifetime, and low driving voltage can be expected. In the case where both the host material and the guest material have pyrimidine skeletons, the host-guest molecular interaction is enhanced, and these effects probably become more significant.

The reason why materials having LUMO levels close to each other can be selected for the host material and the guest material is described below. First, the LUMO level of the host material is influenced by a pyrimidine skeleton which is a kind of diazine skeleton which is easy to reduce. In particular, the LUMO orbitals of the host materials represented by General Formulae (G1), (G2), (G2-1), and (G3) exist near the pyrimidine skeleton. Meanwhile, the guest material also has a diazine skeleton which is easy to reduce; thus, the LUMO level of the guest material is influenced by the diazine skeleton. In particular, when the diazine skeleton forms a coordinate bond to iridium, the LUMO orbital does not exist in a central metal but exists near the diazine skeleton. As a result, both the host material and the guest material have the LUMO orbitals attributed to the diazine skeletons; thus, the LUMO levels of the host material and the guest material become close to each other.

Note that also in the case where the phosphorescent iridium metal complex (first compound) has a diazine skeleton, particularly a pyrimidine skeleton as described above, the LUMO level of the phosphorescent iridium metal complex is preferably greater than or equal to −3.5 eV and less than or equal to −2.5 eV. The HOMO level is preferably greater than or equal to −6.0 eV and less than or equal to −5.0 eV. Note that preferable examples of the host material (second compound) in this case are those given above.

As described above, the second compound (host material) in one embodiment of the present invention has a LUMO orbital existing near the pyridine skeleton which is easy to reduce and has an excellent electron-transport property. Thus, the electron-transport property is high and the driving voltage of an element is reduced.

Although the light-emitting element in which the phosphorescent iridium metal complex, which is the first compound, is used and which emits phosphorescence is described in Embodiment 1; the present invention is not limited thereto. The organic compound having a pyrimidine skeleton, which is the second compound, has a high T1 level, and thus also has a high S1 level. Thus, the organic compound having a pyrimidine skeleton, which is the second compound, can be used as a host material for a material emitting fluorescence in the visible light region.

In addition, plural kinds of substances can be used as the substances (host materials) in which the light-emitting substance (guest material) is dispersed. Thus, the light-emitting layer may contain a second host material in addition to the organic compound having a pyrimidine skeleton, which is the second compound.

As examples of the second host material, the materials used for the hole-transport layer 112 are given.

The electron-transport layer 114 is a layer containing a substance having a high electron-transport property. For the electron-transport layer 114, metal complexes such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, $Zn(BOX)_2$, or bis[2-(2-hydroxyphenyl)benzothiazolato]zinc (abbreviation: $Zn(BTZ)_2$) can be used. Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can be used. Further, a high molecular compound such as poly(2,5-pyridinediyl) (abbreviation: PPy), poly[(9,9-dihexylfluorene-2,7-diyl)-co-(bipyridine-3,5-diyl)](abbreviation: PF-Py) or poly[(9,9-dioctylfluorene-2,7-diyl)-co-(2,2'-pyridine-6,6'-diyl)](abbreviation: PF-BPy) can be used. The substances given here are mainly ones that have an electron mobility of $10^{-6}$ cm$^2$/Vs or higher. Note that any other substance may be used as long as the substance has an electron-transport property higher than a hole-transport property.

The organic compound having a pyrimidine skeleton used in one embodiment of the present invention, which is the second compound, has a favorable electron-transport property, and thus is suitable for the electron-transport layer.

The electron-transport layer 114 is not limited to a single layer, but may be a stack of two or more layers containing any of the above substances.

The electron-injection layer 115 is a layer containing a substance having a high electron-injection property. For the electron-injection layer 115, an alkali metal, an alkaline earth metal, or a compound thereof, such as lithium fluoride (LiF), cesium fluoride (CsF), calcium fluoride ($CaF_2$), or lithium oxide ($LiO_x$) can be used. A rare earth metal compound like erbium fluoride ($ErF_3$) can also be used. The substances for forming the electron-transport layer 114, which are described above, can also be used.

A composite material in which an organic compound and an electron donor (donor) are mixed may also be used for the electron-injection layer 115. Such a composite material is excellent in an electron-injection property and an electron-transport property because the electron donor causes electron generation in the organic compound. In this case, the organic compound is preferably a material excellent in transporting the generated electrons. Specifically, for example, the substances for forming the electron-transport layer 114 (e.g., a metal complex and a heteroaromatic compound), which are described above, can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Other examples are alkali metal oxide and alkaline earth metal oxide such as lithium oxide, calcium oxide, and barium oxide. A Lewis base such as magnesium oxide can also be used. An organic compound such as tetrathiafulvalene (abbreviation: TTF) can also be used.

Note that each of the above-described hole-injection layer 111, hole-transport layer 112, light-emitting layer 113, electron-transport layer 114, electron-injection layer 115, and charge-generation layer 116 can be formed by a method such as an evaporation method (e.g., a vacuum evaporation method), an inkjet method, or a coating method.

In the above-described light-emitting element, current flows due to a potential difference generated between the first electrode 101 and the second electrode 103 and holes and electrons recombine in the EL layer 102, whereby light is emitted. Then, the emitted light is extracted outside through one or both of the first electrode 101 and the second electrode 103. Therefore, one or both of the first electrode 101 and the second electrode 103 are electrodes having a light-transmitting property.

The above-described light-emitting element can emit phosphorescence originating from the phosphorescent iridium metal complex, which is the first compound, and thus can have higher efficiency than a light-emitting element using a fluorescent compound.

Note that although the light-emitting element described in this embodiment is one structural example of the light-emitting element, a light-emitting element having a different structure which is described in another embodiment can also be applied to a light-emitting device of one embodiment of the present invention. Further, as a light-emitting device including the above light-emitting element, a passive matrix type light-emitting device and an active matrix type light-emitting device can be manufactured. It is also possible to manufacture a light-emitting device with a microcavity structure including a light-emitting element having a structure different from that of the light-emitting elements described in another embodiment. Each of the above light-emitting devices is included in the present invention.

Note that there is no particular limitation on the structure of the TFT in the case of the active matrix light-emitting device. For example, a staggered TFT or an inverted staggered TFT can be used as appropriate. Further, a driver circuit formed over a TFT substrate may be formed using both an n-channel TFT and a p-channel TFT or only either an n-channel TFT or a p-channel TFT. Furthermore, there is no particular limitation on the crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

(Embodiment 2)

In this embodiment, an organic compound having a pyrimidine skeleton will be described.

Another embodiment of the present invention is an organic compound represented by General Formula (G4).

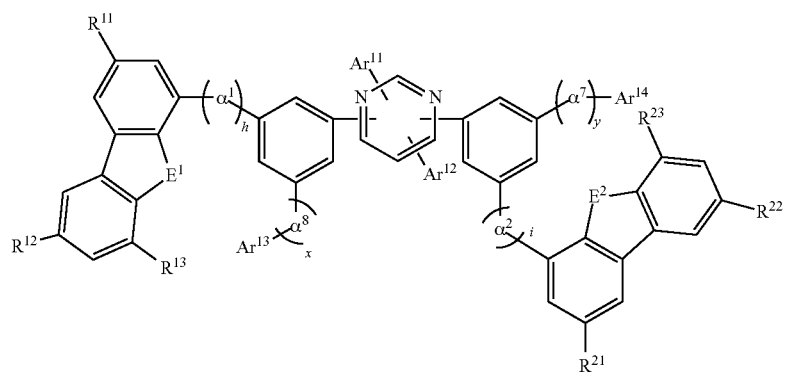

(G4)

In General Formula (G4), $Ar^{11}$, $Ar^{12}$, $R^{11}$ to $R^{13}$, and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $Ar^{13}$ and $Ar^{14}$ separately represent any of hydrogen, an alkyl group having 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group. In addition, $\alpha^1$, $\alpha^2$, $\alpha^8$, and $\alpha^9$ separately represent a substituted or unsubstituted phenylene group. In addition, h, i, x, and y separately represent 0 or 1. In addition, $E^1$ and $E^2$ separately represent sulfur or oxygen.

Another embodiment of the present invention is an organic compound represented by General Formula (G5).

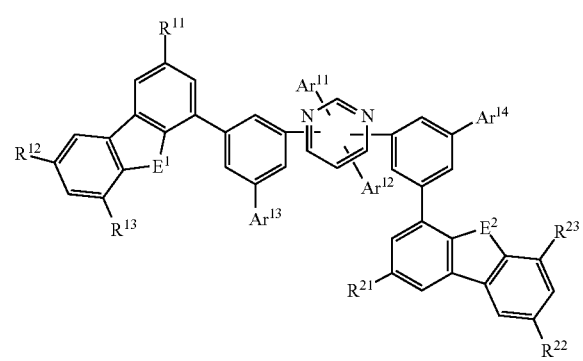

(G5)

In General Formula (G5), $Ar^{11}$, $Ar^{12}$, $R^{11}$ to $R^{13}$, and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $Ar^{13}$ and $Ar^{14}$ separately represent any of hydrogen, an alkyl group having 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group. In addition, $E^1$ and $E^2$ separately represent sulfur or oxygen.

Another embodiment of the present invention is an organic compound represented by General Formula (G6).

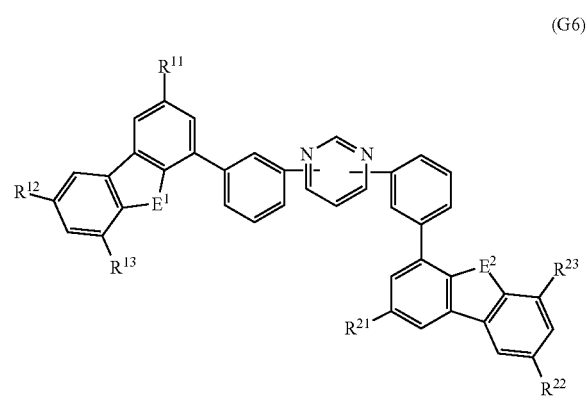

(G6)

In General Formula (G6), $R^{11}$ to $R^{13}$ and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $E^1$ and $E^2$ separately represent sulfur or oxygen.

Another embodiment of the present invention is an organic compound represented by General Formula (G7).

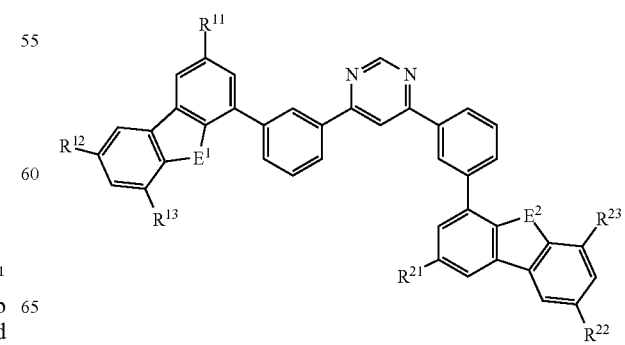

(G7)

In General Formula (G7), $R^{11}$ to $R^{13}$ and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $E^1$ and $E^2$ separately represent sulfur or oxygen.

Another embodiment of the present invention is an organic compound represented by Structural Formula (400).

(400)
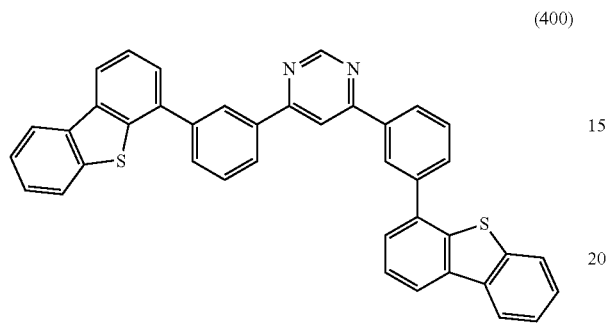

Specific examples of $Ar^{13}$ and $Ar^{14}$ in General Formulae (G4) and (G5) are substituents represented by Structural Formulae (Ar-6) to (Ar-11).

(Ar-6)
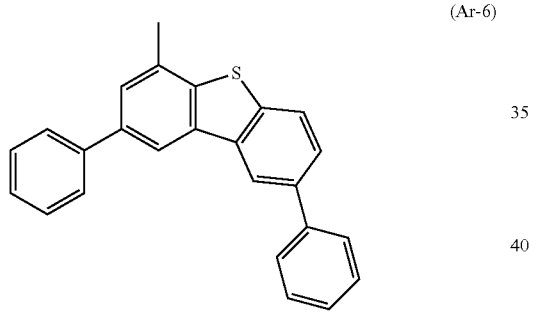

(Ar-7)
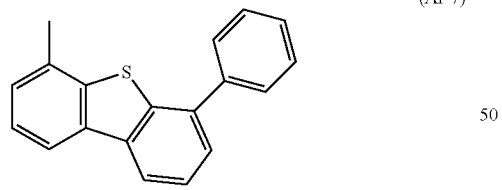

(Ar-8)
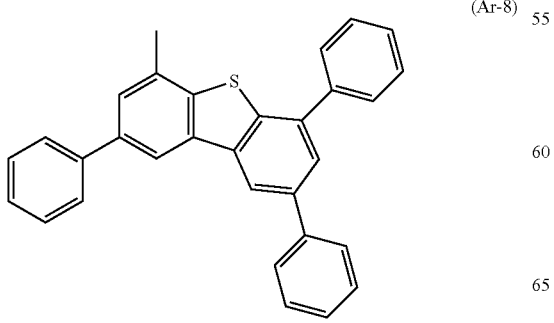

(Ar-9)
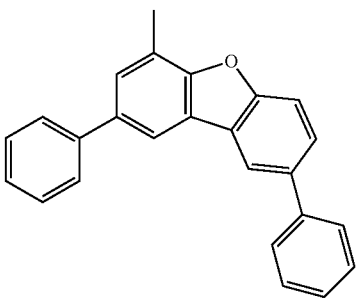

(Ar-10)
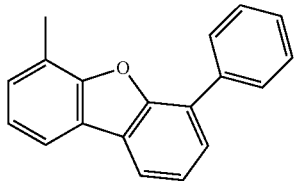

(Ar-11)
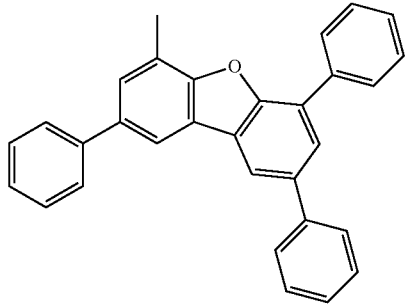

Specific examples of $\alpha^1$, $\alpha^2$, $\alpha^8$, and $\alpha^9$ in General Formula (G4) are substituents represented by Structural Formulae (α-4) to (α-6).

(α-4)

(α-5)
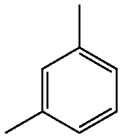

(α-6)
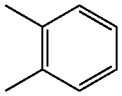

Bonding at the para position as in Structural Formula (α-4) is preferably employed, in which case a favorable carrier-transport property is obtained. Bonding at the meta position as in Structural Formula (α-5) and bonding at the ortho position as in Structural Formula (α-6) are preferably employed, in which case the T1 level or the S1 level is high.

In the case where $Ar^{13}$ and $Ar^{14}$ have substituents, the substituents are separately any of an alkyl group having 1 to 4 carbon atoms, a substituted or unsubstituted phenyl group, and a substituted or unsubstituted biphenyl group. In the case where $\alpha^1$, $\alpha^2$, $\alpha^8$, and $\alpha^9$ have substituents, the substituents are separately any of an alkyl group having 1 to 4 carbon atoms, a substituted or unsubstituted phenyl group, a substituted or unsubstituted biphenyl group, a substituted or unsubstituted dibenzothiophene-4-yl group, and a substituted or unsubstituted dibenzofuran-4-yl group. In General Formulae (G4) to (G6), a phenylene group is bonded to any one or two of the 2-position, the 4-position, the 5-position, and the 6-position of a pyrimidine ring. In General Formulae (G4) to (G7), as the substituent, an alkyl group having 1 to 4 carbon atoms, a substituted or unsubstituted phenyl group, or a substituted or unsubstituted biphenyl group may be bonded to any one or more of the 2-position, the 4-position, the 5-position, and the 6-position of the pyrimidine ring. These substituents are preferably included, in which case a more steric structure and stable film quality are obtained. Further, an alkyl group is preferably included, in which case solubility in a solvent is improved and handling at the time of synthesis or film formation by a wet process becomes easy. However, in some cases, it is preferable that these substituents be not included in view of synthesis cost.

Note that $Ar^{11}$ and $Ar^{12}$ in General Formulae (G4) and (G5) preferably represent hydrogen, in which case synthesis can be performed easily, a carrier (electron)-injection property is improved, and a reduction in driving voltage can be expected. Further, $Ar^{11}$ and $Ar^{12}$ preferably separately represent an alkyl group having 1 to 4-carbon atoms, a substituted or unsubstituted phenyl group, or a substituted or unsubstituted biphenyl group, in which case an amorphous property is improved and the film quality is stabilized.

Specific examples of the organic compound represented by General Formula (G4) are organic compounds represented by Structural Formulae (400) to (415) and Structural Formulae (430) to (440). However, the present invention is not limited thereto.

(400)

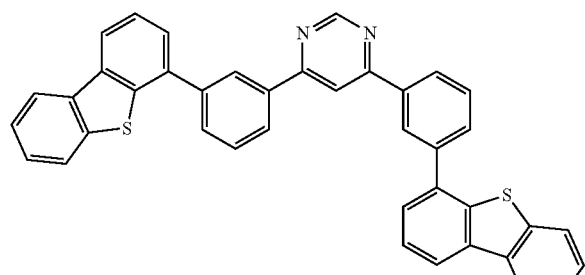

(401)

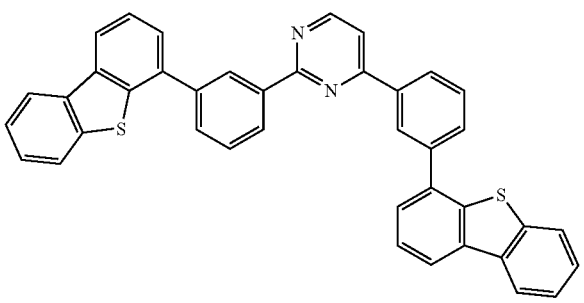

(402)

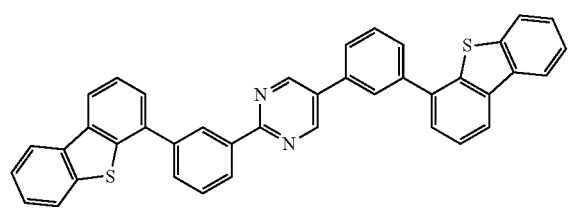

(403)

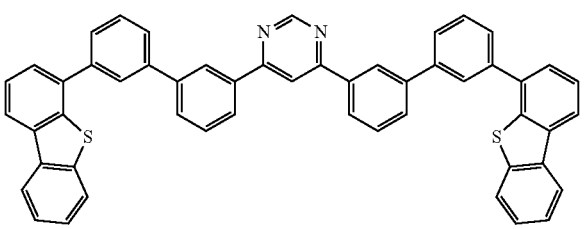

(404)

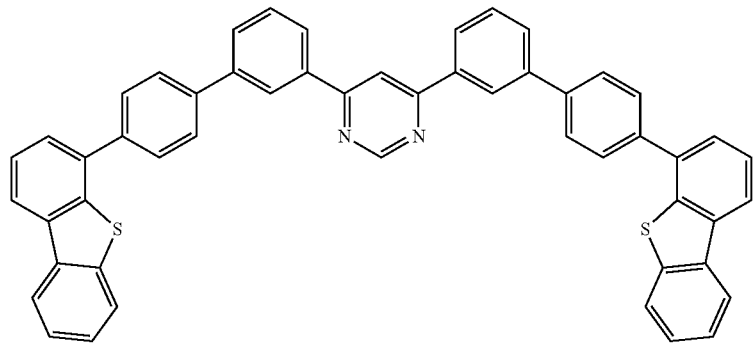

(405)

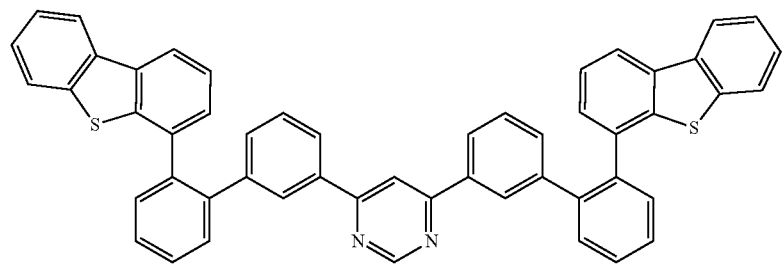

(406)
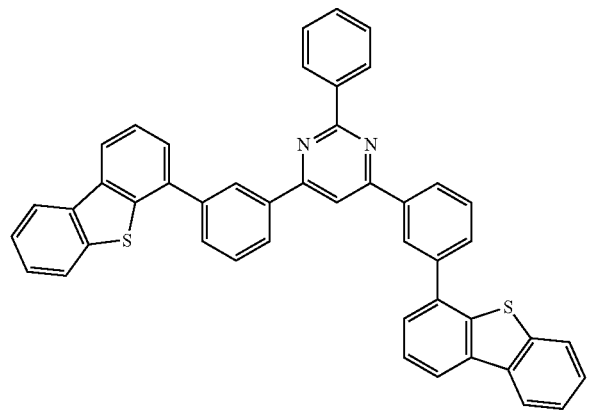
(407)
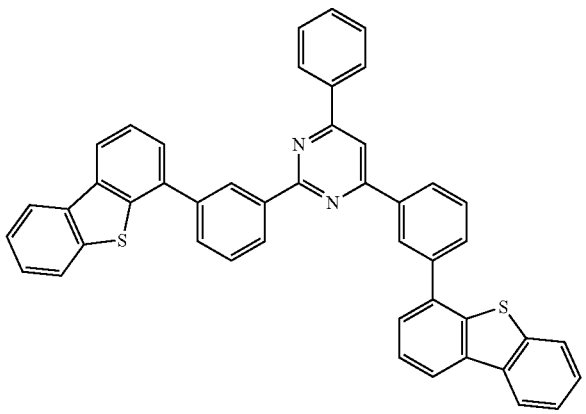
(408)
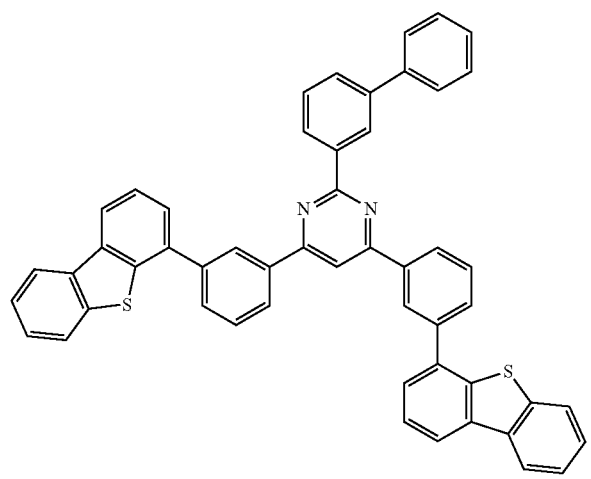
(409)
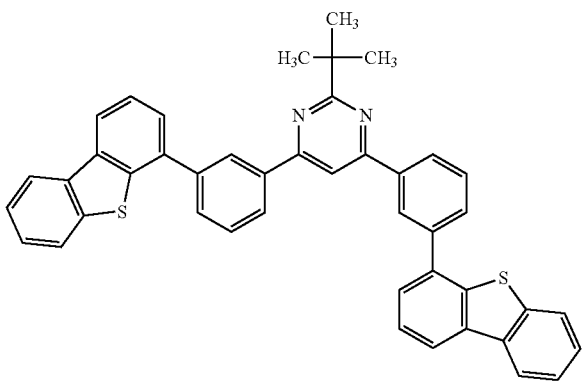
(410)
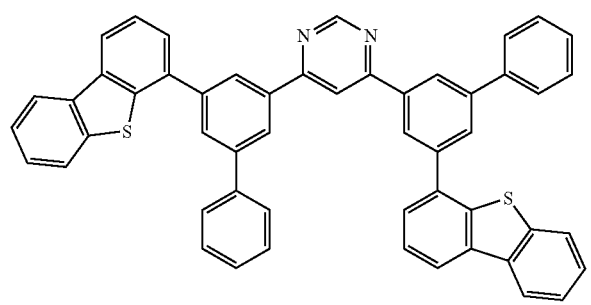
(411)
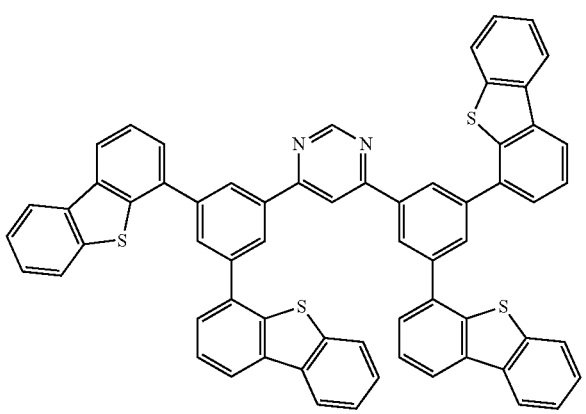

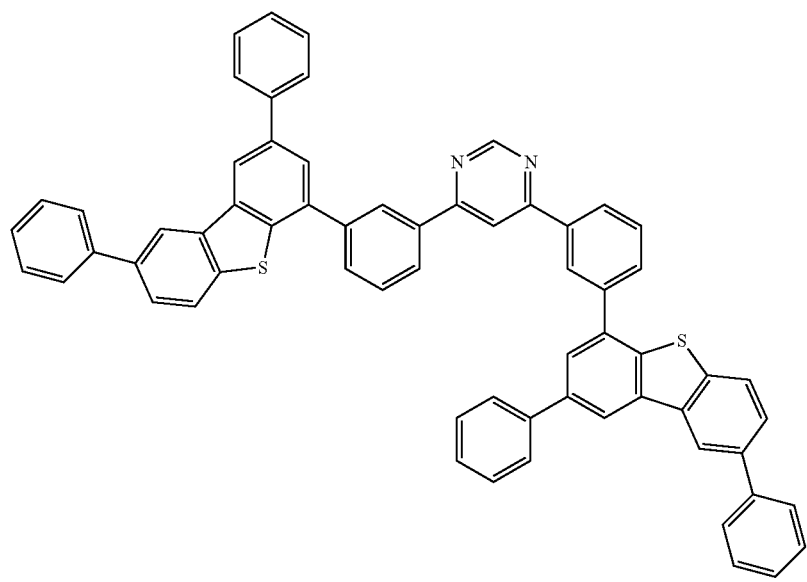
(412)
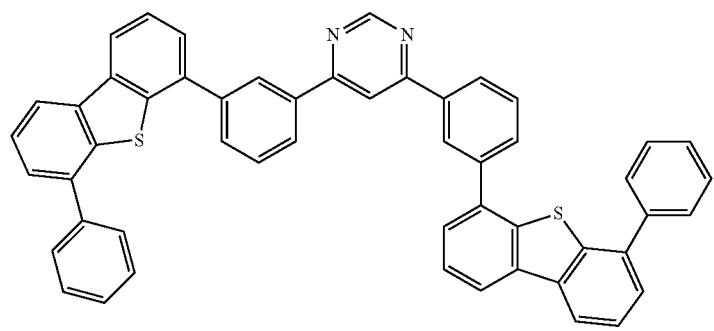
(413)
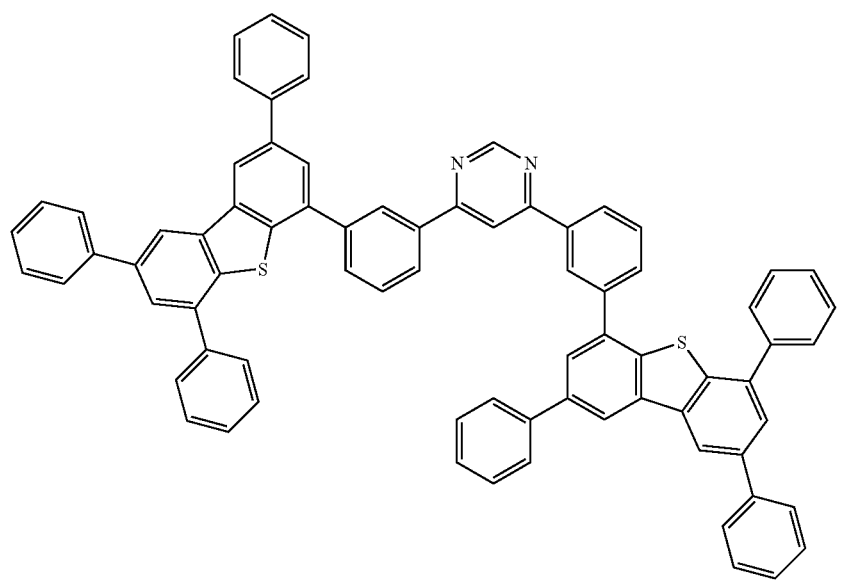
(414)

-continued
(415)
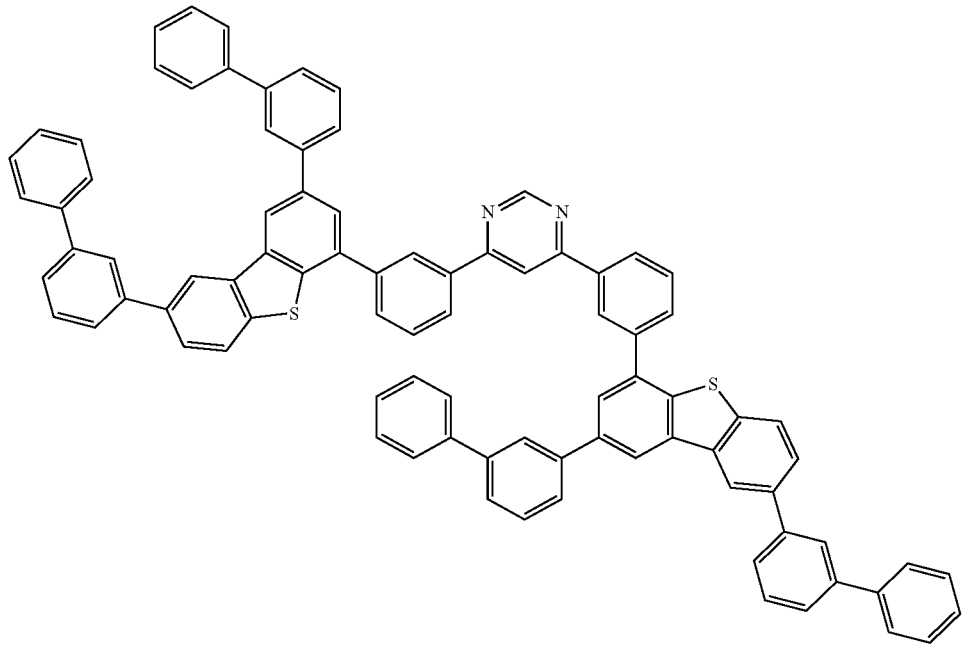
(430)
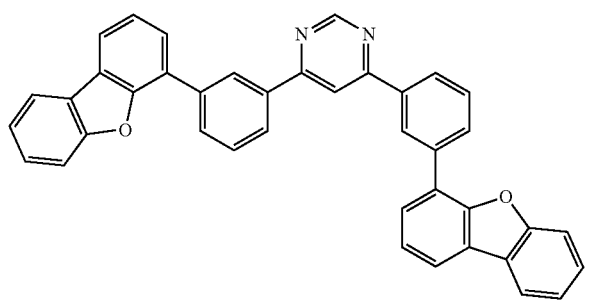
(431)
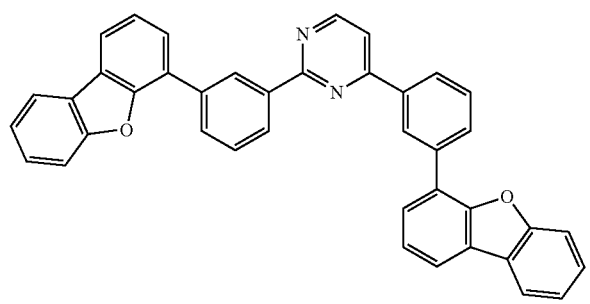
(432)
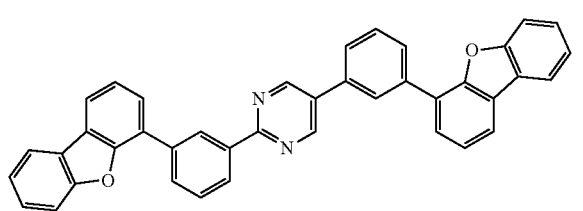
(433)
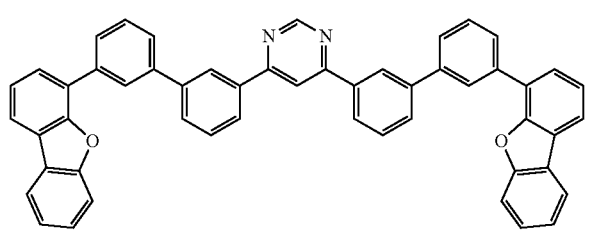
(434)
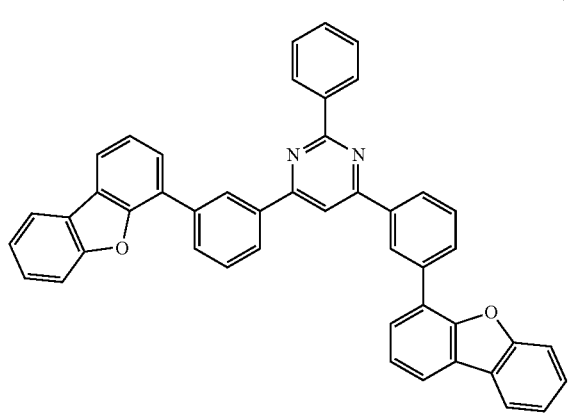
(435)
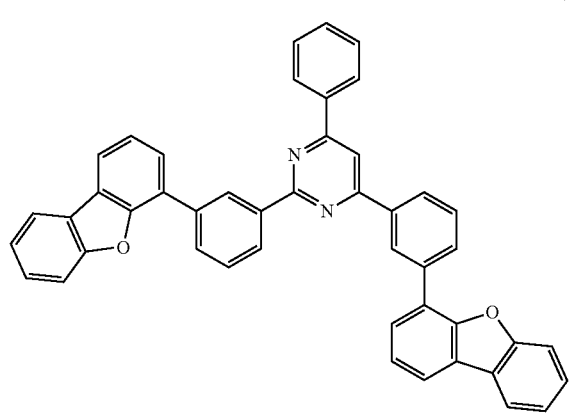

-continued
(436)
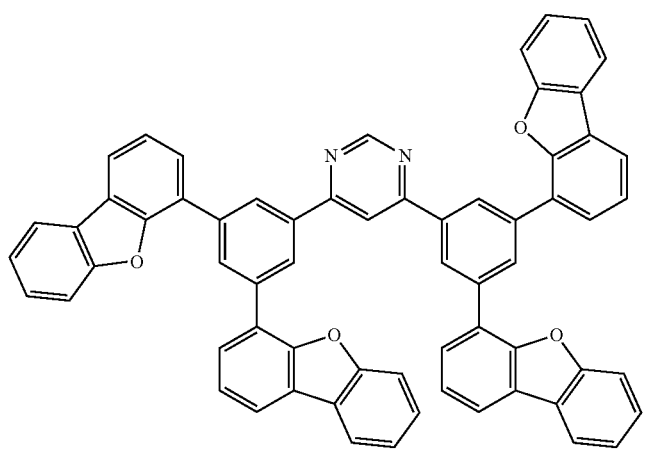
(437)
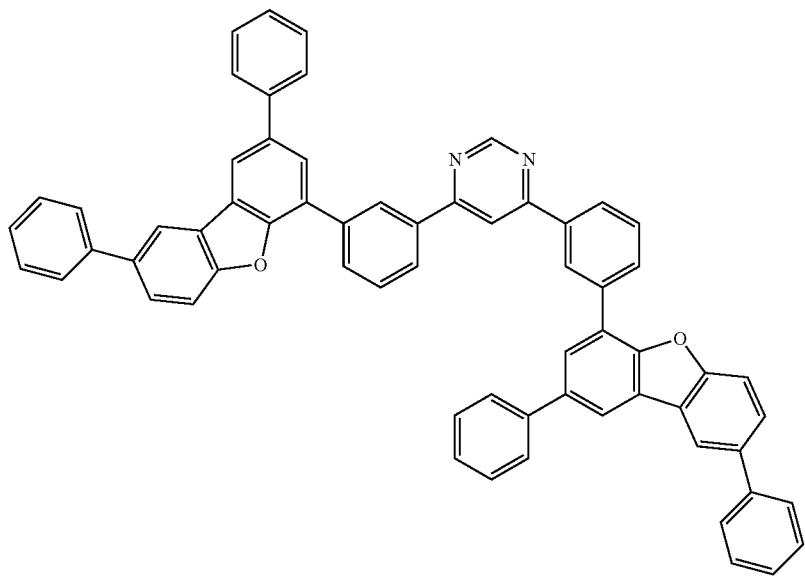
(438)
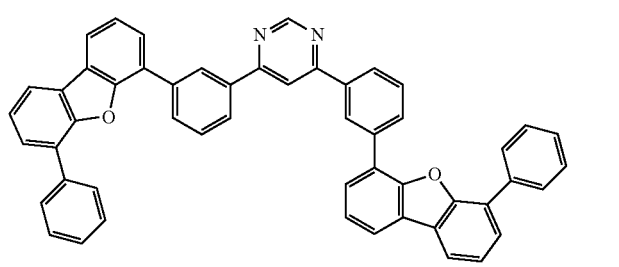
(439)
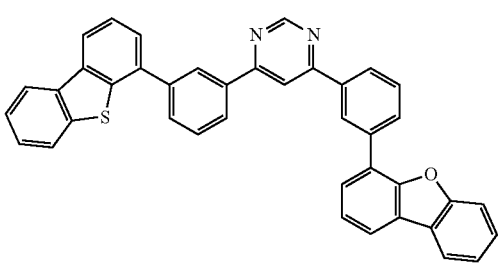
(440)
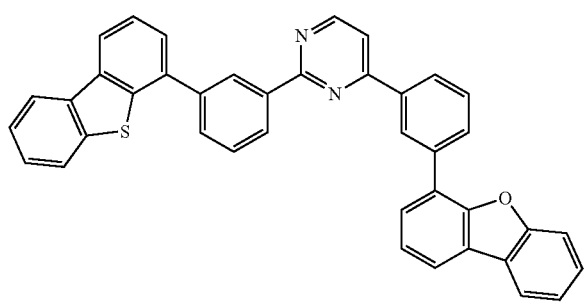

A variety of reactions can be applied to a synthesis method of any of the organic compounds of one embodiment of the present invention. For example, synthesis reactions described below enable the synthesis of the organic compound of one embodiment of the present invention represented by General Formula (G4). Note that the synthesis method of any of the organic compounds of one embodiment of the present invention is not limited to the synthesis methods below.

Synthesis Method of Organic Compound Represented by General Formula (G4)

First, Synthesis Scheme (B-1) is shown below.

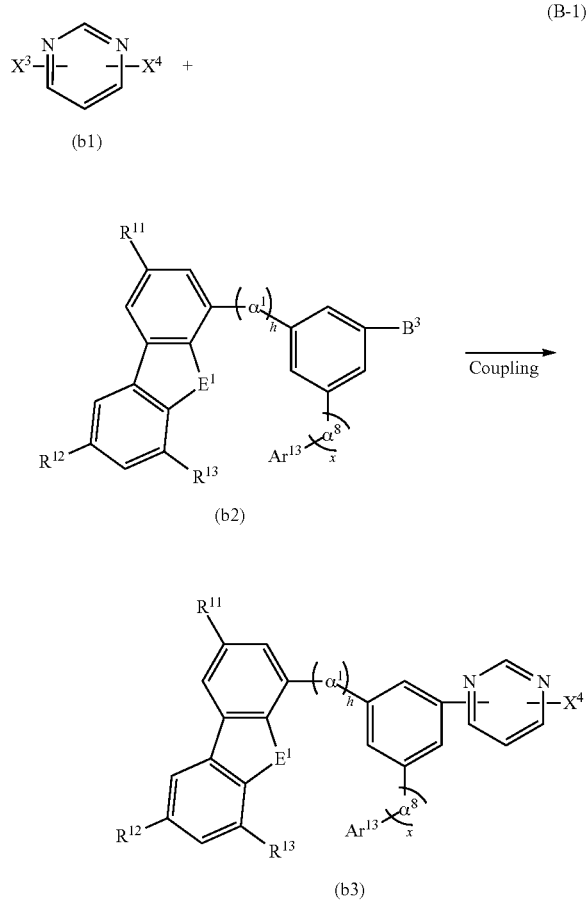

As shown in Synthesis Scheme (B-1), a dihalogenated pyrimidine compound (b1) and an arylboron compound (b2) are coupled, so that a halogenated pyrimidine organic compound (b3) can be synthesized.

In Synthesis Scheme (B-1), $R^{11}$ to $R^{13}$ separately represent any of hydrogen, an alkyl group having 1 to 4 carbon atoms, a substituted or unsubstituted phenyl group, and a substituted or unsubstituted biphenyl group. In addition, $Ar^{13}$ represents any of hydrogen, an alkyl group having 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group. In addition, $\alpha^1$ and $\alpha^8$ separately represent a substituted or unsubstituted phenylene group. In addition, h and x separately represent 0 or 1. In addition, $E^1$ represents sulfur or oxygen. In addition, $X^3$ and $X^4$ separately represent hydrogen, chlorine, bromine, or iodine. Note that $X^4$ represents hydrogen in the case where $Ar^{13}$ represents hydrogen. In addition, $X^3$ and $X^4$ preferably represent bromine, more preferably iodine, which have high reactivity. In addition, $B^3$ represents boronic acid or dialkoxyboron.

A variety of reaction conditions can be employed for the coupling reaction in Synthesis Scheme (B-1). As an example thereof, a synthesis method using a metal catalyst in the presence of a base can be employed.

The case where the Suzuki-Miyaura Reaction is used in Synthesis Scheme (B-1) will be described. A palladium catalyst can be used as the metal catalyst, and a mixture of a palladium complex and a ligand thereof can be used as the palladium catalyst. As examples of the palladium complex, palladium(II) acetate, tetrakis(triphenylphosphine)palladium(0), bis(triphenylphosphine)palladium(II)dichloride, and the like are given. As examples of the ligand, tri(ortho-tolyl)phosphine, triphenylphosphine, tricyclohexylphosphine, and the like are given. In addition, as examples of the substance that can be used as the base, an organic base such as sodium tert-butoxide, an inorganic base such as sodium carbonate or potassium carbonate, and the like are given. The reaction is preferably caused in a solution. As examples of the solvent that can be used in the reaction, the following are given: a mixed solvent of acetonitrile and water; a mixed solvent of thinner such as toluene or xylene and water; a mixed solvent of toluene or xylene, alcohol such as ethanol, and water; a mixed solvent of 1,3-dimethyl-3,4,5,6-tetrahydro-2(1H)-pyrimidinone (abbreviation: DMPU) and water; a mixed solvent of water and ether such as ethylene glycol dimethyl ether; and the like. However, the catalyst, ligand, base, and solvent that can be used are not limited thereto.

Further, in Synthesis Scheme (B-1), an aryl aluminum compound, an aryl zirconium compound, an aryl zinc compound, an aryl tin compound, or the like may be used instead of the arylboronic compound (b2). The reaction is preferably caused under an inert atmosphere of nitrogen, argon, or the like. Heating may be performed using electromagnetic waves.

Then, as shown in Synthesis Scheme (B-2), the halogenated pyrimidine compound (b3) and an arylboron compound (b4) are coupled, so that the organic compound represented by General Formula (G4) described in this embodiment can be synthesized.

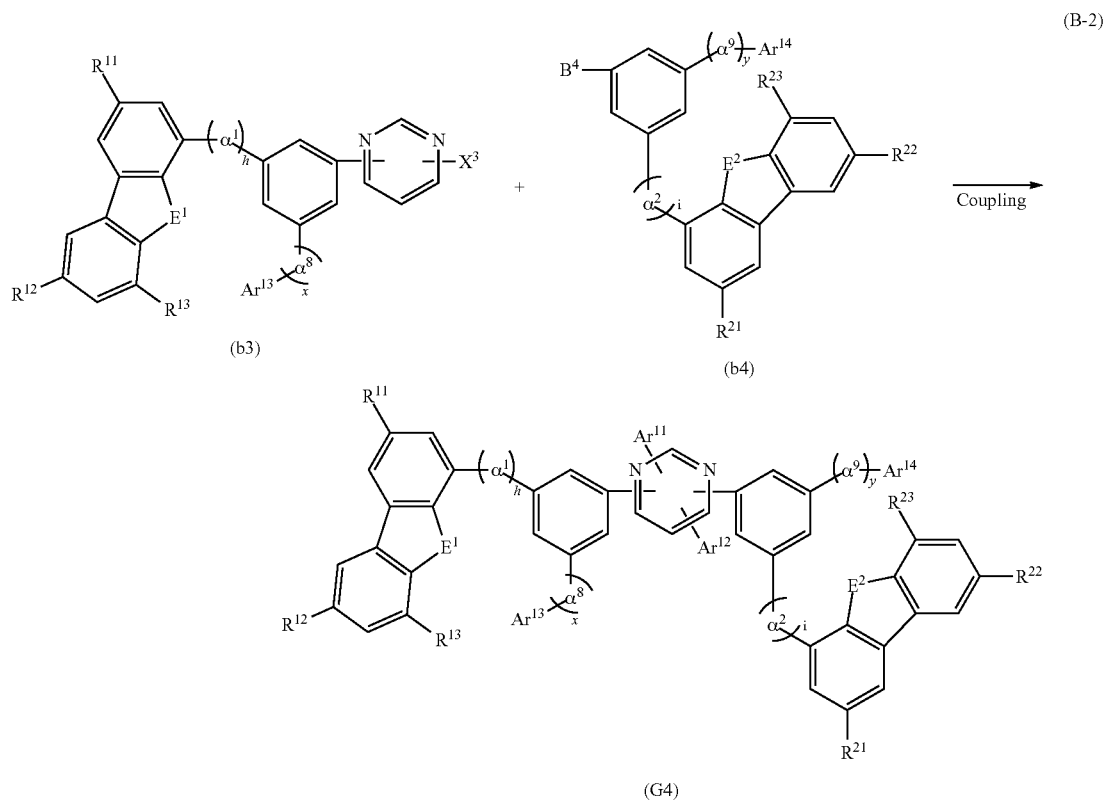

(B-2)

(b3)

(b4)

(G4)

In Synthesis Scheme (B-2), $Ar^{11}$, $Ar^{12}$, $R^{11}$ to $R^{13}$, and $R^{21}$ to $R^{23}$ separately represent any of hydrogen, an alkyl group having 1 to 4 carbon atoms, a substituted or unsubstituted phenyl group, and a substituted or unsubstituted biphenyl group. In addition, $Ar^{13}$ and $Ar^{14}$ separately represent any of hydrogen, an alkyl group having 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group. In addition, $\alpha^1$, $\alpha^2$, $\alpha^8$, $\alpha^9$ separately represent a substituted or unsubstituted phenylene group. In addition, h, i, x, and y separately represent 0 or 1. In addition, $E^1$ and $E^2$ separately represent sulfur or oxygen. In addition, $X^3$ represents hydrogen, chlorine, bromine, or iodine. Note that $X^3$ represents hydrogen in the case where $Ar^{13}$ represents hydrogen. In addition, $X^3$ and $X^4$ preferably represent bromine, more preferably iodine, which have high reactivity. In addition, $B^4$ represents boronic acid or dialkoxyboron.

A variety of reaction conditions can be employed for the coupling reaction in Synthesis Scheme (B-2). As an example thereof, a synthesis method using a metal catalyst in the presence of a base can be employed.

The Suzuki-Miyaura Reaction can be used in Synthesis Scheme (B-2). Synthesis Scheme (B-1) can be referred to for the detail; therefore, a description thereof is omitted.

Note that the compound (b2) and the compound (b4) preferably have the same aryl group, in which case reactions in Synthesis Scheme (B-1) and Synthesis Scheme (B-2) can be performed at the same time (i.e., the compound (b2) and the compound (b4) are added to the compound (b1) at the same time to cause a reaction), thereby making the synthesis easy.

Through the above-described steps, the organic compound of this embodiment can be synthesized.

Since the organic compound of this embodiment has a high S1 level, a high T1 level, and a wide energy gap (Eg) between the HOMO level and the LUMO level, high current efficiency can be obtained by using the organic compound as a host material in which a light-emitting substance is dispersed in a light-emitting layer of a light-emitting element. In particular, the organic compound of one embodiment of the present invention is suitably used as a host material in which a phosphorescent compound is dispersed. Further, since the organic compound of this embodiment is a substance having a high electron-transport property, it can be suitably used as a material for an electron-transport layer in a light-emitting element. By using the organic compound of this embodiment, a light-emitting element with low driving voltage and high current efficiency can be obtained. Furthermore, by using this light-emitting element, a light-emitting device, an electronic device, and a lighting device each having reduced power consumption can be obtained.

(Embodiment 3)

In this embodiment, a light-emitting element which includes a light-emitting layer formed using the organic compound described in Embodiment 2 will be described with reference to FIGS. 2A and 2B.

In this embodiment, a light-emitting element including 4,6-bis[3-(dibenzothiophen-4-yl)phenyl]pyrimidine (abbreviation: 4,6mDBTP2Pm-II), which is an example of the organic compound described in Embodiment 2 and is represented by Structural Formula (400), will be described with reference to FIGS. 2A and 2B.

In the light-emitting element of this embodiment, the EL layer including at least a light-emitting layer is interposed between a pair of electrodes. The EL layer may also include a plurality of layers in addition to the light-emitting layer. The plurality of layers has a structure in which a layer containing a substance having a high carrier-injection property and a layer containing a substance having a high carrier-transport property are combined and stacked so that a light-emitting region is formed in a region away from the electrodes, that is, so that carriers recombine in a region away from the electrodes. In this specification, the layer containing a substance having a high carrier-injection property or a high carrier-transport property is also called a functional layer which has a function of, for example, injecting or transporting carriers. As the functional layer, a hole-injection layer, a hole-transport layer, an electron-injection layer, an electron-transport layer, or the like can be used.

Figure 2A:
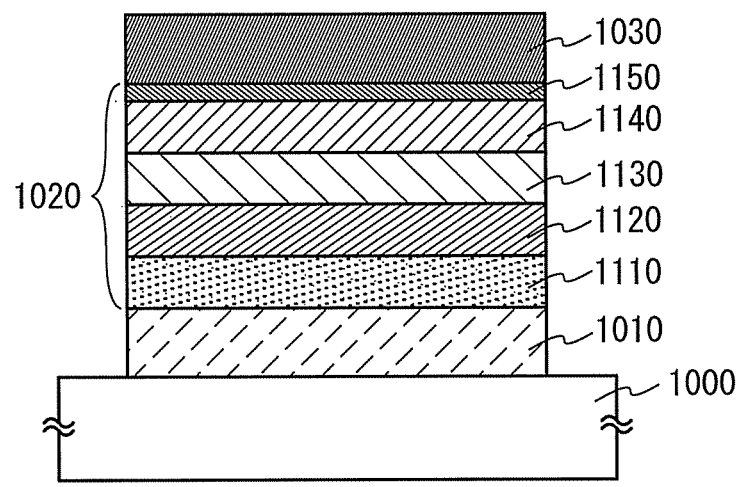
FIGS. 2A and 2B each illustrate a light-emitting element of one embodiment of the present invention.

In the light-emitting element of this embodiment illustrated in FIG. 2A, an EL layer 1020 including a light-emitting layer 1130 is provided between a pair of electrodes, a first electrode 1010 and a second electrode 1030. The EL layer 1020 includes a hole-injection layer 1110, a hole-transport layer 1120, a light-emitting layer 1130, an electron-transport layer 1140, and an electron-injection layer 1150 as functional layers. The light-emitting element illustrated in FIG. 2A includes the first electrode 1010, over a substrate 1000, the hole-injection layer 1110, the hole-transport layer 1120, the light-emitting layer 1130, the electron-transport layer 1140, and the electron-injection layer 1150 which are stacked over the first electrode 1010 in this order, and the second electrode 1030 provided over the electron-injection layer 1150. Note that in the light-emitting element described in this embodiment, the first electrode 1010 and the second electrode 1030 function as an anode and a cathode, respectively.

The substrate 1000 is used as a support of the light-emitting element. For example, glass, quartz, plastic, or the like can be used for the substrate 1000. A flexible substrate may be used. The flexible substrate is a substrate that can be bent, such as a plastic substrate made of, for example, polycarbonate, polyarylate, or polyether sulfone. Alternatively, a film (made of polypropylene, polyester, polyvinyl fluoride, polyvinyl chloride, or the like), a film on which an inorganic substance is deposited, or the like can be used. Note that another substrate can be used as long as it can function as a support in a process of manufacturing the light-emitting element.

For the first electrode 1010, a metal, an alloy, an electrically conductive compound, a mixture thereof, or the like which has a high work function (specifically, a work function of 4.0 eV or more) is preferably used. Specific examples include indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), and the like. Films of these conductive metal oxides are usually formed by sputtering, but may be formed by a sol-gel method or the like. For example, a film of indium oxide-zinc oxide can be formed by a sputtering method using a target obtained by adding 1 wt % to 20 wt % of zinc oxide to indium oxide. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Other examples are gold, platinum, nickel, tungsten, chromium, molybdenum, iron, cobalt, copper, palladium, nitrides of metal materials (e.g., titanium nitride), and the like.

Note that, in the case where in the EL layer 1020, a layer formed in contact with the first electrode 1010 is formed using a composite material described later in which an organic compound and an electron acceptor (acceptor) are mixed, the first electrode 1010 can be formed using any of a variety of metals, alloys, electrically-conductive compounds, mixtures of these materials, and the like regardless of the work function. For example, aluminum, silver, an alloy containing aluminum (e.g., Al—Si), or the like can be used.

The EL layer 1020 formed over the first electrode 1010 includes at least the light-emitting layer 1130, and part of the EL layer 1020 is formed using the organic compound of one embodiment of the present invention. For the part of the EL layer 1020, a known substance can be used, and either a low molecular compound or a high molecular compound can be used. Note that the substance used for forming the EL layer 1020 may have not only a structure formed of only an organic compound but also a structure in which an inorganic compound is partially contained.

As illustrated in FIG. 2A, the EL layer 1020 is formed by stacking the hole-injection layer 1110, the hole-transport layer 1120, the electron-transport layer 1140, the electron-injection layer 1150, and the like in appropriate combination as well as the light-emitting layer 1130.

The hole-injection layer 1110 is a layer containing a substance having a high hole-injection property. As the substance having a high hole-injection property, for example, metal oxides such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide can be used. A phthalocyanine-based compound such as phthalocyanine (abbreviation: $H_2Pc$), or copper(II) phthalocyanine (abbreviation: CuPc) can also be used.

Alternatively, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-yl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Further alternatively, any of high molecular compounds (e.g., oligomers, dendrimers, or polymers) can be used. For example, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacryla mide](abbreviation: PTPDMA), or poly[N,N'-bis(4-butylphenyl)-N,N'-bis(phenyl)benzidine (abbreviation: poly-TPD) can be given. A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can be used.

A composite material in which an organic compound and an electron acceptor (acceptor) are mixed may be used for the hole-injection layer 1110. Such a composite material, in which holes are generated in the organic compound by the electron acceptor, has excellent hole-injection and hole-transport properties. The organic compound here is preferably a material excellent in transporting the generated holes (a substance having a high hole-transport property).

As the organic compound for the composite material, various compounds such as an aromatic amine compound, a carbazole compound, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ cm$^2$/V·s or higher is preferably used. Note that any other substance may be used as long as the substance has a hole-transport property higher than an electron-transport property. Specific examples of the organic compound that can be used for the composite material are given below.

Examples of the organic compound that can be used for the composite material are aromatic amine compounds, such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole compounds such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic compound that can be used are aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Examples of an electron acceptor include organic compounds such as 7,7,8,8-tetracyano-2,3,5,6-tetrafluoroquinodimethane (abbreviation: F$_4$-TCNQ) and chloranil; and transition metal oxides. Other examples are oxides of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable because it is stable in the air, has a low hygroscopic property, and is easily handled.

The composite material may be formed using the above-described electron acceptor and the above-described high molecular compound such as PVK, PVTPA, PTPDMA, or Poly-TPD, and may be used for the hole-injection layer 1110.

The hole-transport layer 1120 is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substance may be used as long as the substance has a hole-transport property higher than an electron-transport property. Note that the layer containing a substance having a high hole-transport property is not limited to a single layer, and may be a stack of two or more layers containing any of the above substances.

For the hole-transport layer 1120, a carbazole derivative such as CBP, CzPA, or PCzPA, or an anthracene derivative such as t-BuDNA, DNA, or DPAnth may be used.

For the hole-transport layer 1120, a high molecular compound such as PVK, PVTPA, PTPDMA, or Poly-TPD can also be used.

The light-emitting layer 1130 is a layer containing a light-emitting substance. In this embodiment, the case where the light-emitting layer is formed using 4,6-bis[3-(dibenzothiophen-4-yl)phenyl]pyrimidine (abbreviation: 4,6mDBTP2Pm-II) shown in Embodiment 2 is described. In a light-emitting layer in which a light-emitting substance (guest material) is dispersed in another substance (host material), 4,6mDBTP2Pm-II can be used as the host material. The guest material which is a light-emitting material is dispersed in 4,6mDBTP2Pm-II, whereby light emission from the guest material can be obtained. As described above, it is effective to use the organic compound of one embodiment of the present invention as the host material in the light-emitting layer.

In addition, as a substance (host material) for dispersing a light-emitting substance (guest material), plural kinds of substances can be used. Thus, the light-emitting layer may contain a second host material in addition to 4,6mDBTP2Pm-II.

Examples of the second host material are the materials used for the hole-transport layer 1120.

As a light-emitting substance, for example, a fluorescent compound which emits fluorescence or a phosphorescent compound which emits phosphorescence can be used. As examples of the fluorescent compound that can be used for the light-emitting layer 1130, a material for blue light emission, a material for green light emission, a material for yellow light emission, and a material for red light emission are given. Examples of the material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Examples of the material for green light emission include N-(9,10-diphenyl-2-anthryl)-N,9-diphenyl-9H-carbazol-3-amine (abbreviation: 2PCAPA), N-[9,10-bis(1, 1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of the material for yellow light emission include rubene and 5,12-bis (1,1'-biphenyl-4-yl)-6,11-diphenyltetracene (abbreviation: BPT). Examples of the material for red light emission include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound that can be used for the light-emitting layer 1130 includes a material for blue light emission, a material for green light emission, a material for yellow light emission, a material for orange light emission, and a material for red light emission. Examples of the material for blue light emission include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3',5'-bis(trifluoromethyl)phenyl]pyridinato-N,$C^{2'}$}iridium(II) picolinate (abbreviation: Ir(CF$_3$ppy)$_2$(pic)), and bis[2-(4',6'-difluorophenyl)pyridinato-N,$C^{2'}$]iridium(III)acetylacetonate (abbreviation: FIr(acac)). Examples of the material for green light emission include tris(2-phenylpyridinato-N,$C^{2'}$)iridium(III) (abbreviation: Ir(ppy)$_3$), bis[2-phenylpyridinato-N,$C^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of the material for yellow light emission include bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)) (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)). Examples of the material for orange light emission include ris(2-phenylquinolinato-N,$C^{2'}$) iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: [Ir(mppr-Me)$_2$(acac)]), and (acetylacetonato)bis(5-isopropyl-3-methyl-2-phenylpyrazinato)iridium(III) (abbreviation: Ir(mppr-iPr)$_2$(acac)). Examples of the material for red light emission include bis[2-(2'-benzo[4,5-a]thienyl)pyridinato-N,$C^{3'}$) iridium(III)acetylacetonate (abbreviation: [Ir(btp)$_2$(acac)]), bis(1-phenylisoquinolinato-N,$C^{2'}$)iridium(III)acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), (dipivaloylmethanato)bis(2,3,5-triphenylpyrazinato)iridium(III) (abbreviation: [Ir(tppr)$_2$(dpm)]), and (2,3,7,8,12,13,17,18-octaethyl-21H,23H-porphyrin)platinum(II) (abbreviation: PtOEP). In addition, rare-earth metal complexes, such as tris(acetylacetonato)(monophenanthroline)terbium(III) (abbreviation: Tb(acac)$_3$(Phen)), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

As the light-emitting substance, a high molecular compound can be used. Specifically, a material for blue light emission, a material for green light emission, and a material for orange to red light emission are given. Examples of the material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)](abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of the material for green light emission include poly(p-phenylenevinylene) (abbreviation: PPV), poly[(9,9-dihexylfluorene-2,7-diyl)-alt-co-(benzo[2,1,3]thiadiazole-4,7-diyl)](abbreviation: PFBT), and poly[(9,9-dioctyl-2,7-divinylenfluorenylene)-alt-co-(2-methoxy-5-(2-ethylhexloxy)-1,4-phenylene)]. Examples of the material for orange to red light emission include poly[2-methoxy-5-(2'-ethylhexoxy)-1,4-phenylenevinylene](abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]}(abbreviation: CN-PPV-DPD).

The organic compound described in Embodiment 2 and the second compound described in Embodiment 1 each exhibit a fluorescent property, and thus can be used as the light-emitting material.

The electron-transport layer 1140 is a layer containing a substance having a high electron-transport property. Examples of the material having a high electron-transport property include metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), and bis(2-methyl-8-quinolinolato)(4-phenylphenolato)aluminum (abbreviation: BAlq). Other examples include metal complexes having an oxazole-based or thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$). Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances given here are mainly ones that have an electron mobility of $10^{-6}$ cm$^2$/Vs or higher. Note that the electron-transport layer is not limited to a single layer, and may be a stack of two or more layers containing any of the above substances.

The organic compound described in Embodiment 2 and the second compound described in Embodiment 1 each have a pyrimidine skeleton, and thus are suitable for the electron-transport layer 1140.

The electron-injection layer 1150 is a layer containing a substance having a high electron-injection property. For the electron-injection layer 1150, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 1140 can also be used.

Alternatively, a composite material in which an organic compound and an electron donor (donor) are mixed may be used for the electron-injection layer 1150. Such a composite material, in which the electron donor causes electron generation in the organic compound, has excellent electron-injection and electron-transport properties. The organic compound here is preferably a material excellent in transporting the generated electrons. Specifically, for example, the substances for forming the electron-transport layer 1140 (e.g., a metal complex and a heteroaromatic compound), which are described above, can be used. As the electron donor, a substance showing an electron-donating property with respect to the organic compound may be used. Specific examples of the electron donor include an alkali metal, an alkaline earth metal, and a rare earth metal are preferable, and lithium, cesium, magnesium, calcium, erbium, ytterbium, and the like can be given. Alkali metal oxides or alkaline earth metal oxides are also preferable, and examples thereof include lithium oxide, calcium oxide, and barium oxide. Alternatively, a Lewis base such as magnesium oxide can be used. Further alternatively, an organic compound such as tetrathiafulvalene (abbreviation: TTF) can be used.

Note that each of the above-described hole-injection layer 1110, hole-transport layer 1120, light-emitting layer 1130, electron-transport layer 1140, and electron-injection layer 1150 can be formed by a method such as an evaporation method (e.g., a vacuum evaporation method), an inkjet method, or a coating method.

When the second electrode 1030 functions as a cathode, the second electrode 1030 is preferably formed using a metal, an alloy, an electrically-conductive compound, a mixture thereof, or the like having a low work function (preferably, a work function of 3.8 eV or less). Specifically, any of the following can be used: aluminum or silver; an element belonging to Group 1 or Group 2 of the periodic table, that is, an alkali metal such as lithium or cesium or an alkaline earth metal such as calcium or strontium; magnesium; an alloy of the above metals (e.g., Mg—Ag or Al—Li); a rare earth metal such as europium or ytterbium; an alloy of the above metals; or the like.

When the composite material described above in which an organic compound and an electron donor (donor) are mixed is used for a layer included in the EL layer 1020, which is formed in contact with the second electrode 1030, a variety of conductive materials such as aluminum, silver, ITO, and indium oxide-tin oxide containing silicon or silicon oxide can be used regardless of the work function When the second electrode 1030 is formed, a vacuum evaporation method or a sputtering method can be used. Alternatively, in the case of using a silver paste or the like, a coating method, an inkjet method, or the like can be used.

In the above-described light-emitting element, current flows due to a potential difference generated between the first electrode 1010 and the second electrode 1030 and holes and electrons recombine in the EL layer 1020, whereby light is emitted. Then, this emitted light is extracted out through one or both of the first electrode 1010 and the second electrode 1030. Therefore, one of or both the first electrode 1010 and the second electrode 1030 are electrodes having a property of transmitting visible light.

Further, a structure of a layer provided between the first electrode 1010 and the second electrode 1030 is not limited to the above-described structure. A structure other than the above may alternatively be employed as long as a light-emitting region in which holes and electrons recombine is provided in a portion away from the first electrode 1010 and the second electrode 1030 in order to prevent quenching due to proximity of the light-emitting region to a metal.

In other words, there is no particular limitation on a stacked structure of the layers. A layer containing a substance having a high electron-transport property, a substance having a high hole-transport property, a substance having a high electron-injection property, a substance having a high hole-injection property, a bipolar substance (a substance having a high electron-transport property and a high hole-transport property), a hole-blocking material, or the like can be freely used in combination with a light-emitting layer containing 4,6mDBTP2Pm-II of one embodiment of the present invention as a host material.

Note that 4,6mDBTP2Pm-II has a high electron-transport property, and thus can be used for the electron-transport layer 1140. In other words, the organic compound of one embodiment of the present invention can be used for an electron-transport layer.

When the organic compound of one embodiment of the present invention is applied to both the light-emitting layer 1130 (particularly, as a host material for the light-emitting layer) and the electron-transport layer 1140, extremely low driving voltage can be achieved.

Figure 2B:
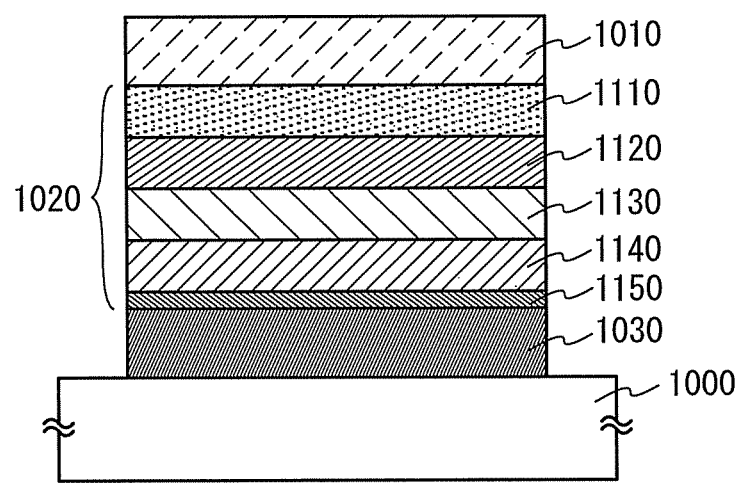

In a light-emitting element illustrated in FIG. 2B, over the substrate 1000, an EL layer 1020 is provided between a pair of electrodes, a first electrode 1010 and a second electrode 1030. The EL layer 1020 includes a hole-injection layer 1110, a hole-transport layer 1120, a light-emitting layer 1130, an electron-transport layer 1140, and an electron-injection layer 1150 as functional layers. The light-emitting element illustrated in FIG. 2B includes, over the substrate 1000, the second electrode 1030 serving as a cathode; the electron-injection layer 1150, the electron-transport layer 1140, the light-emitting layer 1130, the hole-transport layer 1120, and the hole-injection layer 1110 which are stacked in this order over the second electrode 1030; and the first electrode 1010 serving as an anode which is provided over the hole-injection layer 1110.

A specific method of forming a light emitting element is described below.

The light-emitting element of this embodiment has a structure in which the EL layer 1020 is interposed between the pair of electrodes. The EL layer 1020 includes at least the light-emitting layer 1130. The light-emitting layer 1130 is formed using 4,6mDBTP2Pm-II as a host material. Further, the EL layer 1020 may include a functional layer (e.g., the hole-injection layer 1110, the hole-transport layer 1120, the electron-transport layer 1140, or the electron-injection layer 1150) in addition to the light-emitting layer 1130. The electrodes (the first electrode 1010 and the second electrode 1030), the light-emitting layer 1130, and each functional layer may be formed by any of the wet processes such as a droplet discharging method (inkjet method), a spin coating method, and a printing method, or by a dry process such as a vacuum evaporation method, a CVD method, or a sputtering method. The use of a wet process enables the formation at atmospheric pressure using a simple device and process, thereby having the effects of simplifying the process and improving the productivity. In contrast, a dry process does not need dissolution of a material and enables use of a material that has low solubility in a solution, which expands the range of material choices.

All the thin films included in the light-emitting element may be formed by a wet method. In this case, the light-emitting element can be manufactured with only facilities needed for a wet process. Alternatively, formation of the stacked layers up to formation of the light-emitting layer 1130 may be performed by a wet process whereas the functional layer, the first electrode 1010, and the like which are stacked over the light-emitting layer 1130 may be formed by a dry process. Further alternatively, the second electrode 1030 and the functional layer may be formed by a dry process before the formation of the light-emitting layer 1130 whereas the light-emitting layer 1130, the functional layer stacked over the light-emitting layer 1130, and the first electrode 1010 may be formed by a wet process. Needless to say, this embodiment is not limited to this, and the light-emitting element can be formed by appropriate selection from a wet method and a dry method depending on a material to be used, film thickness that is necessary, and the interface state.

In this embodiment, the light-emitting element is formed over a substrate made of glass, plastic or the like. A plurality of such light emitting elements is formed over one substrate, thereby forming a passive matrix light emitting device. In addition, for example, a thin film transistor (TFT) may be formed over a substrate made of glass, plastic, or the like, and a light-emitting element may be manufactured over an electrode electrically connected to the TFT. In this manner, an active matrix light-emitting device in which the TFT controls the drive of the light-emitting element can be manufactured. Note that there is no particular limitation on the structure of the TFT. Either a staggered TFT or an inverted staggered TFT may be employed. In addition, the crystallinity of a semiconductor used for the TFT is not particularly limited either; an amorphous semiconductor or a crystalline semiconductor may be used. Furthermore, a driver circuit formed over a TFT substrate may be formed with both n-channel TFTs and p-channel TFTs or may be formed with either n-channel TFTs or p-channel TFTs.

Thus, the light-emitting element can be formed using 4,6mDBTP2Pm-II described in Embodiment 2. When a light-emitting element is formed using the organic compound of one embodiment of the present invention, the light-emitting element can have low driving voltage and high current efficiency.

Furthermore, a light-emitting device (such as an image display device) using this light-emitting element of one embodiment of the present invention which is obtained as described above can have low power consumption.

Note that with the use of the light-emitting element described in this embodiment, a passive matrix light-emitting device or an active matrix light-emitting device in which driving of the light-emitting element is controlled by a thin film transistor (TFT) can be manufactured.

This embodiment can be combined with any of the other embodiments as appropriate.

(Embodiment 4)

In this embodiment, as one embodiment of the present invention, a light-emitting element including a light-emitting layer formed using the phosphorescent iridium metal complex, which is the first compound, the organic compound having a pyrimidine skeleton, which is the second compound, and two or more other organic compounds will be described with reference to FIG. 3.

Figure 3:
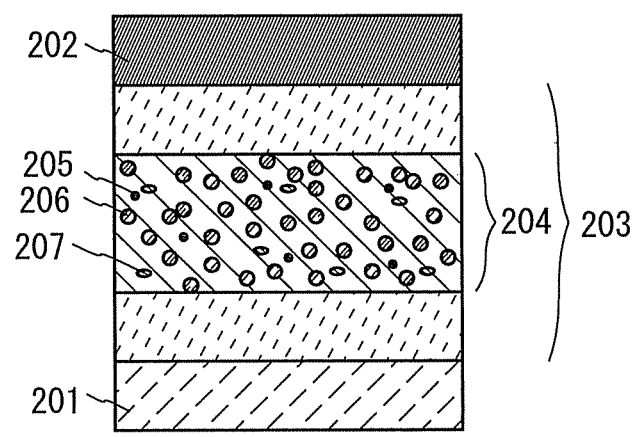
FIG. 3 illustrates a light-emitting element of one embodiment of the present invention.

The light-emitting element described in this embodiment includes an EL layer 203 between a pair of electrodes (a first electrode 201 and a second electrode 202) as illustrated in FIG. 3. Note that the EL layer 203 includes at least a light-emitting layer 204 and may include a hole-injection layer, a hole-transport layer, an electron-transport layer, an electron-injection layer, a charge-generation layer, and the like. Note that the substances given in Embodiment 1 can be used for the hole-injection layer, the hole-transport layer, the electron-transport layer, the electron-injection layer, and the charge-generation layer. Note that the first electrode 201 is used as an anode and the second electrode 202 is used as a cathode in this embodiment.

The light-emitting layer 204 described in this embodiment contains a phosphorescent compound 205 using the phosphorescent iridium metal complex described in Embodiment 1, which is the first compound, a first organic compound 206, and a second organic compound 207. Note that the phosphorescent compound 205 is a guest material in the light-emitting layer 204. Moreover, at least one of the first organic compound 206 and the second organic compound 207 includes the organic compound having a pyrimidine skeleton, which is the second compound, and the one with a higher content than the other in the light-emitting layer 204 is a host material in the light-emitting layer 204.

When the light-emitting layer 204 has the structure in which the guest material is dispersed in the host material, crystallization of the light-emitting layer can be suppressed. Further, it is possible to suppress concentration quenching due to high concentration of the guest material, and thus the light-emitting element can have higher emission efficiency.

Note that it is preferable that a triplet excitation energy level (T1 level) of each of the first organic compound 206 and the second organic compound 207 be higher than that of the phosphorescent compound 205. This is because, when the T1 level of the first organic compound 206 (or the second organic compound 207) is lower than that of the phosphorescent compound 205, the triplet excitation energy of the phosphorescent compound 205, which is to contribute to light emission, is quenched by the first organic compound 206 (or the second organic compound 207) and accordingly the emission efficiency is decreased.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side). However, in the case of a general phosphorescent guest material, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the T1 level of the host material becomes lower than the T1 level of the phosphorescent compound and the above-described problem of quenching occurs; yet, when the host material is designed in such a manner that the T1 level of the host material is higher than the T1 level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and the longest wavelength (lowest energy) absorption band of a guest material so as to maximize energy transfer from a singlet excited state of the host material.

Thus, in this embodiment, a combination of the first organic compound 206 and the second organic compound 207 preferably forms an exciplex (also referred to as excited complex). In that case, the first organic compound 206 and the second organic compound 207 form an exciplex at the time of recombination of carriers (electrons and holes) in the light-emitting layer 204. Thus, in the light-emitting layer 204, a fluorescence spectrum of the first organic compound 206 and that of the second organic compound 207 are converted into an emission spectrum of the exciplex which is located on the longer wavelength side. Moreover, when the first organic compound and the second organic compound are selected in such a manner that the emission spectrum of the exciplex largely overlaps with the absorption spectrum of the guest material, energy transfer from a singlet excited state can be maximized. Note that also in the case of a triplet excited state, energy transfer from the exciplex, not the host material, is assumed to occur.

The phosphorescent iridium metal complex, which is the first compound, is used as the phosphorescent compound 205. For the first organic compound 206 and the second organic compound 207, a combination of a compound which is likely to accept electrons (a compound having an electron-trapping property) and a compound which is likely to accept holes (a compound having a hole-trapping property) is preferably employed. Note that the organic compound having a pyrimidine skeleton, which is the second compound, can be used as the compound which is likely to accept electrons.

Examples of the compound which is likely to accept electrons include 4-phenyl-4'-(9-phenyl-9H-carbazol-3-yl)triphenylamine (abbreviation: PCBA1BP), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenyl-carbazol-3-yl)-N,N'-diphenylbenzene-1,3-diamine (abbreviation: PCA2B), N-(9,9-dimethyl-2-N',N'-diphenylamino-9H-fluoren-7-yl)-N,N-diphenylamine (abbreviation: DPNF), N-phenyl-N-(4-phenylphenyl)-N-(9-phenyl-9H-carbazol-3-yl)amine (abbreviation: PCA1BP), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino]spiro-9,9'-bifluorene (abbreviation: DPASF), N,N-di(biphenyl-4-yl)-N-(9-phenyl-9H-carbazol-3-yl)amine (abbreviation: PCzBBA1), N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-[9,9-dimethyl-2-{N'-phenyl-N'-(9,9-dimethyl-9H-fluoren-2-yl)}amino-9H-fluoren-7-yl]phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

The above-described combination of the first organic compound 206 and the second organic compound 207 is an example of the combination which enables an exciplex to be formed. The combination is determined so that the emission spectrum of the exciplex overlaps with the absorption spectrum of the phosphorescent compound 205 and that the peak of the emission spectrum of the exciplex has a longer wavelength than the peak of the absorption spectrum of the phosphorescent compound 205.

Note that in the case where a compound which is likely to accept electrons and a compound which is likely to accept holes are used for the first organic compound 206 and the second organic compound 207, carrier balance can be controlled by the mixture ratio of the compounds. Specifically, the ratio of the first organic compound to the second organic compound is preferably 1:9 to 9:1.

In the light-emitting element described in this embodiment, energy transfer efficiency can be improved owing to energy transfer utilizing an overlap between an emission spectrum of an exciplex and an absorption spectrum of a phosphorescent compound; accordingly, it is possible to achieve high external quantum efficiency of a light-emitting element.

Note that in another structure of the present invention, the light-emitting layer 204 can be formed using a host molecule having a hole-trapping property and a host molecule having an electron-trapping property as the two kinds of organic compounds other than the phosphorescent compound 205 (guest material) so that a phenomenon (guest coupled with complementary hosts: GCCH) occurs in which holes and electrons are introduced to guest molecules existing in the two kinds of host molecules and the guest molecules are brought into an excited state.

At this time, the host molecule having a hole-trapping property and the host molecule having an electron-trapping property can be respectively selected from the above-described compounds which are likely to accept holes and the above-described compounds which are likely to accept electrons.

Note that although the light-emitting element described in this embodiment is one structural example of a light-emitting element, a light-emitting element having another structure which is described in another embodiment can also be applied to a light-emitting device of one embodiment of the present invention. Further, as a light-emitting device including the above light-emitting element, a passive matrix type light-emitting device and an active matrix type light-emitting device can be manufactured. It is also possible to manufacture a light-emitting device with a microcavity structure including a light-emitting element which is a different light-emitting element from the above light-emitting elements as described in another embodiment. Each of the above light-emitting devices is included in the present invention.

Note that there is no particular limitation on the structure of the TFT in the case of manufacturing the active matrix light-emitting device. For example, a staggered TFT or an inverted staggered TFT can be used as appropriate. Further, a driver circuit formed over a TFT substrate may be formed using both an n-channel TFT and a p-channel TFT or only either an n-channel TFT or a p-channel TFT. Furthermore, there is no particular limitation on the crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

(Embodiment 5)

In this embodiment, as one embodiment of the present invention, a light-emitting element (hereinafter referred to as tandem light-emitting element) in which a plurality of EL layers and a charge-generation layer interposed therebetween will be described.

Figure 4A:
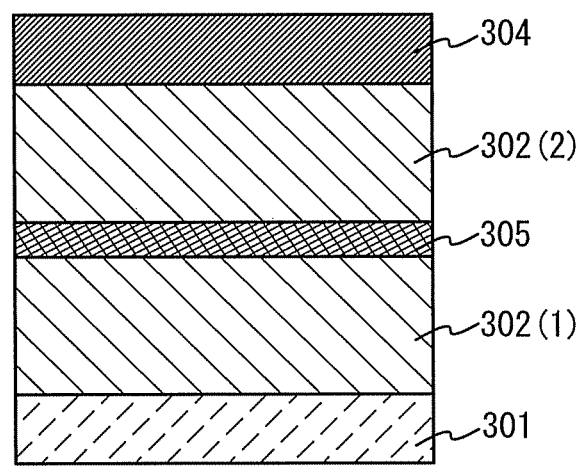
FIGS. 4A and 4B each illustrate a light-emitting element of one embodiment of the present invention.

A light-emitting element described in this embodiment is a tandem light-emitting element including a plurality of EL layers (a first EL layer 302(1) and a second EL layer 302(2)) between a pair of electrodes (a first electrode 301 and a second electrode 304) as illustrated in FIG. 4A.

In this embodiment, the first electrode 301 functions as an anode, and the second electrode 304 functions as a cathode. Note that the first electrode 301 and the second electrode 304 can have structures similar to those described in Embodiment 1. Although the plurality of EL layers (the first EL layer 302(1) and the second EL layer 302(2)) may have structures similar to those described in Embodiment 1 or Embodiment 3, any of the EL layers may have a structure similar to that described in Embodiment 1 or Embodiment 3. In other words, the structures of the first EL layer 302(1) and the second EL layer 302(2) may be the same as or different from each other and can be the same as in Embodiment 1 or Embodiment 3.

Further, a charge-generation layer 305 is provided between the plurality of EL layers (the first EL layer 302(1) and the second EL layer 302(2)). The charge-generation layer 305 has a function of injecting electrons into one of the EL layers and injecting holes into the other of the EL layers when a voltage is applied between the first electrode 301 and the second electrode 304. In this embodiment, when voltage is applied such that the potential of the first electrode 301 is higher than that of the second electrode 304, the charge-generation layer 305 injects electrons into the first EL layer 302(1) and injects holes into the second EL layer 302(2).

Note that in terms of light extraction efficiency, the charge-generation layer 305 preferably has a light-transmitting property with respect to visible light (specifically, the charge-generation layer 305 has a visible light transmittance of 40% or more). Further, the charge-generation layer 305 functions even if it has lower conductivity than the first electrode 301 or the second electrode 304.

The charge-generation layer 305 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances given here are mainly ones that have a hole mobility of $10^{-6}$ cm$^2$/Vs or higher. Note that any other substance may be used as long as the substance has a hole-transport property higher than an electron-transport property.

Examples of the electron acceptor include 7,7,8,8-tetracyano-2,3,5,6-tetrafluoroquinodimethane (abbreviation: F$_4$-TCNQ) and chloranil. Other examples include transition metal oxides. Other examples include oxides of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable because it is stable in the air, has a low hygroscopic property, and is easily handled.

On the other hand, in the case of the structure in which an electron donor is added to an organic compound having a high electron-transport property, as the organic compound having a high electron-transport property for example, a metal complex having a quinoline skeleton or a benzoquinoline skeleton, such as Alq, Almq$_3$, BeBq$_2$, or BAlq, or the like can be used. A metal complex having an oxazole-based ligand or a thiazole-based ligand, such as Zn(BOX)$_2$ or Zn(BTZ)$_2$ can be used. Other than such a metal complex, PBD, OXD-7, TAZ, BPhen, BCP, or the like can be used. The substances given here are mainly ones that have an electron mobility of $10^{-6}$ cm$^2$/Vs or higher. The organic compound having a pyrimidine skeleton, which is the second compound, may be used. Note that any other substance may be used as long as the substance has an electron-transport property higher than a hole-transport property.

As the electron donor, an alkali metal, an alkaline earth metal, a rare earth metal, a metal belonging to Group 2 or Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the electron donor.

Note that forming the charge-generation layer 305 by using any of the above materials can suppress an increase in drive voltage caused by the stack of the EL layers.

Figure 4B:
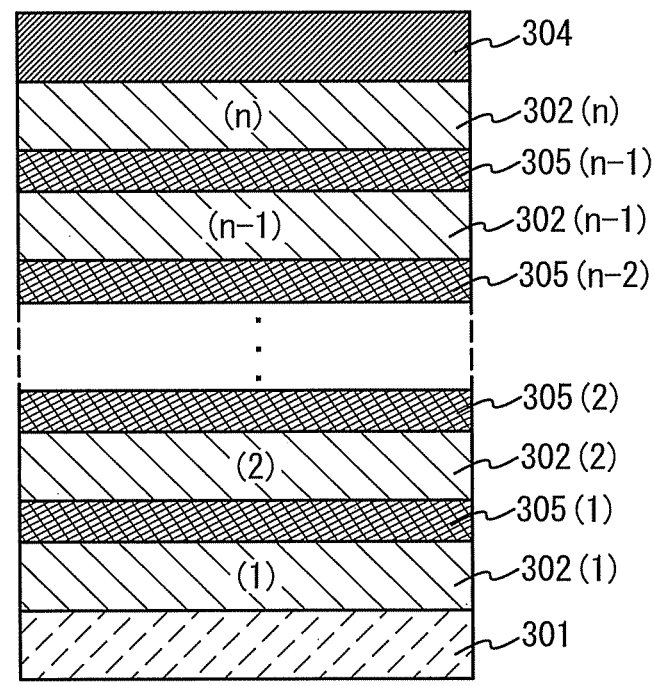

Although the light-emitting element including two EL layers is described in this embodiment, the present invention can be similarly applied to a light-emitting element in which n EL layers (n is three or more) are stacked as illustrated in FIG. 4B. In the case where a plurality of EL layers are provided between a pair of electrodes as in the light-emitting element of this embodiment, by providing a charge-generation layer between the EL layers, the light-emitting element can emit light in a high luminance region while the current density is kept low. Since the current density can be kept low, the element can have a long lifetime. When the light-emitting element is applied for illumination, voltage drop due to resistance of an electrode material can be reduced, thereby achieving homogeneous light emission in a large area. Moreover, a light-emitting device of low power consumption, which can be driven at low voltage, can be achieved.

By making the EL layers emit light of different colors from each other, the light-emitting element can provide light emission of a desired color as a whole. For example, in a light-emitting element having the two EL layers, the emission colors of the first and second EL layers are complementary, so that the light-emitting element can be made to emit white light as a whole. Note that "complementary colors" refer to colors that can produce an achromatic color when mixed. In other words, when lights obtained from substances which emit complementary colors are mixed, white emission can be obtained.

Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

(Embodiment 6)

In this embodiment, a light-emitting device including any of the light-emitting elements described in Embodiments 1, 3, 4, and 5 will be described with reference to FIG. 5.

A light-emitting device described in this embodiment has a micro optical resonator (microcavity) structure in which a light resonant effect between a pair of electrodes is utilized. The light-emitting device includes a plurality of light-emitting elements each of which includes at least an EL layer 455 between a pair of electrodes (a reflective electrode 451 and a semi-transmissive and semi-reflective electrode 452) as illustrated in FIG. 5. Further, the EL layer 455 includes at least a first light-emitting layer 454B, a second light-emitting layer 454G; and a third light-emitting layer 454R, each of which serves as a light-emitting region. The EL layer 455 may further include a hole-injection layer, a hole-transport layer, an electron-transport layer, an electron-injection layer, a charge generating layer, and the like. The EL layer 455 may further include a hole-injection layer, a hole-transport layer, an electron-transport layer, an electron-injection layer, a charge generating layer, and the like. Note that a phosphorescent iridium metal complex and an organic compound having a pyrimidine skeleton are contained in at least one of the first light-emitting layer 454B, the second light-emitting layer 454G, and the third light-emitting layer 454R.

Figure 5:
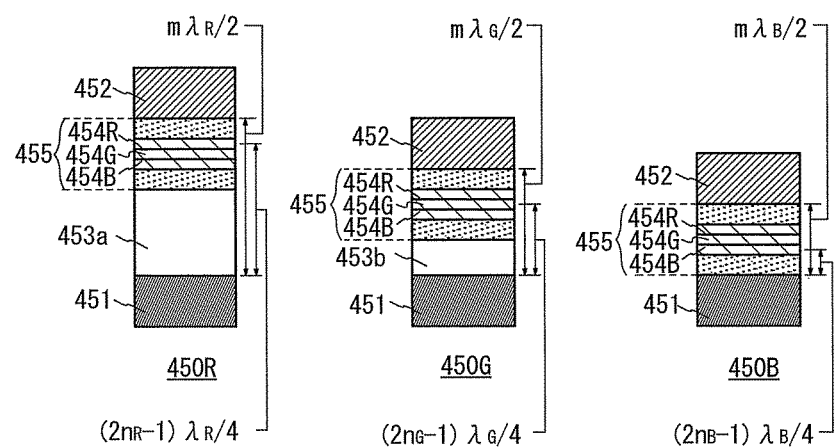
FIG. 5 illustrates light-emitting elements each of which is one embodiment of the present invention.

In this embodiment, a light-emitting device which includes light-emitting elements (a first light-emitting element 450R, a second light-emitting element 450G, and a third light-emitting element 450B) having different structures as illustrated in FIG. 5 will be described.

The first light-emitting element. 450R has a structure in which a first transparent conductive layer 453a, the EL layer 455, the semi-transmissive and semi-reflective electrode 452 are sequentially stacked over the reflective electrode 451. The second light-emitting element 450G has a structure in which a second transparent conductive layer 453b, the EL layer 455, and the semi-transmissive and semi-reflective electrode 452 are sequentially stacked over the reflective electrode 451. The third light-emitting element 450B has a structure in which the EL layer 455 and the semi-transmissive and semi-reflective electrode 452 are sequentially stacked over the reflective electrode 451.

Note that the reflective electrode 451, the EL layer 455, and the semi-transmissive and semi-reflective electrode 452 are common to the light-emitting elements (the first light-emitting element 450R, the second light-emitting element 450G, and the third light-emitting element 450B).

The EL layer 455 includes the first light-emitting layer 454B, the second light-emitting layer 454G, and the third light-emitting layer 454R. The first light-emitting layer 454B, the second light-emitting layer 454G, and the third light-emitting layer 454R emit a light ($\lambda_B$) having a peak in a wavelength range from 420 nm to 480 nm, a light ($\lambda_G$) having a peak in a wavelength range from 500 nm to 550 nm, and a light ($\lambda_R$) having a peak in a wavelength range from 600 nm to 760 nm, respectively. Thus, in each of the light-emitting elements (the first light-emitting element 450R, the second light-emitting element 450G, and the third light-emitting element 450B), the lights emitted from the first light-emitting layer 454B, the second light-emitting layer 454G, and the third light-emitting layer 454R overlap with each other; accordingly, light having a broad emission spectrum that covers a visible light range can be emitted. Note that the above wavelengths satisfy the relation of $\lambda_B < \lambda_G < \lambda_R$.

Each of the light-emitting elements described in this embodiment has a structure in which the EL layer 455 is interposed between the reflective electrode 451 and the semi-transmissive and semi-reflective electrode 452. The lights emitted in all directions from the light-emitting layers included in the EL layer 455 are resonated by the reflective electrode 451 and the semi-transmissive and semi-reflective electrode 452 which function as a micro optical resonator (microcavity). Note that the reflective electrode 451 is formed using a conductive material having reflectivity, and a film whose visible light reflectivity is 40% to 100%, preferably 70% to 100%, and whose resistivity is $1 \times 10^{-2}$ Ωcm or lower is used. In addition, the semi-transmissive and semi-reflective electrode 452 is formed using a conductive material having reflectivity and a conductive material having a light-transmitting property, and a film whose visible light reflectivity is 20% to 80%, preferably 40% to 70%, and whose resistivity is $1 \times 10^{-2}$ Ωcm or lower is used.

In this embodiment, the thicknesses of the transparent conductive layers (the first transparent conductive layer 453a and the second transparent conductive layer 453b) provided in the first light-emitting element 450R and the second light-emitting element 450G, respectively, are varied between the light-emitting elements, whereby the light-emitting elements differ in the optical path length from the reflective electrode 451 to the semi-transmissive and semi-reflective electrode 452. In other words, in light having a broad emission spectrum, which is emitted from the light-emitting layers of each of the light-emitting elements, light with a wavelength that is resonated between the reflective electrode 451 and the semi-transmissive and semi-reflective electrode 452 can be enhanced while light with a wavelength that is not resonated therebetween can be attenuated. Thus, when the elements differ in the optical path length from the reflective electrode 451 to the semi-transmissive and semi-reflective electrode 452, light with different wavelengths can be extracted.

Note that the optical path length (also referred to as optical distance) is expressed as a product of an actual distance and a refractive index, and in this embodiment, is a product of an actual thickness and n (refractive index). In other words, That is, the following relation is satisfied: optical path length=actual thickness×n.

Further, the optical path length from the reflective electrode 451 to the semi-transmissive and semi-reflective electrode 452 is set to $m\lambda_R/2$ (m is a natural number of 1 or more) in the first light-emitting element 450R; the optical path length from the reflective electrode 451 to the semi-transmissive and semi-reflective electrode 452 is set to $m\lambda_G/2$ (m is a natural number of 1 or more) in the second light-emitting element 450G; and the optical path length from the reflective electrode 451 to the semi-transmissive and semi-reflective electrode 452 is set to $m\lambda_B/2$ (m is a natural number of 1 or more) in the third light-emitting element 450B.

In this manner, the light ($\lambda_R$) emitted from the third light-emitting layer 454R included in the EL layer 455 is mainly extracted from the first light-emitting element 450R, the light ($\lambda_G$) emitted from the second light-emitting layer 454G included in the EL layer 455 is mainly extracted from the second light-emitting element 450G, and the light ($\lambda_B$) emitted from the first light-emitting layer 454B included in the EL layer 455 is mainly extracted from the third light-emitting element 450B. Note that the light extracted from each of the light-emitting elements is emitted through the semi-transmissive and semi-reflective electrode 452 side.

Further, strictly speaking, the optical path length from the reflective electrode 451 to the semi-transmissive and semi-reflective electrode 452 can be the distance from a reflection region in the reflective electrode 451 to a reflection region in the semi-transmissive and semi-reflective electrode 452. However, it is difficult to precisely determine the positions of the reflection regions in the reflective electrode 451 and the semi-transmissive and semi-reflective electrode 452; therefore, it is assumed that the above effect can be sufficiently obtained wherever the reflection regions may be set in the reflective electrode 451 and the semi-transmissive and semi-reflective electrode 452.

Next, the optical path length from the reflective electrode 451 to the third light-emitting layer 454R is adjusted to $(2n_R-1)\lambda_R/4$ ($n_R$ is a natural number of 1 or more) because in the first light-emitting element 450R, light (first reflected light) that is reflected by the reflective electrode 451 of the light emitted from the third light-emitting layer 454R interferes with light (first incident light) that directly enters the semi-transmissive and semi-reflective electrode 452 from the third light-emitting layer 454R. By adjusting the optical path length, the phases of the first reflected light and the first incident light can be aligned with each other and the light emitted from the third light-emitting layer 454R can be amplified.

Note that, strictly speaking, the optical path length from the reflective electrode 451 to the third light-emitting layer 454R can be the optical path length from a reflection region in the reflective electrode 451 to a light-emitting region in the third light-emitting layer 454R. However, it is difficult to precisely determine the positions of the reflection region in the reflective electrode 451 and the light-emitting region in the third light-emitting layer 454R; therefore, it is assumed that the above effect can be sufficiently obtained wherever the reflection region and the light-emitting region may be set in the reflective electrode 451 and the third light-emitting layer 454R, respectively.

Next, the optical path length from the reflective electrode 451 to the second light-emitting layer 454G is adjusted to $(2n_G-1)\lambda_G/4$ ($n_G$ is a natural number of 1 or more) because in the second light-emitting element 450G, light (second reflected light) that is reflected by the reflective electrode 451 of the light emitted from the second light-emitting layer 454G interferes with light (second incident light) that directly enters the semi-transmissive and semi-reflective electrode 452 from the second light-emitting layer 454G. By adjusting the optical path length, the phases of the second reflected light and the second incident light can be aligned with each other and the light emitted from the second light-emitting layer 454G can be amplified.

Note that, strictly speaking, the optical path length from the reflective electrode 451 to the second light-emitting layer 454G can be the optical path length from a reflection region in the reflective electrode 451 to a light-emitting region in the second light-emitting layer 454G. However, it is difficult to precisely determine the positions of the reflection region in the reflective electrode 451 and the light-emitting region in the second light-emitting layer 454G; therefore, it is assumed that the above effect can be sufficiently obtained wherever the reflection region and the light-emitting region may be set in the reflective electrode 451 and the second light-emitting layer 454G, respectively.

Next, the optical path length from the reflective electrode 451 to the first light-emitting layer 454B is adjusted to $(2n_B-1)\lambda_B/4$ ($n_B$ is a natural number of 1 or more) because in the third light-emitting element 450B, light (third reflected light) that is reflected by the reflective electrode 451 of the light emitted from the first light-emitting layer 454B interferes with light (third incident light) that directly enters the semi-transmissive and semi-reflective electrode 452 from the first light-emitting layer 454B. By adjusting the optical path length, the phases of the third reflected light and the third incident light can be aligned with each other and the light emitted from the first light-emitting layer 454B can be amplified.

Note that, strictly speaking, the optical path length from the reflective electrode 451 to the first light-emitting layer 454B can be the optical path length from a reflection region in the reflective electrode 451 to a light-emitting region in the first light-emitting layer 454B. However, it is difficult to precisely determine the positions of the reflection region in the reflective electrode 451 and the light-emitting region in the first light-emitting layer 454B; therefore, it is assumed that the above effect can be sufficiently obtained wherever the reflection region and the light-emitting region may be set in the reflective electrode 451 and the first light-emitting layer 454B, respectively.

Note that although each of the light-emitting elements in the above-described structure includes a plurality of light-emitting layers in the EL layer, the present invention is not limited thereto; for example, the structure of the tandem (stacked type) light-emitting element which is described in Embodiment 5 can be combined, in which case a plurality of EL layers is provided so that a charge-generation layer is interposed therebetween in one light-emitting element and one or more light-emitting layers are formed in each of the EL layers.

The light-emitting device described in this embodiment has a microcavity structure, in which light with wavelengths which differ depending on the light-emitting elements can be extracted even when they include the same EL layers, so that it is not needed to form light-emitting elements for the colors of R, G, and B. Therefore, the above structure is advantageous for full color display owing to easiness in achieving higher resolution display or the like. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Note that this embodiment can be freely combined with any of the other embodiments as appropriate.

(Embodiment 7)

In this embodiment, light-emitting devices each of which includes the light-emitting element of one embodiment of the present invention will be described with reference to FIGS. 6A and 6B and FIGS. 7A and 7B. The light-emitting device illustrated in FIGS. 6A and 6B will be described first, and then the light-emitting device illustrated in FIGS. 7A and 7B will be described.

Figure 6A:
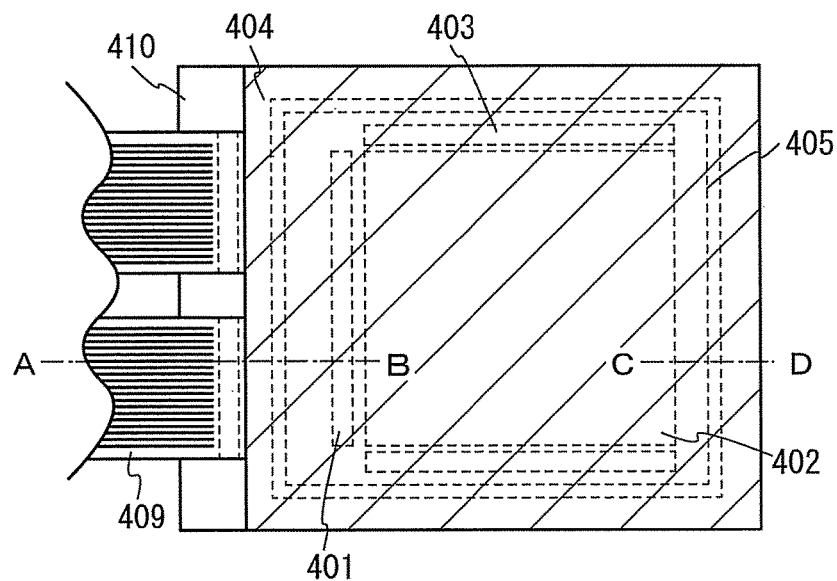
FIGS. 6A and 6B illustrate a light-emitting device of one embodiment of the present invention.
Figure 6B:
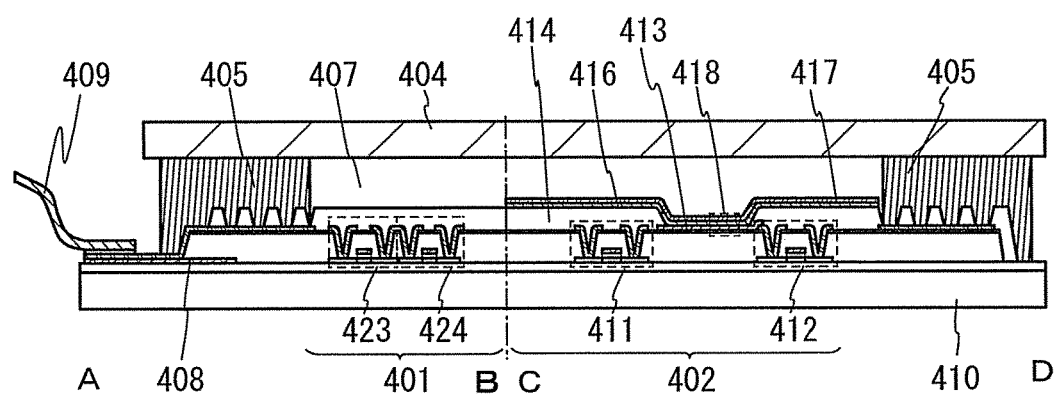

FIG. 6A is a top view illustrating a light-emitting device and FIG. 6B is a cross-sectional view of FIG. 6A taken along lines A-B and C-D.

In FIG. 6A, reference numerals 401, 402 and 403 which are shown by dotted lines denote a driver circuit portion (source driver circuit), a pixel portion, and a driver circuit portion (gate driver circuit), respectively. A reference numeral 404 denotes a sealing substrate, a reference numeral 405 denotes a sealant (also referred to as sealing material), and a portion enclosed by the sealant 405 is a space.

Note that a lead wiring 408 is a wiring for transmitting signals that are to be inputted to the source driver circuit 401 and the gate driver circuit 403, and receives a video signal, a clock signal, a start signal, a reset signal, and the like from a flexible printed circuit (FPC) 409 which serves as an external input terminal. Note that although only an FPC is illustrated here, a printed wiring board (PWB) may be attached thereto. The light-emitting device in this specification includes, in its category, not only the light-emitting device itself but also the light-emitting device provided with the FPC or the PWB.

Next, a cross-sectional structure is described with reference to FIG. 6B. The driver circuit portion and the pixel portion are formed over an element substrate 410. Here, one pixel in the pixel portion 402 and the source driver circuit 401 which is the driver circuit portion are illustrated.

Note that as the source driver circuit 401, a CMOS circuit which is obtained by combining an n-channel TFT 423 and a p-channel TFT 424 is formed. The driver circuit may be any of a variety of circuits formed with TFTs, such as a CMOS circuit, a PMOS circuit, or an NMOS circuit. Although a driver-integrated type where the driver circuit is formed over the substrate is described in this embodiment, the present invention is not limited to this, and the driver circuit may be formed outside the substrate, not over the substrate.

The pixel portion 402 includes a plurality of pixels having a switching TFT 411, a current control TFT 412, and a first electrode 413 electrically connected to a drain of the current control TFT 412. An insulator 414 is formed to cover an end portion of the first electrode 413. Here, the insulator 414 is formed using a positive type photosensitive acrylic resin film.

In order to improve the coverage, the insulator 414 is provided such that either an upper end portion or a lower end portion of the insulator 414 has a curved surface with a curvature. For example, when positive photosensitive acrylic is used as a material for the insulator 414, it is preferable that only an upper end portion of the insulator 414 have a curved surface with a radius of curvature (0.2 µm to 3 µm). For the insulator 414, it is also possible to use either a negative type photosensitive material that becomes insoluble in an etchant by light irradiation or a positive type photosensitive material that becomes soluble in an etchant by light irradiation.

A light-emitting layer 416 and a second electrode 417 are formed over the first electrode 413. Here, as a material for the first electrode 413 functioning as the anode, a material having a high work function is preferably used. For example, it is possible to use a single layer of an ITO film, an indium tin oxide film that includes silicon, an indium oxide film that includes 2 wt % to 20 wt % of zinc oxide, a titanium nitride film, a chromium film, a tungsten film, a Zn film, a Pt film, or the like, a stacked layer of a titanium nitride film and a film that mainly includes aluminum, a three-layer structure of a titanium nitride film, a film that mainly includes aluminum and a titanium nitride film, or the like. Note that when a stacked structure is employed, the resistance of a wiring is low and a favorable ohmic contact is obtained.

In addition, the light-emitting layer 416 is formed by any of a variety of methods such as an evaporation method using an evaporation mask, a droplet discharging method like an inkjet method, a printing method, and a spin coating method. The light-emitting layer 416 contains any of the organic compounds containing pyrimidine skeletons, which are described in the above embodiments. Further, another material included in the light-emitting layer 416 may be a low molecular material, an oligomer, a dendrimer, a high molecular material, or the like.

As a material used for the second electrode 417 which is formed over the light-emitting layer 416 and serves as a cathode, it is preferable to use a material having a low work function (e.g., Al, Mg, Li, Ca, or an alloy or compound thereof such as MgAg, Mg—In, or Al—Li). In order that light generated in the light-emitting layer 416 be transmitted through the second electrode 417, a stack of a metal thin film having a reduced thickness and a transparent conductive film (e.g., ITO, indium oxide containing 2 wt % to 20 wt % of zinc oxide, indium oxide-tin oxide that contains silicon or silicon oxide, or zinc oxide) is preferably used for the second electrode 417.

The sealing substrate 404 is attached to the element substrate 410 with the sealant 405; thus, a light-emitting element 418 is provided in the space 407 enclosed by the element substrate 410, the sealing substrate 404, and the sealant 405. Note that the space 407 is filled with a filler and may be filled with an inert gas (such as nitrogen or argon) or the sealant 405.

Note that as the sealant 405, an epoxy-based resin is preferably used. Such a material preferably allows as little moisture and oxygen as possible to penetrate. As a material for the sealing substrate 404, a glass substrate, a quartz substrate, or a plastic substrate including fiberglass-reinforced plastics (FRP), polyvinyl fluoride (PVF), polyester, acrylic, or the like can be used.

As described above, the active matrix light-emitting device having the light-emitting element of one embodiment of the present invention can be obtained.

Further, the light-emitting element of the present invention can be used for a passive matrix light-emitting device instead of the above active matrix light-emitting device.

Figure 7A:
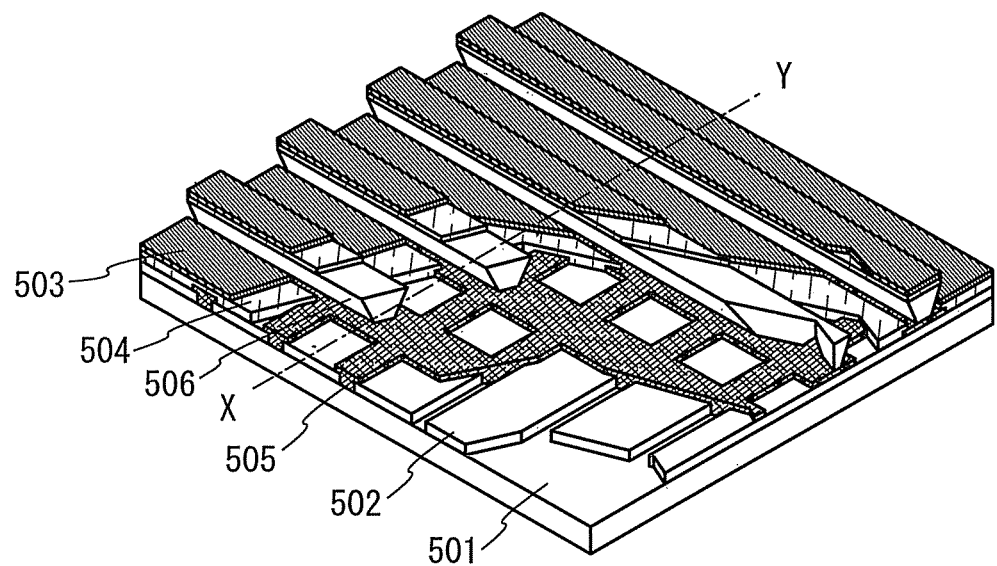
FIGS. 7A and 7B illustrate a light-emitting device of one embodiment of the present invention.
Figure 7B:
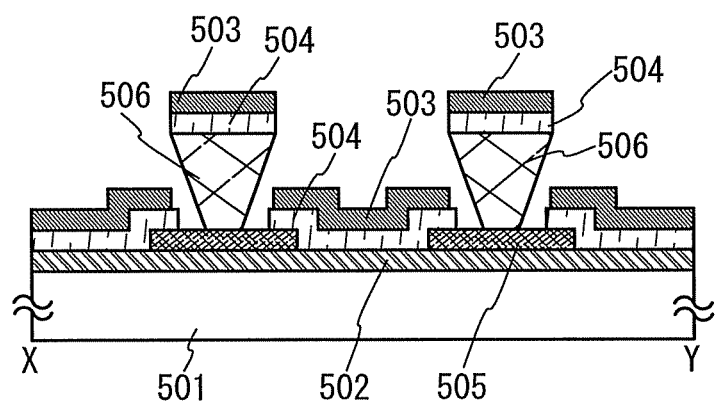

FIGS. 7A and 7B are a perspective view and a cross-sectional view of a passive matrix light-emitting device including the light-emitting element of one embodiment of the present invention. Note that FIG. 7A is a perspective view of the light-emitting device and FIG. 7B is a cross-sectional view of FIG. 7A taken along a line X-Y.

In FIGS. 7A and 7B, an EL layer 504 is provided between a first electrode 502 and a second electrode 503 over a substrate 501. An end portion of the first electrode 502 is covered with an insulating layer 505. In addition, a partition layer 506 is provided over the insulating layer 505. The sidewalls of the partition layer 506 slope so that the distance between one sidewall and the other sidewall gradually decreases toward the surface of the substrate. In other words, a cross section taken along the direction of the short side of the partition layer 506 is trapezoidal, and the base (a side which is in the same direction as a plane direction of the insulating layer 505 and in contact with the insulating layer 505) is shorter than the upper side (a side which is in the same direction as the plane direction of the insulating layer 505 and not in contact with the insulating layer 505). By providing the partition layer 506 in such a manner, a defect of the light-emitting element due to static electricity or the like can be prevented.

Thus, the passive matrix light-emitting device including the light-emitting element of one embodiment of the present invention can be obtained.

The light-emitting devices described in this embodiment (the active matrix light-emitting device and the passive matrix light-emitting device) are both formed using the light-emitting element of one embodiment of the present invention, thereby having low power consumption.

Note that this embodiment can be freely combined with any of the other embodiments as appropriate.

(Embodiment 8)

In this embodiment, electronic devices each of which includes the light-emitting device of one embodiment of the present invention described in the above embodiment will be described. Examples of the electronic devices include cameras such as video cameras and digital cameras, goggle type displays, navigation systems, audio reproducing devices (e.g., car audio systems and audio systems), computers, game machines, portable information terminals (e.g., mobile computers, cellular phones, portable game machines, and electronic book readers), image reproducing devices in which a recording medium is provided (specifically, devices that are capable of reproducing recording media such as digital versatile discs (DVDs) and provided with a display device that can display an image), and the like. Specific examples of these electronic devices are illustrated in FIGS. 8A to 8D. Specific examples of these electronic devices are illustrated in FIGS. 8A to 8D.

Figure 8A:
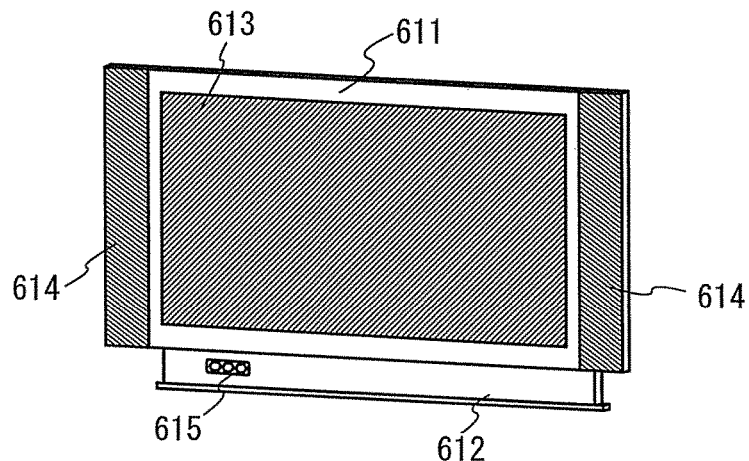
FIGS. 8A to 8D each illustrate an electronic device of one embodiment of the present invention.

FIG. 8A illustrates a television set according to one embodiment of the present invention, which includes a housing 611, a supporting base 612, a display portion 613, speaker portions 614, video input terminals 615, and the like. In this television set, the light-emitting device of one embodiment of the present invention can be applied to the display portion 613. Since the light-emitting device of one embodiment of the present invention is driven at a low voltage and has high current efficiency, by the application of the light-emitting device of one embodiment of the present invention, a television set with reduced power consumption can be obtained.

Figure 8B:
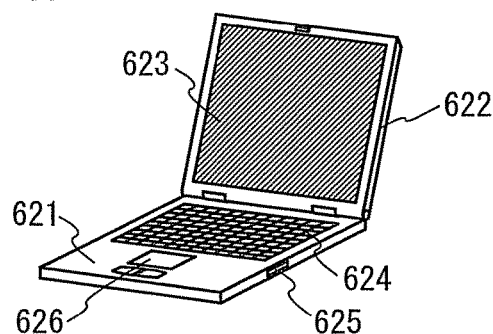

FIG. 8B illustrates a computer according to one embodiment of the present invention, which includes a main body 621, a housing 622, a display portion 623, a keyboard 624, an external connection port 625, a pointing device 626, and the like. In this computer, the light-emitting device of one embodiment of the present invention can be applied to the display portion 623. Since the light-emitting device of one embodiment of the present invention is driven at a low voltage and has high current efficiency, by the application of the light-emitting device of one embodiment of the present invention, a computer with reduced power consumption can be obtained.

Figure 8C:
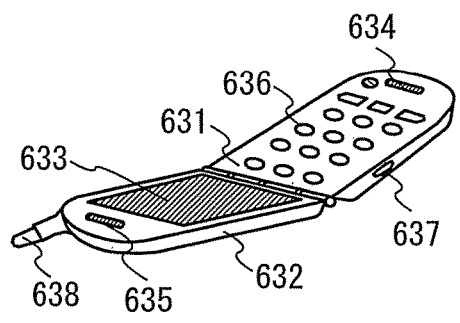

FIG. 8C illustrates a mobile phone according to one embodiment of the present invention, which includes a main body 631, a housing 632, a display portion 633, an audio input portion 634, an audio output portion 635, operation keys 636, an external connection port 637, an antenna 638, and the like. In this mobile phone, the light-emitting device of one embodiment of the present invention can be applied to the display portion 633. Since the light-emitting device of one embodiment of the present invention is driven at a low voltage and has high current efficiency, by the application of the light-emitting device of one embodiment of the present invention, a mobile phone with reduced power consumption can be obtained.

Figure 8D:
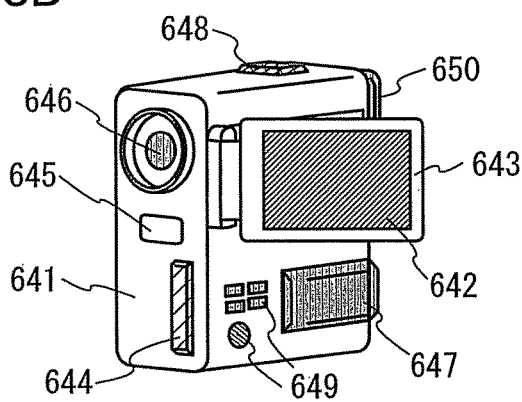

FIG. 8D illustrates a camera of one embodiment of the present invention, which includes a main body 641, a display portion 642, a housing 643, an external connection port 644, a remote control receiving portion 645, an image receiving portion 646, a battery 647, an audio input portion 648, operation keys 649, an eyepiece portion 650, and the like. In this camera, the light-emitting device of one embodiment of the present invention can be applied to the display portion 642. Since the light-emitting device of one embodiment of the present invention is driven at a low voltage and has high current efficiency, by the application of the light-emitting device of one embodiment of the present invention, a camera with reduced power consumption can be obtained.

As described above, the applicable range of the light-emitting device of one embodiment of the present invention is so wide that the light-emitting device can be applied to electronic devices in a variety of fields. With the use of the light-emitting device of one embodiment of the present invention, an electronic device with reduced power consumption can be obtained.

Figure 9A:
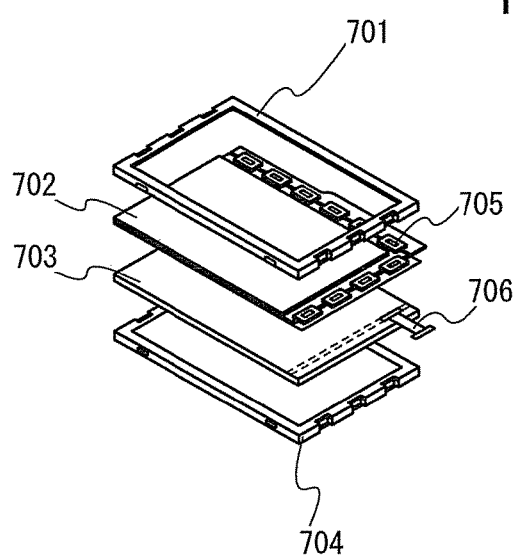
FIGS. 9A to 9C each illustrate a lighting device of one embodiment of the present invention.

The light-emitting device of one embodiment of the present invention can also be used as a lighting device. FIG. 9A illustrates an example of a liquid crystal display device using the light-emitting device of one embodiment of the present invention as a backlight. The liquid crystal display device illustrated in FIG. 9A includes a housing 701, a liquid crystal layer 702, a backlight 703, and a housing 704. The liquid crystal layer 702 is connected to a driver IC 705. The light-emitting device of one embodiment of the present invention is used as the backlight 703, and current is supplied through a terminal 706.

By using the light-emitting device of one embodiment of the present invention as a backlight of a liquid crystal display device as described above, a backlight having low power consumption can be obtained. Moreover, since the light-emitting device of one embodiment of the present invention is a lighting device for surface light emission and the enlargement of the light-emitting device is possible, the backlight can be made larger. Accordingly, a larger-area liquid crystal display device with low power consumption can be obtained.

Figure 9B:
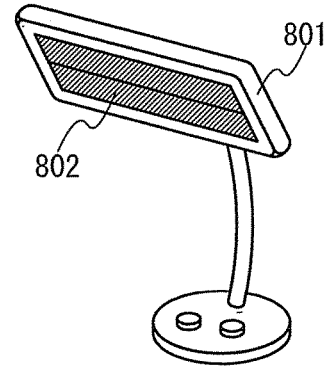

Next, FIG. 9B illustrates an example in which the light-emitting device of one embodiment of the present invention is used for a desk lamp which is a lighting device. The desk lamp illustrated in FIG. 9B has a housing 801 and a light source 802, and the light-emitting device according to one embodiment of the present invention is used as the light source 802. Since the light-emitting device of one embodiment of the present invention is driven at a low voltage and has high current efficiency, by the application of the light-emitting device of one embodiment of the present invention, a desk lamp with reduced power consumption can be obtained.

Figure 9C:
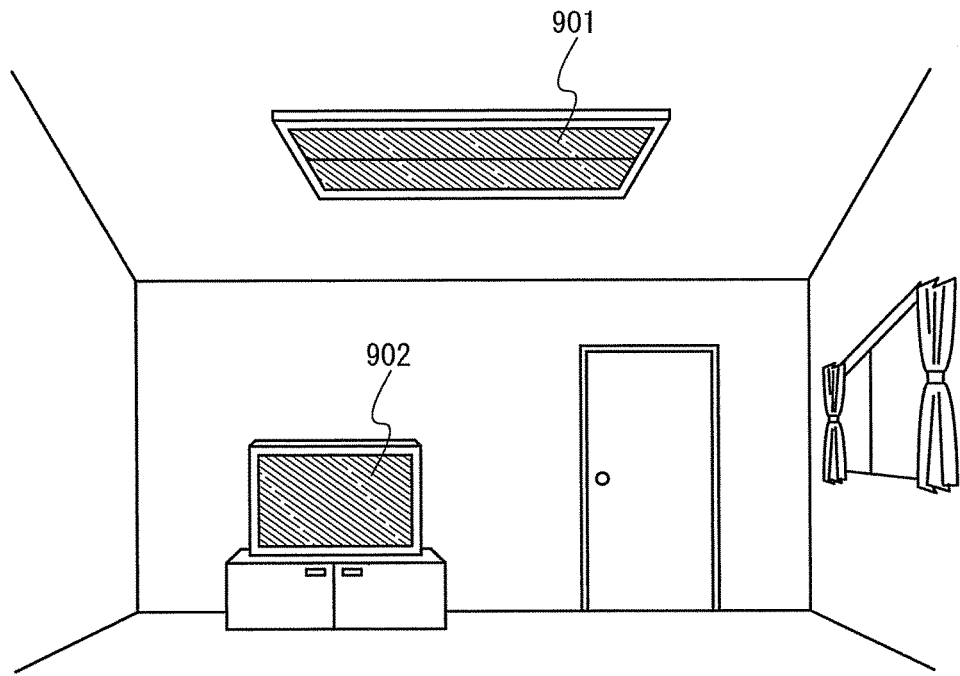

Next, FIG. 9C illustrates an example in which the light-emitting device of one embodiment of the present invention is used for an indoor lighting device 901. Since the light-emitting device of one embodiment of the present invention can also have a larger area, the light-emitting device of one embodiment of the present invention can be used as a lighting device having a large area. Since the light-emitting device of one embodiment of the present invention is driven at a low voltage and has high current efficiency, by the application of the light-emitting device of one embodiment of the present invention, a lighting device with reduced power consumption can be obtained. In a room where the light-emitting device of one embodiment of the present invention is used as the indoor lighting device 901 as described above, a television set 902 of one embodiment of the present invention as described with reference to FIG. 8A can be installed so that public broadcasting and movies can be watched.

Note that this embodiment can be freely combined with any of the other embodiments as appropriate.

Note that the organic compound having a pyrimidine skeleton (the second compound), which is one embodiment of the present invention, can be used for an organic thin-film solar battery. Specifically, the organic compound having a pyrimidine skeleton has a carrier-transport property, and thus can be used for a carrier-transport layer and a carrier-injection layer. Moreover, the organic compound having a pyrimidine skeleton is photoexcited, and thus can be used for a power-generation layer.

EXAMPLE 1

In this example, a synthesis method of 4,6-bis[3-(phenanthren-9-yl)phenyl]pyrimidine (abbreviation: 4,6mPnP2Pm) represented by Structural Formula (300) as one embodiment of the organic compound having a pyrimidine skeleton, which is the second compound, will be described.

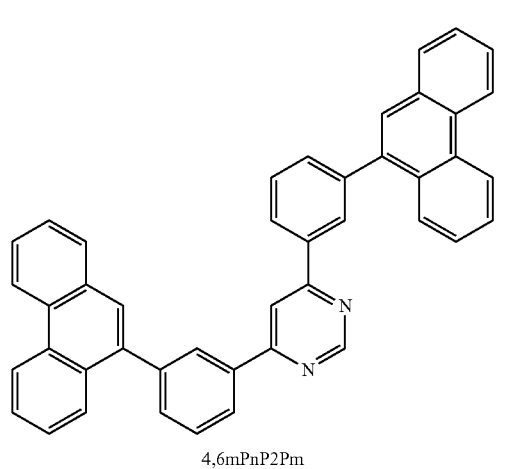

(300)
4,6mPnP2Pm

Synthesis of 4,6-Bis[3-(phenanthren-9-yl)phenyl]pyrimidine (abbreviation: 4,6mPnP2Pm)

A synthesis scheme of 4,6-bis[3-(phenanthren-9-yl)phenyl]pyrimidine (abbreviation: 4,6mPnP2Pm) is shown in (C-1).

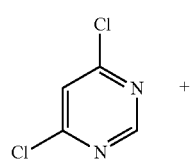

(C-1)

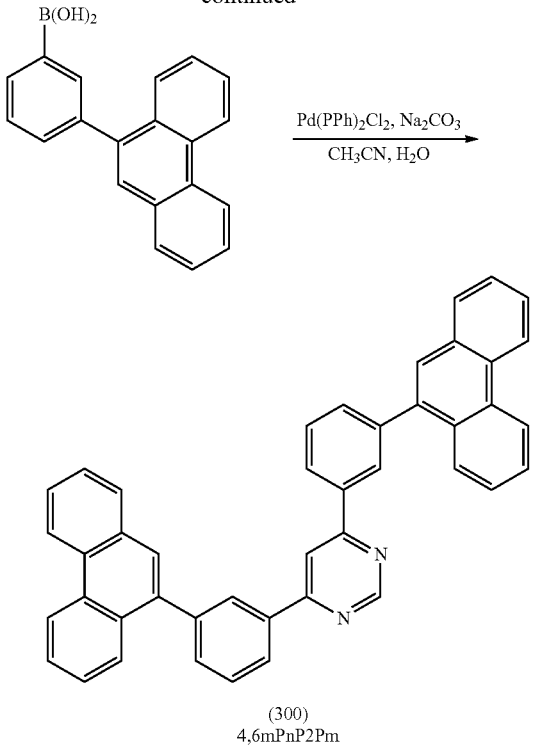

(300)
4,6mPnP2Pm

In a 100 mL round-bottom flask were put 0.64 g (4.3 mmol) of 4,6-dichloropyrimidine, 3.2 g (11 mmol) of 3-(phenanthren-9-yl)phenylboronic acid, and 2.3 g (21 mmol) of sodium carbonate. To this mixture were added 10 mL of acetonitrile and 20 mL of water. While the pressure was reduced, this mixture was stirred to be degassed. To this mixture was added 30 mg (43 μmol) of bis(triphenylphosphine)palladium(II) dichloride. This mixture was heated and stirred while being irradiated with microwaves (2.45 GHz, 100 W) in an argon atmosphere for 1.5 hours. Further, 1.0 g (3.4 mmol) of 3-(9-phenanthryl)phenylboronic acid, 0.71 g (6.7 mmol) of sodium carbonate, and 28 mg (40 mol) of bis(triphenylphosphine)palladium(II) dichloride were added to this mixture, and then the obtained mixture was heated and stirred for 1 hour. After the heating, water was added to the mixture and an organic layer was extracted with dichloromethane. The obtained organic layer was washed with saturated aqueous solution of sodium hydrogen carbonate and saturated saline. Then, magnesium sulfate was added, so that water was adsorbed. This mixture was separated by gravity filtration, and the filtrate was concentrated to give a solid. The solid was purified by silica gel column chromatography. In the column chromatography, toluene was used as a developing solvent. The resulting fraction was concentrated to give a solid. The obtained solid was recrystallized from toluene and hexane to give 0.99 g of a white solid of 4,6-bis[3-(phenanthren-9-yl)phenyl]pyrimidine (abbreviation: 4,6mPnP2Pm) in a yield of 40%.

The resulting white solid of 4,6-bis[3-(phenanthren-9-yl)phenyl]pyrimidine (abbreviation: 4,6mPnP2Pm) was purified by a train sublimation method. The purification by sublimation was performed in such a manner that 4,6-bis[3-(phenanthren-9-yl)phenyl]pyrimidine (abbreviation: 4,6mPnP2Pm) was heated at 280° C. for 14 hours under such conditions that the pressure was 3.7 Pa and the argon flow rate was 5.0 mL/mim. After the purification by sublimation, 0.80 g of a white solid of 4,6-bis[3-(phenanthren-9-yl)phenyl]pyrimidine (abbreviation: 4,6mPnP2Pm) was obtained at a collection rate of 79%.

This compound was identified as 4,6-bis[3-(phenanthren-9-yl)phenyl]pyrimidine (abbreviation: 4,6mPnP2Pm), which was a target substance, by nuclear magnetic resonance ($^1$H NMR) spectroscopy.

$^1$H NMR data of the obtained substance are as follows: $^1$H NMR (CDCl$_3$, 300 MHz):δ=7.50-7.75 (m, 14H), 7.87-7.91 (m, 4H), 8.21-8.31 (m, 5H), 8.73 (d, J1=8.4 Hz, 2H), 8.78 (d, J1=8.4 Hz, 2H), 9.36 (d, J1=0.9 Hz, 1H).

Figure 10A:
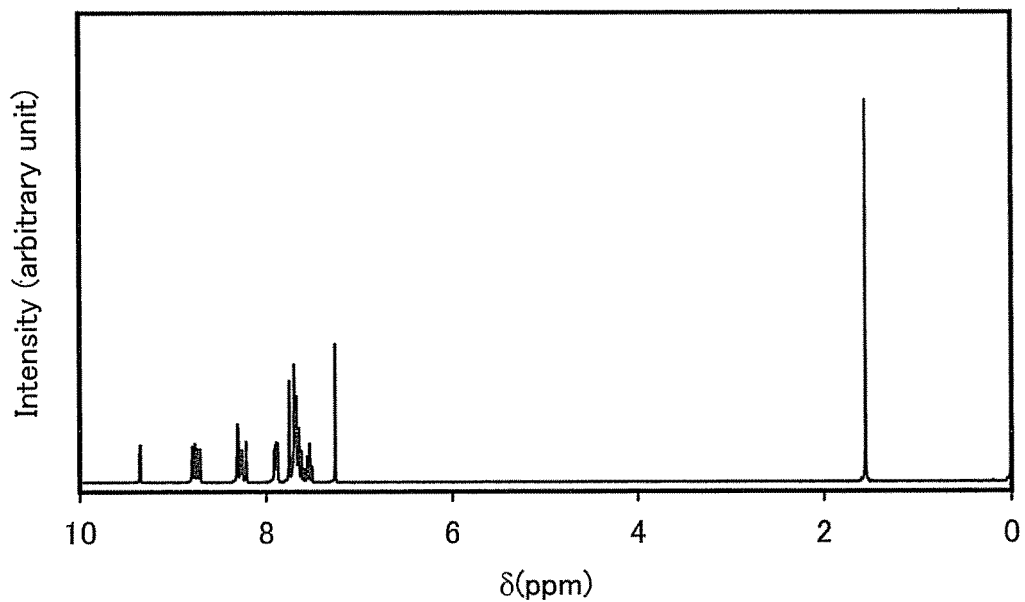
FIGS. 10A and 10B are $^1$H NMR charts of 4,6mPnP2Pm.
Figure 10B:
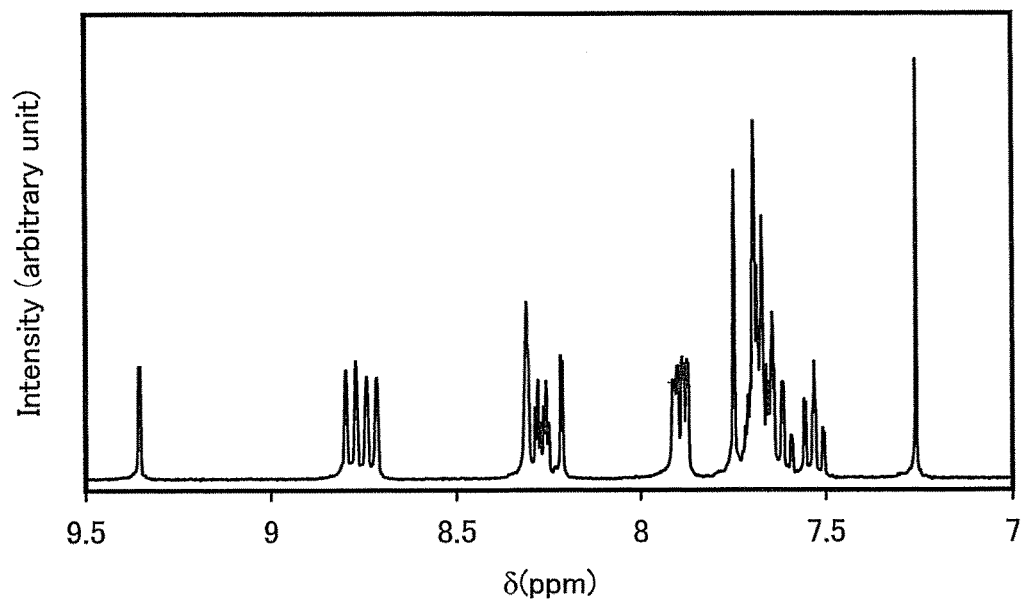

FIGS. 10A and 10B are $^1$H NMR charts. Note that FIG. 10B is a chart where the range of from 7.0 ppm to 9.5 ppm in FIG. 10A is enlarged.

Next, liquid chromatography mass spectrometry (abbreviation: LC/MS) was performed on 4,6-bis[3-(phenanthren-9-yl)phenyl]pyrimidine (abbreviation: 4,6mPnP2Pm) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 4,6mPnP2Pm was dissolved in toluene at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after minutes was 95:5. The composition ratio was changed linearly.

In the MS, ionization was carried out by an electrospray ionization (ESI) method; the capillary voltage and the sample cone voltage were 3.0 kV and 30 V, respectively; detection was carried out in a positive mode. The mass range for the measurement was m/z=100 to 1200.

Figure 97:
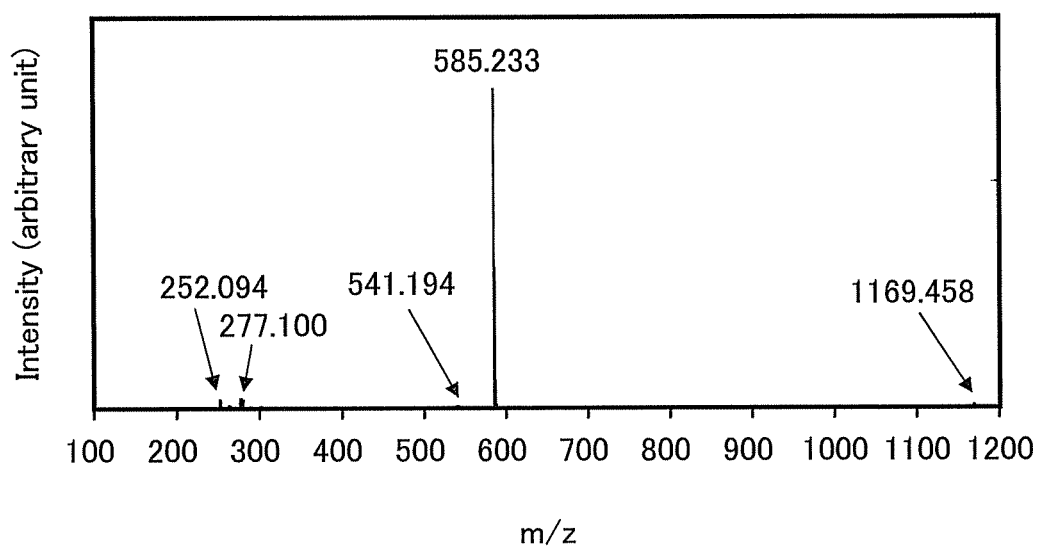
FIG. 97 shows LC-MS measurement results of 4,6mPnP2Pm.

A component with m/z of 584.23 which underwent the separation and the ionization under the above-described conditions was collided with an argon gas in a collision cell to dissociate into product ions. Energy (collision energy) for the collision with argon was 70 eV. FIG. 97 shows the results of the MS of the dissociated product ions by time-of-flight (TOF) mass spectrometry.

The results in FIG. 97 show that as for 4,6mPnP2Pm which is one embodiment of the present invention, peaks of product ions of a partial skeleton are detected mainly around m/z=252, m/z=277, and m/z=541, a peak derived from a precursor ion is detected around m/z=585, and a peak derived from a dimer ion is detected around m/z=1169. Note that the results in FIG. 97 show characteristics derived from 4,6-mPnP2Pm and therefore can be regarded as important data for identifying 4,6-mPnP2Pm contained in the mixture.

A fragment around m/z=541 is probably a product ion generated due to cleavage of a pyrimidine ring in 4,6mPnP2Pm. A pattern of such a product ion is one of the characteristics of the organic compound of one embodiment of the present invention, in which the 4-position and the 6-position of a pyrimidine ring are substituted. Therefore, it is indicated that 4,6mPnP2Pm which is one embodiment of the present invention has a pyrimidine ring whose 4-position and 6-position are substituted.

Further, 4,6mPnP2Pm, which is one embodiment of the present invention), was measured with a time-of-flight secondary ion mass spectrometer (TOF-SIMS); FIGS. 98A to 98D show the obtained qualitative spectra (positive ions and negative ions).

Figure 98A:
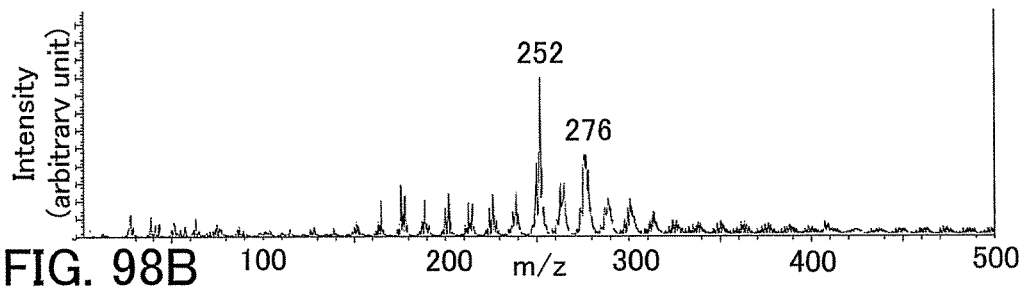
FIGS. 98A to 98D show ToF-SIMS measurement results of 4,6mPnP2Pm.
Figure 98B:
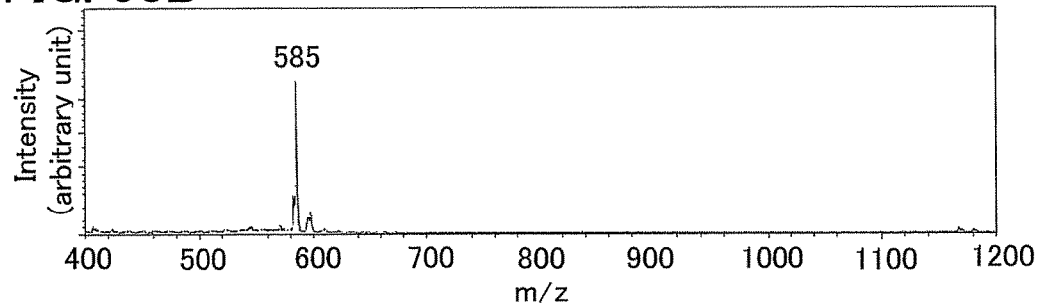
Figure 98C:
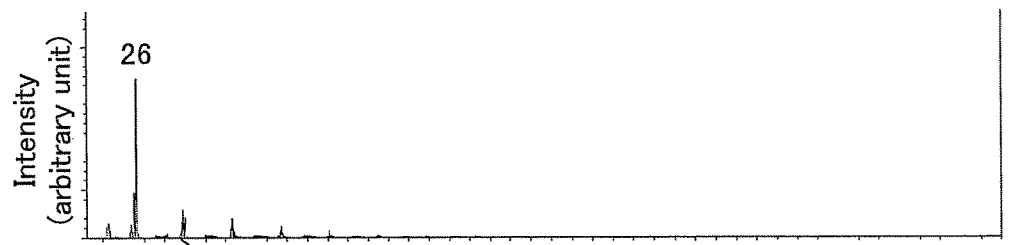
Figure 98D:
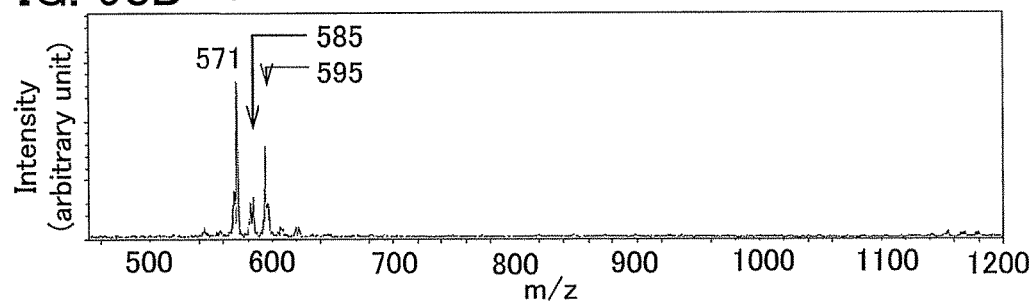

FIG. 98A shows measurement results obtained from positive ions. In FIG. 98A, the horizontal axis represents m/z ranging from 0 to 500 and the vertical axis represents intensity (arbitrary unit). FIG. 98B shows measurement results obtained from positive ions. In FIG. 98B, the horizontal axis represents m/z ranging from 400 to 1200 and the vertical axis represents intensity (arbitrary unit). FIG. 98C shows measurement results obtained from negative ions. In FIG. 98C, the horizontal axis represents m/z ranging from 0 to 500 and the vertical axis represents intensity (arbitrary unit). FIG. 98D shows measurement results obtained from negative ions. In FIG. 98D, the horizontal axis represents m/z ranging from 400 to 1200 and the vertical axis represents intensity (arbitrary unit).

TOF.SIMS 5 (produced by ION-TOF GmbH) was used as a measurement apparatus, and Bi$_3^{++}$ was used as a primary ion source. Note that irradiation with primary ions was performed in a pulsed manner with a pulse width of 7 nm to 12 nm. The irradiation amount was greater than or equal to $8.2 \times 10^{10}$ ions/cm$^2$ and less than or equal to $6.7 \times 10^{11}$ ions/cm$^2$ (or less than or equal to $1 \times 10^{12}$ ions/cm$^2$), the acceleration voltage was 25 keV, and the current value was 0.2 pA. Powder of 4,6mPnP2Pm was a sample for the measurement.

FIGS. 98A and 98B show that peaks of product ions of a partial skeleton of 4,6mPnP2Pm which is one embodiment of the present invention are detected mainly around m/z=252 and m/z=276.

FIGS. 98C and 98D show that a peak of a product ion of a partial skeleton of 4,6mPnP2Pm which is one embodiment of the present invention is detected mainly around m/z=571 and peaks derived from precursor ions are detected around m/z=585 and m/z=595. Note that the results in FIGS. 98C and 98D show characteristics derived from 4,6mPnP2Pm and therefore can be regarded as important data for identifying 4,6mPnP2Pm contained in the mixture.

Figure 11A:
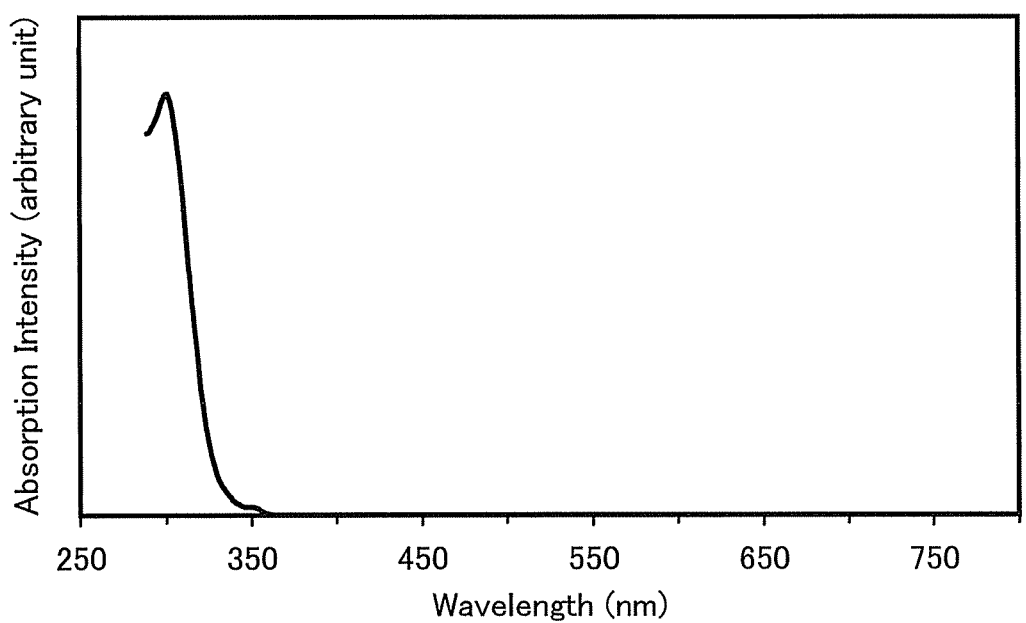
FIGS. 11A and 11B show an absorption spectrum and an emission spectrum of 4,6mPnP2Pm in a toluene solution of 4,6mPnP2Pm.
Figure 11B:
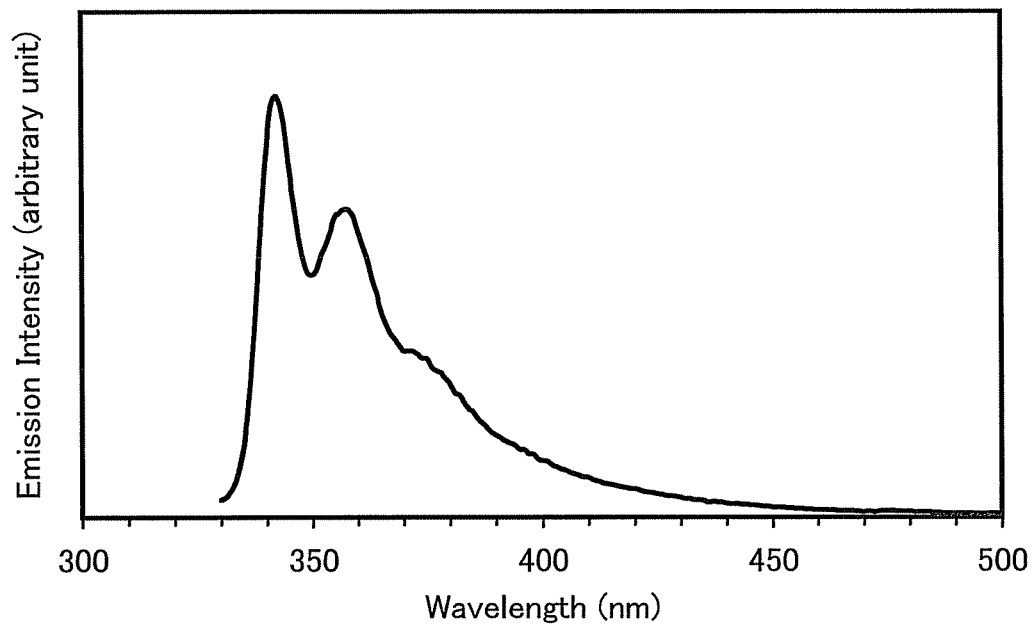
Figure 12A:
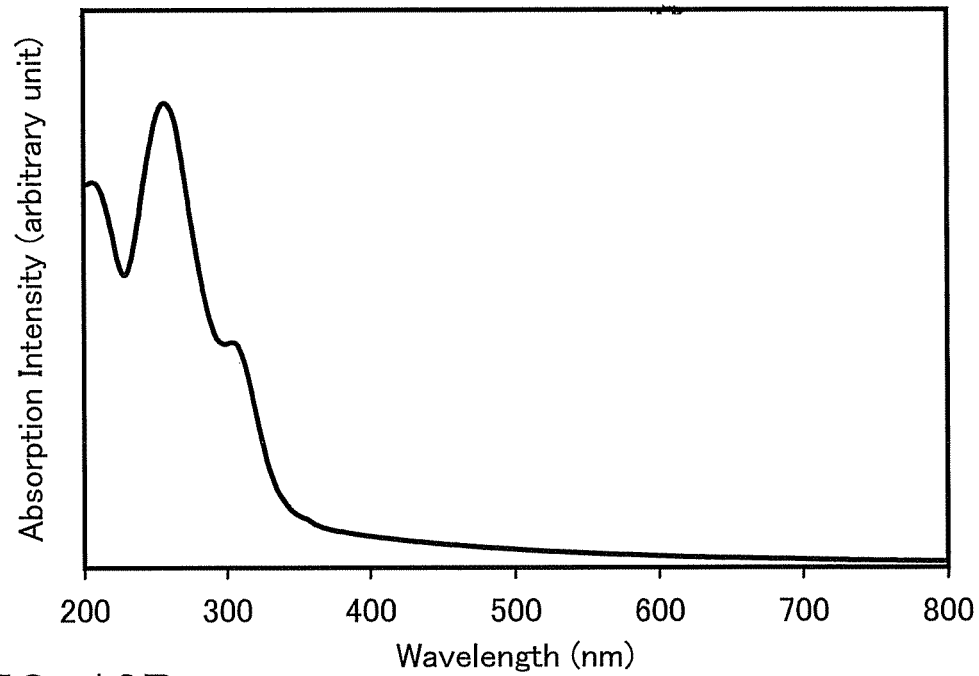
FIGS. 12A and 12B show an absorption spectrum and an emission spectrum of a thin film of 4,6mPnP2Pm.
Figure 12B:
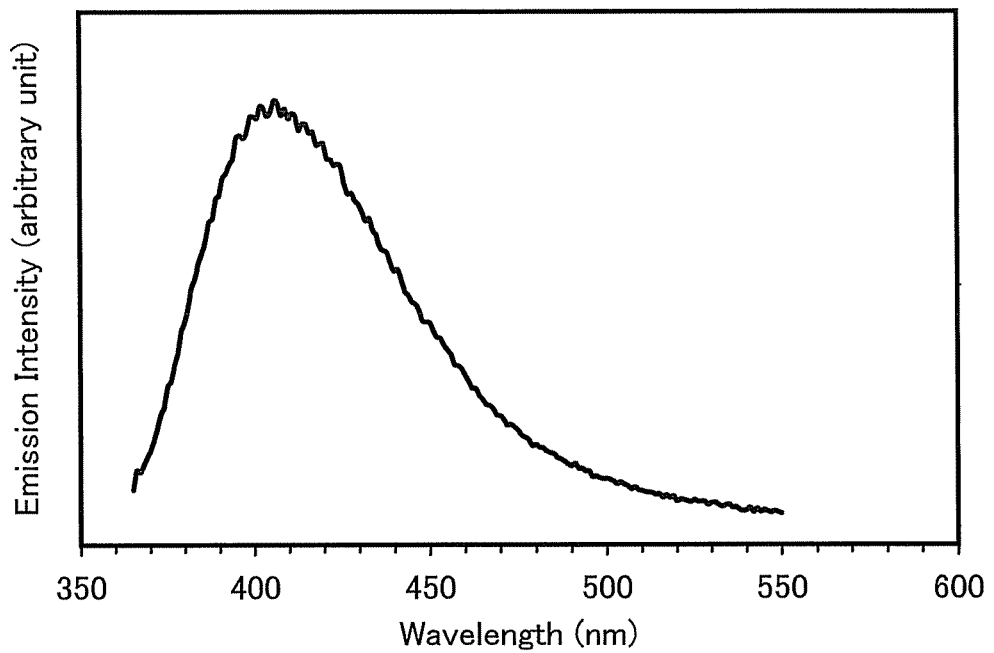

FIG. 11A shows an absorption spectrum of 4,6mPnP2Pm in a toluene solution of 4,6mPnP2Pm and FIG. 11B shows an emission spectrum thereof. FIG. 12A shows an absorption spectrum of a thin film of 4,6mPnP2Pm and FIG. 12B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 11A and 11B and FIGS. 12A and 12B, the horizontal axis represents wavelength (nm) and the vertical axis represents intensity (arbitrary unit). In the case of the toluene solution, the absorption peaks were observed around 281 nm and 299 nm, and the emission wavelength peaks are observed around 322 nm, 342 nm, and 357 nm. In the case of the thin film, the absorption peaks are observed around 206 nm, 257 nm, 304 nm, and 353 nm, and the emission wavelength peak is observed around 406 nm.

Further, the glass transition temperature of 4,6mPnP2Pm synthesized in this example was measured with a differential scanning calorimeter (DSC). According to the measurement results, the glass transition temperature of 4,6mPnP2Pm was 126° C. In this manner, 4,6mPnP2Pm has a high glass transition temperature and favorable heat resistance. Moreover, the crystallization peak does not exist, which means that 4,6mPnP2Pm is difficult to crystallize.

Further, the electrochemical characteristics of 4,6mPnP2Pm (thin film) were measured (measurement instrument: AC-2, produced by Riken Keiki Co., Ltd). Note that the electrochemical characteristics were measured as described below.

The value of the HOMO level was obtained by conversion of a value of the ionization potential measured with a photoelectron spectrometer (AC-2, manufactured by Riken Keiki Co., Ltd.) in the air into a negative value. The value of the LUMO level was obtained in such a manner that the absorption edge, which is obtained from Tauc plot with an assumption of direct transition, using data on the absorption spectrum of the thin film which is shown in this example, is regarded as an optical energy gap and is added to the value of the HOMO level.

According to the measurement results of the electrochemical characteristics, the highest occupied molecular orbital (HOMO level) of 4,6mPnP2Pm (thin film) is −5.95 eV, the lowest unoccupied molecular orbital level (LUMO level) thereof is −2.70 eV, and the band gap (Bg) thereof is 3.25 eV.

The above results show that 4,6mPnP2Pm has a relatively deep HOMO level, a relatively shallow LUMO level, and a relatively wide Bg.

EXAMPLE 2

In this example, a synthesis method of 4,6-bis[3-(naphthalen-1-yl)phenyl]-2-phenylpyrimidine (abbreviation: 2Ph-4,6mNP2Pm) represented by Structural Formula (311) will be described.

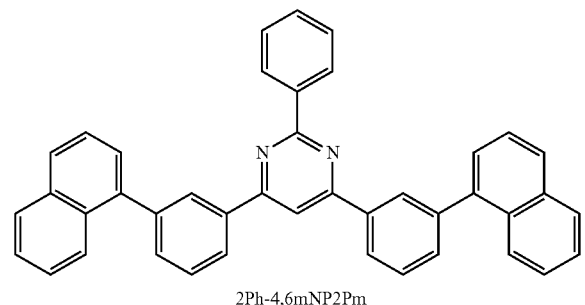

(311)
2Ph-4,6mNP2Pm

Synthesis of 4,6-Bis[3-(naphthalen-1-yl)phenyl]-2-phenylpyrimidine (abbreviation: 2Ph-4,6mNP2Pm)

A synthesis scheme of 4,6-bis[3-(naphthalen-1-yl)phenyl]-2-phenylpyrimidine (abbreviation: 2Ph-4,6mNP2Pm) is shown in (D-1).

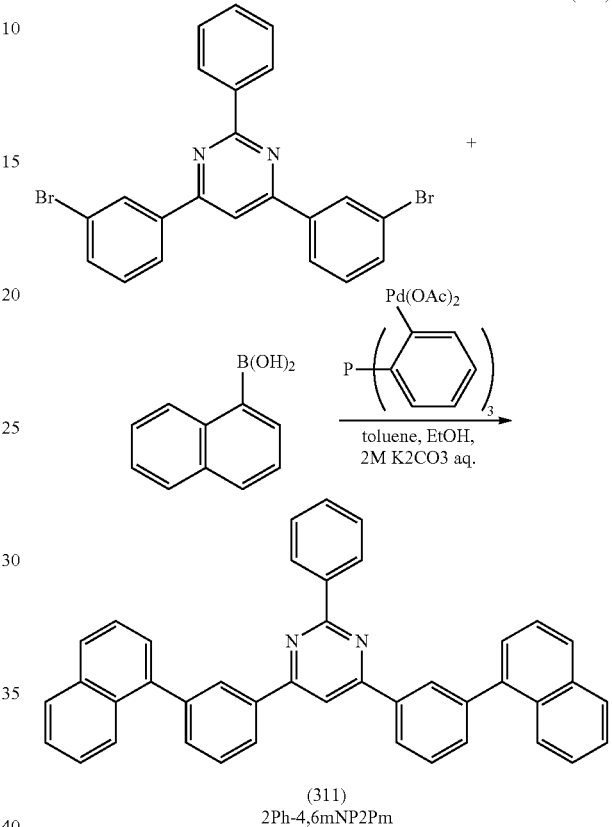

(311)
2Ph-4,6mNP2Pm

In a 100 mL three-neck flask were put 1.80 g (3.86 mmol) of 4,6-bis(3-bromophenyl)-2-phenylpyrimidine, 4.50 g (9.65 mmol) of 1-naphthaleneboronic acid, and 117 mg (386 μmol) of tris(2-methylphenyl)phosphine. To this mixture were added 10 mL of 2.0 M potassium carbonate solution, 15 mL of toluene, and 5 mL of ethanol. While the pressure was reduced, this mixture was stirred to be degassed. To this mixture was added 17 mg (77.2 μmol) of palladium(II) acetate, and the mixture was stirred at 90° C. under a nitrogen stream for 8 hours. After the stirring, the obtained mixture was filtered to collect a solid. The aqueous layer of the filtrate was extracted with toluene. The obtained solution of the extract and the organic layer were washed together with saturated saline, and then magnesium sulfate was added so that moisture was adsorbed. This mixture was separated by gravity filtration, and the filtrate was concentrated to give a solid. Toluene was added to the solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a solid. This solid was purified by silica gel column chromatography (developing solvent: hexane and then toluene and hexane in a 1:4 ratio). The obtained solid was recrystallized from toluene to give 1.84 g of a white solid which was a target substance in a yield of 85%.

By a train sublimation method, 1.66 g of the obtained solid was purified. The purification by sublimation was performed by heating at 260° C. under a pressure of 2.9 Pa with an argon flow rate of 5 mL/min. After the purification by sublimation, 1.52 g of a white solid was obtained at a collection rate of 92%.

This compound was identified as 4,6-bis[3-(naphthalen-1-yl)phenyl]-2-phenylpyrimidine (abbreviation: 2Ph-4,6mNP2Pm), which was a target substance, by nuclear magnetic resonance ($^1$H NMR) spectroscopy.

$^1$H NMR data of the obtained substance are as follows: $^1$H NMR (CDCl$_3$, 300 MHz):δ=7.42-7.60 (m, 11H), 7.65-7.72 (m, 4H), 7.90-7.96 (m, 6H), 8.10 (s, 1H), 8.36-8.40 (m, 4H), 8.69-8.73 (m, 2H).

Figure 13A:
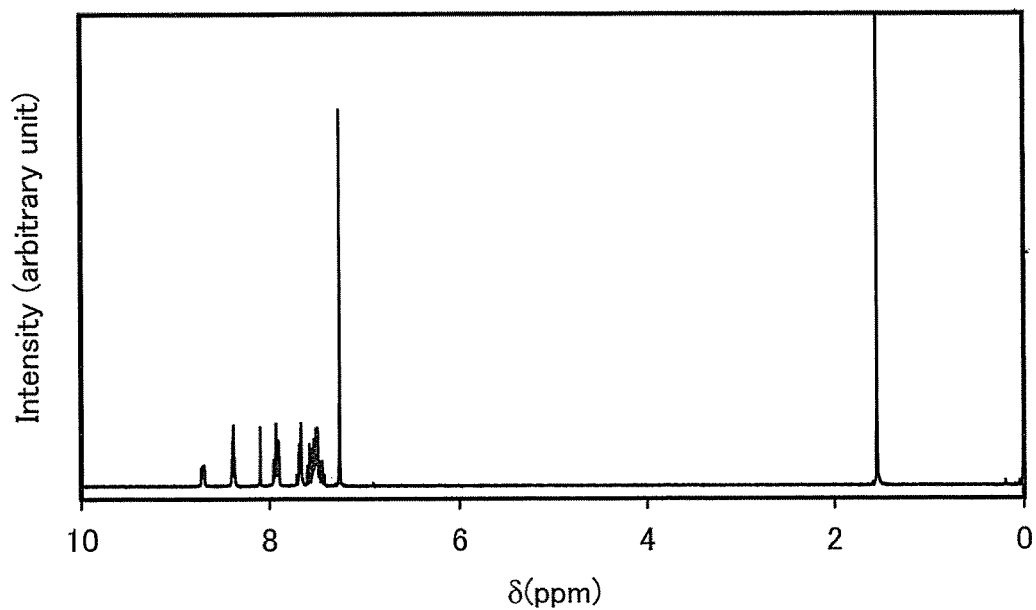
FIGS. 13A and 13B are $^1$H NMR charts of 2Ph-4,6mNP2Pm.
Figure 13B:
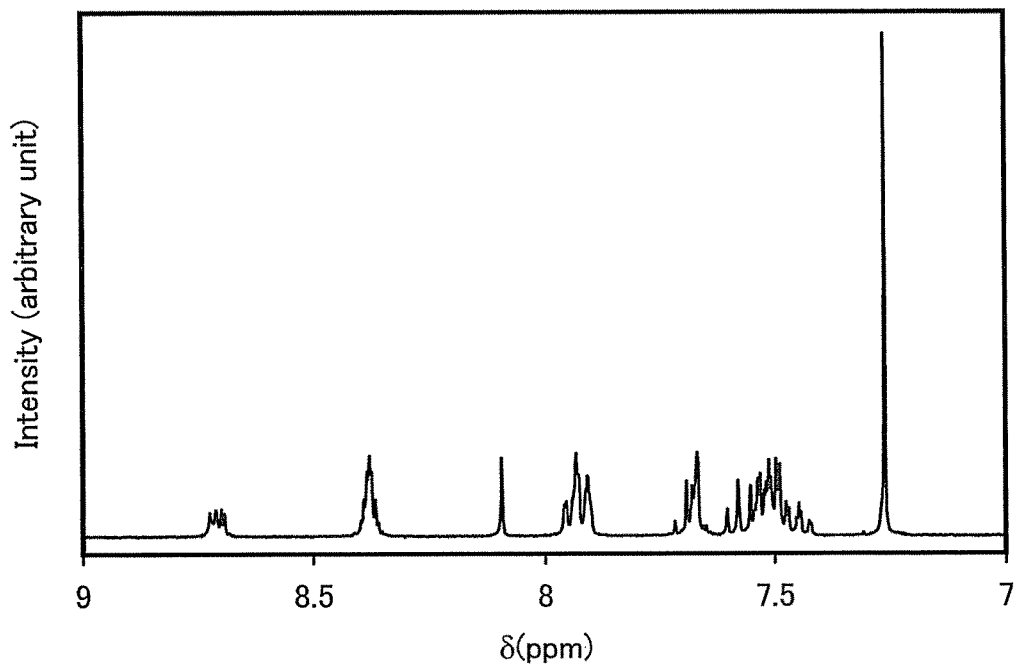

FIGS. 13A and 13B are $^1$H NMR charts. Note that FIG. 13B is a chart where the range of from 7.0 ppm to 9.5 ppm in FIG. 13A is enlarged.

Next, liquid chromatography mass spectrometry (LC/MS) was performed on 4,6-bis[3-(naphthalen-1-yl)phenyl]-2-phenylpyrimidine (abbreviation: 2Ph-4,6mNP2Pm) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 2Ph-4,6mNP2Pm was dissolved in toluene at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after minutes was 95:5. The composition ratio was changed linearly.

In the MS, ionization was carried out by an electrospray ionization (ESI) method; the capillary voltage and the sample cone voltage were set to 3.0 kV and 30 V, respectively; detection was carried out in a positive mode. The mass range for the measurement was m/z=100 to 1200.

Figure 99:
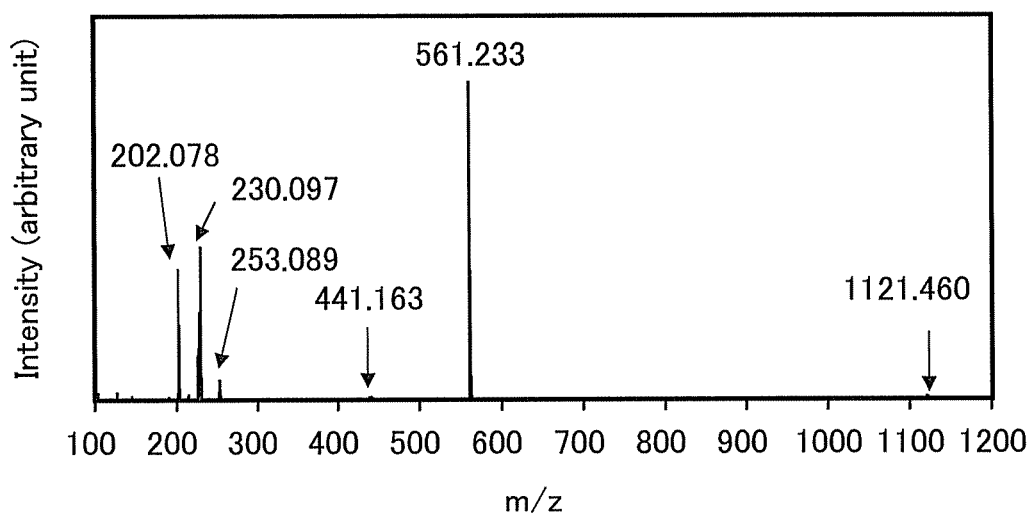
FIG. 99 shows LC-MS measurement results of 2Ph-4,6mNP2Pm.

A component with m/z of 560.23 which underwent the separation and the ionization under the above-described conditions was collided with an argon gas in a collision cell to dissociate into product ions. Energy (collision energy) for the collision with argon was 70 eV. FIG. 99 shows the results of the MS of the dissociated product ions by time-of-flight (TOF) mass spectrometry.

The results in FIG. 99 show that as for 2Ph-4,6mNP2Pm which is one embodiment of the present invention, peaks of product ions of a partial skeleton are detected mainly around m/z=202, m/z=230, m/z=253, and m/z=441, a peak derived from a precursor ion is detected around m/z=561, and a peak derived from a dimer ion is detected around m/z=1121. Note that the results in FIG. 99 show characteristics derived from 2Ph-4,6mNP2Pm and therefore can be regarded as important data for identifying 2Ph-4,6mNP2Pm contained in the mixture.

A fragment around m/z=441 is probably a product ion generated due to cleavage of a pyrimidine ring in 2Ph-4,6mNP2Pm (a phenyl group at the 2-position is lost at the same time as the cleavage). A pattern of such a product ion is one of the characteristics of the organic compound of one embodiment of the present invention, in which the 4-position and the 6-position of a pyrimidine ring are substituted. Therefore, it is indicated that 2Ph-4,6mNP2Pm of one embodiment of the present invention has a pyrimidine ring in which the 4-position and the 6-position are substituted.

Figure 14A:
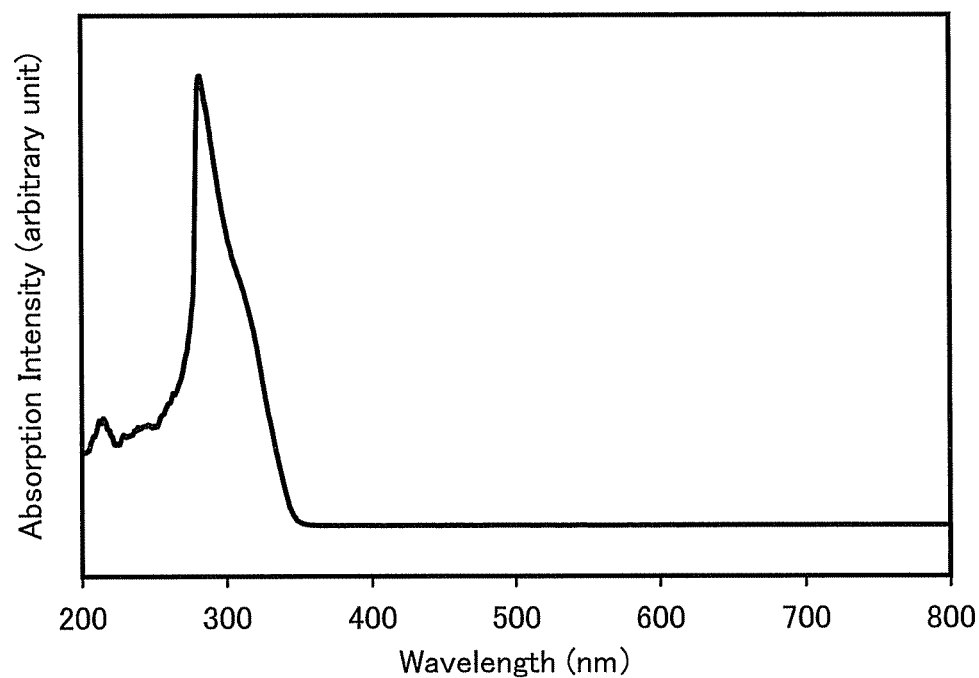
FIGS. 14A and 14B show an absorption spectrum and an emission spectrum of 2Ph-4,6mNP2Pm in a toluene solution of 2Ph-4,6mNP2Pm.
Figure 14B:
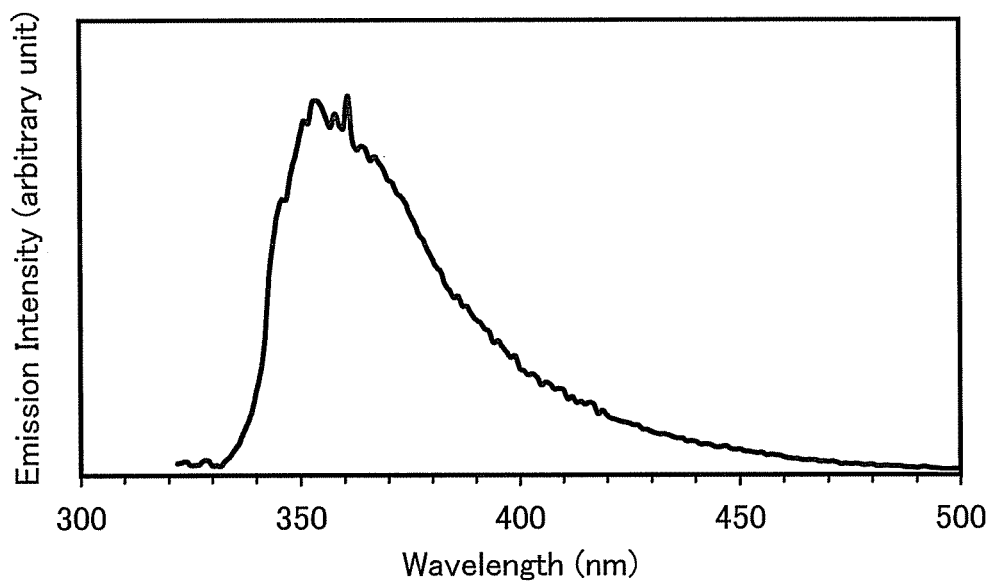
Figure 15A:
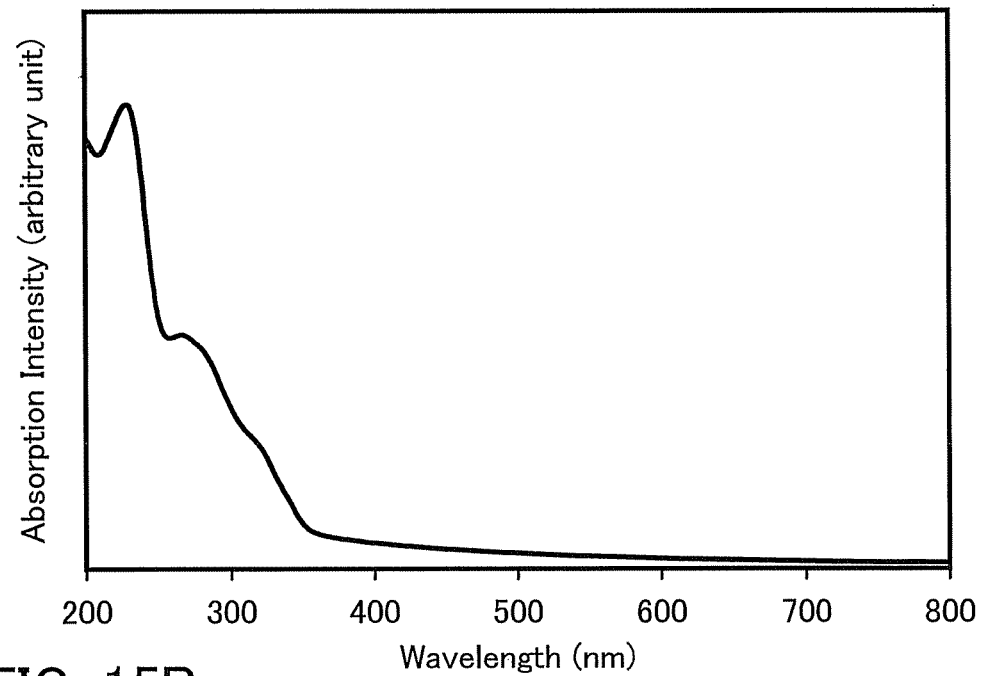
FIGS. 15A and 15B show an absorption spectrum and an emission spectrum of a thin film of 2Ph-4,6mNP2Pm.
Figure 15B:
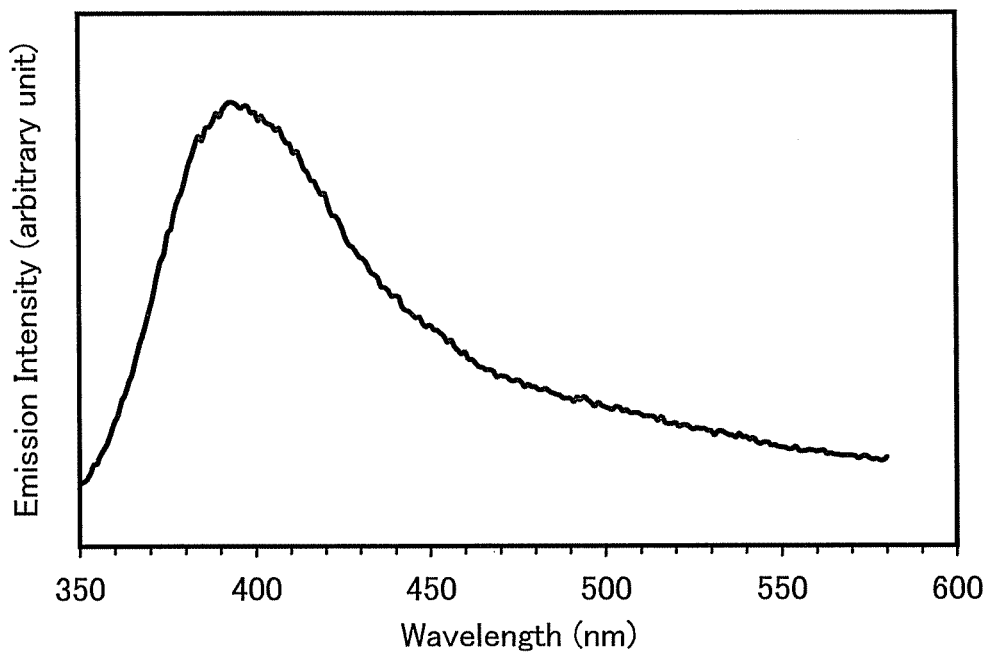

FIG. 14A shows an absorption spectrum of 2Ph-4,6mNP2Pm in a toluene solution of 2Ph-4,6mNP2Pm, and FIG. 14B shows an emission spectrum thereof. FIG. 15A shows an absorption spectrum of a thin film of 2Ph-4,6mNP2Pm and FIG. 15B shows an emission spectrum thereof. The absorption spectrum was measured with a UV-visible spectrophotometer (V550, produced by JASCO Corporation). The measurements were performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 14A and 14B and FIGS. 15A and 15B, the horizontal axis represents wavelength (nm) and the vertical axis represents intensity (arbitrary unit). In the case of the toluene solution, the absorption peak is observed around 282 nm, and the emission wavelength peak is observed around 361 nm. In the case of the thin film, the absorption peaks are observed around 228 nm, 266 nm, 279 nm, 316 nm, and 357 nm, and the emission wavelength peak is observed around 393 nm.

EXAMPLE 3

In this example, a synthesis method of 4,6-bis[3-(triphenylen-2-yl)phenyl]pyrimidine (abbreviation: 4,6mTpP2Pm) represented by Structural Formula (314) will be described.

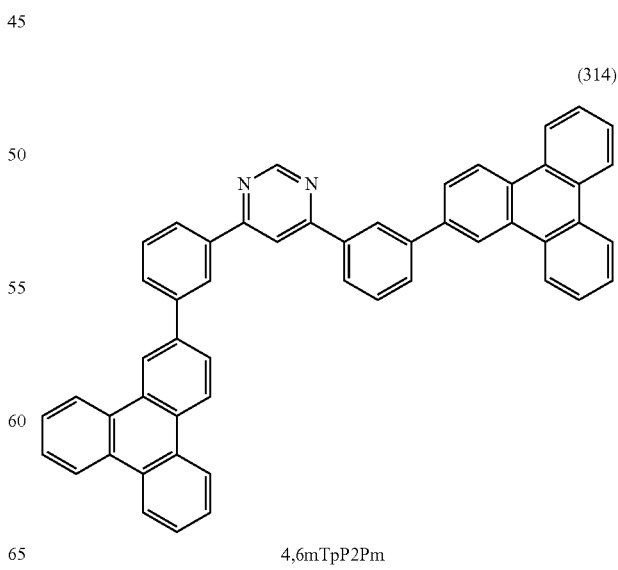

(314)

4,6mTpP2Pm

Synthesis of 4,6-Bis[3-(triphenylen-2-yl)phenyl]pyrimidine (abbreviation: 4,6mTpP2Pm)

A synthesis scheme of 4,6-bis[3-(triphenylen-2-yl)phenyl]pyrimidine (abbreviation: 4,6mTpP2Pm) is shown in (E-1).

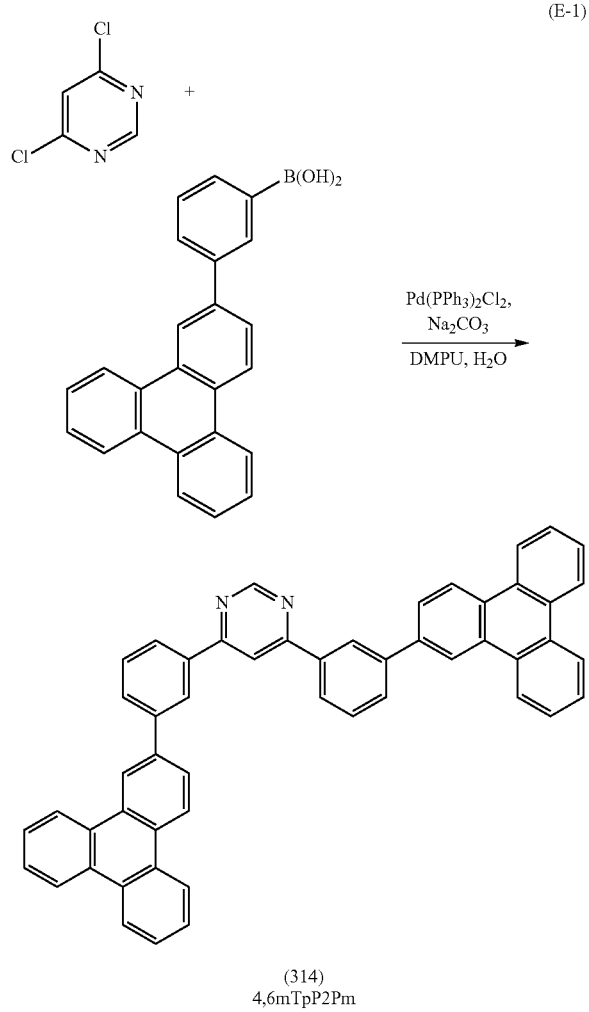

(314)
4,6mTpP2Pm

In a 100 mL round-bottom flask were put 0.65 g (4.38 mmol) of 4,6-dichloropyrimidine, 3.83 g (11.0 mmol) of 3-(triphenylen-2-yl)phenylboronic acid, and 2.33 g (22.0 mmol) of sodium carbonate. To this mixture were added 20 mL of 1,3-dimethyl-3,4,5,6-tetrahydro-2(1H)-pyrimidinone (abbreviation: DMPU) and 10 mL of water. While the pressure was reduced, this mixture was stirred to be degassed. To this mixture was added 41 mg (52.6 μmol) of bis(triphenylphosphine)palladium(II) dichloride, and the atmosphere was replaced with argon. This reaction container was heated by irradiation with microwaves (2.45 GHz, 100 W) under an argon stream for 1.5 hours. After the heating, water was added to the mixture, and the obtained mixture was filtered to give a residue. The obtained solid was washed with ethanol. Toluene was added to the solid, and the obtained mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a white solid. This solid was purified by silica gel column chromatography (developing solvent: hexane and then toluene and ethyl acetate in a 10:1 ratio). The obtained solid was recrystallized from toluene to give 1.12 g of a white solid which was a target substance in a yield of 37%.

By a train sublimation method, 0.88 g of the obtained solid was purified. The purification by sublimation was performed by heating at 370° C. under a pressure of 2.8 Pa with an argon flow rate of 5 mL/min. After the purification by sublimation, 0.71 g of a pale yellow solid was obtained at a collection rate of 81%.

This compound was identified as 4,6-bis[3-(triphenylen-2-yl)phenyl]pyrimidine (abbreviation: 4,6mTpP2Pm), which was a target substance, by nuclear magnetic resonance ($^1$H NMR) spectroscopy.

$^1$H NMR data of the obtained substance are as follows: $^1$H NMR (CDCl$_3$, 300 MHz): δ=7.66-7.76 (m, 10H), 7.98-8.02 (m, 4H), 8.23 (d, J1=7.8H, 2H), 8.34 (s, 1H), 8.62-8.81 (m, 12H), 8.95 (s, 2H), 9.46 (s, 1H).

Figure 16A:
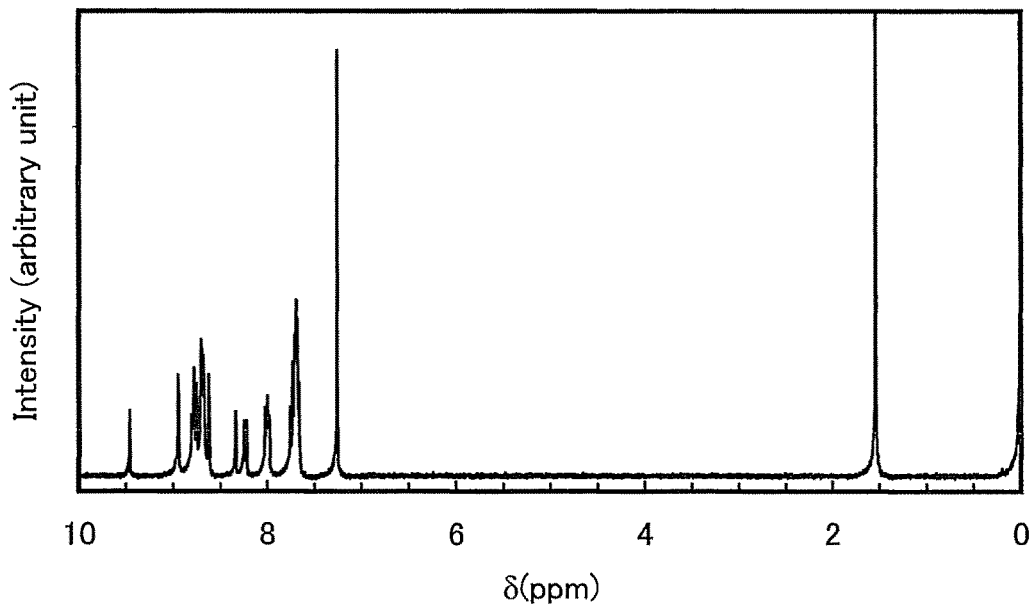
FIGS. 16A and 16B are $^1$H NMR charts of 4,6mTpP2Pm.
Figure 16B:
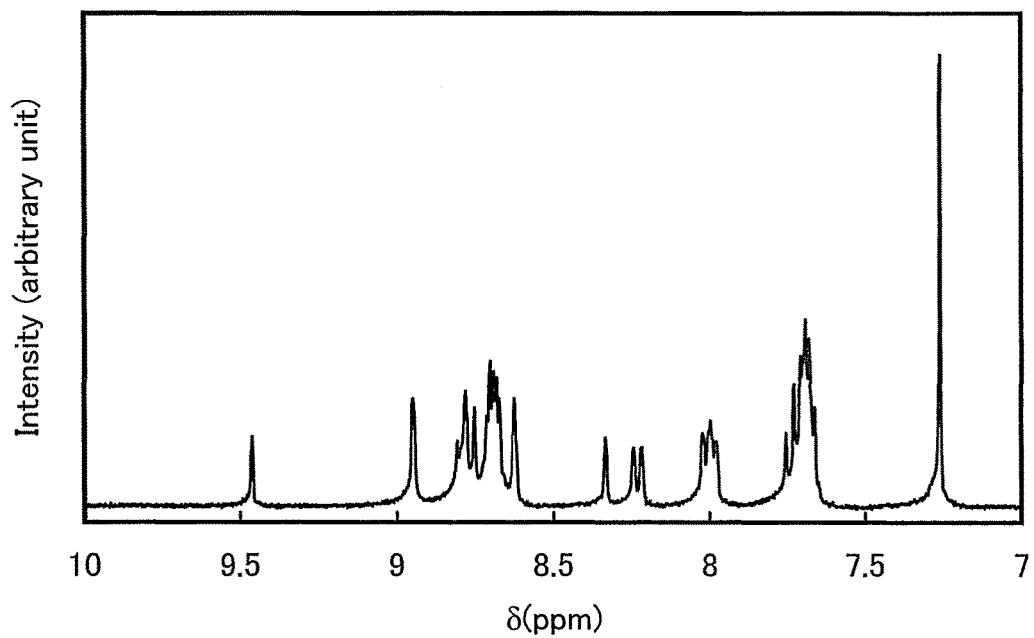

FIGS. 16A and 16B are $^1$H NMR charts. Note that FIG. 16B is a chart where the range of from 7.0 ppm to 9.5 ppm in FIG. 16A is enlarged.

Next, liquid chromatography mass spectrometry (LC/MS) was performed on 4,6-bis[3-(triphenylen-2-yl)phenyl]pyrimidine (abbreviation: 4,6mTpP2Pm) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 4,6mTpP2Pm was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after 10 minutes was 95:5. The composition ratio was changed linearly.

In the MS, ionization was carried out by an electrospray ionization (ESI) method; the capillary voltage and the sample cone voltage were set to 3.0 kV and 30 V, respectively; detection was carried out in a positive mode. The mass range for the measurement was m/z=100 to 1200.

Figure 100:
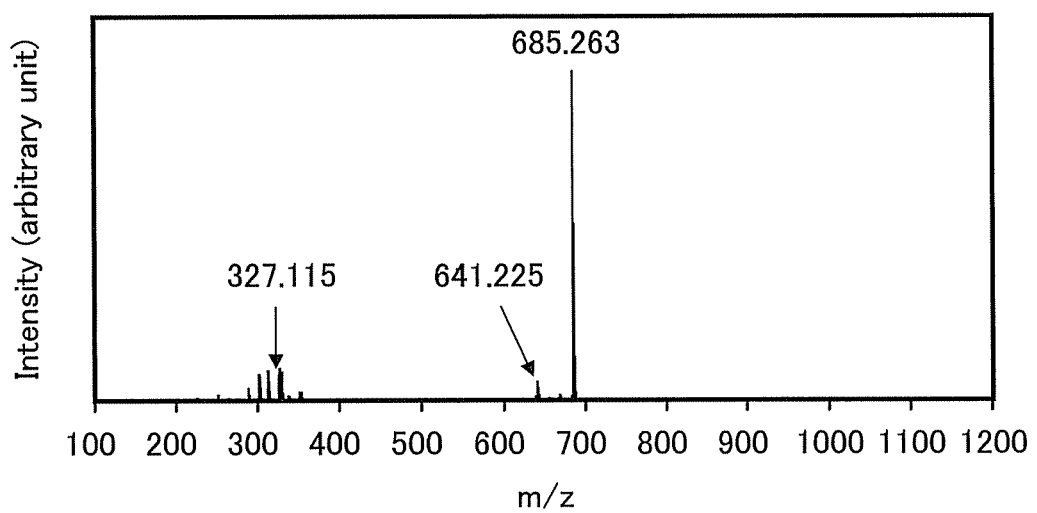
FIG. 100 shows LC-MS measurement results of 4,6mTpP2Pm.

A component with m/z of 684.26 which underwent the separation and the ionization under the above-described conditions was collided with an argon gas in a collision cell to dissociate into product ions. Energy (collision energy) for the collision with argon was 70 eV. FIG. 100 shows the results of the MS of the dissociated product ions by time-of-flight (TOF) mass spectrometry.

The results in FIG. 100 show that as for 4,6mTpP2Pm which is one embodiment of the present invention, peaks of product ions of a partial skeleton are detected mainly around m/z=327 and m/z=641 and a peak derived from a precursor ion is detected around m/z=685. Note that the results shown in FIG. 100 show characteristics derived from 4,6mTpP2Pm and therefore can be regarded as important data for identifying 4,6mTpP2Pm contained in the mixture.

A product ion around m/z=641 is probably a product ion generated due to cleavage of a pyrimidine ring in 4,6mTpP2Pm. A pattern of such a product ion is one of the characteristics of the organic compound of one embodiment of the present invention, in which the 4-position and the 6-position of a pyrimidine ring are substituted. Therefore, it is indicated that 4,6mTpP2Pm of one embodiment of the present invention has a pyrimidine ring whose 4-position and 6-position are substituted.

Figure 17A:
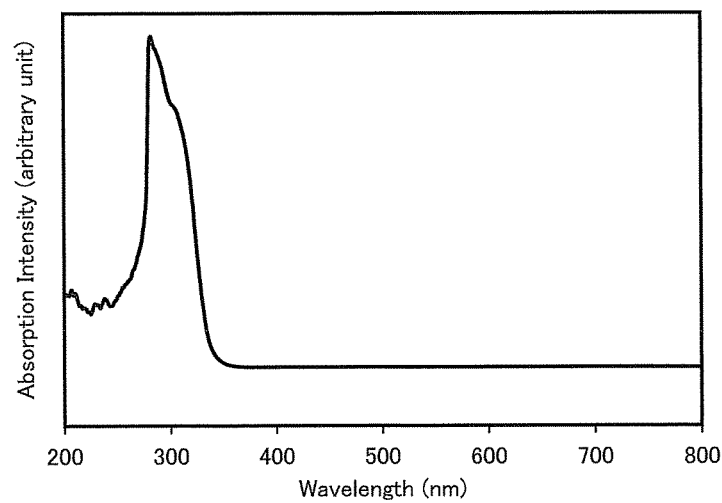
FIGS. 17A and 17B are an absorption spectrum and an emission spectrum of 4,6mTpP2Pm in a toluene solution of 4,6mTpP2Pm.
Figure 17B:
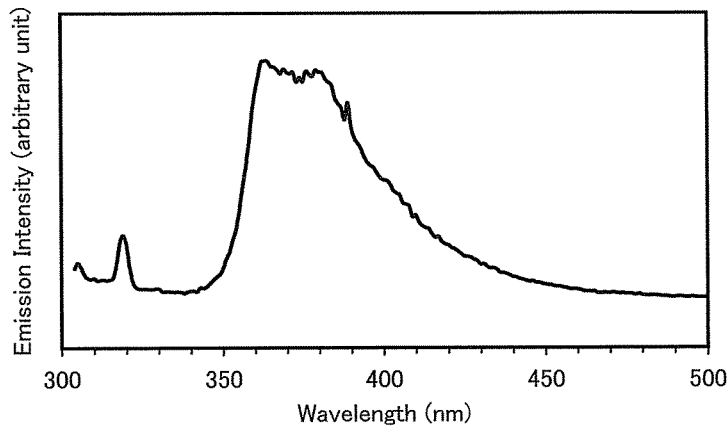
Figure 18A:
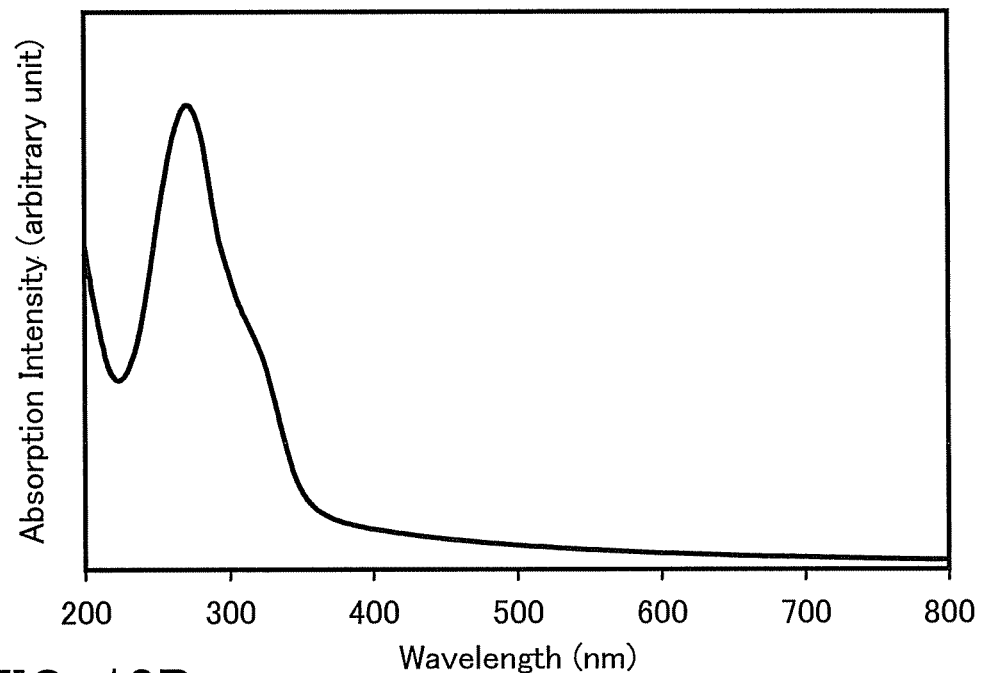
FIGS. 18A and 18B show an absorption spectrum and an emission spectrum of a thin film of 4,6mTpP2Pm.
Figure 18B:
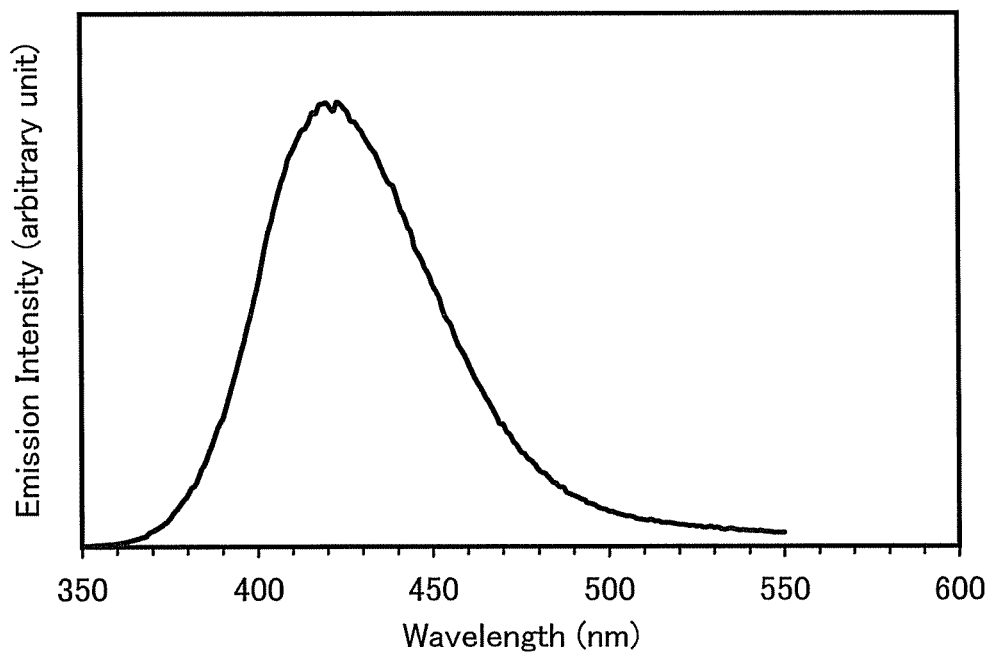

FIG. 17A shows an absorption spectrum of 4,6mTpP2Pm in a toluene solution of 4,6mTpP2Pm, and FIG. 17B shows an emission spectrum thereof. FIG. 18A shows an absorption spectrum of a thin film of 4,6mTpP2Pm and FIG. 18B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 17A and 17B and FIGS. 18A and 18B, the horizontal axis represents wavelength (nm) and the vertical axis represents intensity (arbitrary unit). In the case of the toluene solution, the absorption peak is observed around 281 nm, and the emission wavelength peak is observed around 363 nm. In the case of the thin film, the absorption peaks are observed around 271 nm and 320 nm, and the emission wavelength peak is observed around 423 nm.

EXAMPLE 4

In this example, a synthesis method of 4,6-bis[3-(dibenzothiophen-4-yl)phenyl]pyrimidine (abbreviation: 4,6mDBTP2Pm-II) represented by Structural Formula (400) will be described.

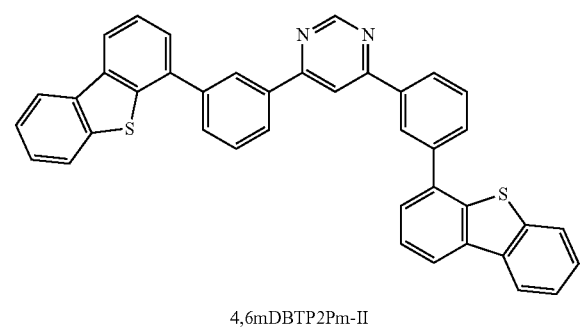

(400)
4,6mDBTP2Pm-II

Synthesis of 4,6-Bis[3-(dibenzothiophen-4-yl)phenyl]pyrimidine (abbreviation: 4,6mDBTP2Pm-II)

A synthesis scheme of 4,6-bis[3-(dibenzothiophen-4-yl)phenyl]pyrimidine (abbreviation: 4,6mDBTP2Pm-II) is shown in (F-1).

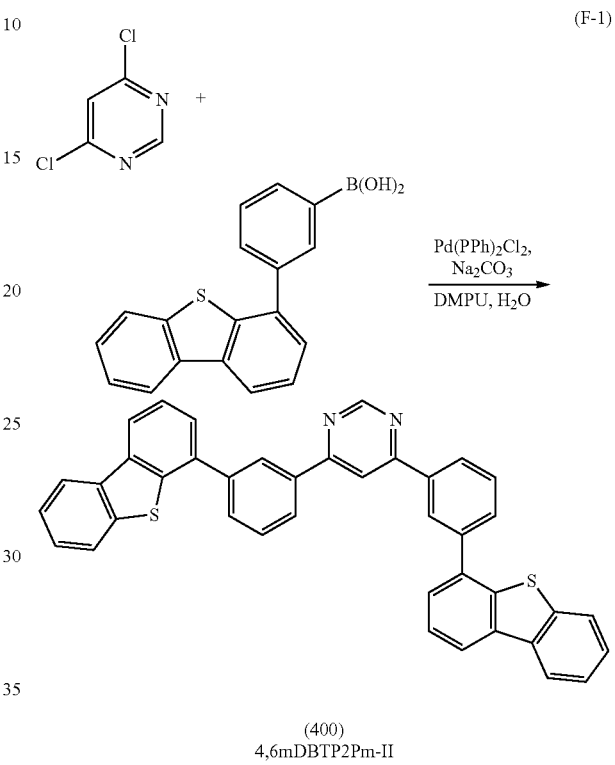

(F-1)

(400)
4,6mDBTP2Pm-II

In a 100 mL recovery flask were put 1.0 g (6.7 mmol) of 4,6-dichloropyrimidine, 5.1 g (17 mmol) of 3-(dibenzothiophen-4-yl)-phenylboronic acid, 3.5 g (34 mmol) of sodium carbonate, 20 mL of 1,3-dimethyl-3,4,5,6-tetrahydro-2(1H)-pyrimidinone (abbreviation: DMPU), and 10 mL of water. While the pressure was reduced, this mixture was stirred to be degassed. To this mixture was added 56 mg (81 μmol) of bis(triphenylphosphine)palladium(II) dichloride, and the atmosphere was replaced with argon. The mixture was stirred while the reaction container was heated by irradiation with microwaves (2.45 GHz, 100 W) for 1.5 hours. After the heating, water was added to the mixture, and the mixture was filtered to give a residue. The obtained solid was washed with dichloromethane and ethanol. Toluene was added to the obtained solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a solid. The obtained solid was recrystallized from toluene to give 2.52 g of a white solid which was a target substance in a yield of 63%.

By a train sublimation method, 2.50 g of the obtained solid was purified. The purification by sublimation was performed by heating at 300° C. under a pressure of 3.6 Pa with an argon flow rate of 5 mL/min. After the purification by sublimation, 1.98 g of a white solid was obtained at a collection rate of 79%.

This compound was identified as 4,6-bis[3-(dibenzothiophen-4-yl)phenyl]pyrimidine (abbreviation: 4,6mDBTP2Pm-II), which was a target substance, by nuclear magnetic resonance ($^1$H NMR) spectroscopy.

$^1$H NMR data of the obtained substance are as follows: $^1$H NMR (CDCl$_3$, 300 MHz):δ=7.41-7.51 (m, 4H), 7.58-7.62 (m, 4H), 7.68-7.79 (m, 4H), 8.73 (dt, J1=8.4 Hz, J2=0.9 Hz, 2H), 8.18-8.27 (m, 7H), 8.54 (t, J1=1.5 Hz, 211), 9.39 (d, J1=0.9 Hz, 1H).

Figure 19A:
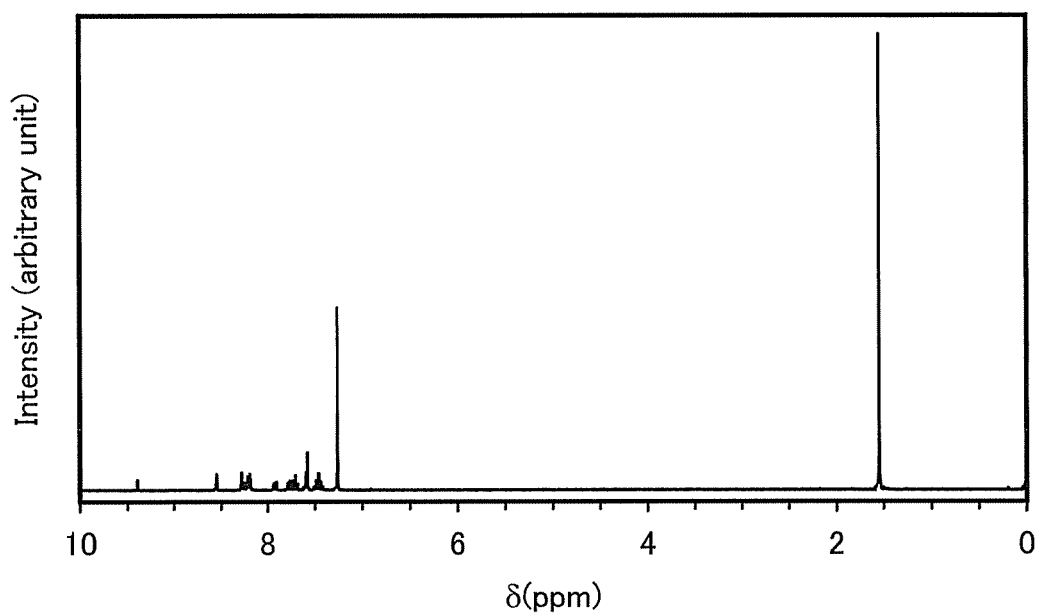
FIGS. 19A and 19B are $^1$H NMR charts of 4,6mDBTP2Pm-II.
Figure 19B:
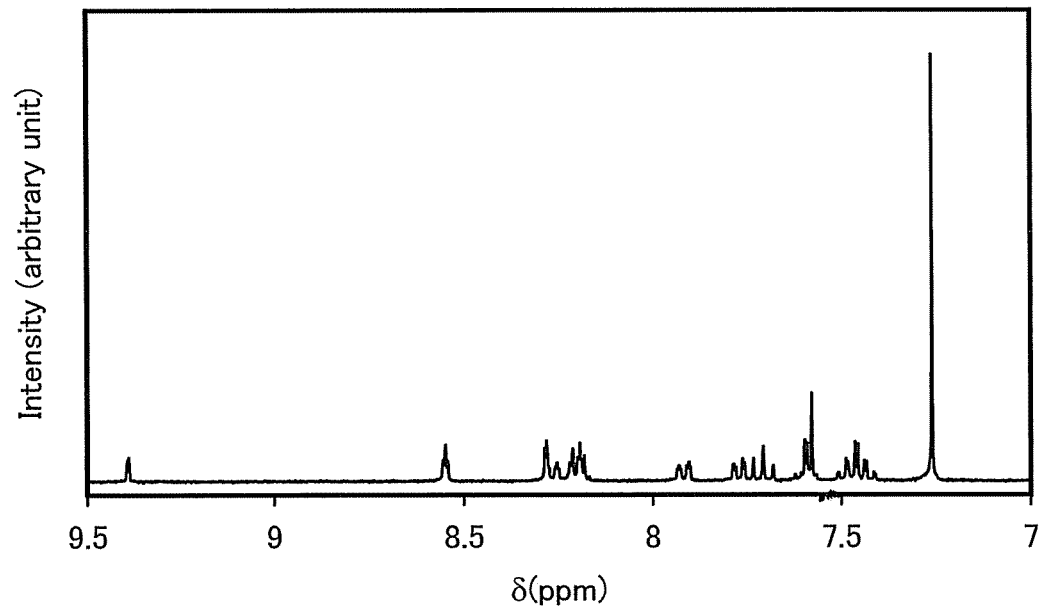

FIGS. 19A and 19B are $^1$H NMR charts. Note that FIG. 19B is a chart where the range of from 7.0 ppm to 9.5 ppm in FIG. 19A is enlarged.

Next, liquid chromatography mass spectrometry (LC/MS) was performed on 4,6-bis[3-(dibenzothiophen-4-yl)phenyl]pyrimidine (abbreviation: 4,6mDBTP2Pm-II) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 4,6mDBTP2Pm-II was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after 10 minutes was 95:5. The composition ratio was changed linearly.

In the MS, ionization was carried out by an electrospray ionization (ESI) method; the capillary voltage and the sample cone voltage were set to 3.0 kV and 30 V, respectively; detection was carried out in a positive mode. The mass range for the measurement was m/z=100 to 1200.

Figure 101:
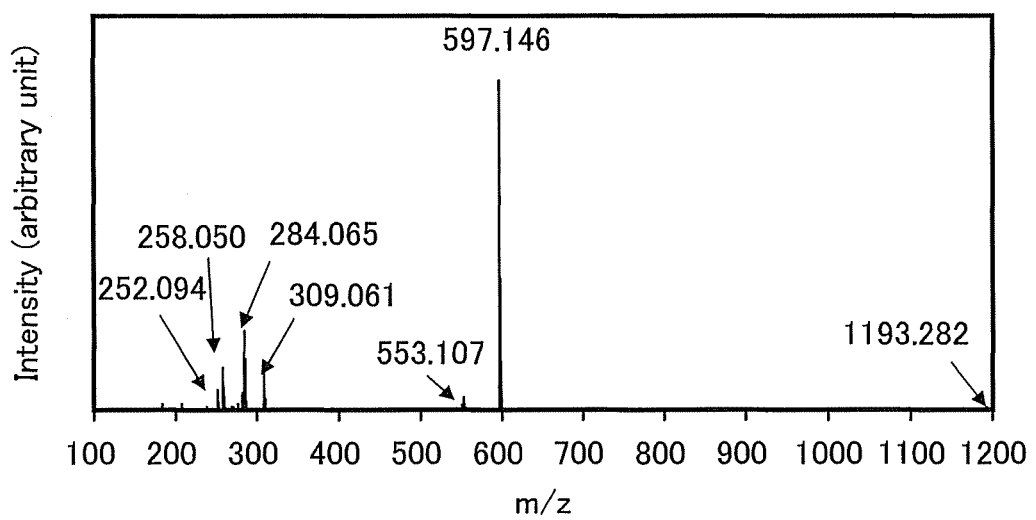
FIG. 101 shows LC-MS measurement results of 4,6mDBTP2Pm-II.

A component with m/z of 596.14 which underwent the separation and the ionization under the above-mentioned conditions was collided with an argon gas in a collision cell to dissociate into product ions. Energy (collision energy) for the collision with argon was 70 eV. FIG. 101 shows the results of the MS of the dissociated product ions by time-of-flight (TOF) mass spectrometry.

The results in FIG. 101 show that as for 4,6mDBTP2Pm-II which is one embodiment of the present invention, peaks of product ions of a partial skeleton are detected mainly around m/z=252, m/z=258, m/z=284, m/z=309, and m/z=553, a peak derived from a precursor ion is detected around m/z=597, and a peak derived from a dimer ion is detected around m/z=1193. Note that the results in FIG. 101 show characteristics derived from 4,6mDBTP2Pm-II and therefore can be regarded as important data for identifying 4,6mDBTP2Pm-II contained in the mixture.

A product ion around m/z=553 is probably a fragment generated due to cleavage of a pyrimidine ring in 4,6mDBTP2Pm-II. A pattern of such a product ion is one of the characteristics of the organic compound of one embodiment of the present invention, in which the 4-position and the 6-position of a pyrimidine ring are substituted. Therefore, it is indicated that 4,6mDBTP2Pm-II of one embodiment of the present invention has a pyrimidine ring whose 4-position and 6-position are substituted.

Further, 4,6mDBTP2Pm-II, which is one embodiment of the present invention), was measured with a time-of-flight secondary ion mass spectrometer (TOF-SIMS); FIGS. 102A to 102D show the obtained qualitative spectra (positive ions and negative ions).

Figure 102A:
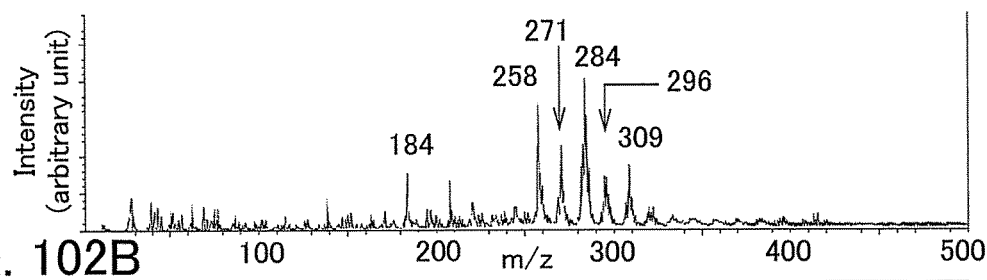
FIGS. 102A to 102D show ToF-SIMS measurement results of 4,6mDBTP2Pm-II.
Figure 102B:
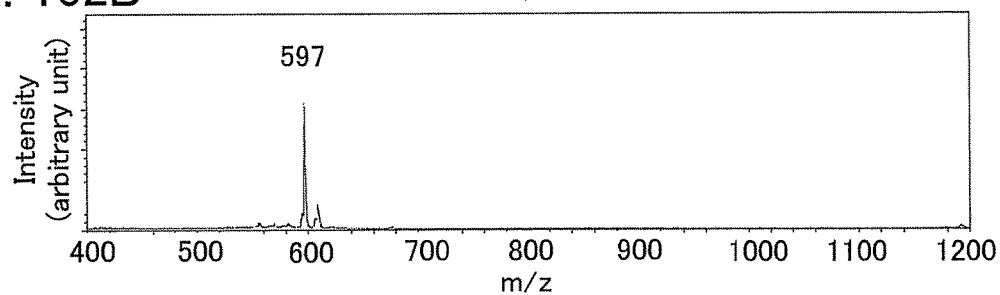
Figure 102C:
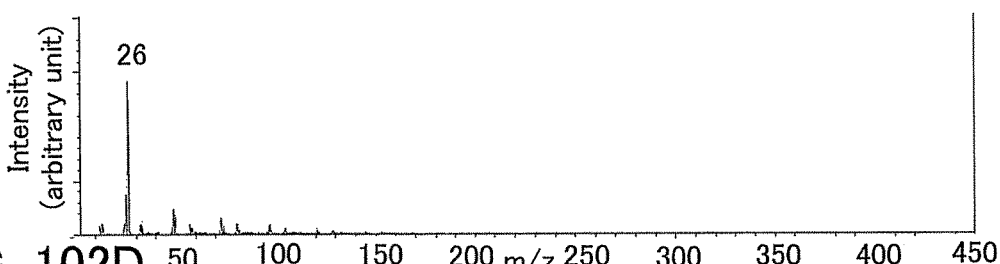
Figure 102D:
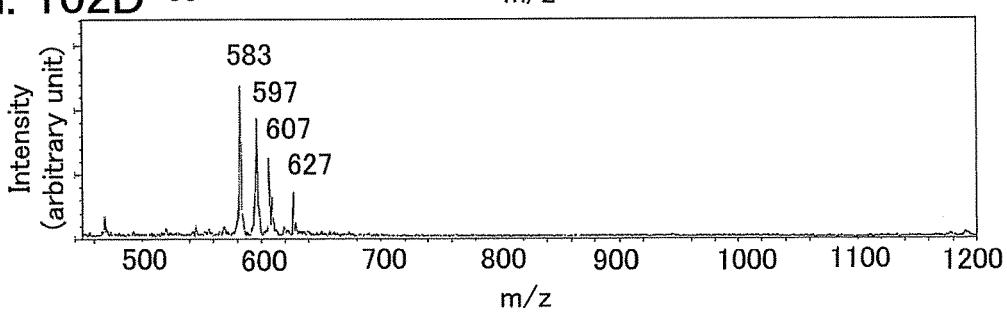

FIG. 102A shows measurement results obtained from positive ions. In FIG. 102A, the horizontal axis represents m/z ranging from 0 to 500 and the vertical axis represents intensity (arbitrary unit). FIG. 102B shows measurement results obtained from positive ions. In FIG. 102B, the horizontal axis represents m/z ranging from 400 to 1200 and the vertical axis represents intensity (arbitrary unit). FIG. 102C shows measurement results obtained from negative ions. In FIG. 102C, the horizontal axis represents m/z ranging from 0 to 500 and the vertical axis represents intensity (arbitrary unit). FIG. 102D shows measurement results obtained from negative ions. In FIG. 102D, the horizontal axis represents m/z ranging from 400 to 1200 and the vertical axis represents intensity (arbitrary unit).

TOF.SIMS 5 (produced by ION-TOF GmbH) was used as a measurement apparatus, and Bi$_3$$^{++}$ was used as a primary ion source. Note that irradiation with the primary ions was performed in a pulsed manner with a pulse width of 7 nm to 12 nm. The irradiation amount was greater than or equal to $8.2 \times 10^{10}$ ions/cm$^2$ and less than or equal to $6.7 \times 10^{11}$ ions/cm$^2$ (less than or equal to $1 \times 10^{12}$ ions/cm$^2$), the acceleration voltage was 25 keV, and the current value was 0.2 pA. Powder of 4,6mDBTP2Pm-II was a sample for the measurement.

FIGS. 102A and 102B show that peaks of product ions of a partial skeleton of 4,6mDBTP2Pm-II which is one embodiment of the present invention are detected mainly around m/z=184, m/z=258, m/z=271, m/z=284, m/z=296, m/z=309, and m/z=597.

The results in FIGS. 102C and 102D show that as for 4,6mDBTP2Pm-II which is one embodiment of the present invention, a peak of a product ion of a partial skeleton is detected mainly around m/z=583 and peaks derived from precursor ions are detected around m/z=597, m/z=607, and m/z=627. Note that the results in FIGS. 102C and 102D show characteristics derived from 4,6mDBTP2Pm-II and therefore can be regarded as important data for identifying 4,6mDBTP2Pm-II contained in the mixture.

Further, 4,6mDBTP2Pm-II of one embodiment of the present invention was measured by a GC-MS detector (ITQ1100 Ion Trap GC-MS" Direct Exposure Probe (DEP) system), produced by Thermo Fisher Scientific Inc. The mode, the ionization voltage, the emission current, and the electron lens were EI+, 70 eV, 250 μA, and 15 V, respectively. The sample temperature was increased to 1000° C. at a rate of 10° C./sec. The measurement results show that peaks of product ions of a partial skeleton of 4,6mDBTP2Pm-II (m/z=596.14) which is one embodiment of the present invention are detected mainly around m/z=184, m/z=282, m/z=298, m/z=310, m/z=552, and m/z=568 and that a peak derived from a precursor ion is detected around m/z=596. Note that the results show characteristics derived from 4,6mDBTP2Pm-II and therefore can be regarded as important data for identifying 4,6mDBTP2Pm-II contained in the mixture.

The product ion around m/z=184 is probably a fragment derived from dibenzothiophene in 4,6mDBTP2Pm-II. A pattern of such a product ion is one of the characteristics of the organic compound having a dibenzothiophene skeleton, which is one embodiment of the present invention. Therefore, it is indicated that 4,6mDBTP2Pm-II of one embodiment of the present invention has a dibenzothiophene skeleton.

The product ions around m/z=552 and m/z=568 are probably fragments generated due to cleavage of a pyrimidine ring in 4,6mDBTP2Pm-II. A pattern of such a product ion is one of the characteristics of the organic compound of one embodiment of the present invention, in which the 4-position and the 6-position of a pyrimidine ring are substituted. Therefore, it is indicated that 4,6mDBTP2Pm-II of one embodiment of the present invention has a pyrimidine ring whose 4-position and 6-position are substituted.

Figure 20A:
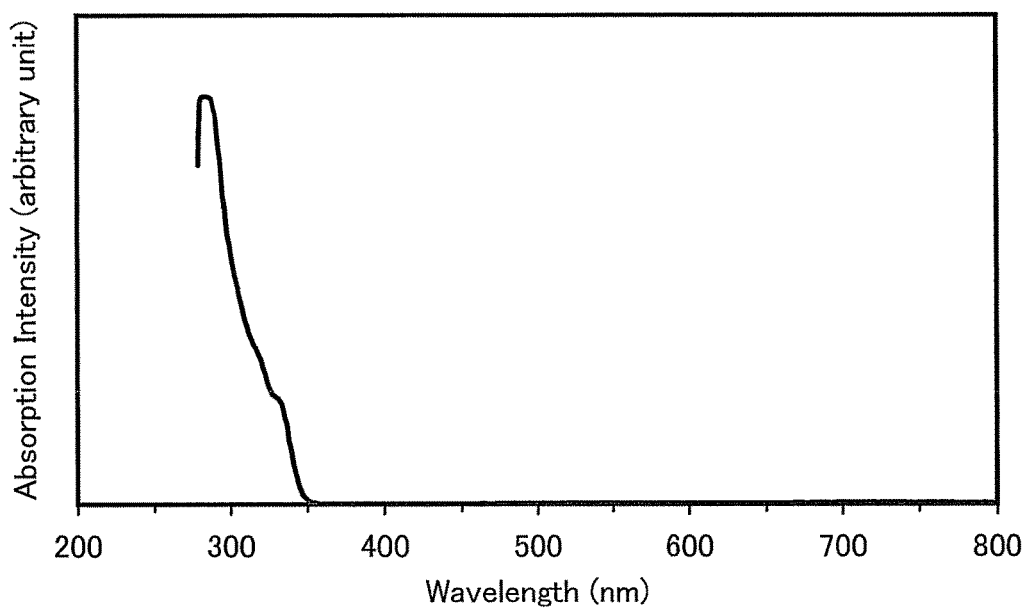
FIGS. 20A and 20B show an absorption spectrum and an emission spectrum of 4,6mDBTP2Pm-II in a toluene solution of 4,6mDBTP2Pm-II.
Figure 20B:
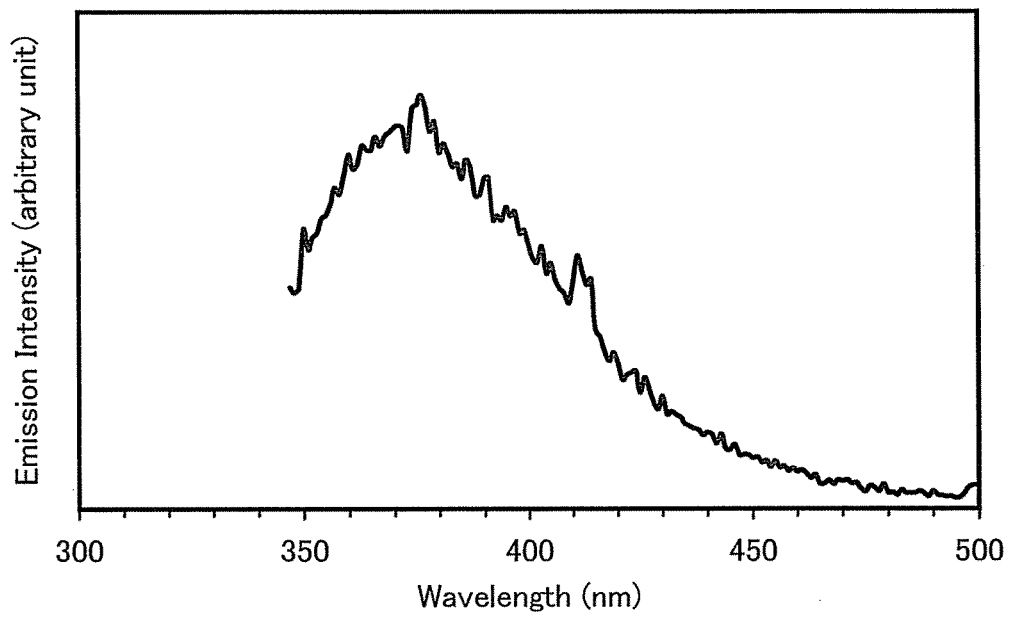
Figure 21A:
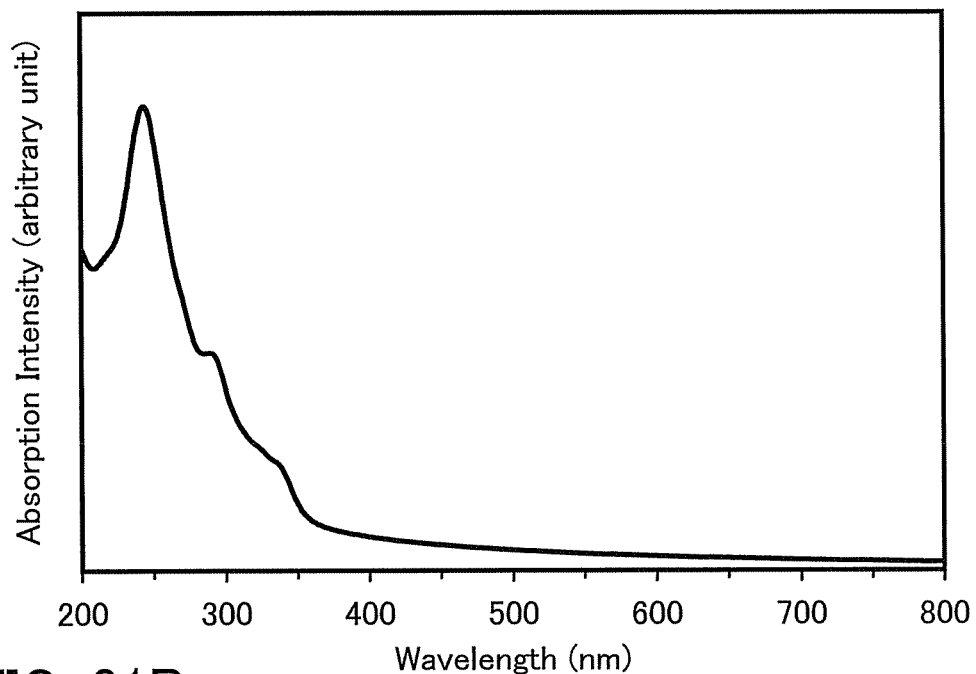
FIGS. 21A and 21B show an absorption spectrum and an emission spectrum of a thin film of 4,6mDBTP2Pm-II.
Figure 21B:
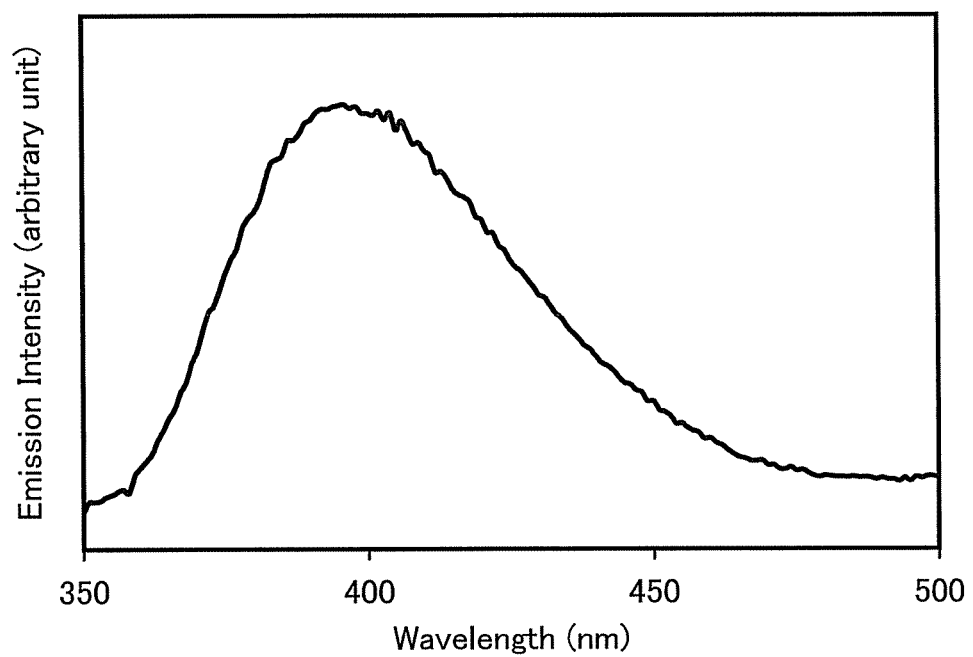

FIG. 20A shows an absorption spectrum of 4,6mDBTP2Pm-II in a toluene solution of 4,6mDBTP2Pm-II and FIG. 20B shows an emission spectrum thereof. FIG. 21A shows an absorption spectrum of a thin film of 4,6mDBTP2Pm-II and FIG. 21B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film.

In FIGS. 20A and 20B and FIGS. 21A and 21B, the horizontal axis represents wavelength (nm) and the vertical axis represents intensity (arbitrary unit). In the case of the toluene solution, the absorption peak is observed around 282 nm, and the emission wavelength peak is observed around 376 nm. In the case of the thin film, the absorption peaks are observed around 244 nm, 265 nm, 290 nm, 317 nm, and 334 nm, and the emission wavelength peak is observed around 396 nm.

EXAMPLE 5

In this example, a synthesis method of 2,4-bis[3-(dibenzothiophen-4-yl)phenyl]pyrimidine (abbreviation: 2,4mDBTP2Pm-II) represented by Structural Formula (401) will be described.

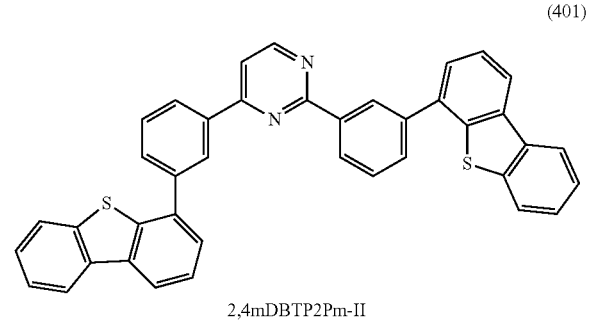 [SMILES: c1cc(-c2ccnc(-c3cccc(-c4cccc5c4sc4ccccc45)c3)n2)cc(-c2cccc3c2sc2ccccc23)c1]

(401)
2,4mDBTP2Pm-II

Synthesis of 2,4-Bis[3-(dibenzothiophen-4-yl)phenyl]pyrimidine (abbreviation: 2,4mDBTP2Pm-II)

A synthesis scheme of 2,4-bis[3-(dibenzothiophen-4-yl)phenyl]pyrimidine (abbreviation: 2,4mDBTP2Pm-II) is shown in (G-1).

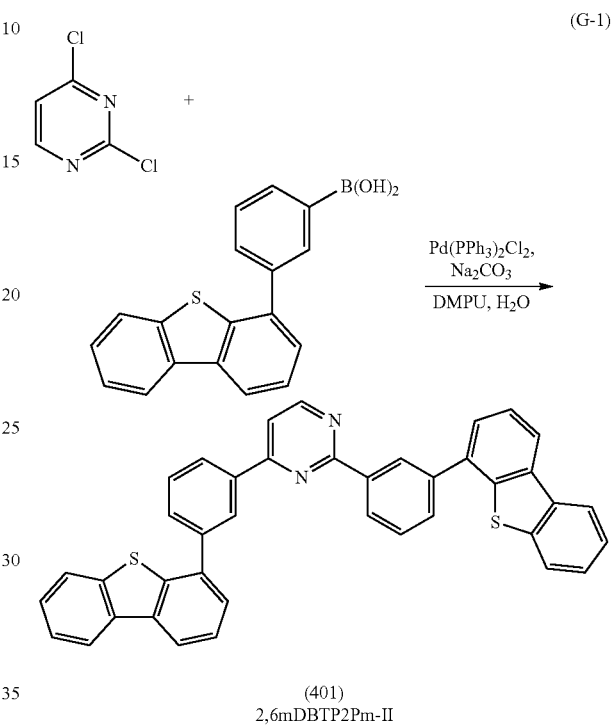

(401)
2,6mDBTP2Pm-II

In a 100 mL recovery flask were put 0.75 g (5.03 mmol) of 2,4-dichloropyrimidine, 3.82 g (12.6 mmol) of 3-(dibenzothiophen-4-yl)phenylboronic acid, and 2.67 g (25.2 mmol) of sodium carbonate. To this mixture were added 20 mL of 1,3-dimethyl-3,4,5,6-tetrahydro-2(1H)-pyrimidinone (abbreviation: DMPU) and 10 mL of water. While the pressure was reduced, this mixture was stirred to be degassed. To this mixture was added 42 mg (60.3 mmol) of bis(triphenylphosphine)palladium(II) dichloride, and the atmosphere was replaced with argon. This reaction container was heated by irradiation with microwaves (2.45 GHz, 100 W) under an argon stream for 55 minutes. After the heating, water was added to the mixture, and the mixture was filtered to give a residue. The obtained solid was washed with ethanol and dichloromethane. Toluene was added to the solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a white solid. This solid was purified by silica gel column chromatography (developing solvent, toluene). The obtained solid was recrystallized from toluene to give 1.87 g of a white solid which was a target substance in a yield of 62%.

By a train sublimation method, 1.80 g of the obtained solid was purified. The purification by sublimation was performed by heating at 300° C. under a pressure of 5.1 Pa with an argon flow rate of 10 mL/min. After the purification by sublimation, 1.98 g of a white solid was obtained at a collection rate of 68%.

This compound was identified as 2,4-bis[3-(dibenzothiophen-4-yl)phenyl]pyrimidine (abbreviation: 2,4mDBTP2Pm-II), which was a target substance, by nuclear magnetic resonance ($^1$H NMR) spectroscopy.

$^1$H NMR data of the obtained substance are as follows: $^1$H NMR (CDCl$_3$, 300 MHz):δ=7.39-7.76 (m, 13H), 7.90 (dt, J1=7.8 Hz, J2=1.5 Hz, 2H), 8.13-8.20 (m, 4H), 8.32 (dt, J1=8.1 Hz, J2=1.5 Hz, 1H), 8.68 (dt, J1=7.8 Hz, J2=1.5 Hz, 1H), 8.72 (t, J1=1.5 Hz, 1H), 8.92 (d, J1=5.4 Hz, 1H), 9.07 (t, J1=1.5 Hz, 1H).

Figure 22A:
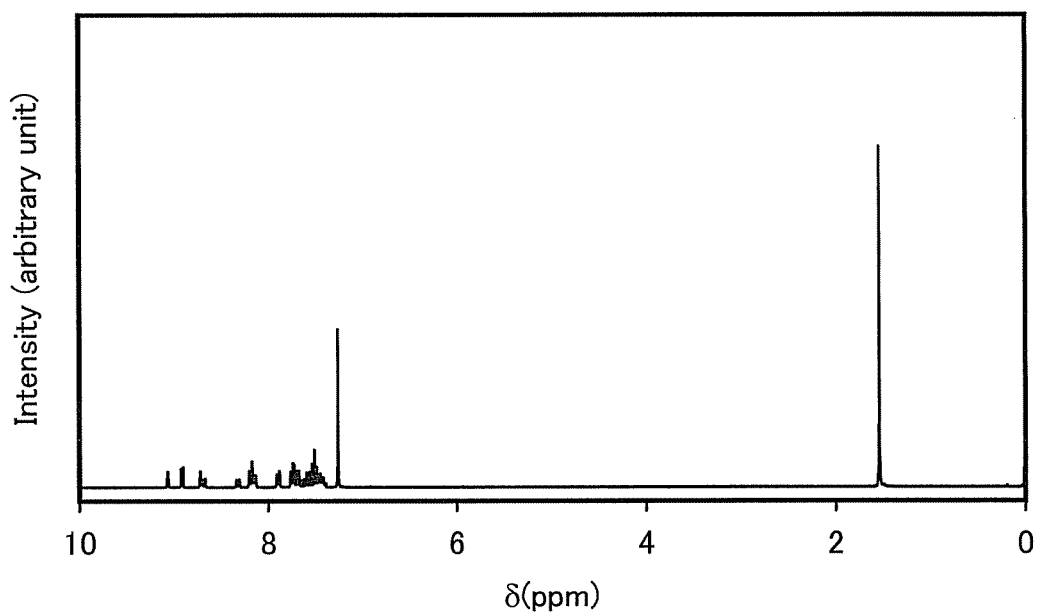
FIGS. 22A and 22B are $^1$H NMR charts of 2,4DBTP2Pm-II.
Figure 22B:
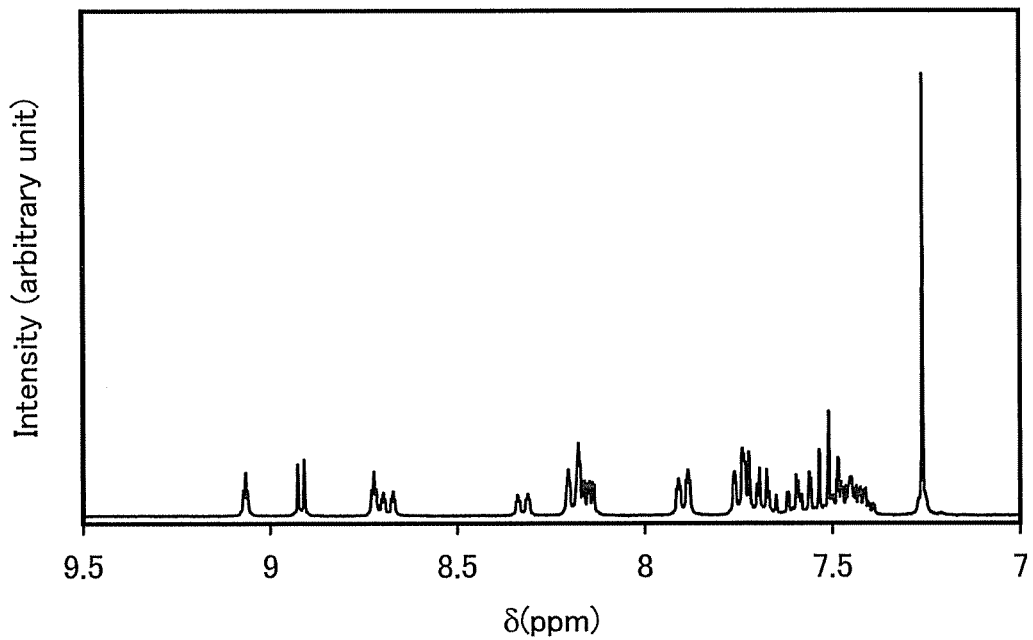

FIGS. 22A and 22B are $^1$H NMR charts. Note that FIG. 22B is a chart where the range of from 7.0 ppm to 9.5 ppm in FIG. 22A is enlarged.

Figure 23A:
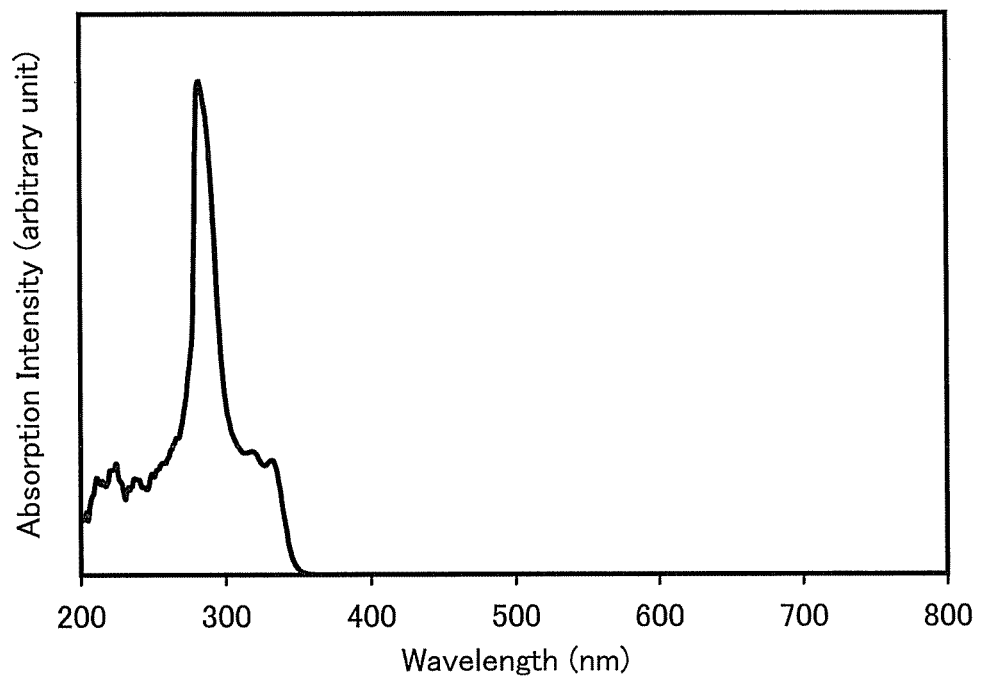
FIGS. 23A and 23B show an absorption spectrum and an emission spectrum of 2,4DBTP2Pm-II in a toluene solution of 2,4DBTP2Pm-II.
Figure 23B:
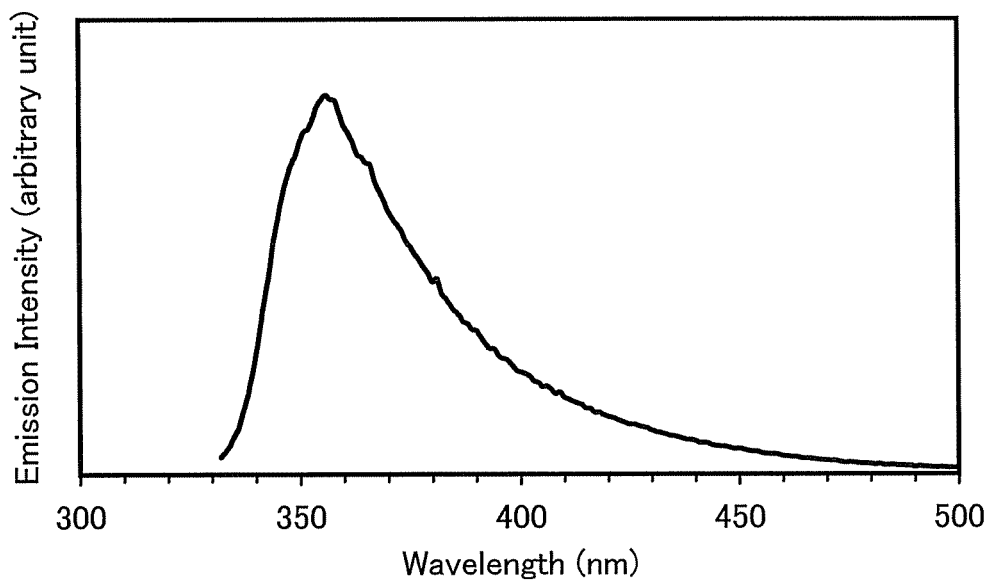
Figure 24A:
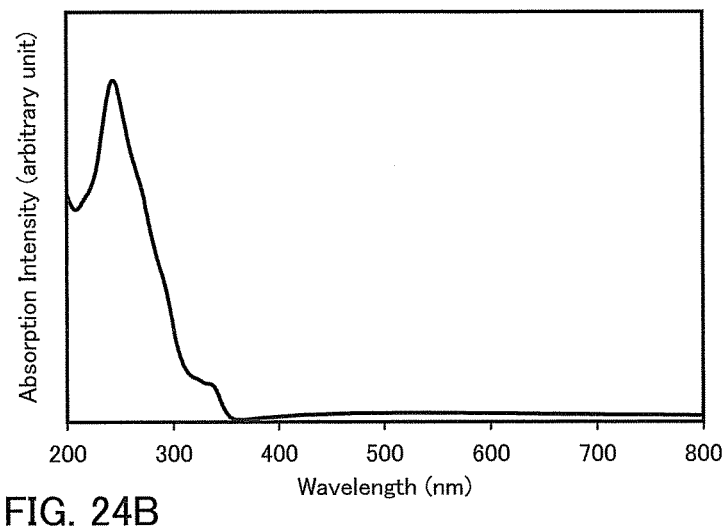
FIGS. 24A and 24B show an absorption spectrum and an emission spectrum of a thin film of 2,4DBTP2Pm-II.
Figure 24B:
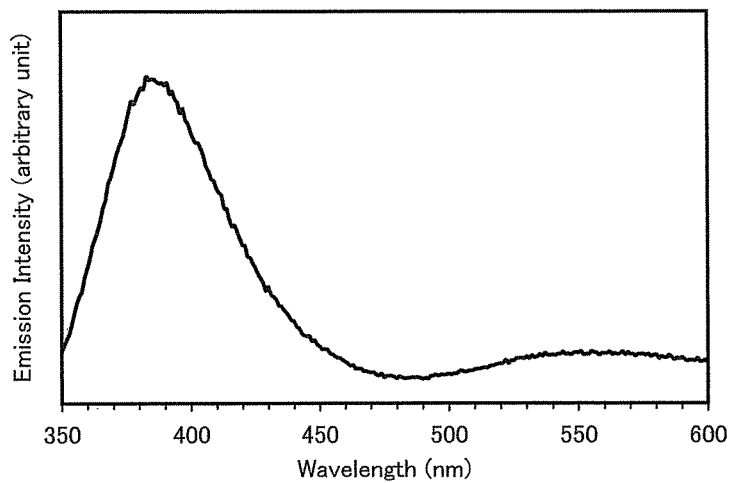

FIG. 23A shows an absorption spectrum of 2,4mDBTP2Pm-II in a toluene solution of 2,4mDBTP2Pm-II and FIG. 23B shows an emission spectrum thereof. FIG. 24A shows an absorption spectrum of a thin film of 2,4mDBTP2Pm-II and FIG. 24B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 23A and 23B and FIGS. 24A and 24B, the horizontal axis represents wavelength (nm) and the vertical axis represents intensity (arbitrary unit). In the case of the toluene solution, the absorption peak is observed around 283 nm, and the emission wavelength peak is observed around 356 nm. In the case of the thin film, the absorption peaks are observed around 226 nm, 244 nm, 287 nm, 318 nm, and 335 nm, and the emission wavelength peak is observed around 385 nm.

EXAMPLE 6

In this example, a synthesis method of 2,5-bis[3-(dibenzothiophen-4-yl)phenyl]pyrimidine (abbreviation: 2,5mDBTP2Pm-II) represented by Structural Formula (402) will be described.

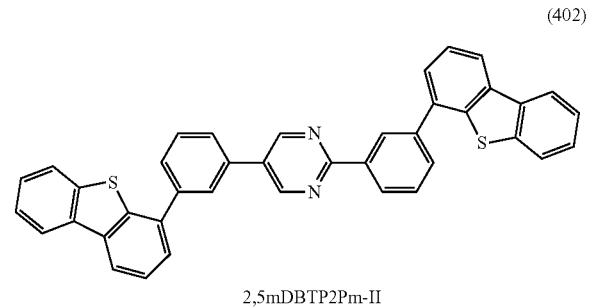 [SMILES: c1cc(-c2cnc(-c3cccc(-c4cccc5c4sc4ccccc45)c3)nc2)cc(-c2cccc3c2sc2ccccc23)c1]

(402)
2,5mDBTP2Pm-II

Synthesis of 2,5-Bis[3-(dibenzothiophen-4-yl)phenyl]pyrimidine (abbreviation: 2,5mDBTP2Pm-II)

A synthesis scheme of 2,5-bis[3-(dibenzothiophen-4-yl)phenyl]pyrimidine (abbreviation: 2,5mDBTP2Pm-II) is shown in (H-1).

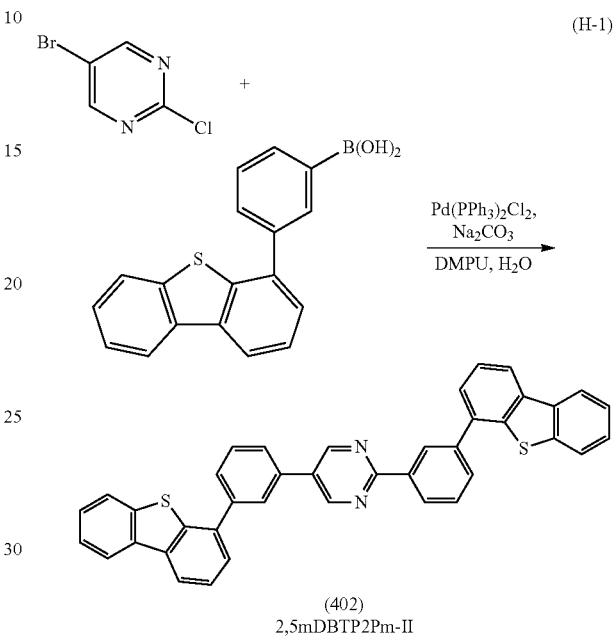

(402)
2,5mDBTP2Pm-II

In a 100 mL recovery flask were put 0.97 g (5.03 mmol) of 5-bromo-2-chloropyrimidine, 3.82 g (12.6 mmol) of 3-(dibenzothiophen-4-yl)phenylboronic acid, and 2.67 g (25.2 mmol) of sodium carbonate. To this mixture were added 20 mL of 1,3-dimethyl-3,4,5,6-tetrahydro-2(1H)-pyrimidinone (abbreviation: DMPU) and 10 mL of water. While the pressure was reduced, this mixture was stirred to be degassed. To this mixture was added 42 mg (60.3 mmol) of bis(triphenylphosphine)palladium(II) dichloride, and the atmosphere was replaced with argon. The reaction container was heated by irradiation with microwaves (2.45 GHz, 100 W) under a nitrogen stream for 1.5 hours. After the heating, water was added to the mixture, and the mixture was filtered to give a residue. The obtained solid was washed with ethanol and dichloromethane. Toluene was added to this solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a white solid. This solid was purified by silica gel column chromatography (developing solvent, hexane). The obtained solid was recrystallized from toluene to give 1.87 g of a white-solid which was a target substance in a yield of 62%.

By a train sublimation method, 1.81 g of the obtained solid was purified. The purification by sublimation was performed by heating at 335° C. under a pressure of 5.1 Pa with an argon flow rate of 10 mL/min. After the purification by sublimation, 1.52 g of a white solid was obtained at a collection rate of 84%.

This compound was identified as 2,5-bis[3-(dibenzthiophen-4-yl)phenyl]pyrimidine (abbreviation:

2,5mDBTP2Pm-II), which was a target substance, by nuclear magnetic resonance ($^1$H NMR) spectroscopy.

$^1$H NMR data of the obtained substance are as follows: $^1$H NMR (CDCl$_3$, 300 MHz):δ=7.46-7.51 (m, 4H), 7.55-7.75 (m, 7H), 7.82-7.88 (m, 3H), 7.92 (dt, J1=7.8 Hz, J2=1.5 Hz, 1H), 8.09 (t, J1=1.5 Hz, 1H), 8.18-8.23 (m, 4H), 8.60 (dt, J1=8.4 Hz, J2=1.5 Hz, 1H), 8.92 (t, J1=1.8 Hz, 1H), 9.17 (s, 2H).

Figure 25A:
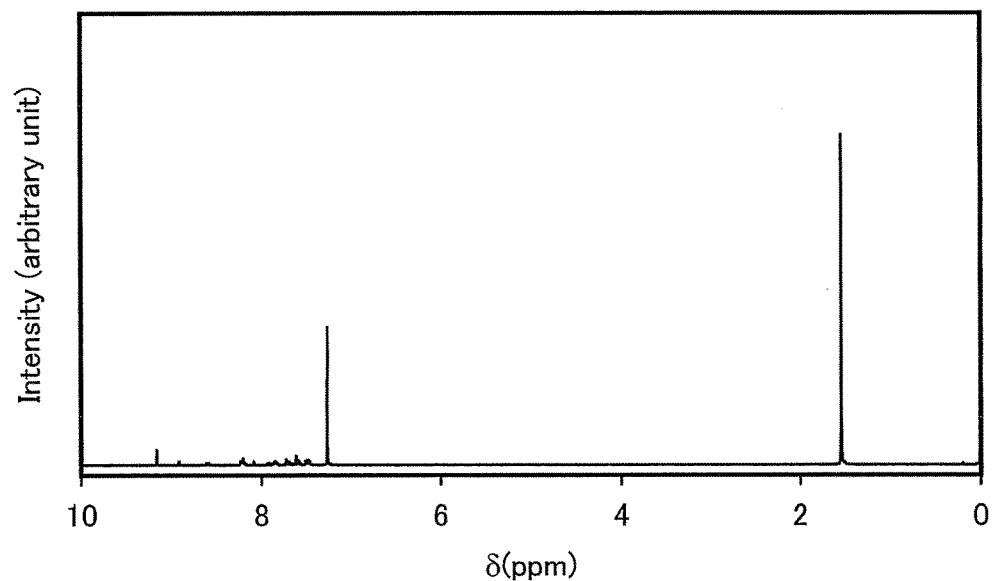
FIGS. 25A and 25B are $^1$H NMR charts of 2,5DBTP2Pm-II.
Figure 25B:
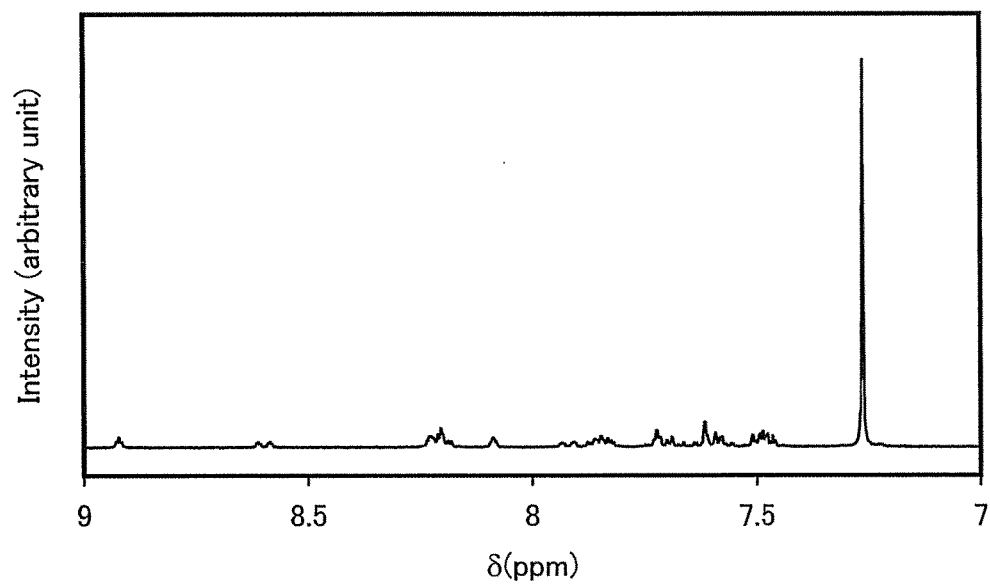

FIGS. 25A and 25B are $^1$H NMR charts. Note that FIG. 25B is a chart where the range of from 7.0 ppm to 9.5 ppm in FIG. 25A is enlarged.

Next, liquid chromatography mass spectrometry (LC/MS) was performed on 2,5-bis[3-(dibenzthiophen-4-yl)phenyl]pyrimidine (abbreviation: 2,5mDBTP2Pm-II) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 2,5mDBTP2Pm-II was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after minutes was 95:5. The composition ratio was changed linearly.

In the MS, ionization was carried out by an electrospray ionization (ESI) method; the capillary voltage and the sample cone voltage were 3.0 kV and 30 V, respectively; detection was carried out in a positive mode. The mass range for the measurement was m/z=100 to 1200.

Figure 103:
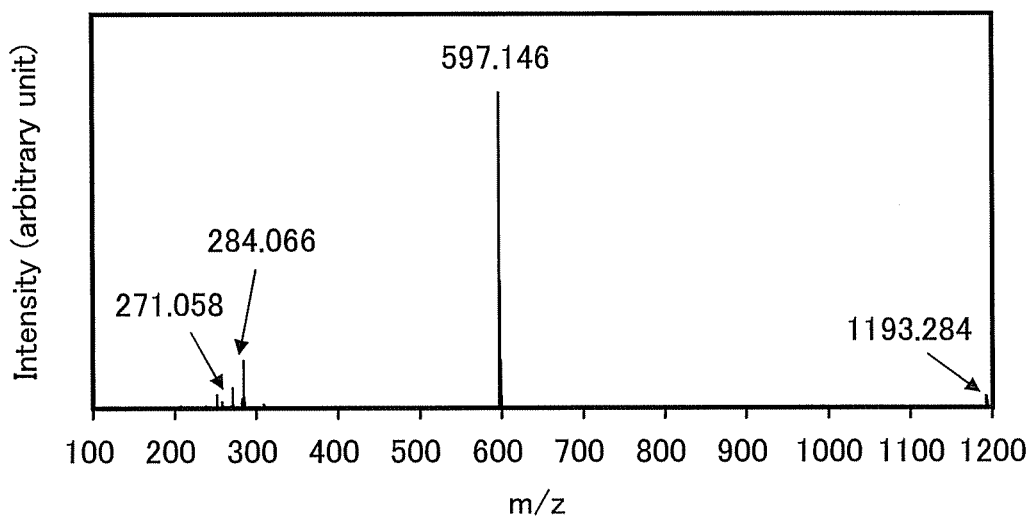
FIG. 103 shows LC-MS measurement results of 2,5mDBTP2Pm-II.

A component with m/z of 596.14 which underwent the separation and the ionization under the above-described conditions was collided with an argon gas in a collision cell to dissociate into product ions. Energy (collision energy) for the collision with argon was 70 eV. FIG. 103 shows the results of the MS of the dissociated product ions by time-of-flight (TOF) mass spectrometry.

The results in FIG. 103 show that as for 2,5mDBTP2Pm-II which is one embodiment of the present invention, peaks of product ions of a partial skeleton are detected mainly around m/z=271 and m/z=284, a peak derived from a precursor ion is detected around m/z=597, and a peak derived from a dimer ion is detected around m/z=1193. Note that the results in FIG. 103 show characteristics derived from 2,5mDBTP2Pm-II and therefore can be regarded as important data for identifying 2,5mDBTP2Pm-II contained in the mixture.

Figure 26A:
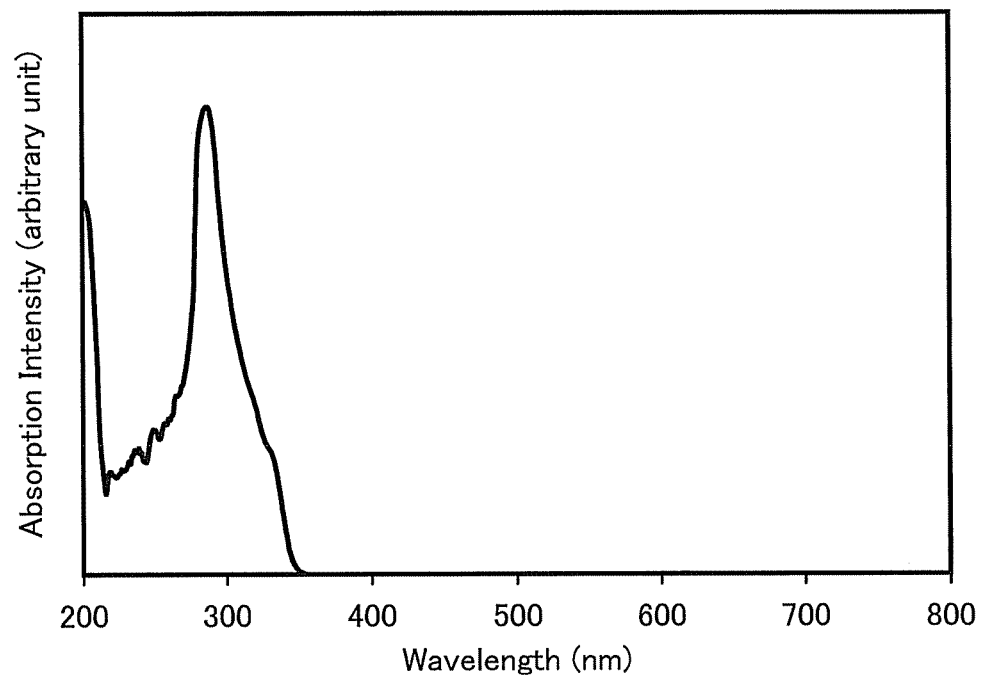
FIGS. 26A and 26B show an absorption spectrum and an emission spectrum of 2,5DBTP2Pm-II in a toluene solution of 2,5DBTP2Pm-II.
Figure 26B:
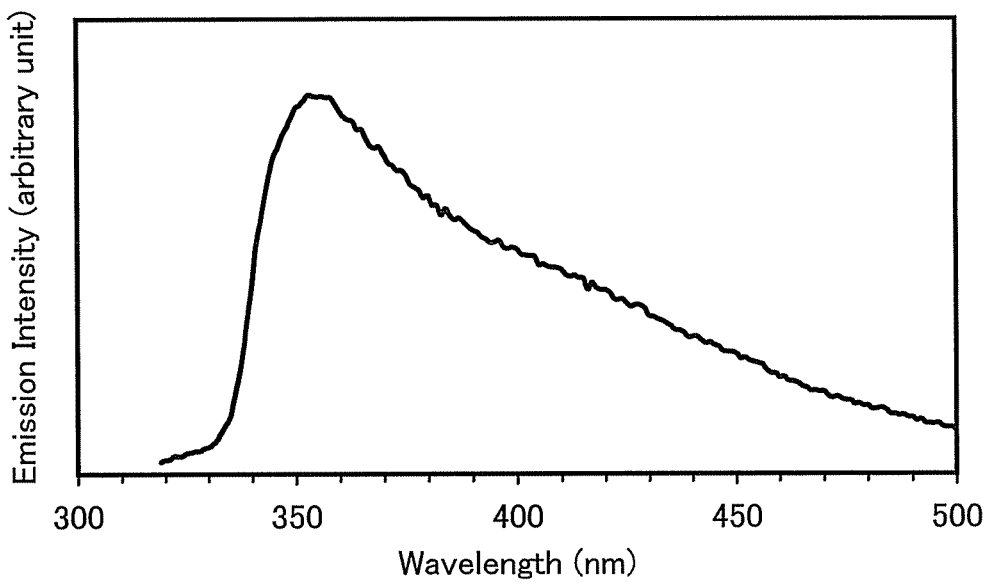
Figure 27A:
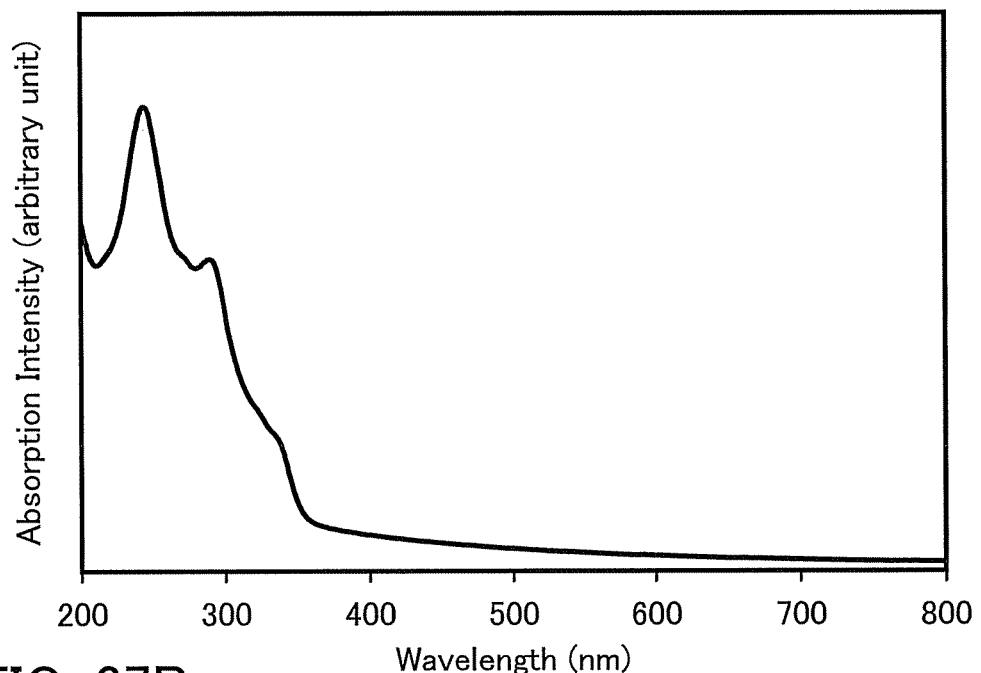
FIGS. 27A and 27B show an absorption spectrum and an emission spectrum of a thin film of 2,5DBTP2Pm-II.
Figure 27B:
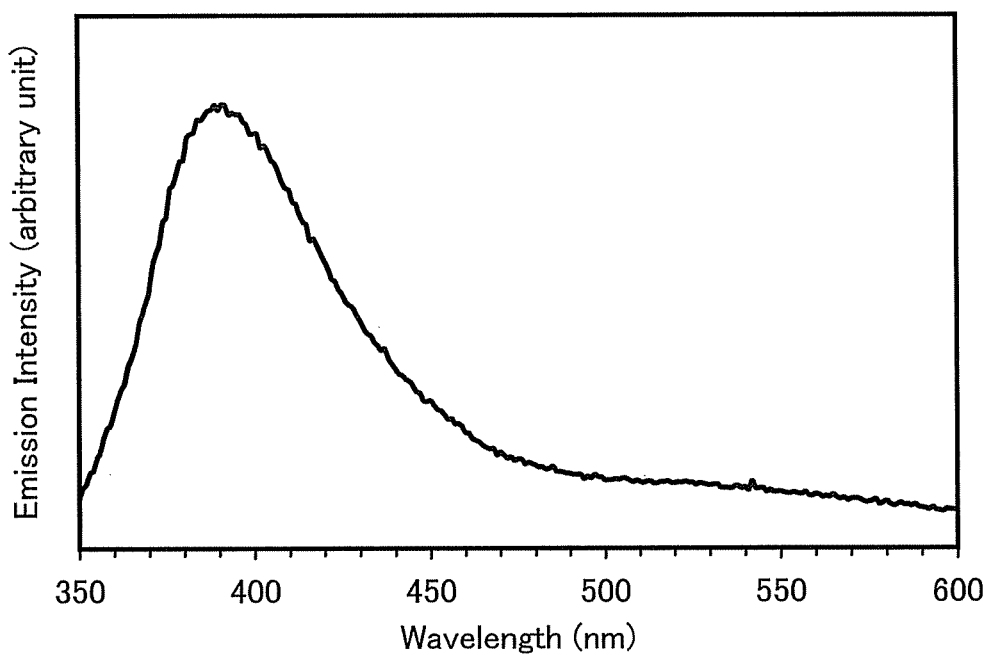

FIG. 26A shows an absorption spectrum of 2,5mDBTP2Pm-II in a toluene solution of 2,5mDBTP2Pm-II and FIG. 26B shows an emission spectrum thereof. FIG. 26A shows an absorption spectrum of a thin film of 2,5mDBTP2Pm-II and FIG. 26B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 26A and 26B and FIGS. 27A and 27B, the horizontal axis represents wavelength (nm) and the vertical axis represents intensity (arbitrary unit). In the case of the toluene solution, the absorption peak is observed around 287 nm, and the emission wavelength peak is observed around 353 nm. In the case of the thin film, the absorption peaks are observed around 244 nm, 268 nm, 289 nm, 326 nm, and 334 nm, and the emission wavelength peak is observed around 391 nm.

EXAMPLE 7

In this example, a synthesis method of 4,6-bis[3-(2,8-diphenyl-dibenzthiophen-4-yl)phenyl]pyrimidine (abbreviation: 4,6mDBTP2Pm-III) represented by Structural Formula (412) will be described.

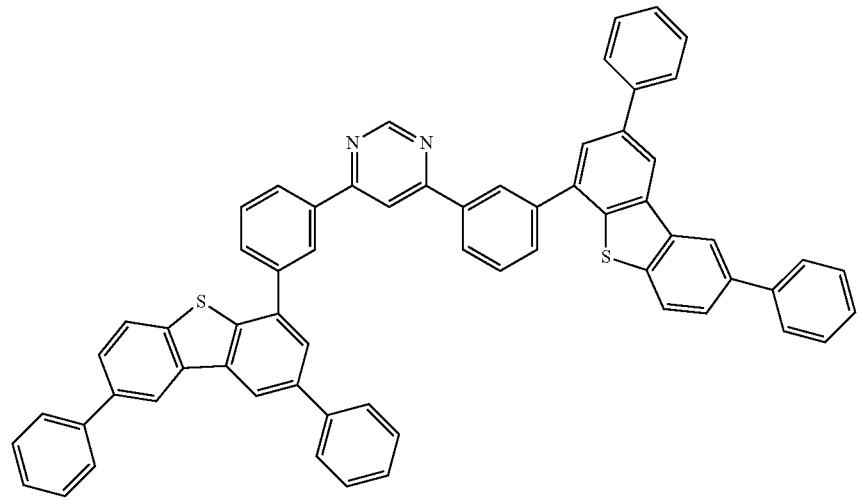

(412)

4,6mDBTP2Pm-III

Synthesis of 4,6-Bis[3-(2,8-diphenyl-dibenzthiophen-4-yl)phenyl]pyrimidine (abbreviation: 4,6mDBTP2Pm-III)

A synthesis scheme of 4,6-bis[3-(2,8-diphenyl-dibenzthiophen-4-yl)phenyl]pyrimidine (abbreviation: 4,6mDBTP2Pm-III) is shown in (I-1).

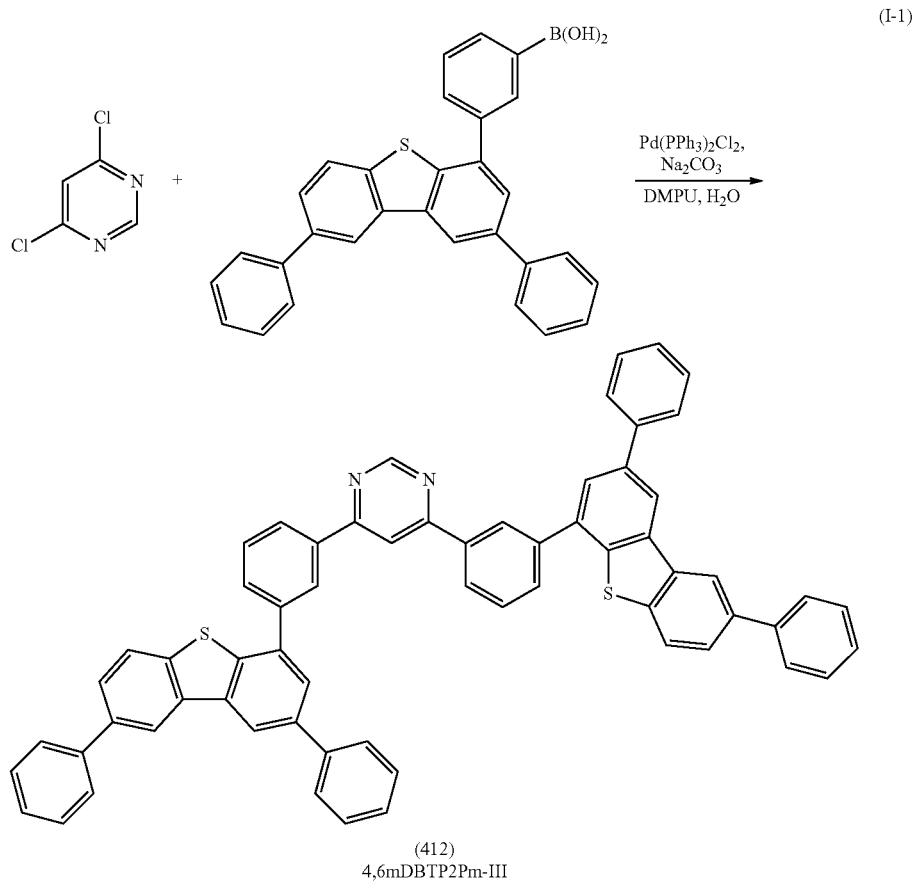

(412)
4,6mDBTP2Pm-III

In a 100 mL round-bottom flask were put 0.50 g (3.33 mmol) of 4,6-dichloropyrimidine, 3.80 g (8.33 mmol) of 3-(2,8-diphenyl-dibenzothiophen-4-yl)phenylboronic acid, and 1.77 g (16.7 mmol) of sodium carbonate. To this mixture were added 20 mL of 1,3-dimethyl-3,4,5,6-tetrahydro-2 (1H)-pyrimidinone (abbreviation: DMPU) and 10 mL of water. While the pressure was reduced, this mixture was stirred to be degassed. To this mixture was added 45 mg (63.7 mmol) of bis(triphenylphosphine)palladium(II) dichloride, and the atmosphere was replaced with argon. The reaction container was heated by irradiation with microwaves (2.45 GHz, 100 W) under a nitrogen stream for 1.5 hours. After the heating, water was added to the mixture, and the mixture was filtered to give a residue. The obtained solid was washed with ethanol and dichloromethane. Toluene was added to this solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a solid. This solid was purified by silica gel column chromatography (developing solvent, hexane). The obtained solid was recrystallized from toluene to give 1.74 g of a white solid which was a target substance in a yield of 58%.

By a train sublimation method, 1.19 g of the obtained solid was purified. The purification by sublimation was performed by heating at 380° C. under a pressure of 2.5 Pa with an argon flow rate of 5 mL/min. After the purification by sublimation, 1.04 g of a white solid was obtained at a collection rate of 87%.

This compound was identified as 4,6-bis[3-(2,8-diphenyl-dibenzthiophen-4-yl)phenyl]pyrimidine (abbreviation: 4,6mDBTP2Pm-III), which was a target substance, by nuclear magnetic resonance ($^1$H NMR) spectroscopy.

$^1$H NMR data of the obtained substance are as follows: $^1$H NMR (CDCl$_3$, 300 MHz):δ=7.37-7.42 (m, 4H), 7.50 (t, J1=7.5 Hz, 8H), 7.65-7.83 (m, 16H), 7.97 (dt, J1=7.8 Hz, J1=1.5 Hz, 2H), 8.29-8.33 (m, 3H), 8.43 (t, J1=1.5 Hz, 4H), 8.62 (t, J1=1.5 Hz, 2H), 9.41 (d, J1=1.2 Hz, 1H).

Figure 28A:
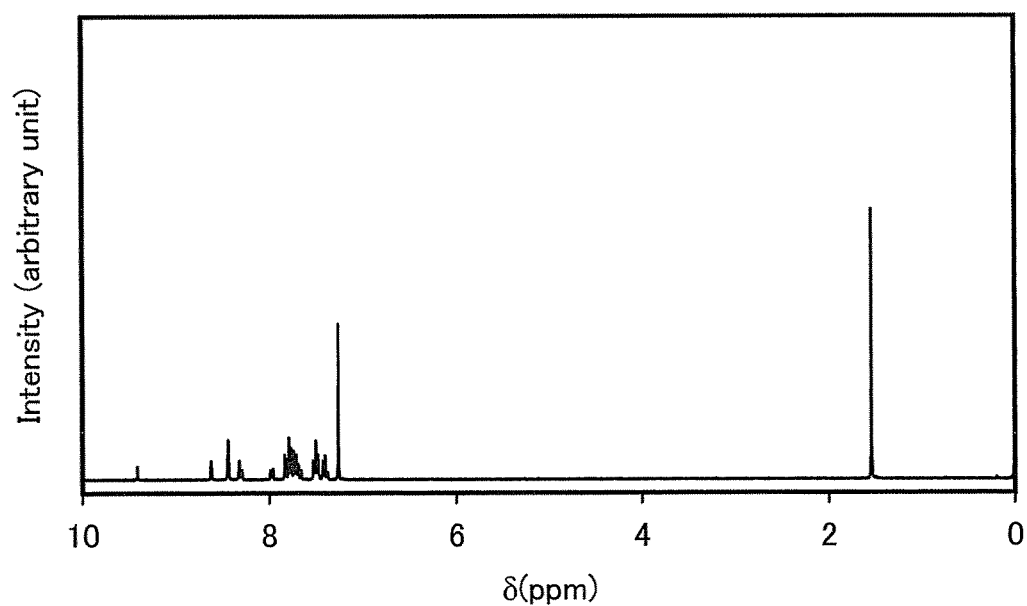
FIGS. 28A and 28B are $^1$H NMR charts of 4,6mDBTP2Pm-III.
Figure 28B:
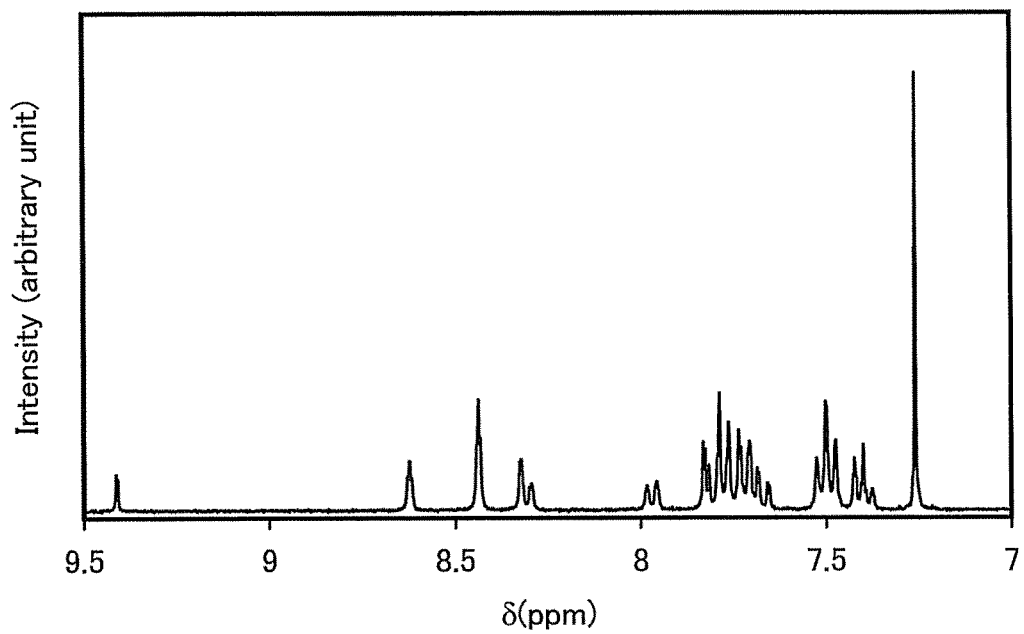

FIGS. 28A and 28B are $^1$H NMR charts. Note that FIG. 28B is a chart where the range of from 7.0 ppm to 9.5 ppm in FIG. 28A is enlarged.

Next, liquid chromatography mass spectrometry (LC/MS) was performed on 4,6-bis[3-(2,8-diphenyl-dibenzthiophen-4-yl)phenyl]pyrimidine (abbreviation: 4,6mDBTP2Pm-III) obtained in this example.

In the LC/MS, liquid chromatography (LC) separation was carried out with ACQUITY UPLC (produced by Waters Corporation) and mass spectrometry (MS) analysis was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 4,6mDBTP2Pm-II was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after 10 minutes was 95:5. The composition ratio was changed linearly.

In the MS, ionization was carried out by an electrospray ionization (ESI) method; the capillary voltage and the sample cone voltage were 3.0 kV and 30 V, respectively; detection was carried out in a positive mode. The mass range for the measurement was m/z=100 to 1200.

Figure 104:
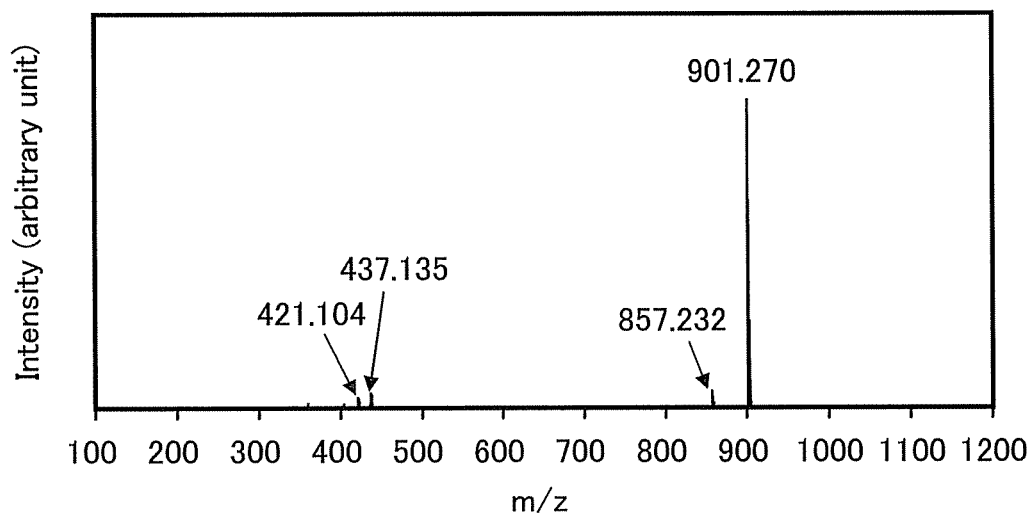
FIG. 104 shows LC-MS measurement results of 4,6mDBTP2Pm-II.

A component with m/z of 900.26 which underwent the separation and the ionization under the above-described conditions was collided with an argon gas in a collision cell to dissociate into product ions. Energy (collision energy) for the collision with argon was 70 eV. FIG. 104 shows the results of the MS of the dissociated product ions by time-of-flight (TOF) mass spectrometry.

The results in FIG. 104 show that as for 4,6mDBTP2Pm-III which is one embodiment of the present invention, peaks of product ions of a partial skeleton are detected mainly around m/z=421, m/z=437, and m/z=857 and a peak derived from a precursor ion is detected around m/z=901. Note that the results in FIG. 104 show characteristics derived from 4,6mDBTP2Pm-III and therefore can be regarded as important data for identifying 4,6mDBTP2Pm-III contained in the mixture.

The product ion around m/z=857 is probably a product ion generated due to cleavage of a pyrimidine ring in 4,6mDBTP2Pm-III. A pattern of such a product ion is one of the characteristics of the organic compound of one embodiment of the present invention, in which the 4-position and the 6-position of a pyrimidine ring are substituted. Therefore, it is indicated that 4,6mDBTP2Pm-H of one embodiment of the present invention has a pyrimidine ring whose 4-position and 6-position are substituted.

Figure 29A:
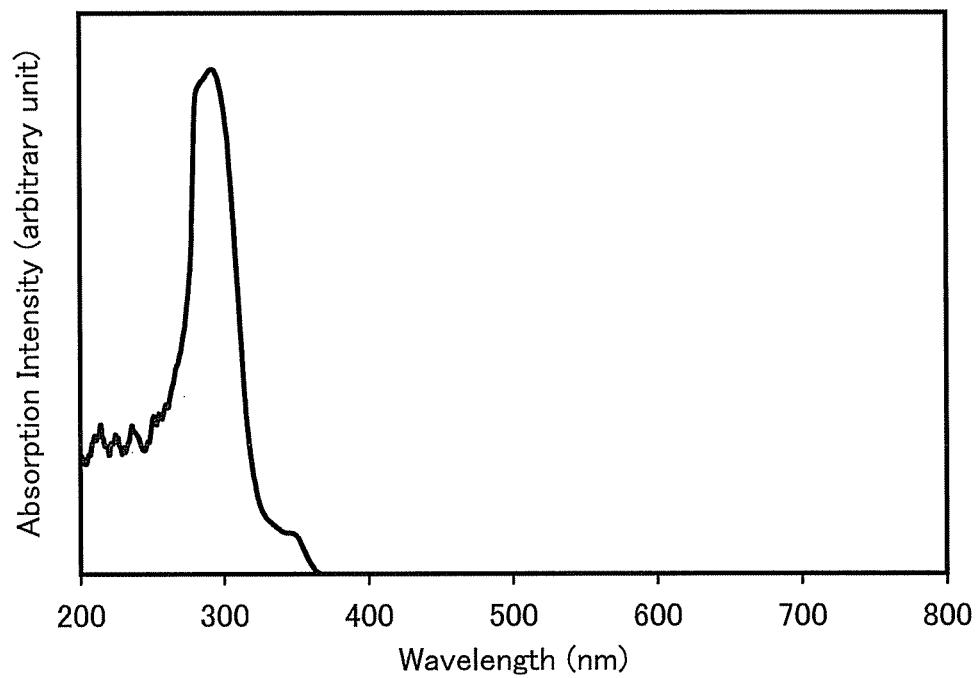
FIGS. 29A and 29B show an absorption spectrum and an emission spectrum of 4,6mDBTP2Pm-III in a toluene solution of 4,6mDBTP2Pm-III.
Figure 29B:
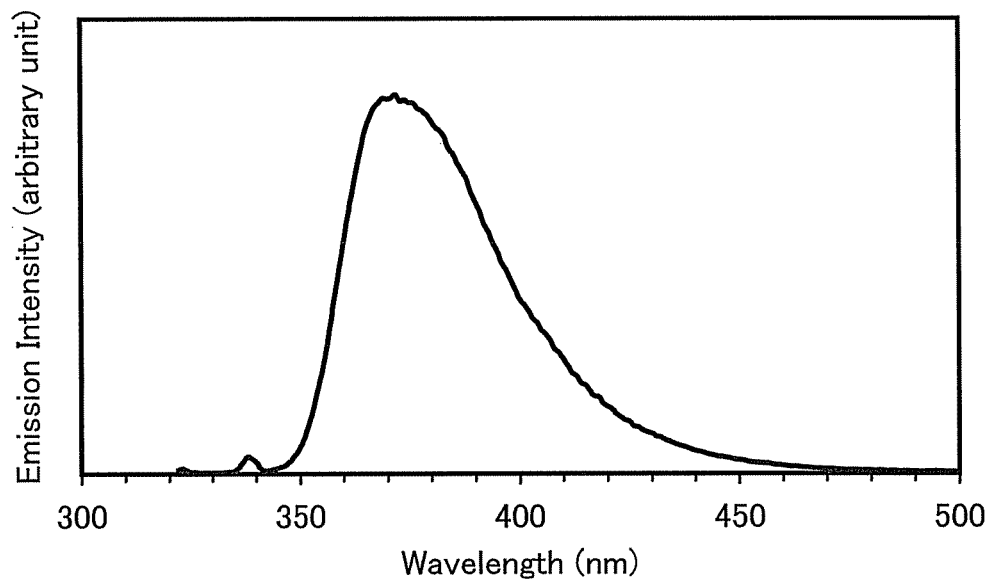
Figure 30A:
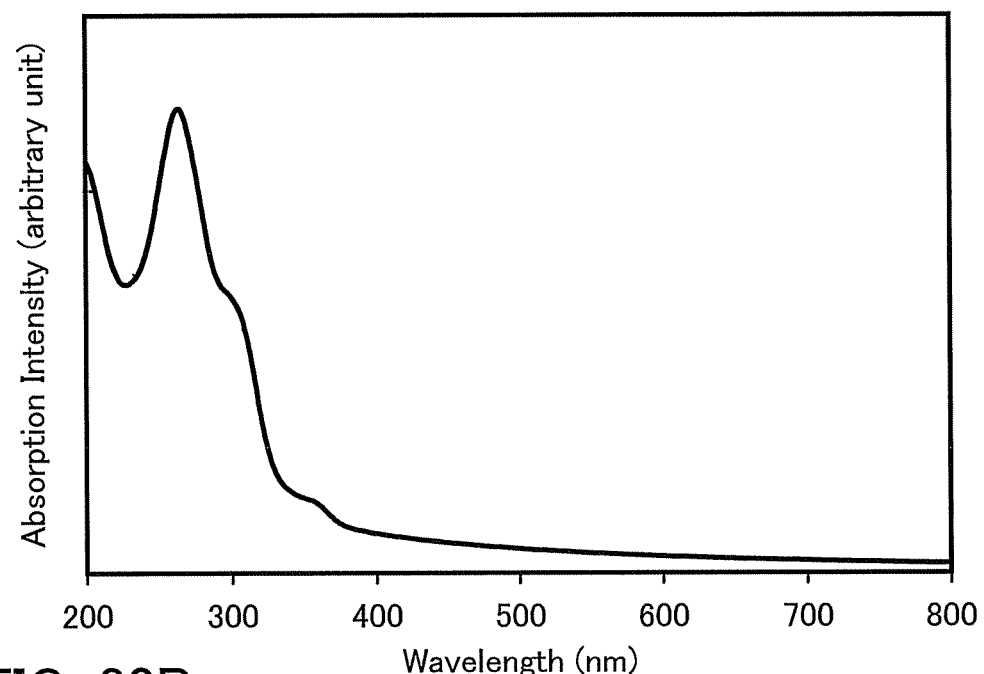
FIGS. 30A and 30B show an absorption spectrum and an emission spectrum of a thin film of 4,6mDBTP2Pm-III.
Figure 30B:
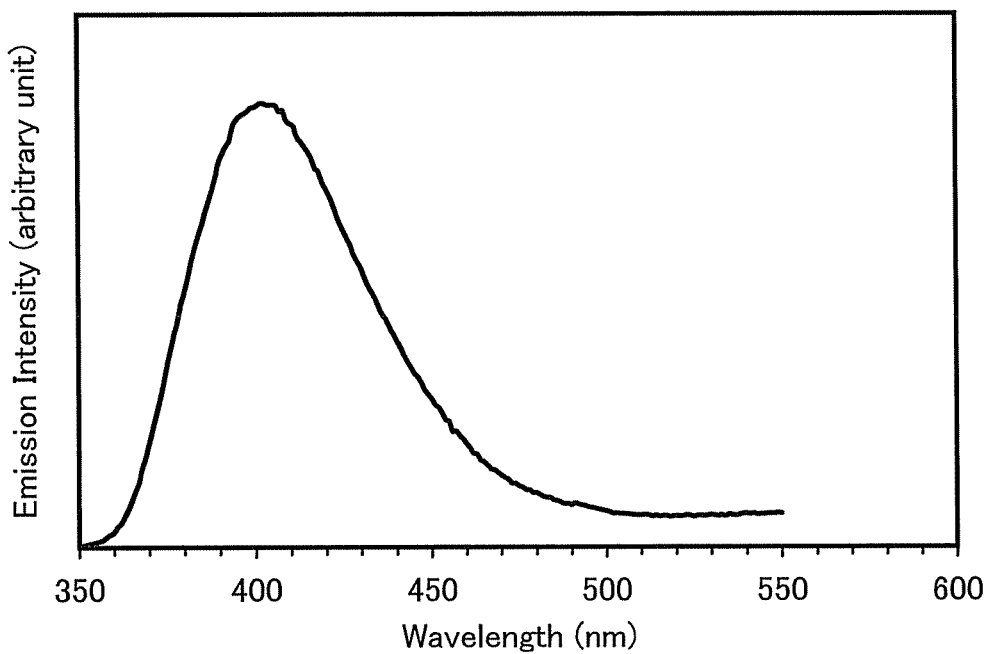

FIG. 29A shows an absorption spectrum of 4,6mDBTP2Pm-III in a toluene solution of 4,6mDBTP2Pm-III, and FIG. 29B shows an emission spectrum thereof. FIG. 30A shows an absorption spectrum of a thin film of 4,6mDBTP2Pm-III and FIG. 30B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 29A and 29B and FIGS. 30A and 30B, the horizontal axis represents wavelength (nm) and the vertical axis represents intensity (arbitrary unit). In the case of the toluene solution, the absorption peak is observed around 292 nm, and the emission wavelength peak is observed around 372 nm. In the case of the thin film, the absorption peaks are observed around 264 nm, 301 nm, and 354 nm, and the emission wavelength peak is observed around 402 nm.

EXAMPLE 8

In this example, a synthesis method of 4,6-bis[3-(dibenzofuran-4-yl)phenyl]pyrimidine (abbreviation: 4,6mDBFP2Pm-II) represented by Structural Formula (430) will be described.

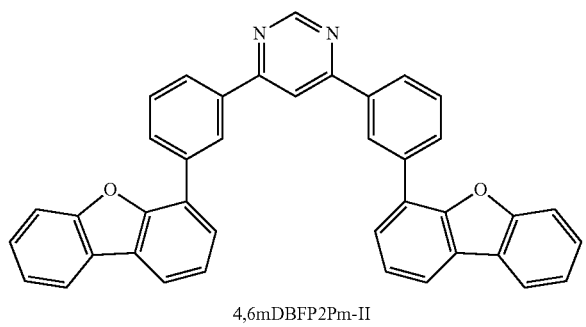

(430)

4,6mDBFP2Pm-II

Synthesis of
4,6-Bis[3-(dibenzofuran-4-yl)phenyl]pyrimidine
(abbreviation: 4,6mDBFP2Pm-II)

A synthesis scheme of 4,6-bis[3-(dibenzofuran-4-yl)phenyl]pyrimidine (abbreviation: 4,6mDBFP2Pm-II) is shown in (J-1).

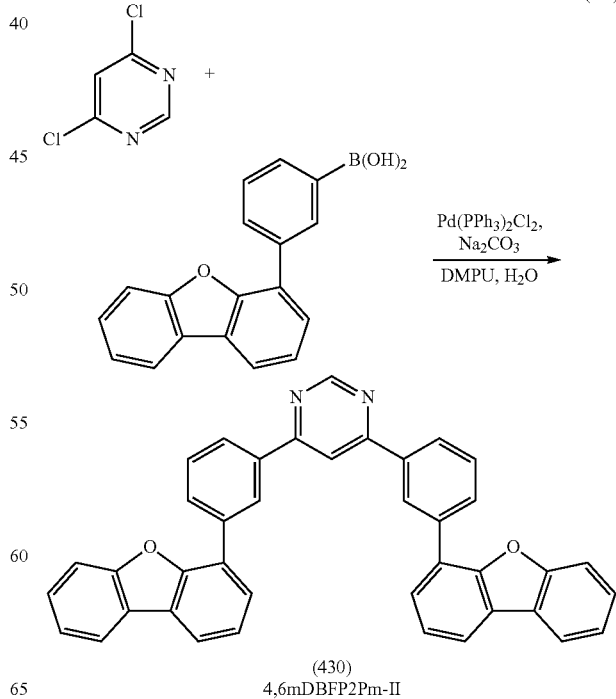

(J-1)

(430)
4,6mDBFP2Pm-II

In a 100 mL recovery flask were put 0.79 g (5.31 mmol) of 4,6-dichloropyrimidine, 3.82 g (13.3 mmol) of 3-(dibenzofuran-4-yl)-phenylboronic acid, and 2.82 g (26.6 mmol) of sodium carbonate. To this mixture were added 20 mL of 1,3-dimethyl-3,4,5,6-tetrahydro-2(1H)-pyrimidinone (abbreviation: DMPU) and 10 mL of water. While the pressure was reduced, this mixture was stirred to be degassed. To this mixture was added 45 mg (63.7 μmol) of bis(triphenylphosphine)palladium(II) dichloride, and the atmosphere was replaced with argon. The reaction container was heated by irradiation with microwaves (2.45 GHz, 100 W) under a nitrogen stream for 1.5 hours. After the heating, water was added to the mixture, and the mixture was filtered to give a residue. The obtained solid was washed with ethanol and dichloromethane. Toluene was added to this solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a solid. This solid was purified by silica gel column chromatography (developing solvent: hexane). The obtained solid was recrystallized from toluene to give 1.56 g of a white solid which was a target substance in a yield of 52%.

By a train sublimation method, 1.51 g of the obtained solid was purified. The purification by sublimation was performed by heating at 280° C. under a pressure of 3.5 Pa with an argon flow rate of 5 mL/min. After the purification by sublimation, 1.23 g of a white solid was obtained at a collection rate of 81%.

This compound was identified as 4,6-bis[3-(dibenzofuran-4-yl)phenyl]pyrimidine (abbreviation: 4,6mDBFP2Pm-II), which was a target substance, by nuclear magnetic resonance ($^1$H NMR) spectroscopy.

$^1$H NMR data of the obtained substance are as follows: $^1$H NMR (CDCl$_3$, 300 MHz):δ=7.34-7.50 (m, 6H), 7.57 (d, J1=8.4 Hz, 2H), 7.73 (t, J1=7.8 Hz, 4H), 7.98-8.01 (m, 4H), 8.11 (d, J1=7.8 Hz, 2H), 8.26 (d, J1=7.8 Hz, 2H), 8.33 (d, J1=0.9 Hz, 1H), 8.69 (t, J1=1.5 Hz, 2H), 9.41 (s, 1H).

Figure 31A:
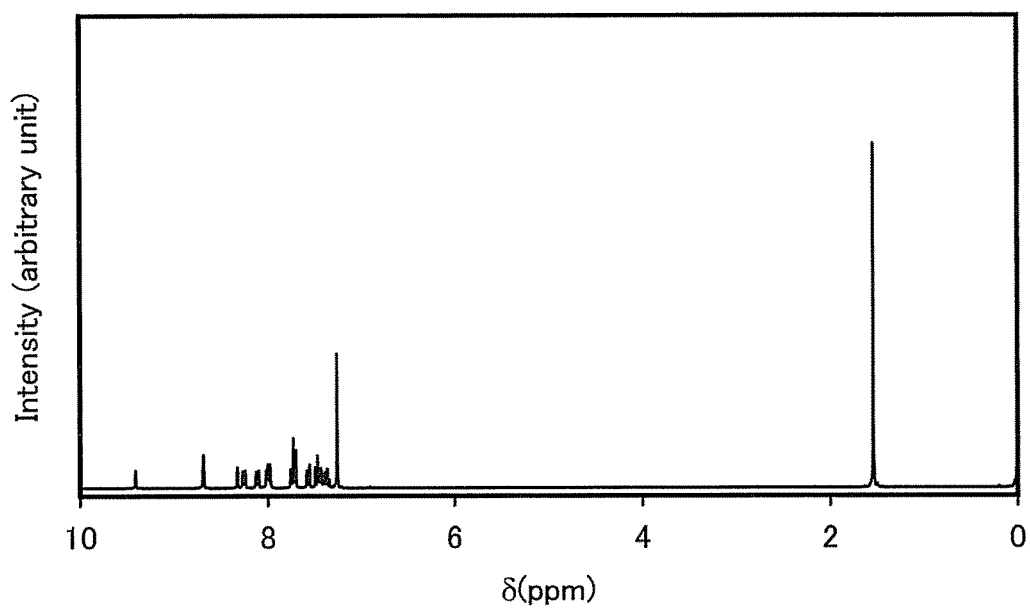
FIGS. 31A and 31B are $^1$H NMR charts of 4,6mDBFP2Pm-II.
Figure 31B:
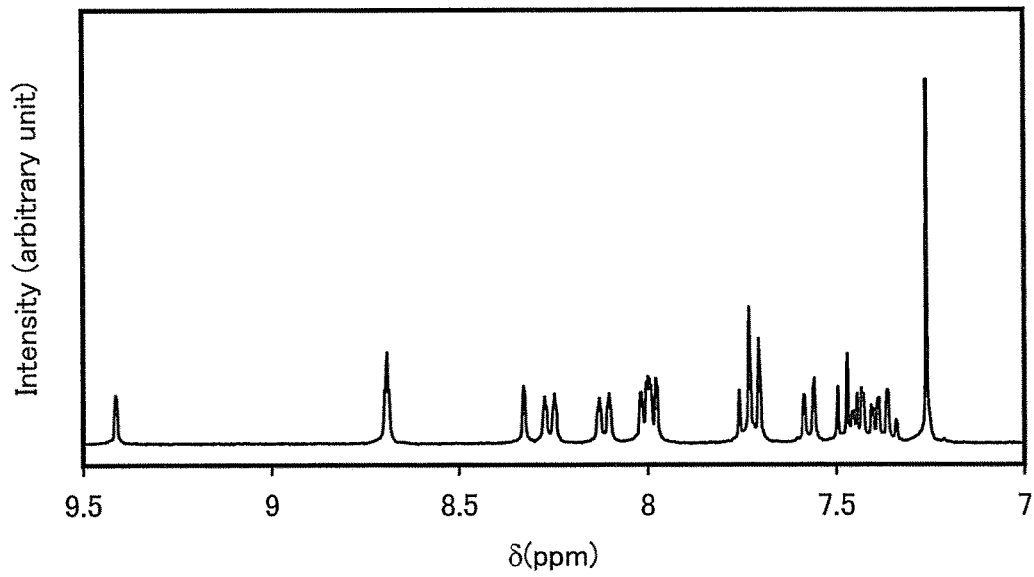

FIGS. 31A and 31B are $^1$H NMR charts. Note that FIG. 31B is a chart where the range of from 7.0 ppm to 9.5 ppm in FIG. 31A is enlarged.

Next, liquid chromatography mass spectrometry (LC/MS) was performed on 4,6-bis[3-(dibenzofuran-4-yl)phenyl]pyrimidine (abbreviation: 4,6mDBFP2Pm-II) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 4,6mDBFP2Pm-II was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after 10 minutes was 95:5. The composition ratio was changed linearly.

In the MS, ionization was carried out by an electrospray ionization (ESI) method; the capillary voltage and the sample cone voltage were set to 3.0 kV and 30 V, respectively; detection was carried out in a positive mode. The mass range for the measurement was m/z=100 to 1200.

Figure 105:
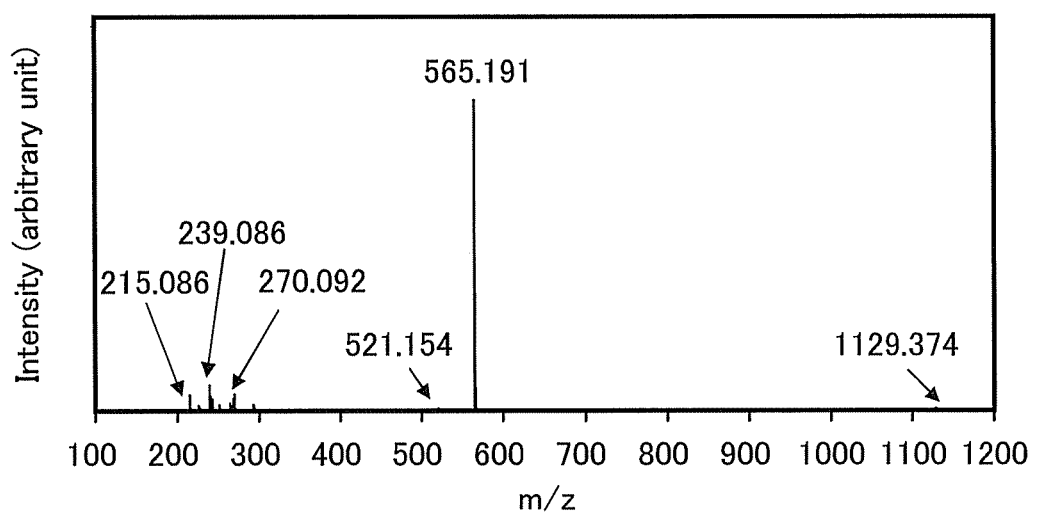
FIG. 105 shows LC-MS measurement results of 4,6mDBFP2Pm-II.

A component with m/z of 564.18 which underwent the separation and the ionization under the above-mentioned conditions was collided with an argon gas in a collision cell to dissociate into product ions. Energy (collision energy) for the collision with argon was 70 eV. FIG. 105 shows the results of the MS of the dissociated product ions by time-of-flight (TOF) mass spectrometry.

The results in FIG. 105 show that as for 4,6mDBFP2Pm-II which is one embodiment of the present invention, peaks of product ions of a partial skeleton are detected mainly around m/z=215, m/z=239, m/z=270, and m/z=521, a peak derived from a precursor ion is detected around m/z=565, and a peak derived from a dimer ion is detected around m/z=1129. Note that the results in FIG. 105 show characteristics derived from 4,6mDBFP2Pm-II and therefore can be regarded as important data for identifying 4,6mDBFP2Pm-II contained in the mixture.

The product ion around m/z=521 is probably a product ion generated due to cleavage of a pyrimidine ring in 4,6mDBFP2Pm-II. A pattern of such a product ion is one of the characteristics of the organic compound according to one embodiment of the present invention, in which the 4-position and the 6-position of a pyrimidine ring are substituted. Therefore, it is indicated that 4,6mDBFP2Pm-II of one embodiment of the present invention has a pyrimidine ring whose 4-position and 6-position are substituted.

Figure 32A:
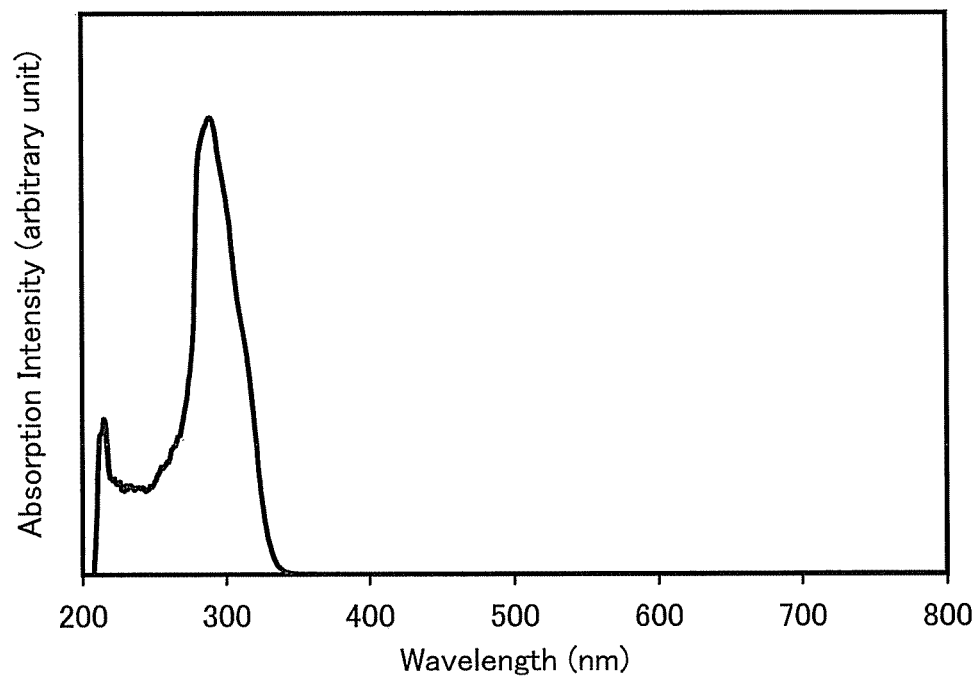
FIGS. 32A and 32B show an absorption spectrum and an emission spectrum of 4,6mDBFP2Pm-II in a toluene solution of 4,6mDBFP2Pm-II.
Figure 32B:
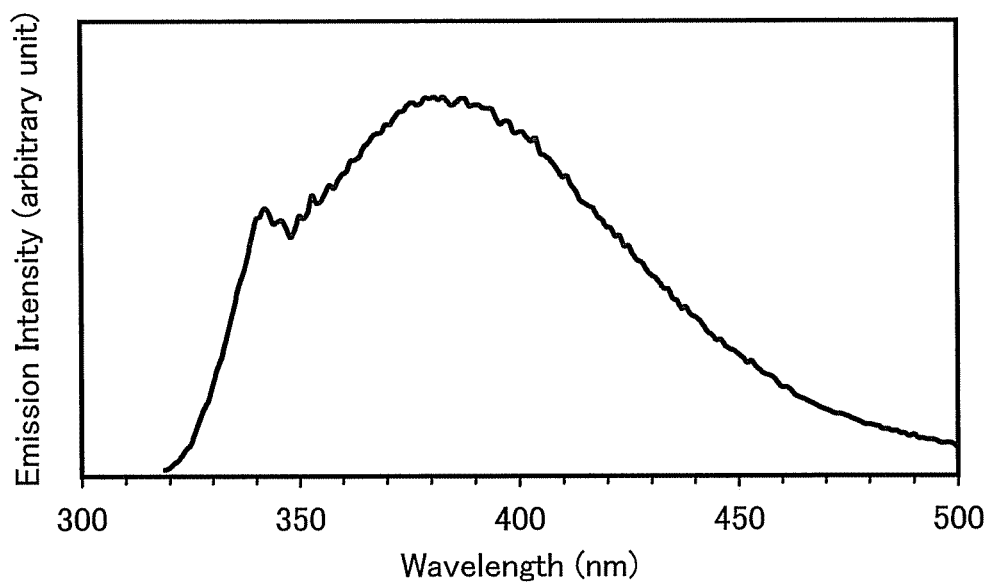
Figure 33A:
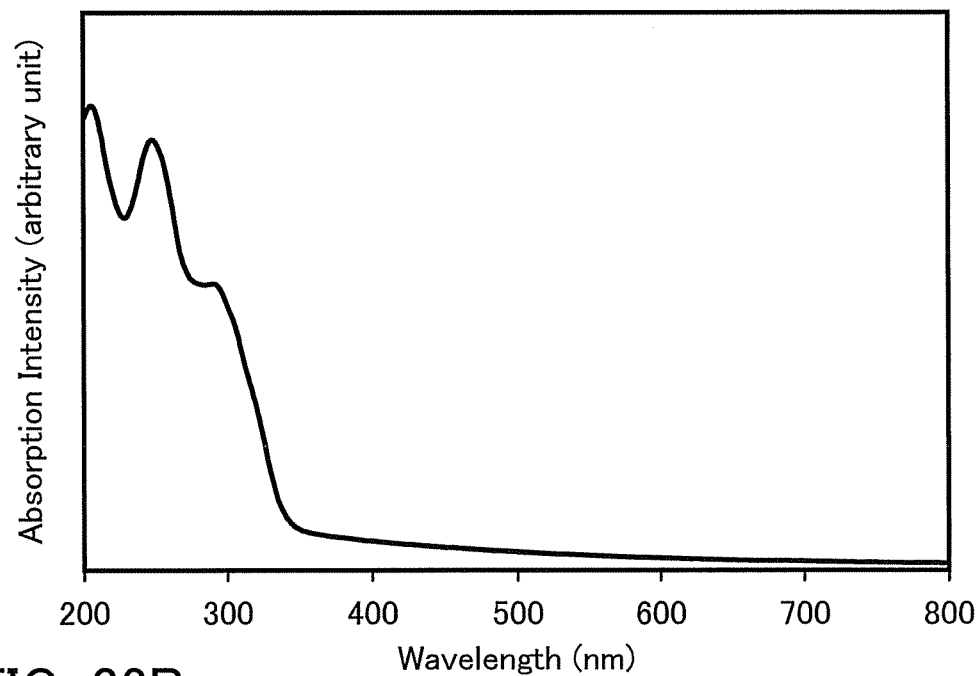
FIGS. 33A and 33B show an absorption spectrum and an emission spectrum of a thin film of 4,6mDBFP2Pm-II.
Figure 33B:
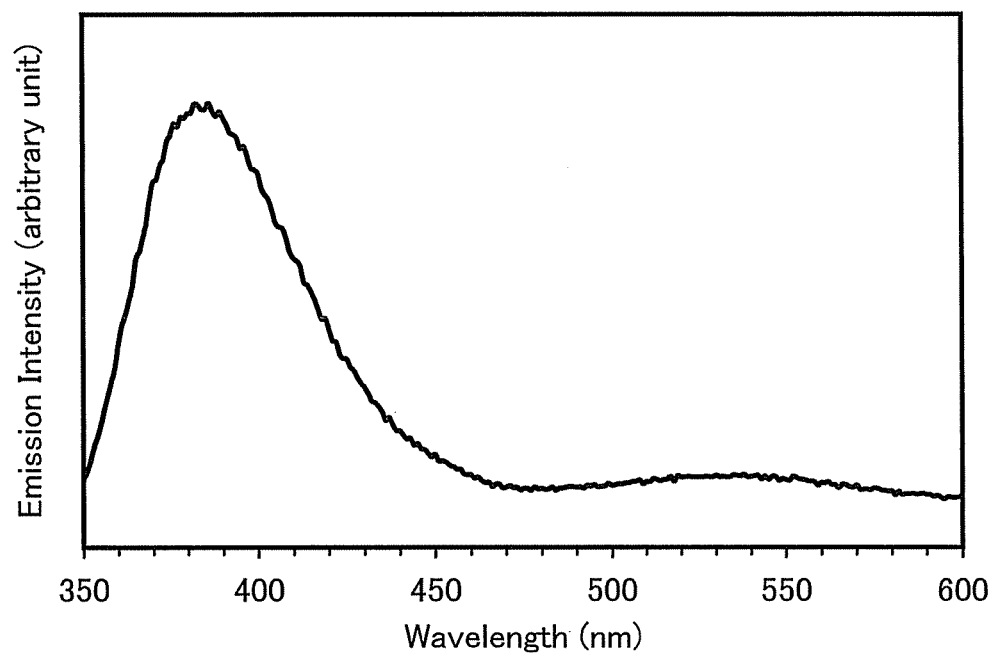

FIG. 32A shows an absorption spectrum of 4,6mDBFP2Pm-II in a toluene solution of 4,6mDBFP2Pm-II and FIG. 32B shows an emission spectrum thereof. FIG. 33A shows an absorption spectrum of a thin film of 4,6mDBFP2Pm-II and FIG. 33B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 32A and 32B and FIGS. 33A and 33B, the horizontal axis represents wavelength (nm) and the vertical axis represents intensity (arbitrary unit). In the case of the toluene solution, the absorption peak is observed around 289 nm, and the emission wavelength peak is observed around 383 nm. In the case of the thin film, the absorption peaks are observed around 206 nm, 248 nm, 290 nm, 303 nm, and 315 nm, and the emission wavelength peak is observed around 383 nm.

EXAMPLE 9

In this example, a synthesis method of 2,4-bis[3-(dibenzofuran-4-yl)phenyl]pyrimidine (abbreviation: 2,4mDBFP2Pm-II) represented by Structural Formula (431) will be described.

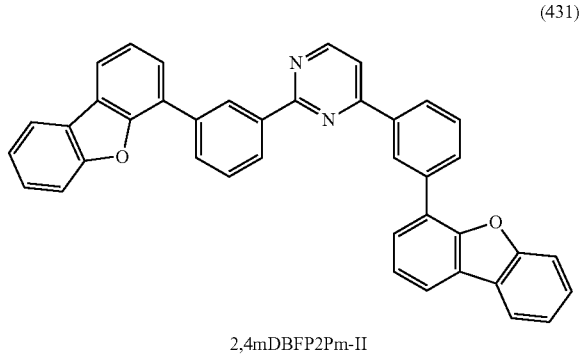

(431)
2,4mDBFP2Pm-II

Synthesis of
2,4-Bis[3-(dibenzofuran-4-yl)phenyl]pyrimidine
(abbreviation: 2,4mDBFP2Pm-II)

A synthesis scheme of 2,4-bis[3-(dibenzofuran-4-yl)phenyl]pyrimidine (abbreviation: 2,4mDBFP2Pm-II) is shown in (K-1).

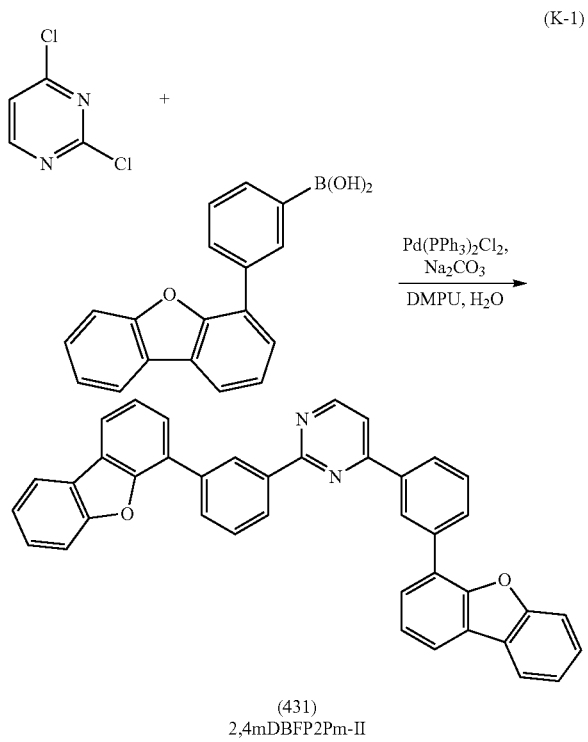

(K-1)

(431)
2,4mDBFP2Pm-II

In a 100 mL recovery flask were put 0.79 g (5.31 mmol) of 2,4-dichloropyrimidine, 3.82 g (13.3 mmol) of 3-(dibenzofuran-4-yl)-phenylboronic acid, and 2.82 g (26.6 mmol) of sodium carbonate. To this mixture were added 20 mL of 1,3-dimethyl-3,4,5,6-tetrahydro-2(1H)-pyrimidinone (abbreviation: DMPU) and 10 mL of water. While the pressure was reduced, this mixture was stirred to be degassed. To this mixture was added 45 mg (63.7 mol) of bis(triphenylphosphine)palladium(II) dichloride, and the atmosphere was replaced with argon. The reaction container was heated by irradiation with microwaves (2.45 GHz, 100 W) under a nitrogen stream for 1 hour. After the heating, water was added to the mixture, and the mixture was filtered to give a residue. The obtained solid was washed with ethanol and dichloromethane. Toluene was added to this solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a white solid. This solid was purified by silica gel column chromatography (developing solvent: hexane). The obtained solid was recrystallized from toluene to give 1.89 g of a white solid which was a target substance in a yield of 63%.

By a train sublimation method, 1.93 g of the obtained solid was purified. The purification by sublimation was performed by heating at 270° C. under a pressure of 3.3 Pa with an argon flow rate of 5 mL/min. After the purification by sublimation, 1.43 g of a white solid was obtained at a collection rate of 74%.

This compound was identified as 2,4-bis[3-(dibenzofuran-4-yl)phenyl]pyrimidine (abbreviation: 2,4mDBFP2Pm-II), which was a target substance, by nuclear magnetic resonance ($^1$H NMR) spectroscopy.

$^1$H NMR data of the obtained substance are as follows: $^1$H NMR (CDCl$_3$, 300 MHz):δ=7.31-7.45 (m, 6H), 7.54-7.57 (m, 2H), 7.68-7.77 (m, 5H), 7.92-8.00 (m, 4H), 8.07-8.13 (m, 2H), 8.33 (dt, J1=7.8 Hz, J2=1.2 Hz, 1H), 8.70 (dt, J1=8.1 Hz, J2=1.5 Hz, 1H), 8.89 (t, J1=1.5 Hz, 1H), 8.93 (d, J1=5.4 Hz, 1H), 9.22 (t, J1=1.5 Hz, 1H).

Figure 34A:
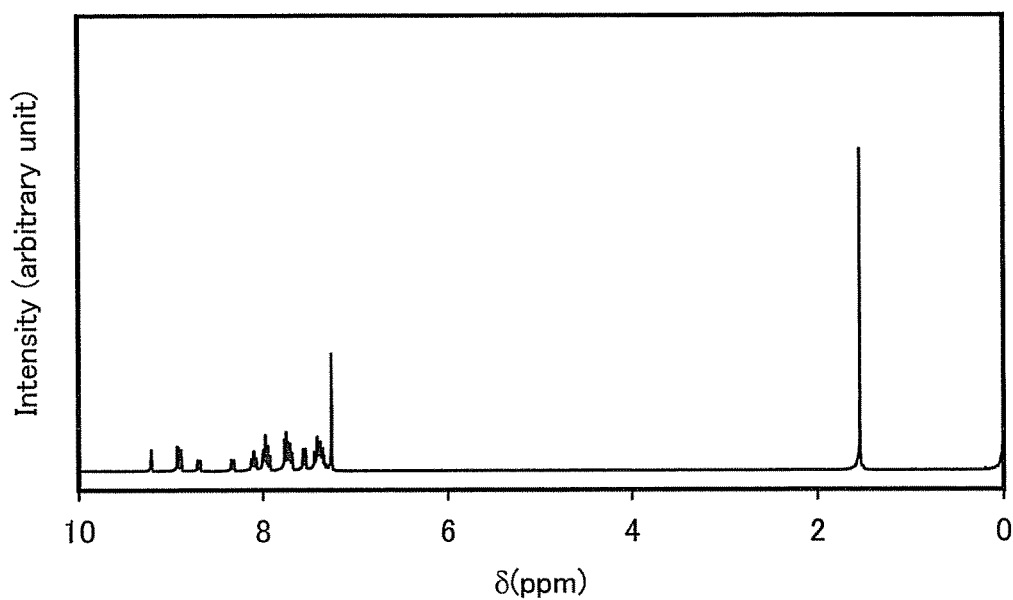
FIGS. 34A and 34B are $^1$H NMR charts of 2,4DBFP2Pm-II.
Figure 34B:
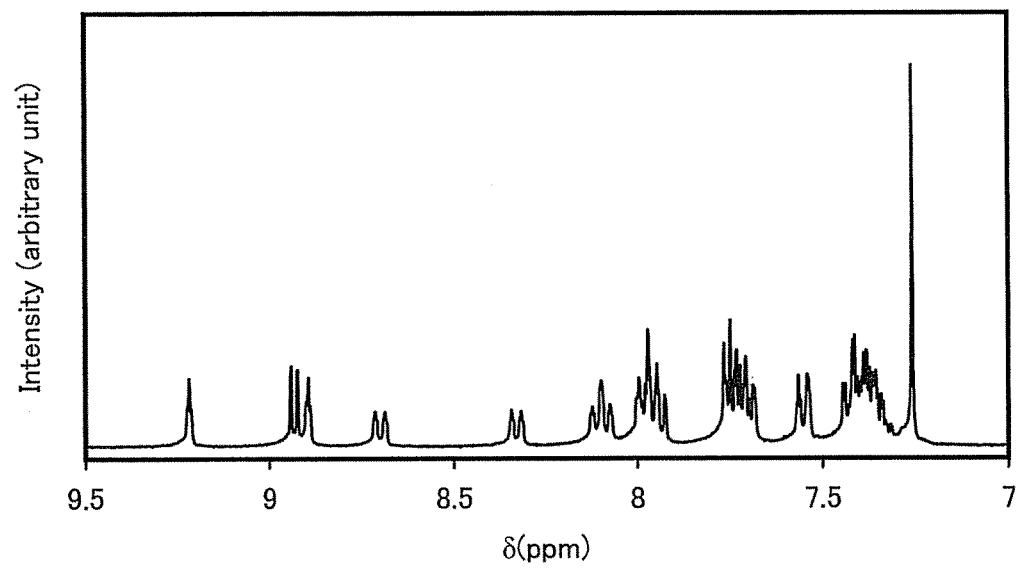

FIGS. 34A and 34B are $^1$H NMR charts. Note that FIG. 34B is a chart where the range of from 7.0 ppm to 9.5 ppm in FIG. 34A is enlarged.

Next, liquid chromatography mass spectrometry (LC/MS) was performed on 2,4-bis[3-(dibenzofuran-4-yl)phenyl]pyrimidine (abbreviation: 2,4mDBFP2Pm-II) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 2,4mDBFP2Pm-II was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B after 10 minutes was 95:5. The composition ratio was changed linearly.

In the MS, ionization was carried out by an electrospray ionization (ESI) method; the capillary voltage and the sample cone voltage were 3.0 kV and 30 V, respectively; detection was carried out in a positive mode. The mass range for the measurement was m/z=100 to 1200.

Figure 106:
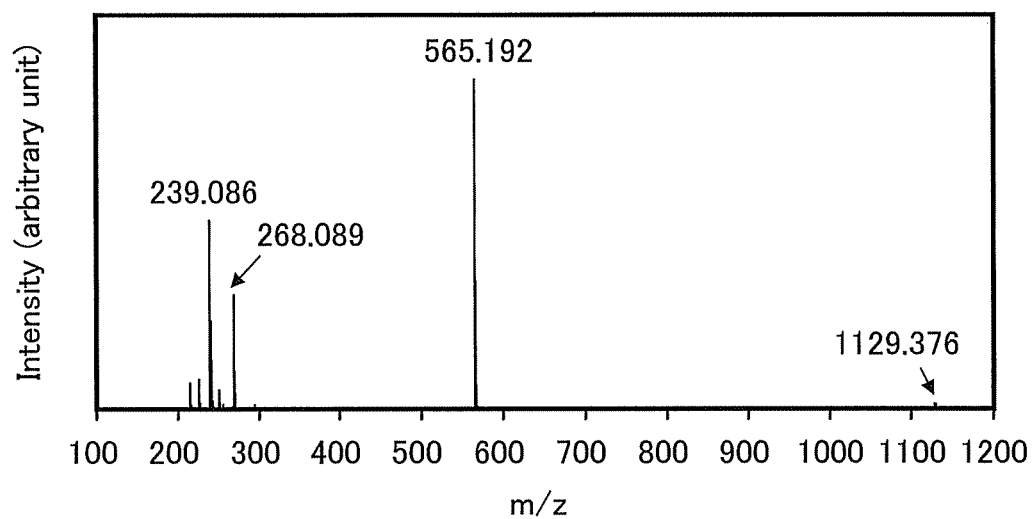
FIG. 106 shows LC-MS measurement results of 2,4mDBFP2Pm-II.

A component with m/z of 564.18 which underwent the separation and the ionization under the above-described conditions was collided with an argon gas in a collision cell to dissociate into product ions. Energy (collision energy) for the collision with argon was 70 eV. FIG. 106 shows the results of the MS of the dissociated product ions by time-of-flight (TOF) mass spectrometry.

The results in FIG. 106 show that as for 2,4mDBFP2Pm-II which is one embodiment of the present invention, peaks of product ions of a partial skeleton are detected mainly around m/z=239 and m/z=268, a peak derived from a precursor ion is detected around m/z=565, and a peak derived from a dimer ion is detected around m/z=1129. Note that the results in FIG. 106 show characteristics derived from 2,4mDBFP2Pm-II and therefore can be regarded as important data for identifying 2,4mDBFP2Pm-II contained in the mixture.

Figure 35A:
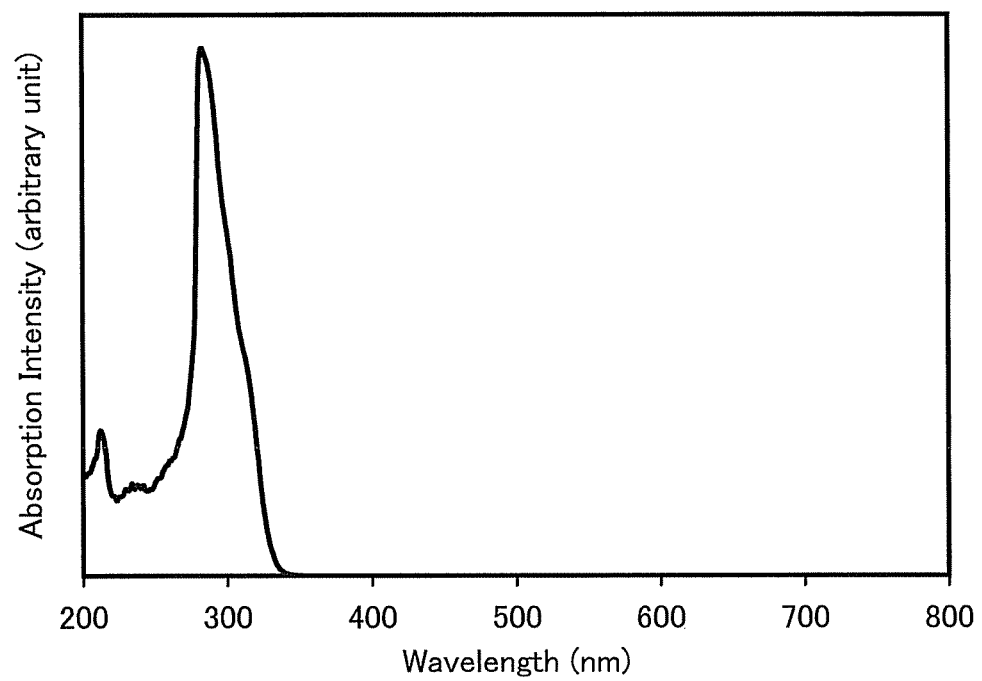
FIGS. 35A and 35B show an absorption spectrum and an emission spectrum of 2,4DBFP2Pm-II in a toluene solution of 2,4DBFP2Pm-II.
Figure 35B:
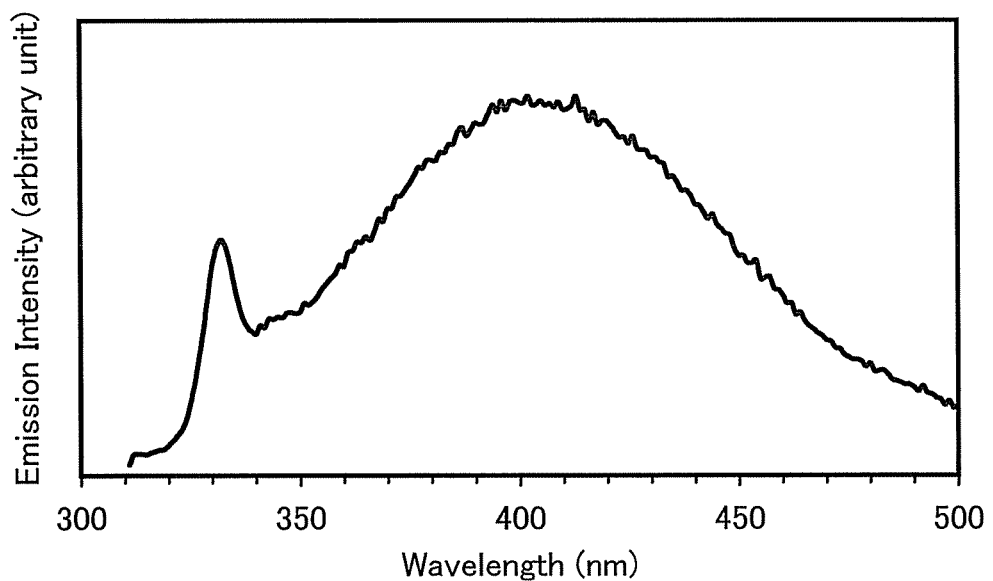
Figure 36A:
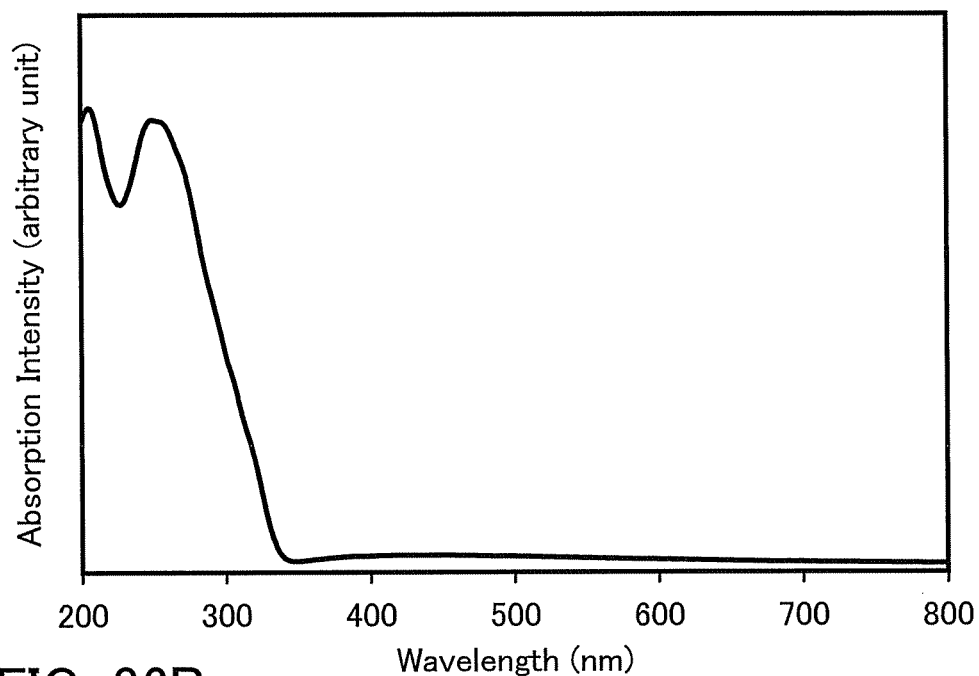
FIGS. 36A and 36B show an absorption spectrum and an emission spectrum of a thin film of 2,4DBFP2Pm-II.
Figure 36B:
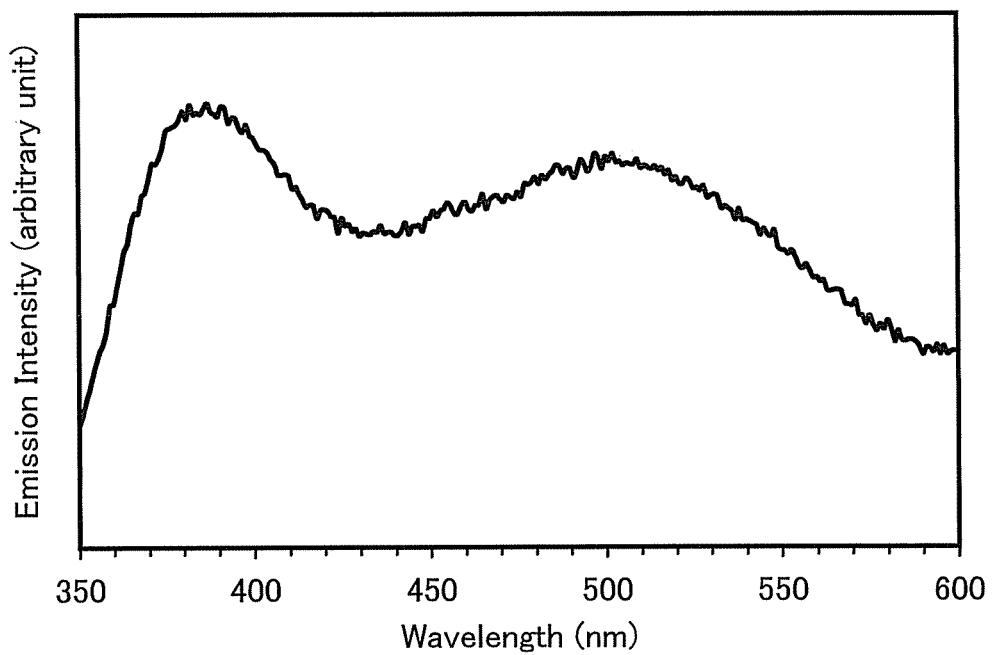

FIG. 35A shows an absorption spectrum of 2,4mDBFP2Pm-II in a toluene solution of 2,4mDBFP2Pm-II and FIG. 35B shows an emission spectrum thereof. FIG. 36A shows an absorption spectrum of a thin film of 2,4mDBFP2Pm-II and FIG. 36B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 35A and 35B and FIGS. 36A and 36B, the horizontal axis represents wavelength (nm) and the vertical axis represents intensity (arbitrary unit). In the case of the toluene solution, the absorption peak is observed around 283 nm, and the emission wavelength peak is observed around 413 nm. In the case of the thin film, the absorption peak is observed around 316 nm, and the emission wavelength peak is observed around 387 nm.

EXAMPLE 10

In this example, a synthesis method of 2,5-[3-(dibenzofuran-4-yl)phenyl]pyrimidine (abbreviation: 2,5-mDBFP2Pm-II) represented by Structural Formula (432) will be described.

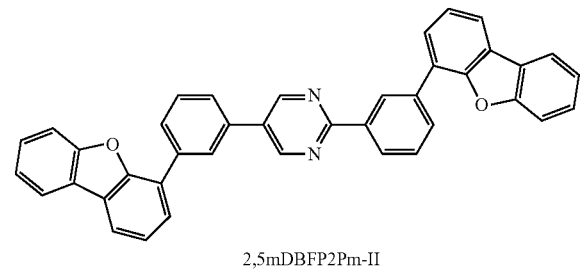

(432)
2,5mDBFP2Pm-II

Synthesis of 2,5-[3-(Dibenzofuran-4-yl)phenyl]pyrimidine (abbreviation: 2,5mDBFP2Pm-II)

A synthesis scheme of 2,5-[3-(dibenzofuran-4-yl)phenyl]pyrimidine (abbreviation: 2,5mDBFP2Pm-II) is shown in (L-1).

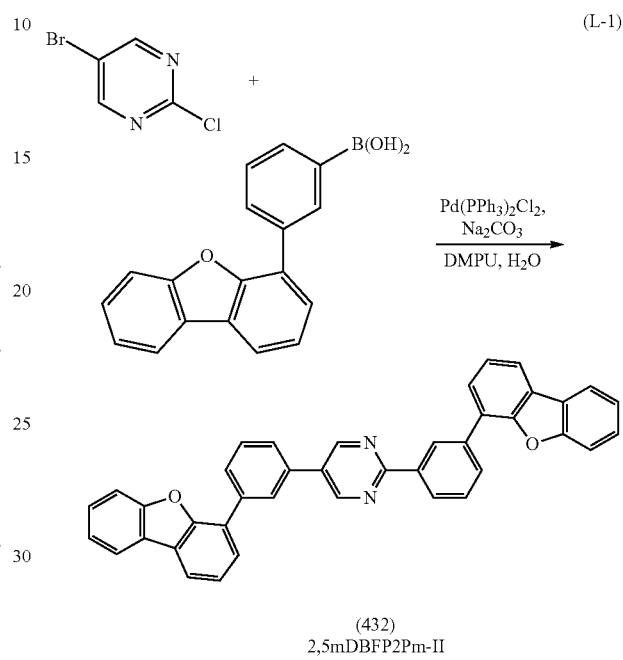

(432)
2,5mDBFP2Pm-II

In a 100 mL recovery flask were put 1.03 g (5.31 mmol) of 5-bromo-2-chloropyrimidine, 3.82 g (13.3 mmol) of 3-(dibenzofuran-4-yl)-phenylboronic acid, and 2.82 g (26.6 mmol) of sodium carbonate. To this mixture were added 20 mL of 1,3-dimethyl-3,4,5,6-tetrahydro-2(1H)-pyrimidinone (abbreviation: DMPU) and 10 mL of water. While the pressure was reduced, this mixture was stirred to be degassed. To this mixture was added 45 mg (63.7 μmol) of bis(triphenylphosphine)palladium(II) dichloride, and the atmosphere was replaced with argon. The reaction container was heated by irradiation with microwaves (2.45 GHz, 100 W) under a nitrogen stream for 2.5 hours. After the heating, water was added to the mixture, and the mixture was filtered to give a residue. The obtained solid was washed with ethanol and dichloromethane. Toluene was added to this solid, and the mixture was suction-filtered through Celite (produced by Wako Pure Chemical Industries, Ltd., Catalog No. 531-16855), alumina, and Florisil (produced by Wako Pure Chemical Industries, Ltd., Catalog No. 540-00135), and the filtrate was concentrated to give a white solid. This solid was purified by silica gel column chromatography (developing solvent, hexane). The obtained solid was recrystallized from toluene to give 1.80 g of a white solid which was a target substance in a yield of 60%.

By a train sublimation method, 1.80 g of the obtained solid was purified. The purification by sublimation was performed by heating at 300° C. under a pressure of 3.3 Pa with an argon flow rate of 5 mL/min. After the purification by sublimation, 1.51 g of a white solid was obtained at a collection rate of 84%.

This compound was identified as 2,5-[3-(dibenzofuran-4-yl)phenyl]pyrimidine (abbreviation: 2,5mDBFP2Pm-II), which was a target substance, by nuclear magnetic resonance ($^1$H NMR) spectroscopy.

$^1$H NMR data of the obtained substance are as follows: $^1$H NMR (CDCl$_3$, 300 MHz):δ=7.35-7.41 (m, 2H), 7.45-7.52 (m, 4H), 7.62-7.78 (m, 7H), 7.96-8.03 (m, 5H), 8.14 (dt, J1=7.8 Hz, J2=1.5 Hz, 1H), 8.21 (dd, J1=2.7 Hz, J2=1.5 Hz, 1H), 8.59 (dt, J1=7.8 Hz, J2=1.5 Hz, 1H), 9.03 (t, J1=1.2 Hz, 1H), 9.18 (s, 2H).

Figure 37A:
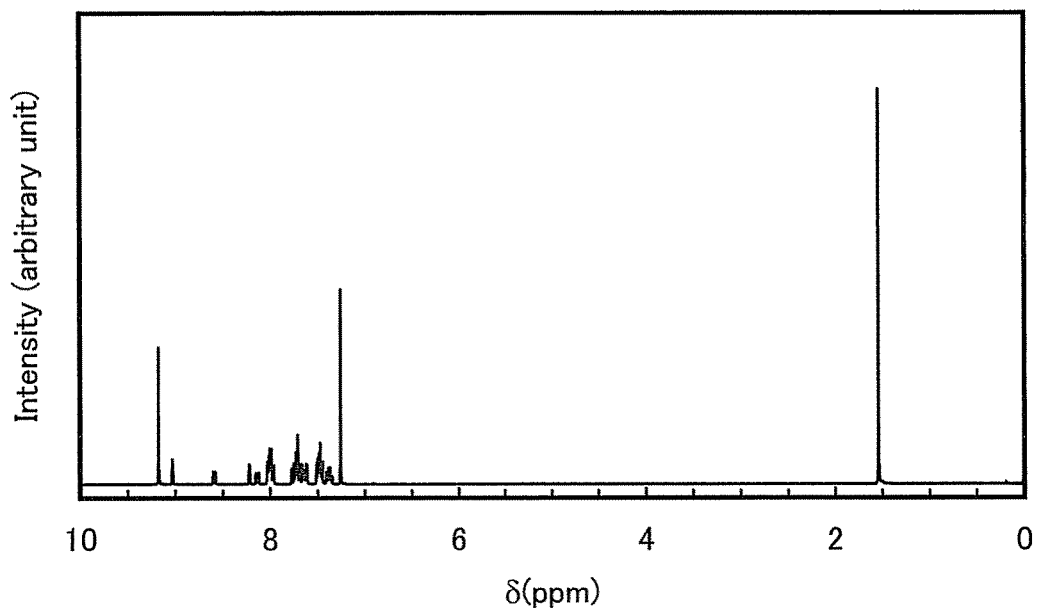
FIGS. 37A and 37B are $^1$H NMR charts of 2,5DBFP2Pm-II.
Figure 37B:
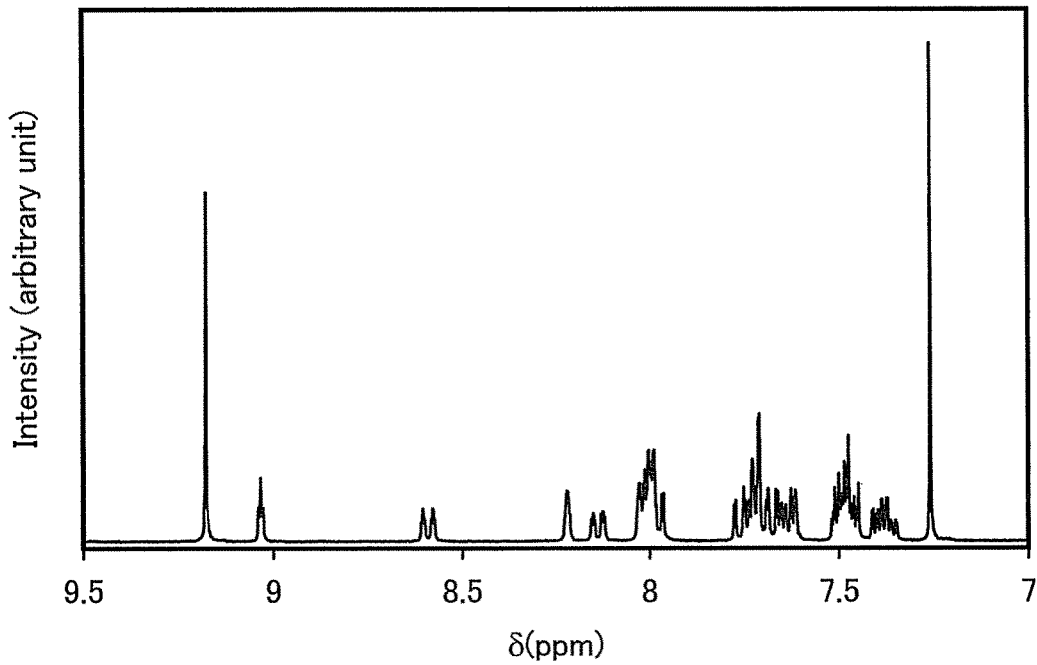

FIGS. 37A and 37B are $^1$H NMR charts. Note that FIG. 37B is a chart where the range of from 7.0 ppm to 9.5 ppm in FIG. 37A is enlarged.

Next, liquid chromatography mass spectrometry (LC/MS) was performed on 2,5-[3-(dibenzofuran-4-yl)phenyl]pyrimidine (abbreviation: 2,5mDBFP2Pm-II) obtained in this example.

In the LC/MS, liquid chromatography (LC) separation was carried out with ACQUITY UPLC (produced by Waters Corporation) and mass spectrometry (MS) was carried out with Xevo G2 T of MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Further, a sample was prepared in such a manner that 2,5mDBFP2Pm-II was dissolved in chloroform at a given concentration and the mixture was diluted with acetonitrile. The injection amount was 5.0 μL.

In the LC separation, a gradient method in which the composition of mobile phases is changed was employed. The composition ratio of Mobile Phase A to Mobile Phase B was 40:60 for 0 to 1 minute after the start of the measurement, and then the composition was changed so that the ratio of Mobile Phase A to Mobile Phase B in the 10th minute was 95:5. The composition ratio was changed linearly.

In the MS, ionization was carried out by an electrospray ionization (ESI) method; the capillary voltage and the sample cone voltage were set to 3.0 kV and 30 V, respectively; detection was carried out in a positive mode. The mass range for the measurement was m/z=100 to 1200.

Figure 107:
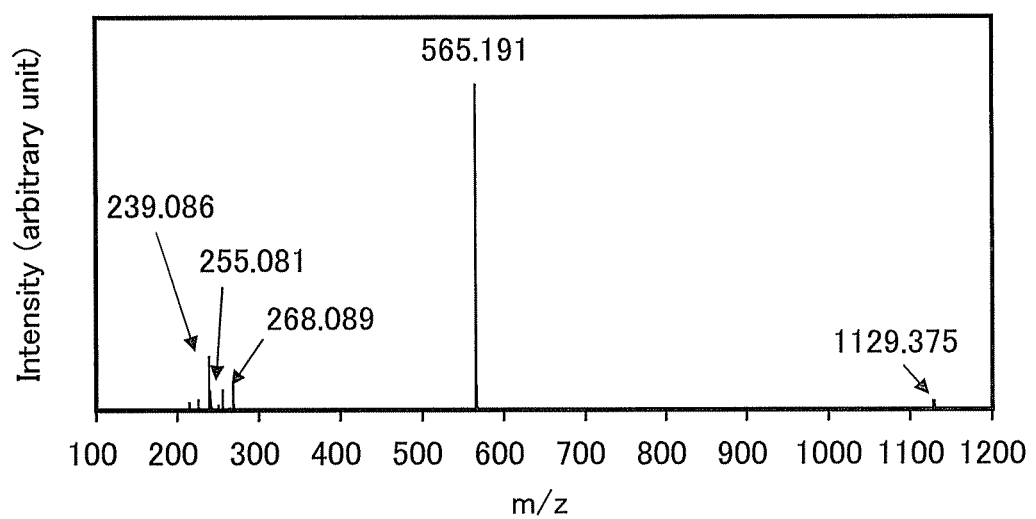
FIG. 107 shows LC-MS measurement results of 2,5mDBFP2Pm-II.

A component with m/z of 564.18 which underwent the separation and the ionization under the above-described conditions was collided with an argon gas in a collision cell to dissociate into product ions. Energy (collision energy) for the collision with argon was 70 eV. FIG. 107 shows the results of the MS of the dissociated product ions by time-of-flight (TOF) mass spectrometry.

The results in FIG. 107 show that as for 2,5mDBFP2Pm-II which is one embodiment of the present invention, peaks of product ions of a partial skeleton are detected mainly around m/z=239, m/z=255, and m/z=268, a peak derived from a precursor ion is detected around m/z=565, and a peak derived from a dimer ion is detected around m/z=1129. Note that the results shown in FIG. 107 show characteristics derived from 2,5mDBFP2Pm-II and therefore can be regarded as important data for identifying 2,5mDBFP2Pm-II contained in the mixture.

Figure 38A:
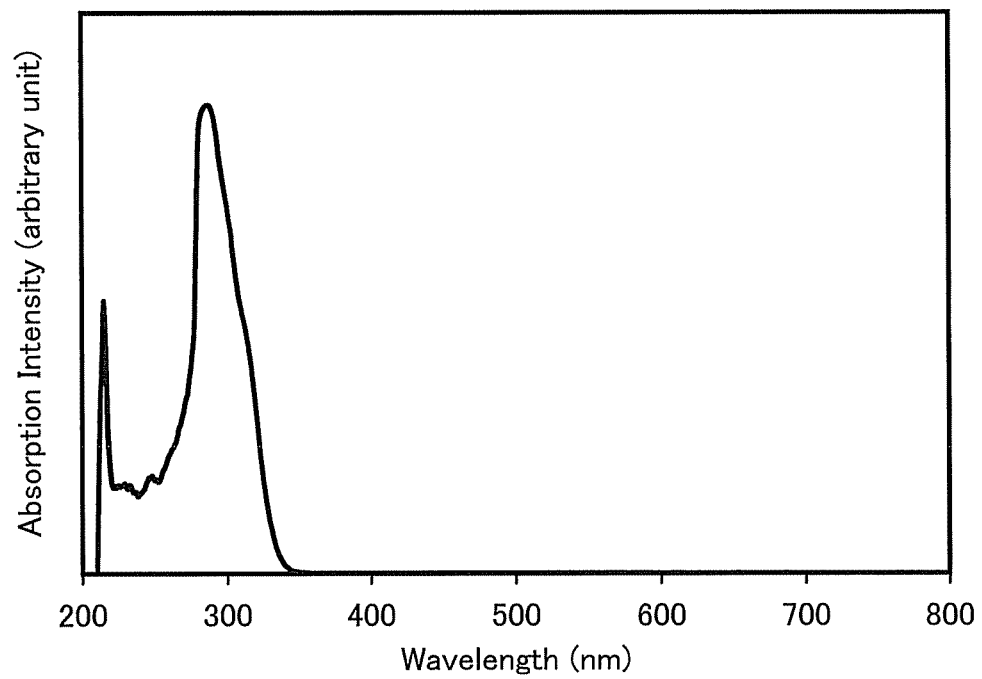
FIGS. 38A and 38B show an absorption spectrum and an emission spectrum of 2,5DBFP2Pm-II in a toluene solution of 2,5DBFP2Pm-II.
Figure 38B:
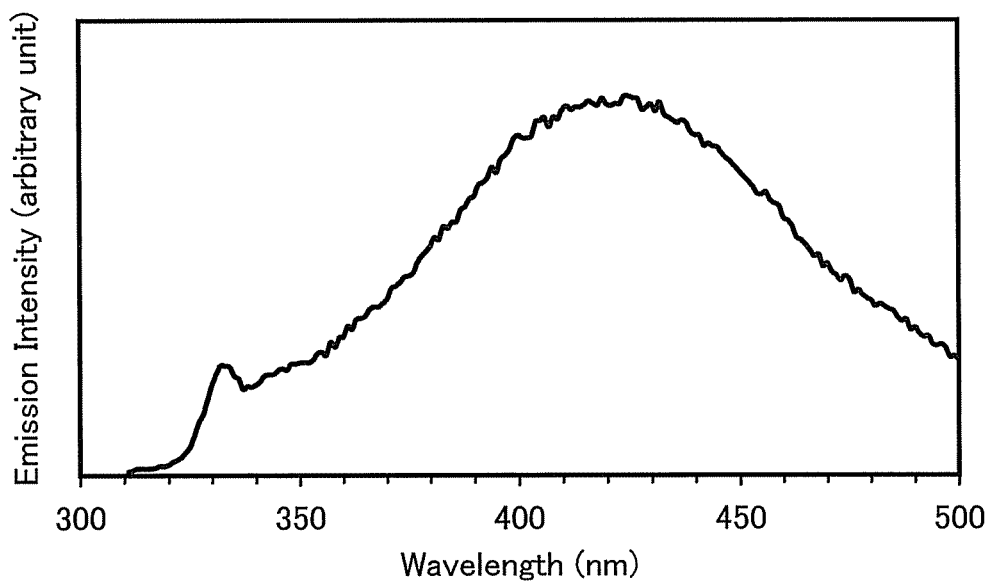
Figure 39A:
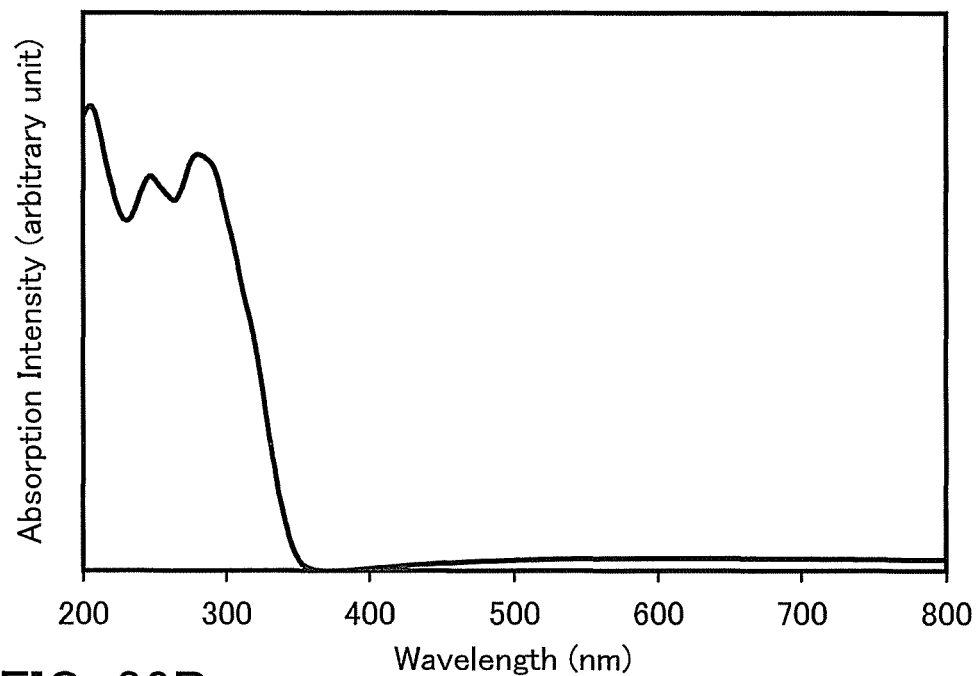
FIGS. 39A and 39B show an absorption spectrum and an emission spectrum of a thin film of 2,5DBFP2Pm-II.
Figure 39B:
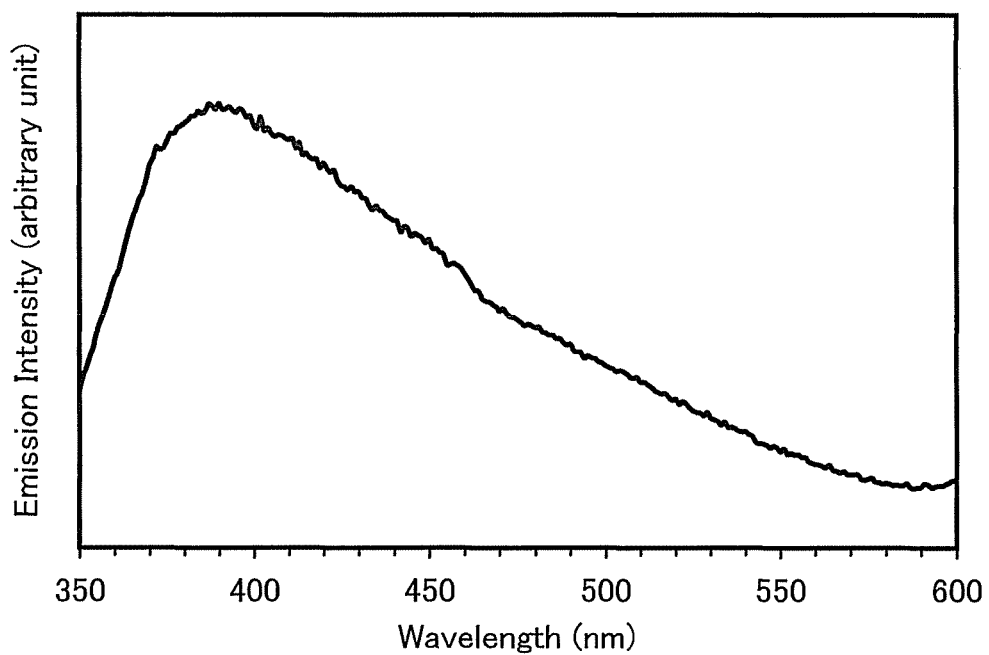

FIG. 38A shows an absorption spectrum of 2,5mDBFP2Pm-II in a toluene solution of 2,5mDBFP2Pm-II, and FIG. 38B shows an emission spectrum thereof. FIG. 39A shows an absorption spectrum of a thin film of 2,5mDBFP2Pm-II and FIG. 39B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of a quartz substrate from those of the quartz substrate and the thin film. In FIGS. 38A and 38B and FIGS. 39A and 39B, the horizontal axis represents wavelength (nm) and the vertical axis represents intensity (arbitrary unit). In the case of the toluene solution, the absorption peak is observed around 287 nm, and the emission wavelength peak is observed around 425 nm. In the case of the thin film, the absorption peaks are observed around 205 nm, 247 nm, 280 nm, 302 nm, and 316 nm n, and the emission wavelength peak is observed around 390 nm.

As described in Examples 1 to 10, according to the absorption spectra, the organic compounds having pyrimidine skeletons that are the second compounds, which are embodiments of the present invention, each have a wide band gap (Bg) between the HOMO level and the LUMO level. The organic compounds each have almost no absorption in the visible light region and have a high light-transmitting property; thus, when any of the organic compounds is used for a light-emitting element, emission energy is unlikely to be absorbed and the element can be expected to have high efficiency. According to the emission spectra, the organic compounds each have a high S1 level, and thus can be expected to be used as a host material for a material emitting fluorescence in the visible light region. Moreover, the organic compounds each have a high S1 level, and thus can be expected to have a high T1 level. Moreover, the organic compounds emit light of purple to blue; thus, the organic compounds can also be used as a light-emitting material.

EXAMPLE 11

In this example, electrochemical characteristics (solution) of Structural Formulae (300), (311), (314), (400), (401), (402), (412), (430), (431), and (432) formed in Examples 1 to 10 as embodiments of the organic compound having a pyrimidine skeleton, which is the second compound, and Structural Formulae (200) to (204), (210) to (213), (250), and (251) which can be used as the first compound were measured. Chemical formulae of materials used in this example are shown below.

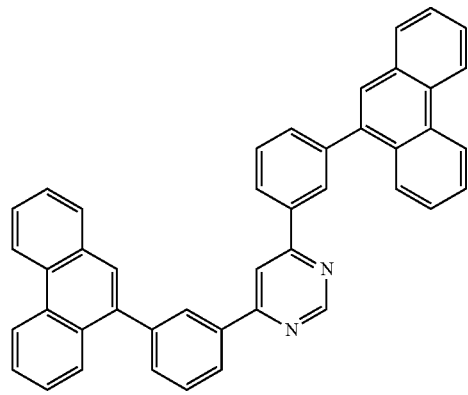
(300)
4,6mPnP2Pm
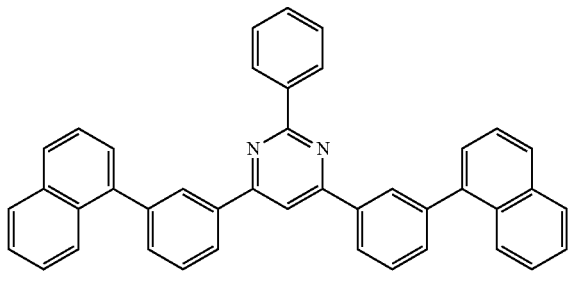
(311)
2Ph-4,6mNP2Pm
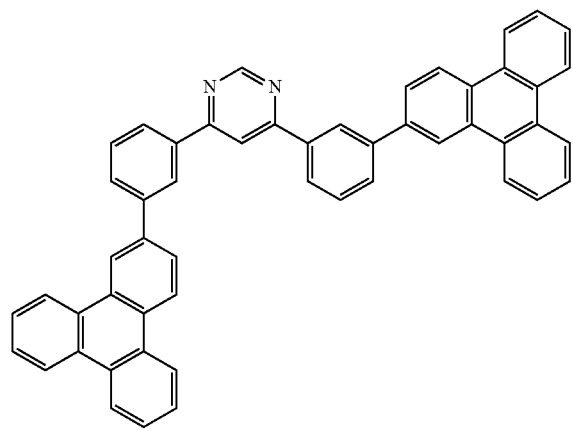
(314)
4,6mTpP2Pm
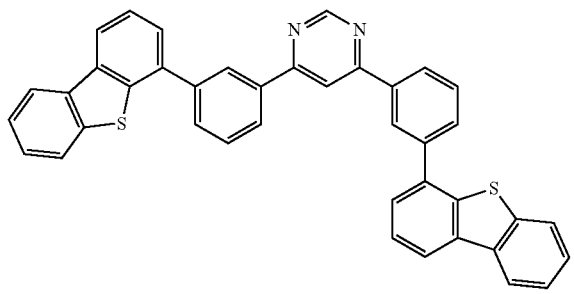
(400)
4,6mDBTP2Pm-II
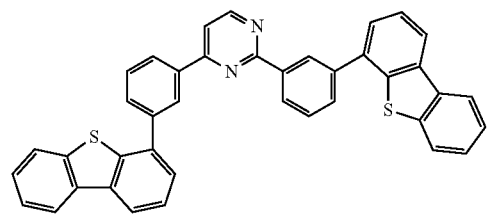
(401)
2,4mDBTP2Pm-II
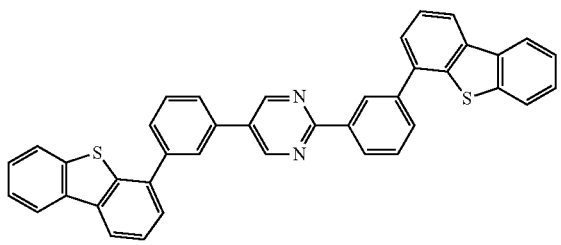
(402)
2,5mDBTP2Pm-II (412)
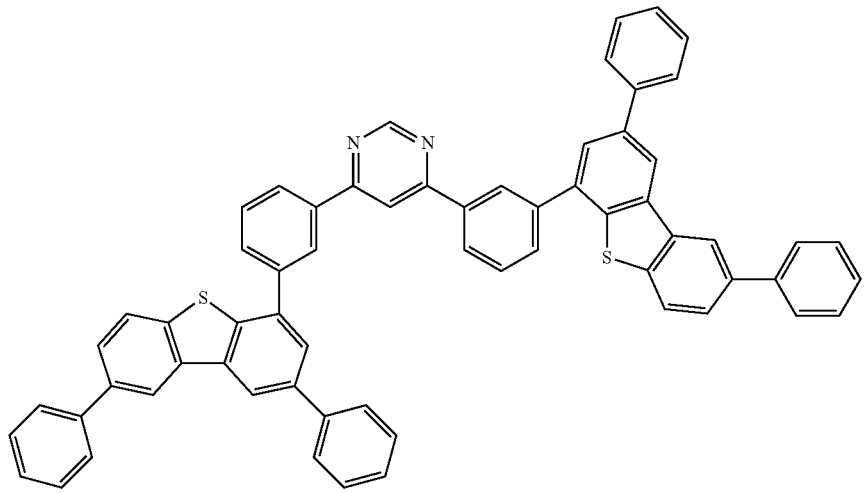
4,6mDBFP2Pm-III
(430)
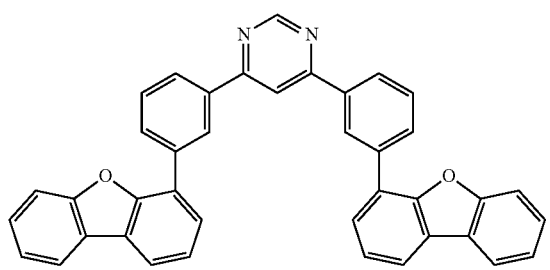
4,6mDBFP2Pm-II
(431)
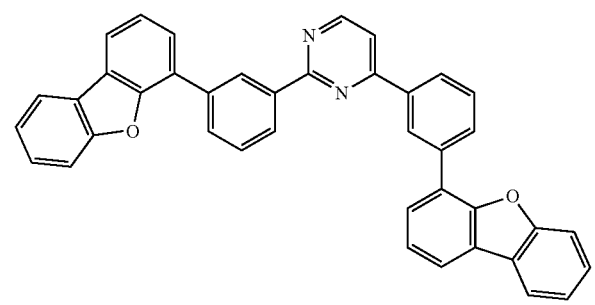
2,4mDBFP2Pm-II
(432)
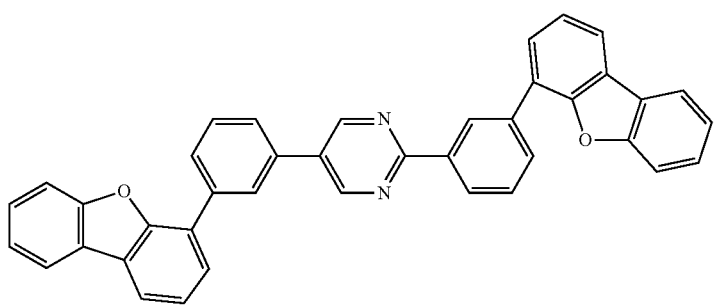
2,5mDBFP2Pm-II
(200) (201)
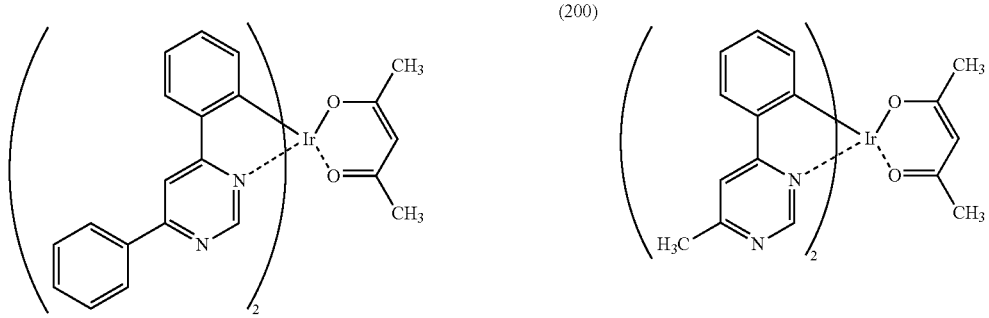

-continued
(202)
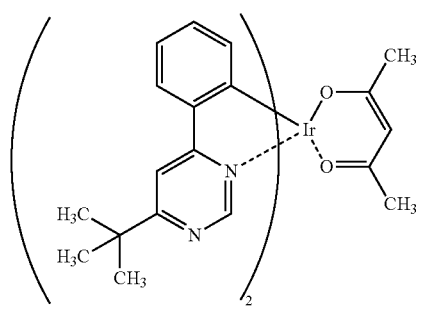
(203)
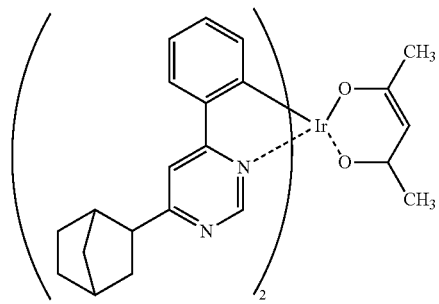
(204)
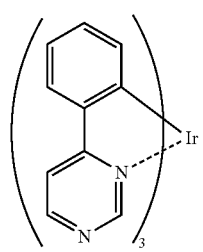
(210)
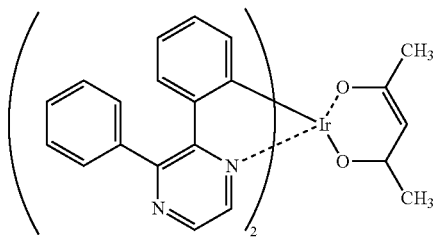
(211)
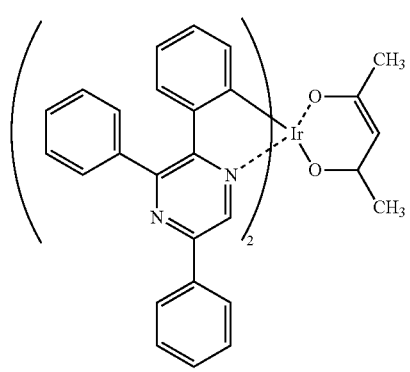
(212)
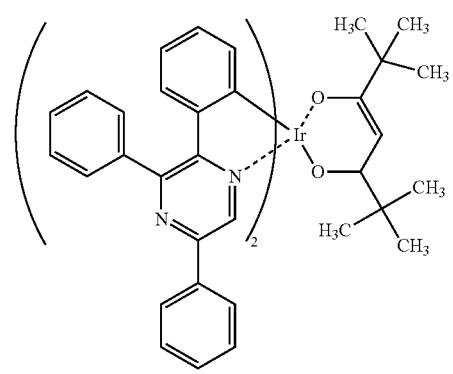
(213)
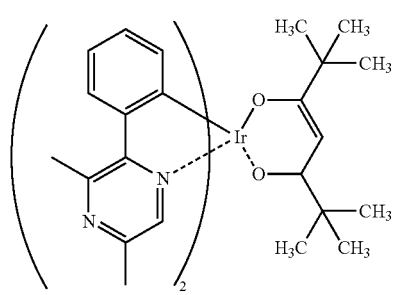
(250)
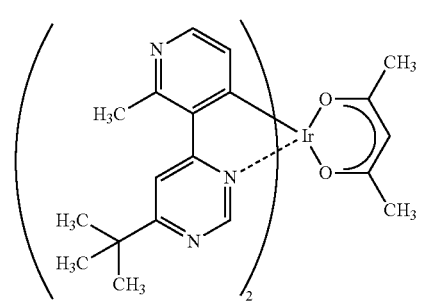

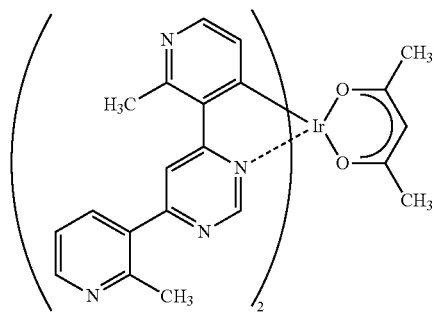
(251)

The electrochemical characteristics were examined by cyclic voltammetry (CV) measurement. An electrochemical analyzer (ALS model 600A or 600C, produced by BAS Inc.) was used for the measurement. Table 1 shows the measurement results.

TABLE 1

| Classification | Structural Formula No. | Abbreviation | Solution (CV) [eV] | |
|---|---|---|---|---|
| | | | Oxidation side | Reduction side |
| Host | 300 | 4,6-mPnP2Pm | −6.22 | −2.79 |
| | 311 | 2Ph-4,6-mNP2Pm | −6.24 | −2.79 |
| | 314 | 4,6mTpP2Pm | ND | −2.79 |
| | 400 | 4,6mDBTP2Pm-II | −6.22 | −2.83 |
| | 401 | 2,4mDBTP2Pm-II | −6.18 | −2.72 |
| | 402 | 2,5mDBTP2Pm-II | −6.22 | −2.72 |
| | 412 | 4,6-mDBTP2Pm-III | −6.04 | −2.83 |
| | 430 | 4,6mDBFP2Pm-II | ND | −2.78 |
| | 431 | 2,4mDBFP2Pm-II | ND | −2.68 |
| | 432 | 2,5mDBFP2Pm-II | ND | −2.66 |
| Dopant | 200 | Ir(dppm)$_2$(acac) | −5.56 | −2.98 |
| | 201 | Ir(mppm)$_2$(acac) | −5.56 | −2.75 |
| | 202 | Ir(tBuppm)$_2$(acac) | −5.56 | −2.73 |
| | 203 | Ir(nbppm)$_2$(acac) | −5.55 | −2.74 |
| | 204 | Ir(dppm)$_3$ | −5.52 | −2.93 |
| | 210 | Ir(dppr)$_2$(acac) | −5.60 | −2.97 |
| | 211 | Ir(tppr)$_2$(acac) | −5.60 | −3.09 |
| | 212 | Ir(tppr)$_2$(dpm) | −5.57 | −3.05 |
| | 213 | Ir(mppr-Me)$_2$(dpm) | −5.50 | −2.77 |
| | 250 | Ir(tBumpypm)$_2$(acac) | −5.85 | −2.90 |
| | 251 | Ir(tBumpypm)$_3$ | −5.91 | −2.87 |

The data on the oxidation side (potential of one-electron oxidation) in Table 1 correspond to values of HOMO levels. According to the data, 4,6mPnP2Pm and the like of embodiments of the organic compound having a pyrimidine skeleton that is the second compound each have a deeper HOMO level (smaller value) than an iridium metal complex that is a dopant; thus, holes can be efficiently injected into the iridium metal complex that is a dopant. It was also found that when the iridium metal complex has a HOMO level of greater than or equal to −6.0 eV and less than or equal to −5.0 eV, the iridium metal complex can trap electrons more efficiently than the organic compound having a pyrimidine skeleton that is the second compound.

The data on the oxidation side (potential of one-electron reduction) in Table 1 correspond to values of LUMO levels. According to the data, 4,6mPnP2Pm and the like of embodiments of the organic compound having a pyrimidine skeleton, which is the second compound, each have a LUMO level which is equal to or slightly shallower than that of the phosphorescent iridium metal complex, which is a dopant, and have a similar value of the LUMO level to the phosphorescent iridium metal complex; thus, electrons can be efficiently injected into the iridium metal complex that is a dopant. Moreover, it was indicated that the iridium complex that is a dopant does not impair the electron-transport properties of 4,6mPnP2Pm and the like that are host materials and an element having low driving voltage can be manufactured.

The above results show that any of the organic compounds having pyrimidine skeletons of embodiments of the present invention has a relatively deep HOMO level and an appropriate LUMO level, and thus is suitable as a host material for an iridium metal complex. In particular, any of the organic compounds having pyrimidine skeletons is suitable as an iridium metal complex having a diazine skeleton, specifically a pyrimidine skeleton, which has a similar LUMO level to a host material.

The phosphorescent iridium metal complexes represented by Structural Formulae (200) to (204), (250), and (251) each have a pyrimidine skeleton, and the phosphorescent iridium metal complexes represented by Structural Formulae (210) to (213) each have a pyrazine skeleton, and thus all the phosphorescent iridium metal complexes have diazine skeletons.

Note that the cyclic voltammetry (CV) measurement was performed as described below. Although described below is a description of the measurement of 4,6mPnP2Pm, the description is applied to the measurement of the other compounds.

As for a solution used for the CV measurement, dehydrated dimethylformamide (DMF, manufactured by Sigma-Aldrich Inc., 99.8%, catalog No. 22705-6) was used as a solvent, and tetra-n-butylammonium perchlorate (n-Bu$_4$NClO$_4$, manufactured by Tokyo Chemical Industry Co., Ltd., catalog No. T0836), which was a supporting electrolyte, was dissolved in the solvent such that the concentration of tetra-n-butylammonium perchlorate was 100 mmol/L. Further, the object to be measured was dissolved in the solvent such that the concentration thereof was 2 mmol/L. A platinum electrode (PTE platinum electrode, manufactured by BAS Inc.) was used as a working electrode, a platinum electrode (Pt counter electrode for VC-3 (5 cm), manufactured by BAS Inc.) was used as an auxiliary electrode, and an Ag/Ag$^+$ electrode (RE-7 reference electrode for nonaqueous solvent, manufactured by BAS Inc.) was used as a reference electrode. The CV measurement was performed at room temperature (20° C. to 25° C.). In addition, the scan rate at the CV measurement was set to 0.1 V/sec in all the measurement.

(Calculation of Potential Energy of Reference Electrode with Respect to Vacuum Level)

First, a potential energy (eV) of the reference electrode (Ag/Ag$^+$ electrode), which was used in this example, with respect to the vacuum level was calculated. In other words, Fermi level of the Ag/Ag$^+$ electrode was calculated. It is known that the oxidation-reduction potential of ferrocene in methanol is +0.610 [Vvs. SHE] with respect to the normal hydrogen electrode (Reference: Christian R. Goldsmith et al., J. Am. Chem. Soc., Vol. 124, No. 1, 83-96, 2002).

In contrast, using the reference electrode used in this example, the oxidation-reduction potential of ferrocene in methanol was calculated to be +0.11 V [vs. Ag/Ag$^+$]. Therefore, the potential energy of the reference electrode used in this example was found to be lower than that of the standard hydrogen electrode by 0.50 [eV]

Here, it is known that the potential energy of the standard hydrogen electrode with respect to the vacuum level is −4.44 eV (Reference: Toshihiro Ohnishi and Tamami Koyama, *High molecular EL material*, Kyoritsu shuppan, pp. 64-67). Therefore, the potential energy of the reference electrode, which was used in this example, with respect to the vacuum level can be calculated as follows: −4.44−0.50=−4.94 [eV].

The oxidation characteristics of the organic compounds of this example were measured in the following manner: the potential of the working electrode with respect to the reference electrode was scanned from about 0.3 V to about 1.5 V, and then from about 1.5 V to about 0.3 V.

Now, the calculation of the HOMO level of the object by CV measurement is described in detail. The oxidation peak potential (from the neutral state to the oxidation state) $E_{pa}$ [V] and the reduction peak potential (from the oxidation state to the neutral state) $E_{pc}$ [V] were calculated. Therefore, the half-wave potential (intermediate potential between $E_{pa}$ and $E_{pc}$) can be calculated as follows: $((E_{pa}+E_{pc})/2$ [V]). This shows that the compound of this example can be oxidized by the electric energy of the value of the half-wave potential [V vs. Ag/Ag$^+$], and this energy corresponds to the HOMO level.

The reduction characteristics of the compound of this example was measured in the following manner: the potential of the working electrode with respect to the reference electrode was scanned from about −1.5 V to about −2.2 V, and then from about −2.2 V to about −1.5 V.

Now, the calculation of the LUMO level of the object by CV measurement is described in detail. The reduction peak potential (from the neutral state to the reduction state) $E_{pa}$ [V] and the oxidation peak potential (from the reduction state to the neutral state) $E_{pc}$[V] were calculated. Therefore, the half-wave potential (intermediate potential between $E_{pa}$ and $E_{pc}$) can be calculated as follows: $((E_{pa}+E_{pc})/2$ [V]). This shows that the compound of this example can be reduced by the electric energy of the value of the half-wave potential [V vs. Ag/Ag$^+$], and this energy corresponds to the LUMO level.

EXAMPLE 12

In this example, evaluation was performed on a light-emitting element 1 which includes a phosphorescent iridium metal complex having a pyrimidine skeleton, which is a first compound, and the organic compound having a pyrimidine skeleton, which is a second compound. The organic compound having a pyrimidine skeleton is represented by Structural Formula (300) and described in Embodiment 1 and Example 1. The phosphorescent iridium metal complex having a pyrimidine skeleton and the organic compound having a pyrimidine skeleton were used as light-emitting substances. Chemical formulae of materials used in this example are shown below.

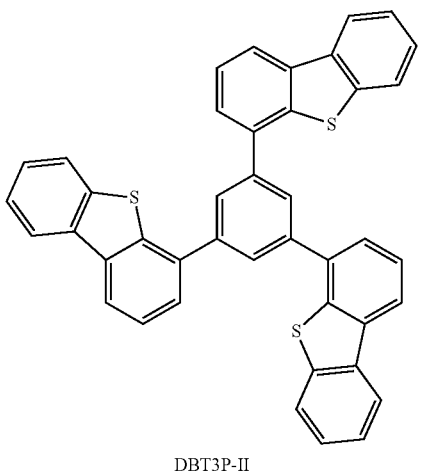

DBT3P-II

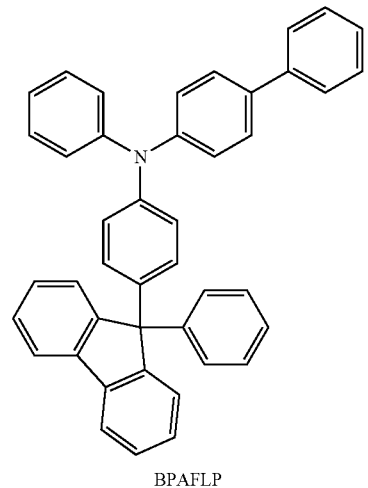

BPAFLP

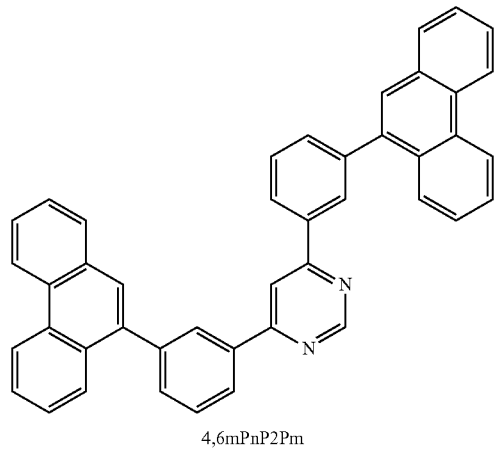

4,6mPnP2Pm

-continued

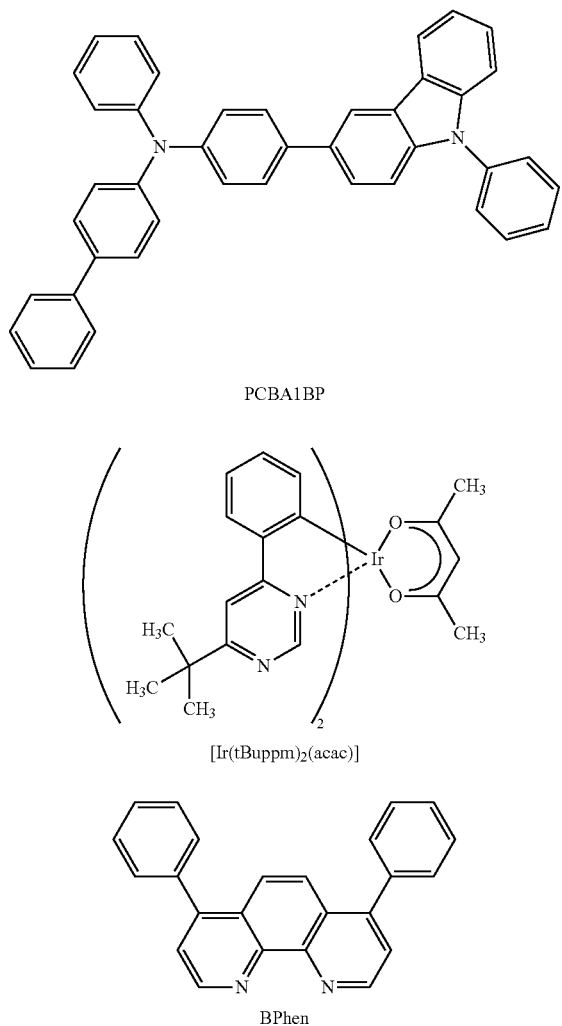

PCBA1BP

[Ir(tBuppm)₂(acac)]

BPhen

Figure 40:
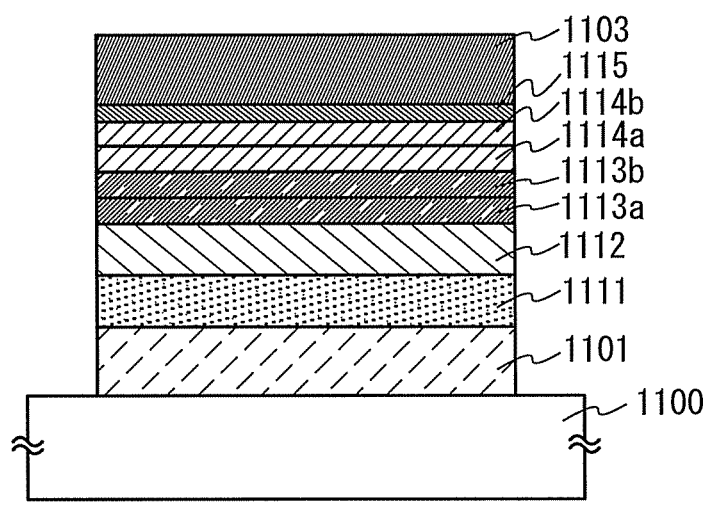
FIG. 40 illustrates a light-emitting element 1 in Example.

The light-emitting element 1 is described with reference to FIG. 40. A manufacturing method of the light-emitting element 1 of this example is described below.
(Light-Emitting Element 1)

First, over a substrate 1100, an indium oxide-tin oxide compound containing silicon or silicon oxide (ITO-SiO₂, hereinafter abbreviated to ITSO) was deposited by a sputtering method, so that a first electrode 1101 was formed. Note that the composition ratio of In₂O₃ to SnO₂ and SiO₂ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed, baked at 200° C. for 1 hour, and then subjected to UV ozone treatment for 370 seconds.

After that, the substrate 1100 was transferred into a vacuum evaporation apparatus where the pressure had been reduced to approximately 10⁻⁴ Pa, and subjected to vacuum baking at 170° C. for 30 minutes in a heating chamber of the vacuum evaporation apparatus, and then the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about 10⁻⁴ Pa. After that, on the first electrode 1101, 1,3,5-tri(dibenzothiophen-4-yl)-benzene (abbreviation: DBT3P-II) and molybdenum oxide were co-evaporated, so that a hole-injection layer 1111 was formed. The thickness of the hole-injection layer 1111 was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, on the hole-injection layer 1111, 4-phenyl-4'-(9-phenylfluoren-9-yl)triphenylamine (abbreviation: BPAFLP) was deposited to a thickness of 20 nm, so that a hole-transport layer 1112 was formed.

Further, 4,6-bis[3-(phenanthren-9-yl)phenyl]pyrimidine (abbreviation: 4,6mPnP2Pm) synthesized in Example 1, 4-phenyl-4'-(9-phenyl-9H-carbazol-3-yl)triphenylamine (abbreviation: PCBA1BP), and (acetylacetonato)bis(6-tert-butyl-4-phenylpyrimidinato)iridium(III) (abbreviation: [Ir(tBuppm)₂(acac)]) were co-evaporated, so that a first light-emitting layer 1113a was formed on the hole-transport layer 1112. Here, the weight ratio of 4,6mPnP2Pm to PCBA1BP and [Ir(tBuppm)₂(acac)] was adjusted to 0.7:0.3:0.05 (=4,6mPnP2Pm: PCBA1BP: [Ir(tBuppm)₂(acac)]). The thickness of the first light-emitting layer 1113a was set to 15 nm.

Next, 4,6-mPnP2Pm, PCBA1BP, and [Ir(tBuppm)₂(acac)] were co-evaporated on the first light-emitting layer 1113a, so that a second light-emitting layer 1113b was formed on the first light-emitting layer 1113a. Here, the weight ratio of 4,6mPnP2Pm to PCBA1BP and [Ir(tBuppm)₂(acac)] was adjusted to 0.8:0.2:0.05 (=4,6mPnP2Pm: PCBA1BP: [Ir(tBuppm)₂(acac)]). The thickness of the second light-emitting layer 1113b was set to 25 nm.

Then, on the second light-emitting layer 1113b, a film of 4,6mPnP2Pm was formed to a thickness of 10 nm, so that a first electron-transport layer 1114a was formed.

Then, on the first electron-transport layer 1114a, a film of bathophenanthroline (abbreviation: BPhen) was formed to a thickness of 20 nm, so that a second electron-transport layer 1114b was formed.

Further, a film of lithium fluoride (LiF) was formed to a thickness of 1 nm on the second electron-transport layer 1114b by evaporation, so that an electron-injection layer 1115 was formed.

Lastly, by evaporation, a film of aluminum was formed to a thickness of 200 nm as a second electrode 1103 functioning as a cathode. Through the above-steps, the light-emitting element 1 was manufactured.

Table 2 shows an element structure of the light-emitting element 1 obtained as described above.

TABLE 2

| | First electrode | Hole-injection layer | Hole-transport layer | First light-emitting layer | Second light-emitting layer |
|---|---|---|---|---|---|
| Light-emitting element 1 | ITSO 110 nm | DBT3P-II:MoOx (=4:2) 40 nm | BPAFLP 20 nm | 4,6-mPnP2Pm:PCBA1BP:Ir(tBuppm)$_2$acac = (0.7:0.3:0.05) 15 nm | 4,6-mPnP2Pm:PCBA1BP:Ir(tBuppm)$_2$acac = (0.8:0.2:0.05) 25 nm |

| | First electron-transport layer | Second electron-transport layer | Electron-injection layer | Second electrode |
|---|---|---|---|---|
| Light-emitting element 1 | 4,6-mPnP2Pm 10 nm | BPhen 20 nm | LiF 1 nm | Al 200 nm |

In a glove box containing a nitrogen atmosphere, the light-emitting element 1 was sealed so as not to be exposed to the air (a sealant was applied onto an outer edge of the element and heat treatment was performed at 80° C. for 1 hour at the time of sealing). After that, operation characteristics of the light-emitting element 1 were measured. Note that the measurement was carried out at room temperature (in an atmosphere kept at 25° C.).

Figure 41:
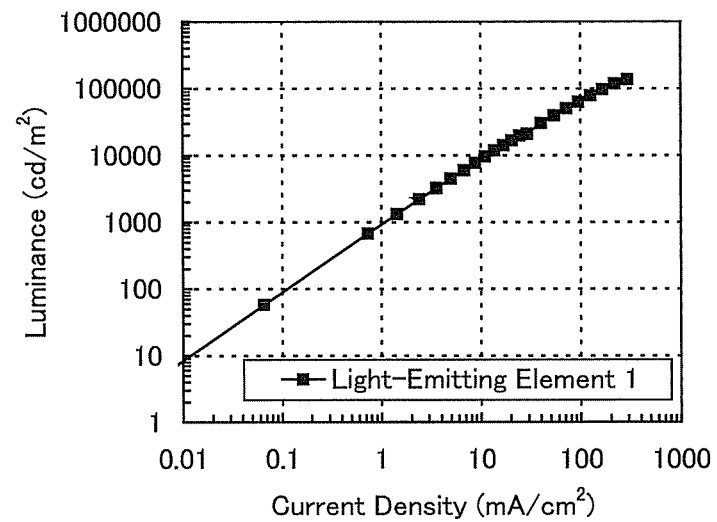
FIG. 41 shows luminance versus current density characteristics of the light-emitting element 1.
Figure 42:
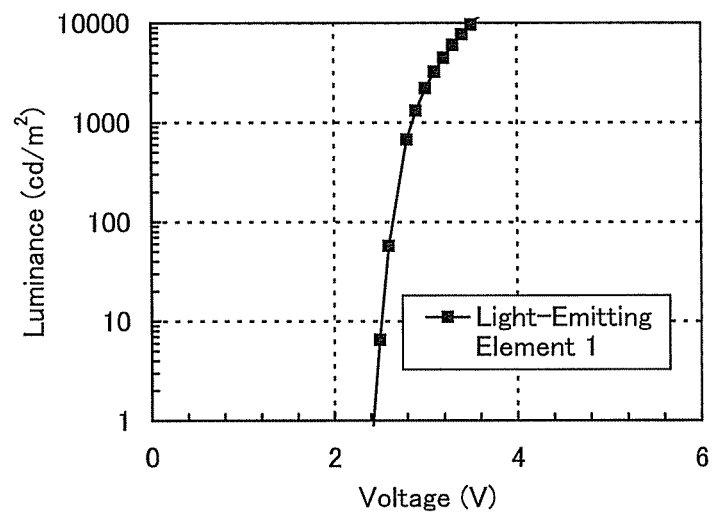
FIG. 42 shows luminance versus voltage characteristics of the light-emitting element 1.
Figure 43:
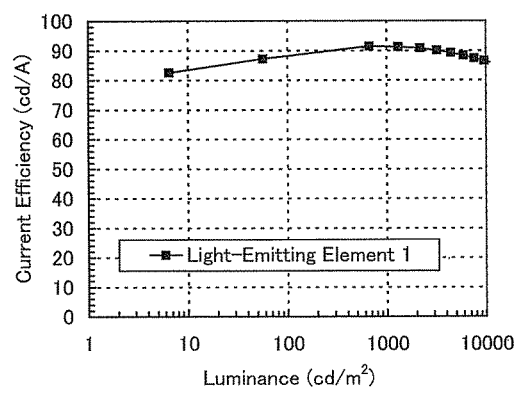
FIG. 43 shows current efficiency versus luminance characteristics of the light-emitting element 1.
Figure 44:
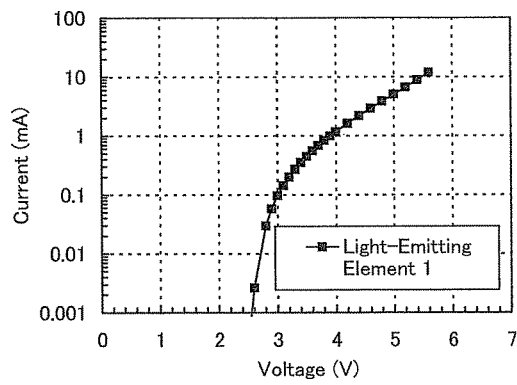
FIG. 44 shows current versus voltage characteristics of the light-emitting element 1.
Figure 45:
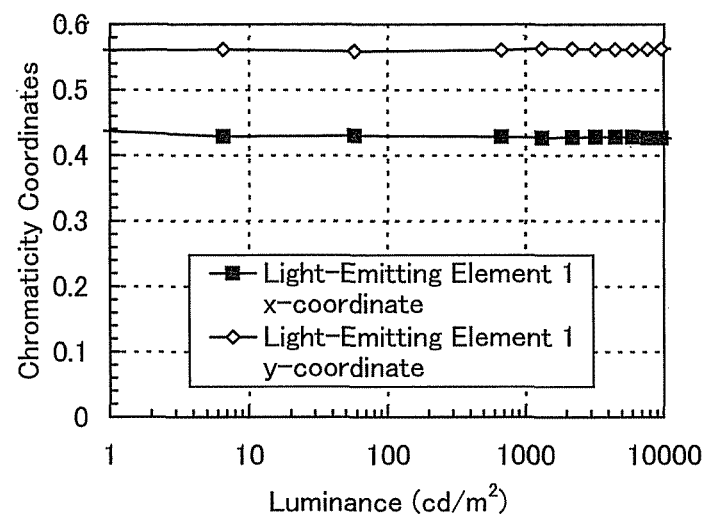
FIG. 45 shows chromaticity coordinates versus luminance characteristics of the light-emitting element 1.
Figure 46:
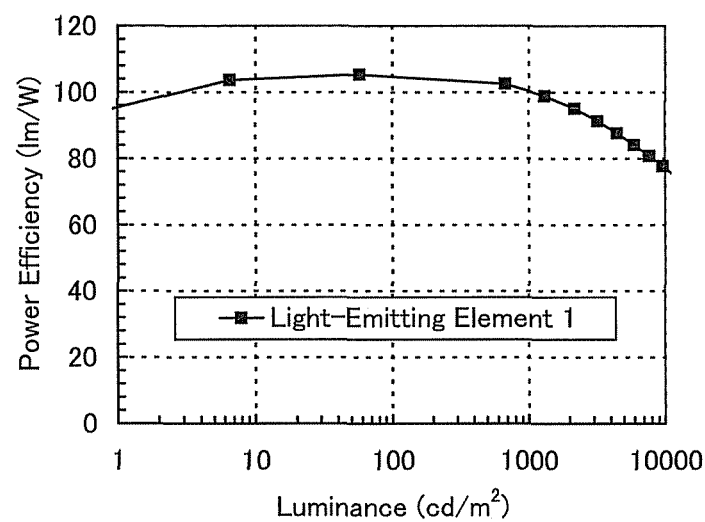
FIG. 46 shows power efficiency versus luminance characteristics of the light-emitting element 1.

FIG. 41 shows luminance versus current density characteristics of the light-emitting element 1. In FIG. 41, the horizontal axis represents current density (mA/cm$^2$) and the vertical axis represents luminance (cd/m$^2$). FIG. 42 shows luminance versus voltage characteristics of the light-emitting element 1. In FIG. 42, the horizontal axis represents voltage (V) and the vertical axis represents luminance (cd/m$^2$). FIG. 43 shows current efficiency versus luminance characteristics of the light-emitting element 1. In FIG. 43, the horizontal axis represents luminance (cd/m$^2$) and the vertical axis represents current efficiency (cd/A). FIG. 44 shows current versus voltage characteristics of the light-emitting element 1. In FIG. 44, the horizontal axis represents voltage (V) and the vertical axis represents current (mA). FIG. 45 shows chromaticity coordinate versus luminance characteristics of the light-emitting element 1. In FIG. 45, the horizontal axis represents luminance (cd/m$^2$) and the vertical axis represents chromaticity coordinates (x-coordinate and y-coordinate). FIG. 46 shows power efficiency versus luminance characteristics of the light-emitting element 1. In FIG. 46, the horizontal axis represents luminance (cd/m$^2$) and the vertical axis represents power efficiency (lm/W).

Table 3 shows the voltage (V), current density (mA/cm$^2$), CIE chromaticity coordinates (x, y), luminance (cd/m$^2$), current efficiency (cd/A), and external quantum efficiency (%) of the light-emitting element 1 at a luminance of around 1000 cd/m$^2$.

TABLE 3

| | Voltage (V) | Current density (mA/cm$^2$) | Chromaticity x Chromaticity y | Luminance (cd/m$^2$) | Current efficiency (cd/A) | External quantum efficiency (%) |
|---|---|---|---|---|---|---|
| Light-emitting element 1 | 2.9 | 1.4 | 0.43 0.56 | 1300 | 91 | 25 |

Figure 47:
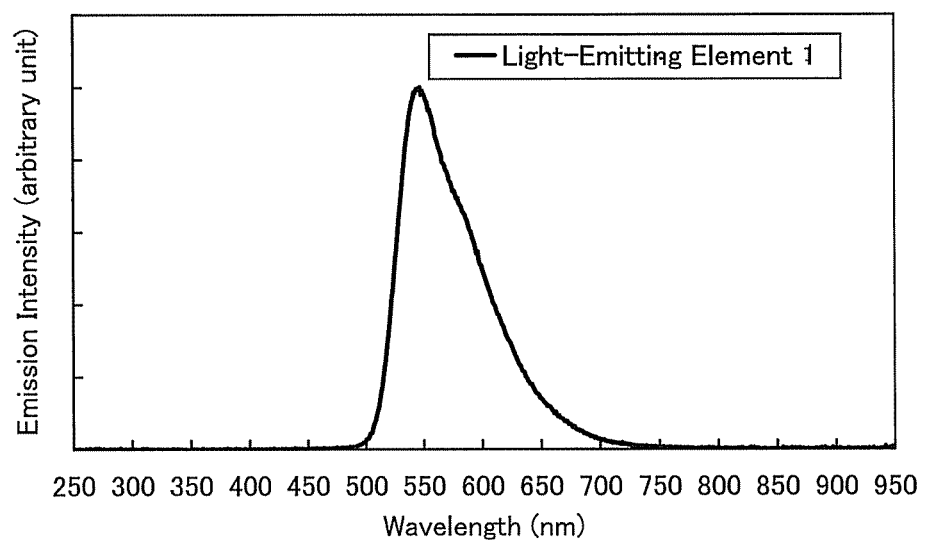
FIG. 47 shows an emission spectrum of the light-emitting element 1.

FIG. 47 shows an emission spectrum at a current density of the light-emitting element 1 of 2.5 mA/cm$^2$. As shown in FIG. 47, the emission spectrum of the light-emitting element 1 has a peak at 547 nm.

As shown in Table 3, the CIE chromaticity coordinates of the light-emitting element 1 at a luminance of 1300 cd/m$^2$ were (x, y)=(0.43, 0.56). Thus, light emission derived from the dopant was obtained.

As described above, the light-emitting element 1 of one embodiment of the present invention which includes, as the light-emitting substances, the phosphorescent iridium metal complex having a pyrimidine skeleton, which is the first compound, and the organic compound having a pyrimidine skeleton, which is the second compound, can efficiently emit light in the green wavelength range. In addition, 4,6mPnP2Pm was found to have a higher T1 level than green light. This shows that 4,6mPnP2Pm is suitable as a host for a material emitting green light or light with a wavelength longer than that of green light.

Further, FIG. 41 and FIG. 42 show that the light-emitting element 1 has low driving voltage and low power consumption. FIG. 43 and FIG. 46 show that the light-emitting element 1 has high efficiency. FIG. 45 shows that the light-emitting element 1 has favorable carrier balance at any luminance.

Figure 48:
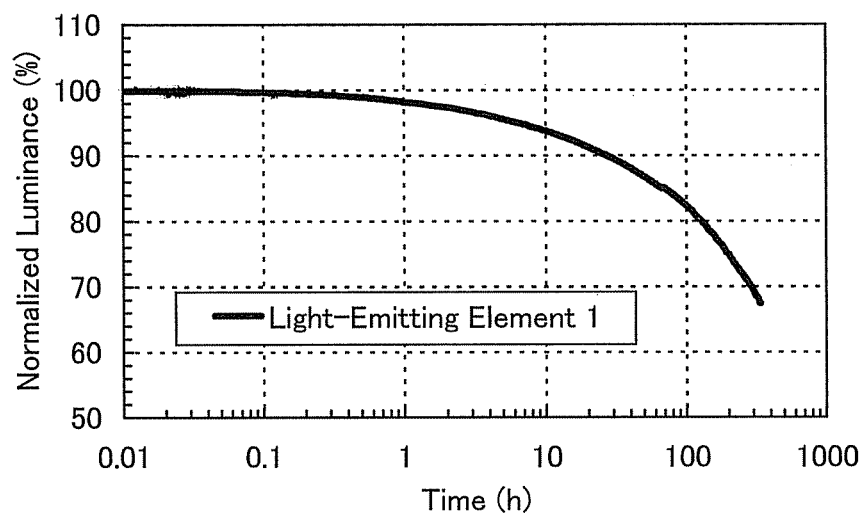
FIG. 48 shows normalized luminance versus time characteristics of the light-emitting element 1.
Figure 49:
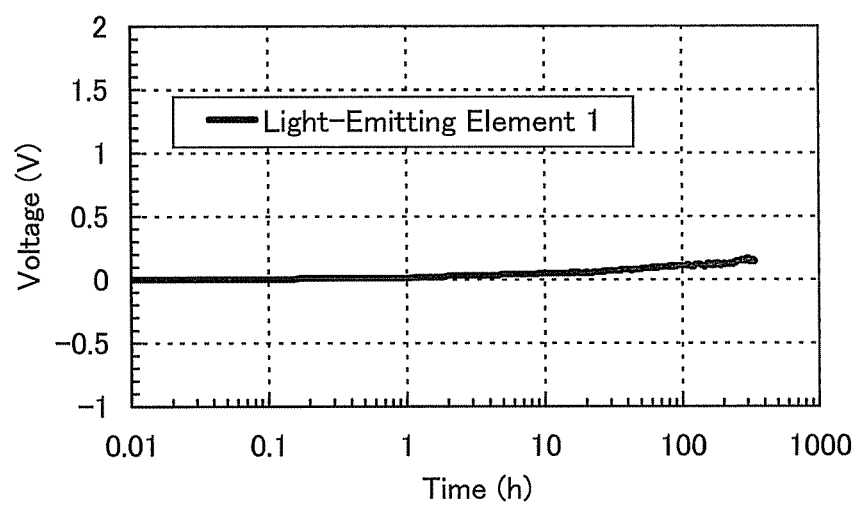
FIG. 49 shows voltage versus time characteristics of the light-emitting element 1.

Next, a reliability test was performed on the light-emitting element 1. FIG. 48 and FIG. 49 show results of the reliability test.

In the reliability test, the light-emitting element 1 was driven under the conditions where the initial luminance was 5000 cd/m$^2$ and the current density was constant. The results are shown in FIG. 48. The horizontal axis represents driving time (h) of the element and the vertical axis represents normalized luminance (%) on the assumption that the initial luminance is 100%. FIG. 48 shows that the normalized luminance of the light-emitting element 1 became 70% or lower after about 290 hours.

FIG. 48 shows that the light-emitting element 1 has a long lifetime.

The above results show that the light-emitting element 1 of one embodiment of the present invention which includes, as the light-emitting substances, the phosphorescent iridium metal complex having a pyrimidine skeleton, which is the first compound, and the organic compound having a pyrimidine skeleton, which is the second compound has high efficiency, low driving voltage, low power consumption, and a long lifetime.

Next, in the reliability test, a change in voltage of the light-emitting element 1 over time was measured under the conditions where the initial luminance was 5000 cd/m² and the current density was constant. The results are shown in FIG. 49. The horizontal axis represents driving time (h) of the element and the vertical axis represents voltage (V). FIG. 49 shows that voltage rise of the light-emitting element 1 over time is small.

EXAMPLE 13

In this example, evaluation was performed on a light-emitting element 2 and a light-emitting element 3 each of which includes the organic compound of one embodiment of the present invention, which is represented by Structural Formula (400) and synthesized in Example 4. Chemical formulae of materials for the light-emitting element 2 used in this example are shown below.

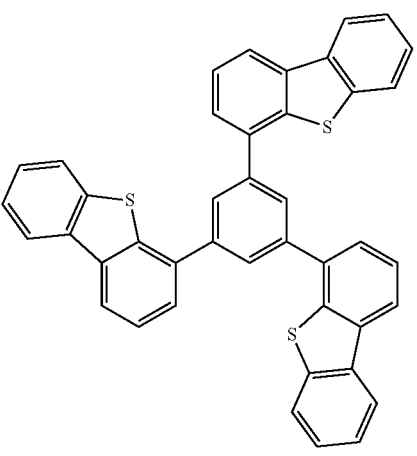

DBT3P-II

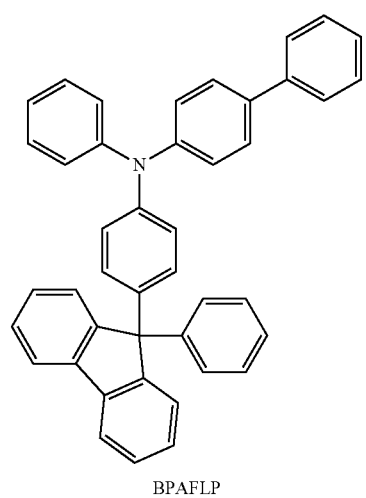

BPAFLP

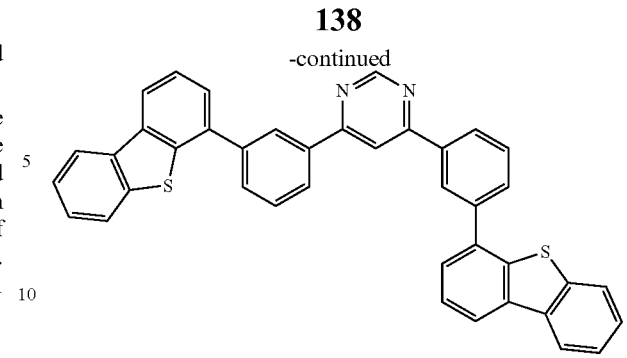

4,6mDBTP2Pm-II

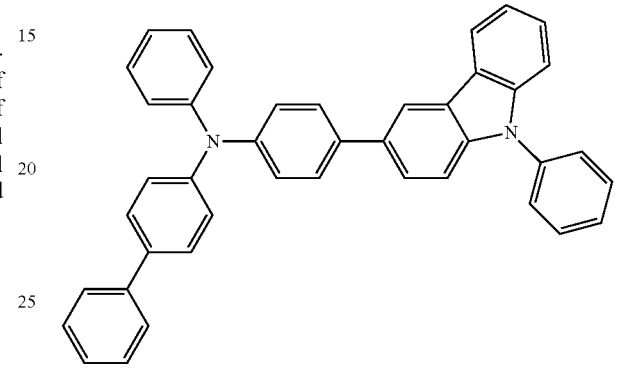

PCBA1BP

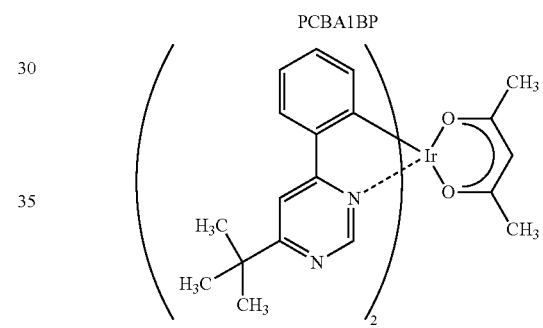

[Ir(tBuppm)₂(acac)]

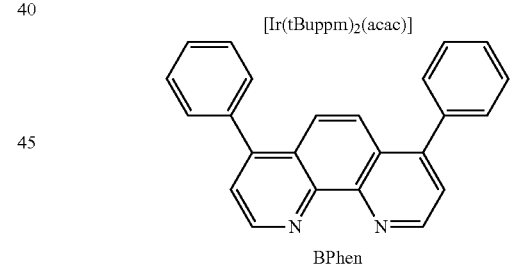

BPhen

Figure 50A:
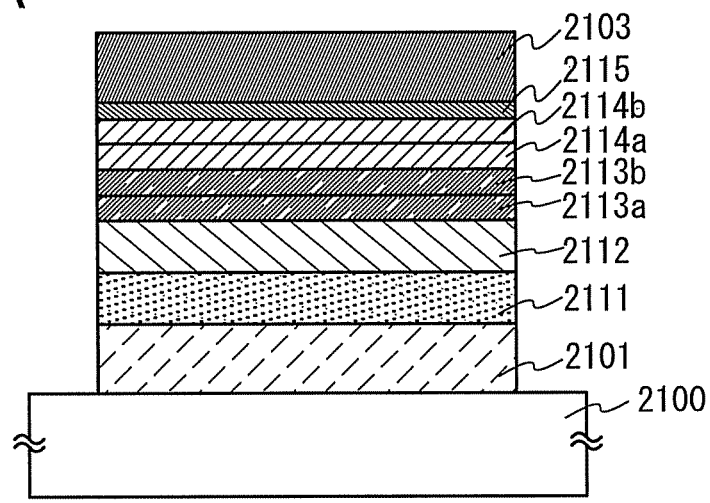
FIGS. 50A to 50C illustrate light-emitting elements 2 to 7 in Examples.

The light-emitting element 2 is described with reference to FIG. 50A. A manufacturing method of the light-emitting element 2 of this example is described below.

(Light-Emitting Element 2)

First, over a substrate 2100, an indium oxide-tin oxide compound containing silicon or silicon oxide (ITSO) was deposited by a sputtering method, so that a first electrode 2101 was formed. Note that the composition ratio of $In_2O_3$ to $SnO_2$ and $SiO_2$ in the target used was 85:10:5 [wt %]. The thickness of the first electrode 2101 was 110 nm and the electrode area was 2 mm×2 mm. Here, the first electrode 2101 functions as an anode of the light-emitting element.

Next, as pretreatment for forming the light-emitting element over the substrate 2100, the surface of the substrate was washed, baked at 200° C. for 1 hour, and then subjected to UV ozone treatment for 370 seconds.

After that, the substrate 2100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 2100 was cooled down for about 30 minutes.

Next, the substrate 2100 provided with the first electrode 2101 was fixed to a substrate holder in the vacuum evaporation apparatus so that a surface on which the first electrode 2101 was provided faced downward. The pressure in the vacuum evaporation apparatus was reduced to about $10^{-4}$ Pa. After that, on the first electrode 2101, 1,3,5-tri(dibenzothiophen-4-yl)-benzene (abbreviation: DBT3P-II) and molybdenum oxide were co-evaporated, so that a hole-injection layer 2111 was formed. The thickness of the hole-injection layer 2111 was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, on the hole-injection layer 2111, 4-phenyl-4'-(9-phenylfluoren-9-yl)triphenylamine (abbreviation: BPAFLP) was deposited to a thickness of 20 nm, so that a hole-transport layer 2112 was formed.

Further, 4,6-bis[3-(dibenzothiophen-4-yl)phenyl]pyrimidine (abbreviation: 4,6mDBTP2Pm-II) synthesized in Example 4, 4-phenyl-4'-(9-phenyl-9H-carbazol-3-yl)triphenylamine (abbreviation: PCBA1BP), and (acetylacetonato)bis(6-tert-butyl-4-phenylpyrimidinato)iridium(III) (abbreviation: [Ir(tBuppm)$_2$(acac)]) were co-evaporated, so that a first light-emitting layer 2113a was formed on the hole-transport layer 2112. Here, the weight ratio of 4,6mDBTP2Pm-II to PCBA1BP and [Ir(tBuppm)$_2$(acac)] was adjusted to 0.7:0.3:0.05 (=4,6mDBTP2Pm-II: PCBA1BP: [Ir(tBuppm)$_2$(acac)]). The thickness of the first light-emitting layer 2113a was set to 15 nm.

Next, 4,6mDBTP2Pm-II, PCBA1BP, and [Ir(tBuppm)$_2$(acac)] were co-evaporated on the first light-emitting layer 2113a, so that a second light-emitting layer 2113b was formed on the first light-emitting layer 2113a. Here, the weight ratio of 4,6mDBTP2Pm-II to PCBA1BP and [Ir(tBuppm)$_2$(acac)] was adjusted to 0.8:0.2:0.05 (=4,6mDBTP2Pm-II: PCBA1BP: [Ir(tBuppm)$_2$(acac)]). The thickness of the second light-emitting layer 2113b was set to 25 nm.

Then, on the second light-emitting layer 2113b, a film of 4,6mDBTP2Pm-II was formed to a thickness of 10 nm, so that a first electron-transport layer 2114a was formed.

Then, on the first electron-transport layer 2114a, a film of bathophenanthroline (abbreviation: BPhen) was formed to a thickness of 20 nm, so that a second electron-transport layer 2114b was formed.

Further, a film of lithium fluoride (LiF) was formed to a thickness of 1 nm on the second electron-transport layer 2114b by evaporation, so that an electron-injection layer 2115 was formed.

Lastly, by evaporation, a film of aluminum was formed to a thickness of 200 nm as a second electrode 2103 functioning as a cathode. Through the above-steps, the light-emitting element 2 was manufactured.

Table 4 shows an element structure of the light-emitting element 2 obtained as described above.

TABLE 4

| | First electrode | Hole-injection layer | Hole-transport layer | First light-emitting layer | Second light-emitting layer |
|---|---|---|---|---|---|
| Light-emitting element 2 | ITSO 110 nm | DBT3P-II:MoOx (=4:2) 40 nm | BPAFLP 20 nm | 4,6mDBTP2Pm-II:PCBA1BP:Ir(tBuppm)$_2$acac = (0.7:0.3:0.05) 15 nm | 4,6mDBTP2Pm-II:PCBA1BP:Ir(tBuppm)$_2$acac = (0.8:0.2:0.05) 25 nm |

| | First electron-transport layer | Second electron-transport layer | Electron-injection layer | Second electrode |
|---|---|---|---|---|
| Light-emitting element 2 | 4,6mDBTP2Pm-II 10 nm | BPhen 20 nm | LiF 1 nm | Al 200 nm |

Chemical formulae of materials for the light-emitting element 3 used in this example are shown below.

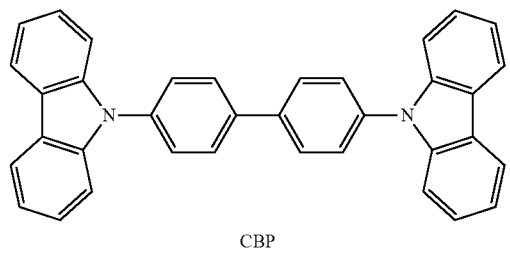

CBP

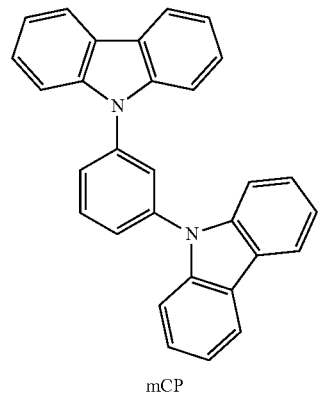

mCP

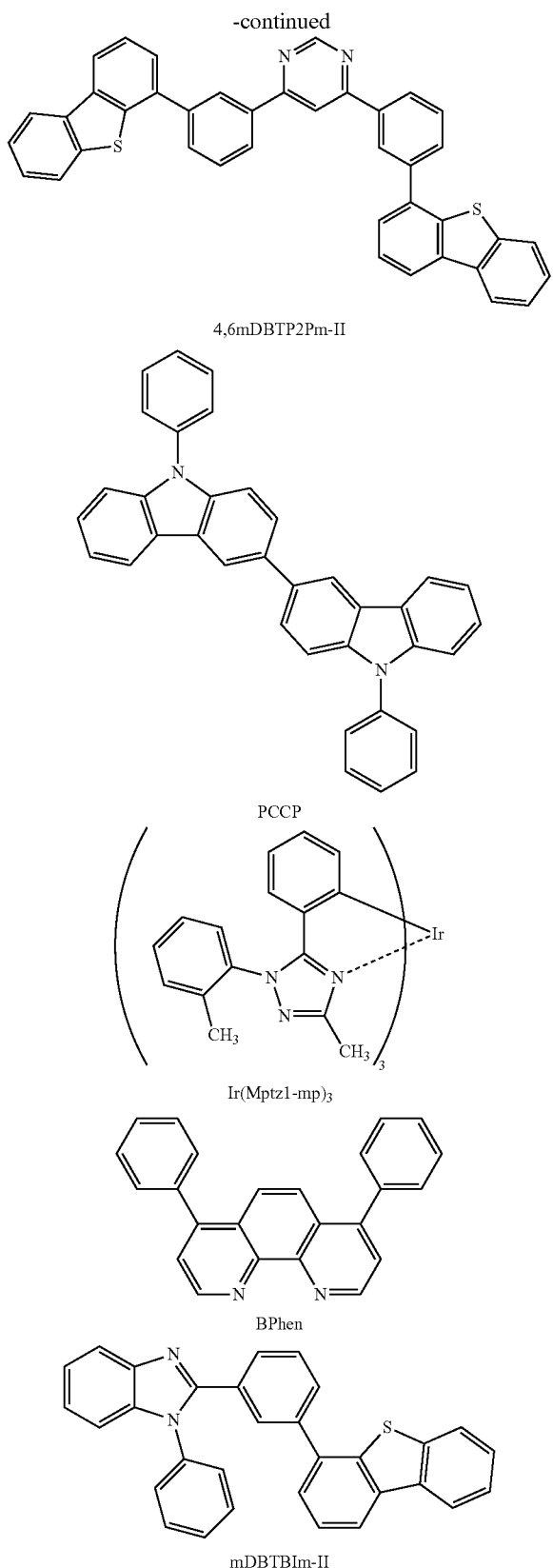

4,6mDBTP2Pm-II

PCCP

Ir(Mptz1-mp)₃

BPhen mDBTBIm-II

Figure 50B:
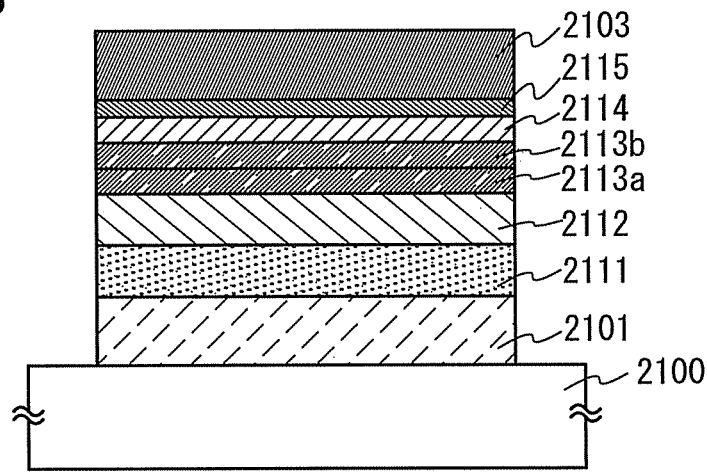

The light-emitting element 3 is described with reference to FIG. 50B. A manufacturing method of the light-emitting element 3 of this example is described below.

(Light-Emitting Element 3)

First, over a substrate 2100, an indium oxide-tin oxide compound containing silicon or silicon oxide (ITSO) was deposited by a sputtering method, so that a first electrode 2101 was formed. Note that the composition ratio of $In_2O_3$ to $SnO_2$ and $SiO_2$ in the target used was 85:10:5 [wt %]. The thickness of the first electrode 2101 was 110 nm and the electrode area was 2 mm×2 mm. Here, the first electrode 2101 functions as an anode of the light-emitting element.

Next, as pretreatment for forming the light-emitting element over the substrate 2100, the surface of the substrate was washed, baked at 200° C. for 1 hour, and then subjected to UV ozone treatment for 370 seconds.

After that, the substrate 2100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 2100 was cooled down for about 30 minutes.

Next, the substrate 2100 provided with the first electrode 2101 was fixed to a substrate holder in the vacuum evaporation apparatus so that a surface on which the first electrode 2101 was provided faced downward. The pressure in the vacuum evaporation apparatus was reduced to about $10^{-4}$ Pa. After that, on the first electrode 2101, 4,4′-di(N-carbazolyl)biphenyl (abbreviation: CBP) and molybdenum oxide were co-evaporated, so that a hole-injection layer 2111 was formed. The thickness of the hole-injection layer 2111 was set to 60 nm, and the weight ratio of CBP to molybdenum oxide was adjusted to 4:2 (=CBP: molybdenum oxide). Note that the co-evaporation method refers to an evaporation method in which evaporation is carried out from a plurality of evaporation sources at the same time in one treatment chamber.

Next, on the hole-injection layer 2111, a film of 1,3-bis(N-carbazolyl)benzene (abbreviation: mCP) was formed to a thickness of 20 nm, so that a hole-transport layer 2112 was formed.

Further, 4,6-bis[3-(dibenzothiophen-4-yl)phenyl]pyrimidine (abbreviation: 4,6mDBTP2Pm-II) synthesized in Example 4, 9-phenyl-9H-3-(9-phenyl-9H-carbazol-3-yl)-carbazole (abbreviation: PCCP), and tris[3-methyl-1-(2-methylphenyl)-5-phenyl-1H-1,2,4-triazolato]iridium(III) (abbreviation: [Ir(Mptz1-mp)₃]) were co-evaporated, so that a first light-emitting layer 2113a was formed on the hole-transport layer 2112. Here, the weight ratio of 4,6mDBTP2Pm-II to PCCP and [Ir(Mptz1-mp)₃] was adjusted to 1:0.3:0.08 (=4,6mDBTP2Pm-II: PCCP: [Ir(Mptz1-mp)₃]). The thickness of the first light-emitting layer 2113a was set to 30 nm.

Next, 2-[3-(dibenzothiophen-4-yl)phenyl]-1-phenyl-1H-benzimidazole (abbreviation: mDBTBIm-II) and [Ir(Mptz1-mp)₃] were co-evaporated on the first light-emitting layer 2113a, so that a second light-emitting layer 2113b was formed on the first light-emitting layer 2113a. Here, the weight ratio of mDBTBIm-II to [Ir(Mptz1-mp)₃] was adjusted to 1:0.08 (=mDBTBIm-II: [Ir(Mptz1-mp)₃]). The thickness of the second light-emitting layer 2113b was set to 10 nm.

Then, on the second light-emitting layer 2113b, a film of bathophenanthroline (abbreviation: BPhen) was formed to a thickness of 15 nm, so that an electron-transport layer 2114 was formed.

Further, a film of lithium fluoride (LiF) was formed to a thickness of 1 nm on the electron-transport layer 2114 by evaporation, so that an electron-injection layer 2115 was formed.

Lastly, a film of aluminum was formed to a thickness of 200 nm by evaporation as the second electrode 2103 functioning as a cathode. Through the above-steps, the light-emitting element 3 was manufactured.

Table 5 shows an element structure of the light-emitting element 3 obtained as described above.

TABLE 5

| | First electrode | Hole-injection layer | Hole-transport layer | First light-emitting layer | Second light-emitting layer | Electron-transport layer | Electron-injection layer | Second electrode |
|---|---|---|---|---|---|---|---|---|
| Light-emitting element 3 | ITSO 110 nm | CBP:MoOx (=4:2) 60 nm | mCP 20 nm | 4,6mDBTP2Pm-II:PCCP:Ir(Mptz1-mp)$_3$ = (1:0.3:0.08) 30 nm | mDBTBIm-II:Ir(Mptz1-mp)$_3$ = (1:0.08) 10 nm | BPhen 15 nm | LiF 1 nm | Al 200 nm |

In a glove box containing a nitrogen atmosphere, the light-emitting element 2 and the light-emitting element 3 were sealed so as not to be exposed to the air (a sealant was applied onto an outer edge of each element and heat treatment was performed at 80° C. for 1 hour at the time of sealing). After that, operation characteristics of the light-emitting element 2 and the light-emitting element 3 were measured. Note that the measurement was carried out at room temperature (in an atmosphere kept at 25° C.).

Figure 51:
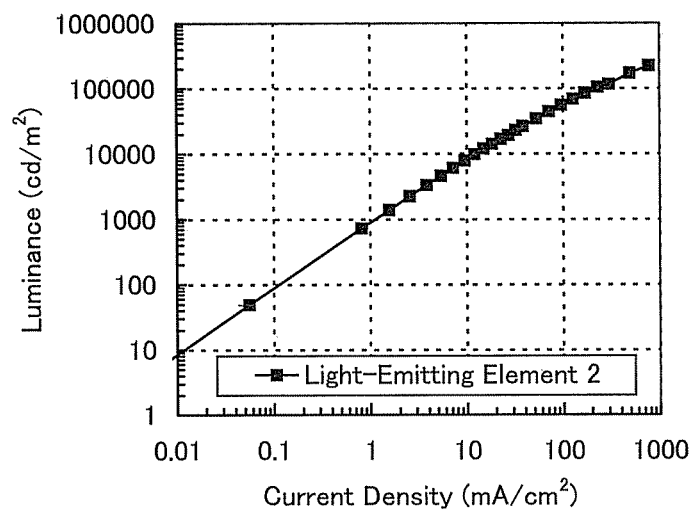
FIG. 51 shows luminance versus current density characteristics of the light-emitting element 2.
Figure 52:
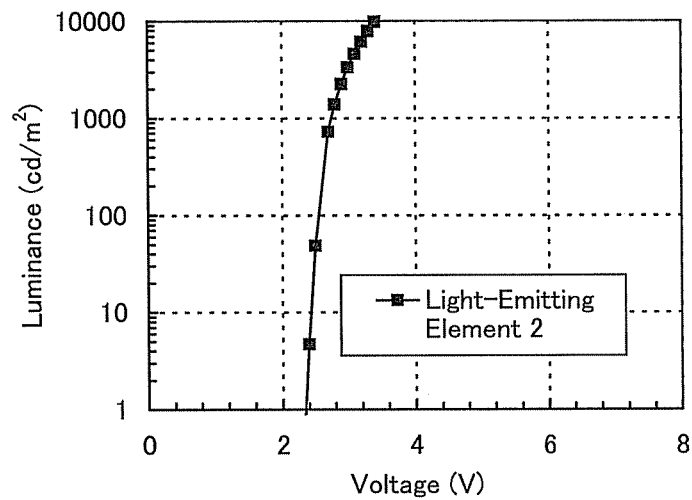
FIG. 52 shows luminance versus voltage characteristics of the light-emitting element 2.
Figure 53:
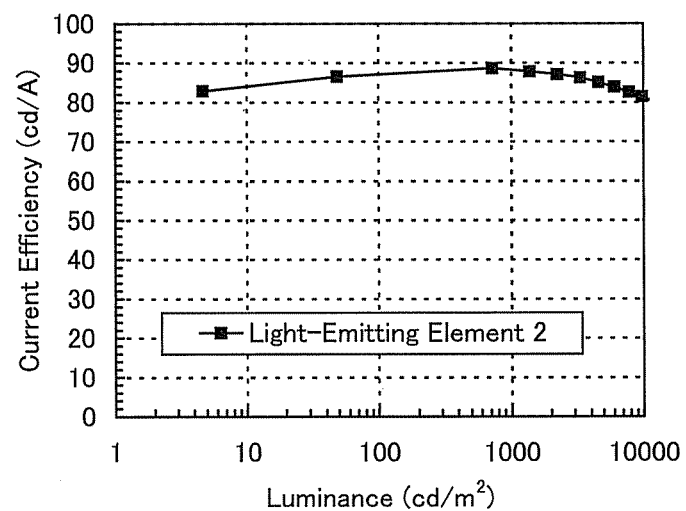
FIG. 53 shows current efficiency versus luminance characteristics of the light-emitting element 2.
Figure 54:
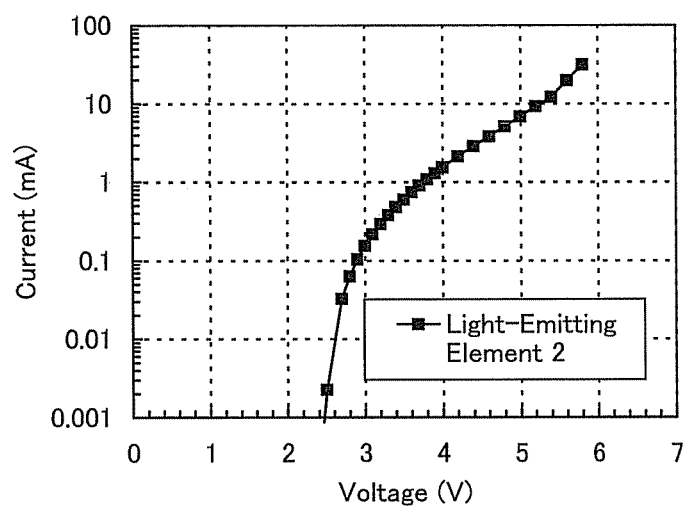
FIG. 54 shows current versus voltage characteristics of the light-emitting element 2.
Figure 55:
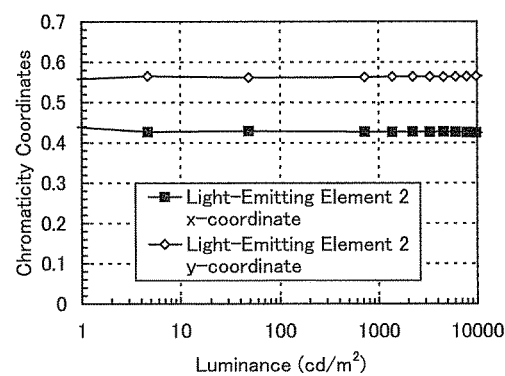
FIG. 55 shows chromaticity coordinates versus luminance characteristics of the light-emitting element 2.
Figure 56:
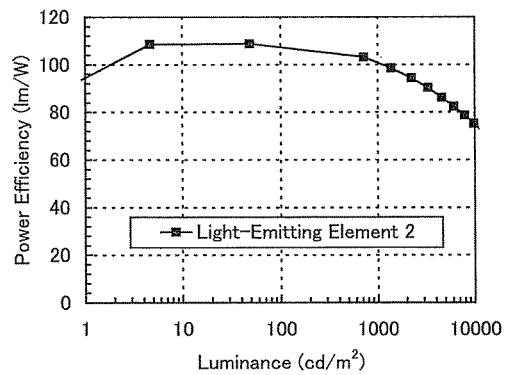
FIG. 56 shows power efficiency versus luminance characteristics of the light-emitting element 2.
Figure 58:
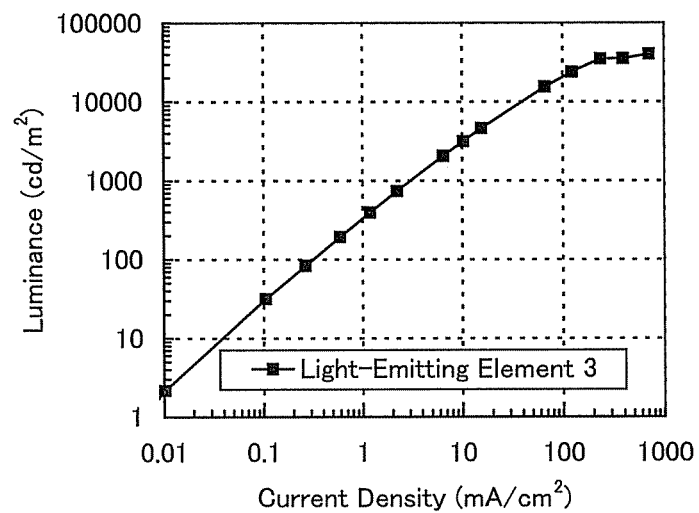
FIG. 58 shows luminance versus current density characteristics of the light-emitting element 3.
Figure 59:
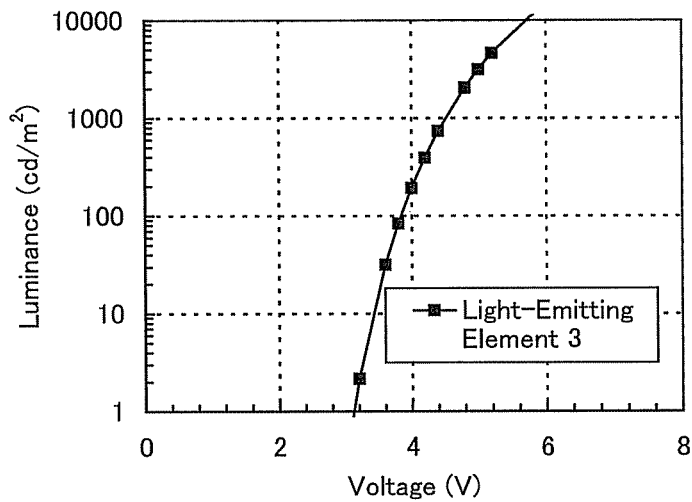
FIG. 59 shows luminance versus voltage characteristics of the light-emitting element 3.
Figure 60:
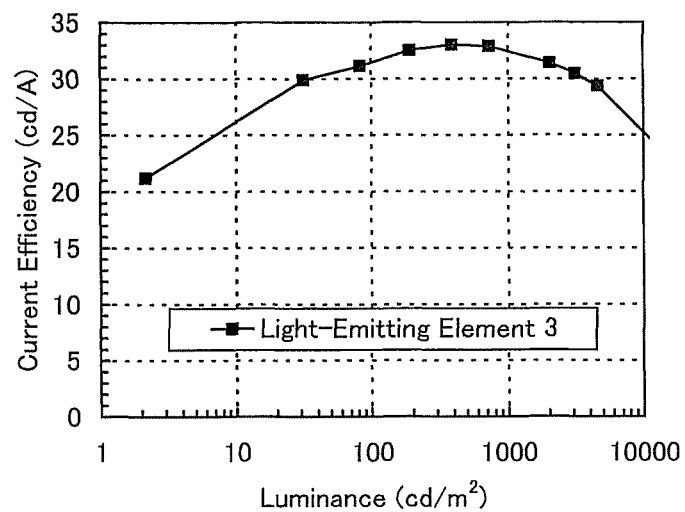
FIG. 60 shows current efficiency versus luminance characteristics of the light-emitting element 3.
Figure 61:
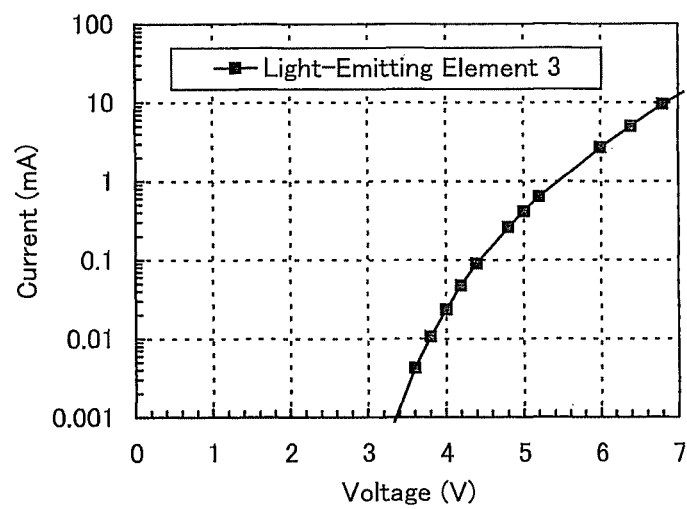
FIG. 61 shows current versus voltage characteristics of the light-emitting element 3.
Figure 62:
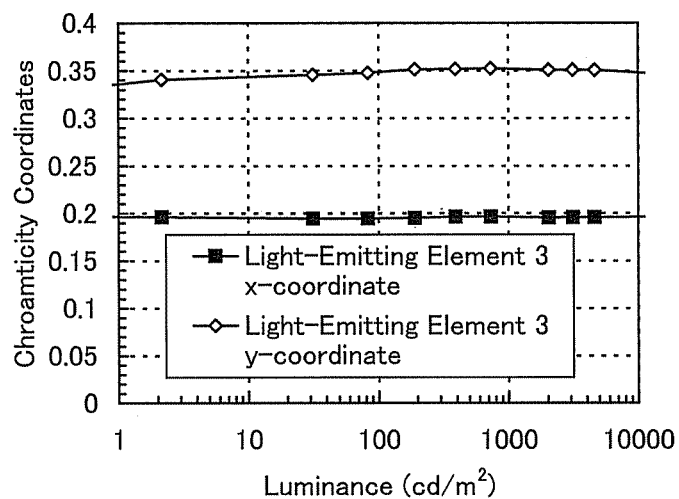
FIG. 62 shows chromaticity coordinates versus luminance characteristics of the light-emitting element 3.
Figure 63:
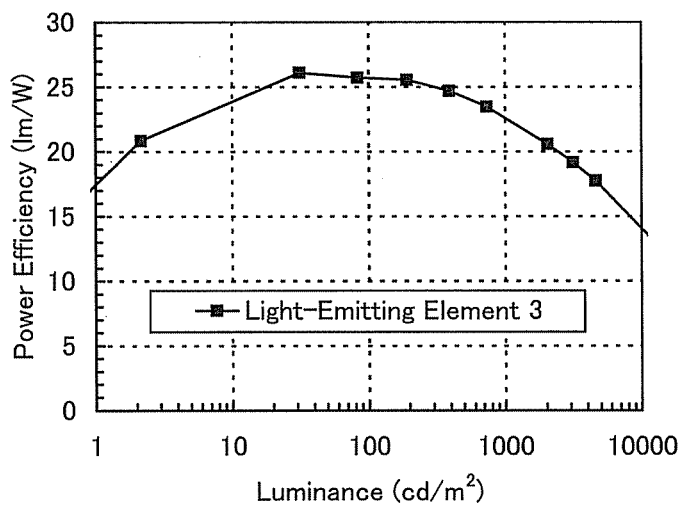
FIG. 63 shows power efficiency versus luminance characteristics of the light-emitting element 3.

FIG. 51 and FIG. 58 show luminance versus current density characteristics of the light-emitting element 2 and the light-emitting element 3, respectively. In each of FIG. 51 and FIG. 58, the horizontal axis represents current density (mA/cm$^2$) and the vertical axis represents luminance (cd/m$^2$). FIG. 52 and FIG. 59 show luminance versus voltage characteristics of the light-emitting element 2 and the light-emitting element 3, respectively. In each of FIG. 52 and FIG. 59, the horizontal axis represents voltage (V) and the vertical axis represents luminance (cd/m$^2$). FIG. 53 and FIG. 60 show current efficiency versus luminance characteristics of the light-emitting element 2 and the light-emitting element 3, respectively. In each of FIG. 53 and FIG. 60, the horizontal axis represents luminance (cd/m$^2$) and the vertical axis represents current efficiency (cd/A). FIG. 54 and FIG. 61 show current versus voltage characteristics of the light-emitting element 2 and the light-emitting element 3, respectively. In each of FIG. 54 and FIG. 61, the horizontal axis represents voltage (V) and the vertical axis represents current (mA). FIG. 55 and FIG. 62 show chromaticity coordinate versus luminance characteristics of the light-emitting element 2 and the light-emitting element 3, respectively. In each of FIG. 55 and FIG. 62, the horizontal axis represents luminance (cd/m$^2$) and the vertical axis represents chromaticity coordinates (x-coordinate and y-coordinate). FIG. 56 and FIG. 63 show power efficiency versus luminance characteristics of the light-emitting element 2 and the light-emitting element 3, respectively. In each of FIG. 56 and FIG. 63, the horizontal axis represents luminance (cd/m$^2$) and the vertical axis represents power efficiency (lm/W).

FIG. 56 and FIG. 63 show that the light-emitting element 2 and the light-emitting element 3 have high efficiency. FIG. 55 and FIG. 62 show that the light-emitting element 2 and the light-emitting element 3 have favorable carrier balance at any luminance. FIG. 54 and FIG. 61 show that the light-emitting element 2 and the light-emitting element 3 have low driving voltage and low power consumption.

Table 6 shows the voltage (V), current density (mA/cm$^2$), CIE chromaticity coordinates (x, y), luminance (cd/m$^2$), current efficiency (cd/A), and external quantum efficiency (%) of the light-emitting element 2 and the light-emitting element 3 at a luminance of around 1000 cd/m$^2$.

TABLE 6

| | Voltage (V) | Current density (mA/cm$^2$) | Chromaticity x Chromaticity y | Luminance (cd/m$^2$) | Current efficiency (cd/A) | External quantum efficiency (%) |
|---|---|---|---|---|---|---|
| Light-emitting element 2 | 2.7 | 0.8 | 0.43 0.56 | 723 | 89 | 24 |
| Light-emitting element 3 | 4.4 | 2.2 | 0.20 0.35 | 735 | 33 | 15 |

Figure 57:
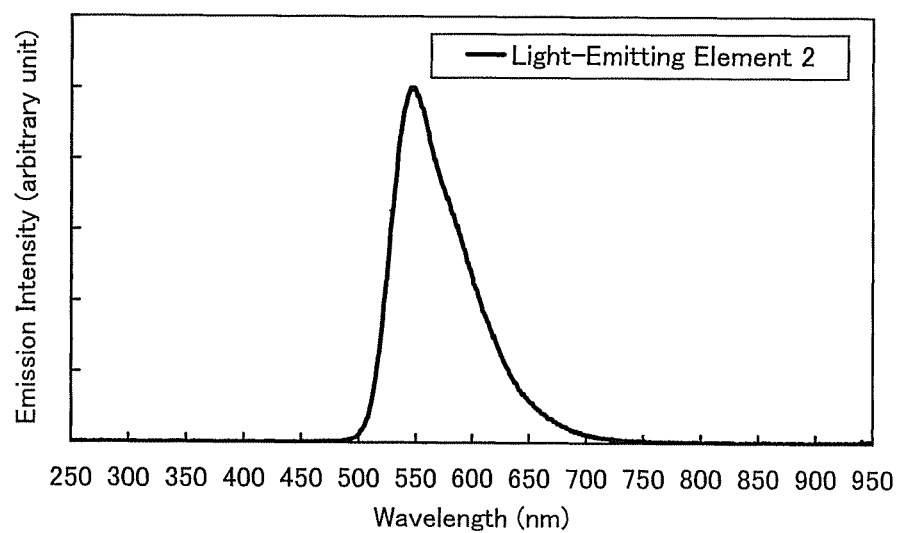
FIG. 57 shows an emission spectrum of the light-emitting element 2.
Figure 64:
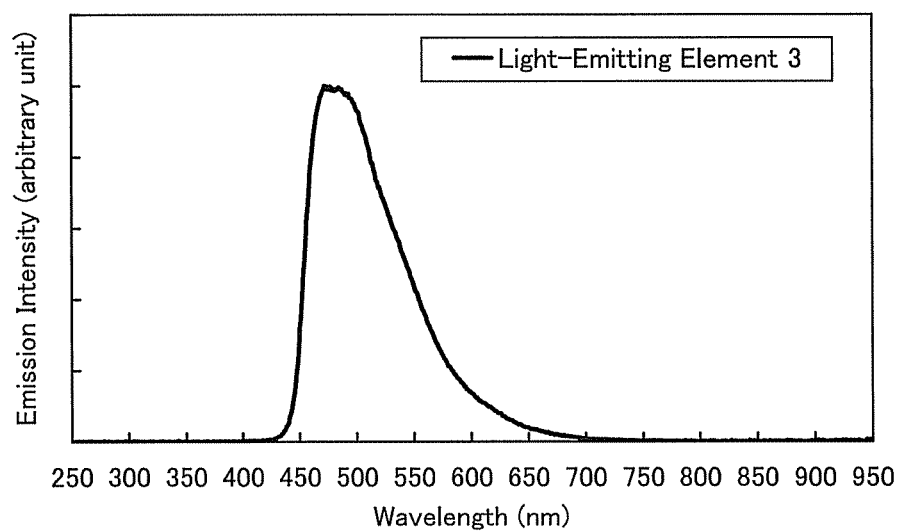
FIG. 64 shows an emission spectrum of the light-emitting element 3.
Figure 65:
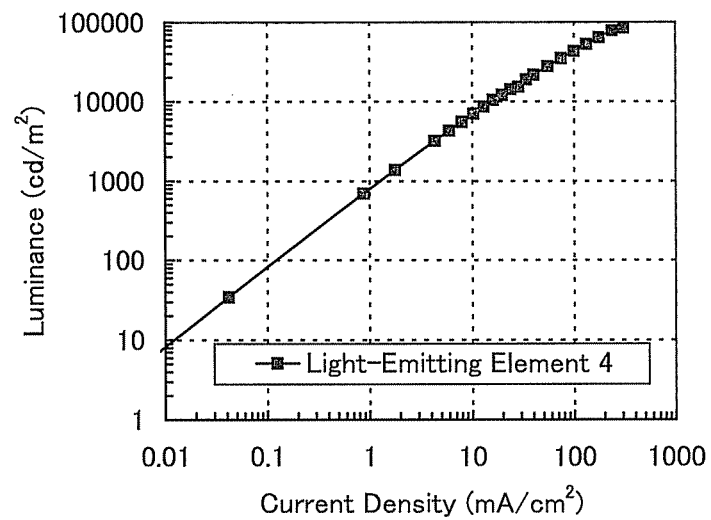
FIG. 65 shows luminance versus current density characteristics of the light-emitting element 4.
Figure 66:
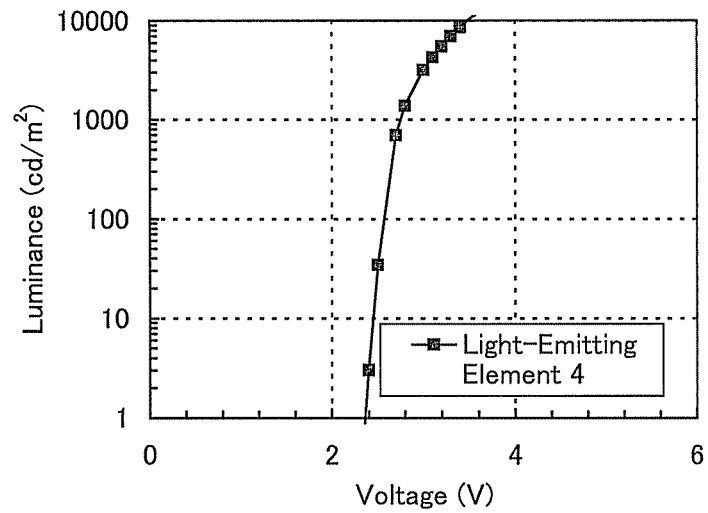
FIG. 66 shows luminance versus voltage characteristics of the light-emitting element 4.
Figure 67:
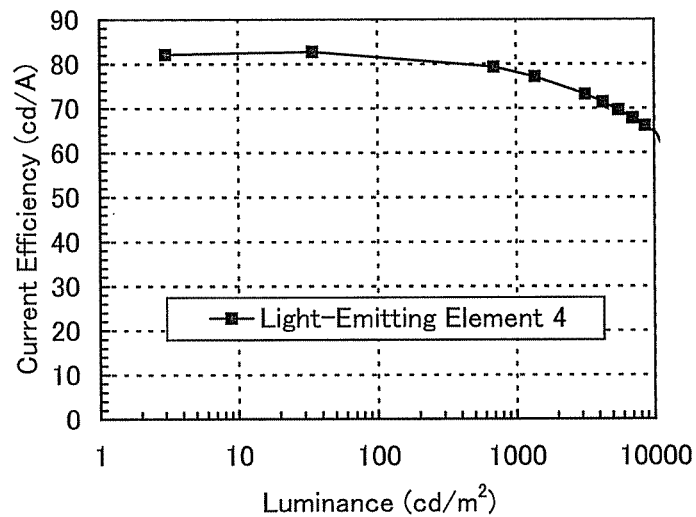
FIG. 67 shows current efficiency versus luminance characteristics of the light-emitting element 4.
Figure 68:
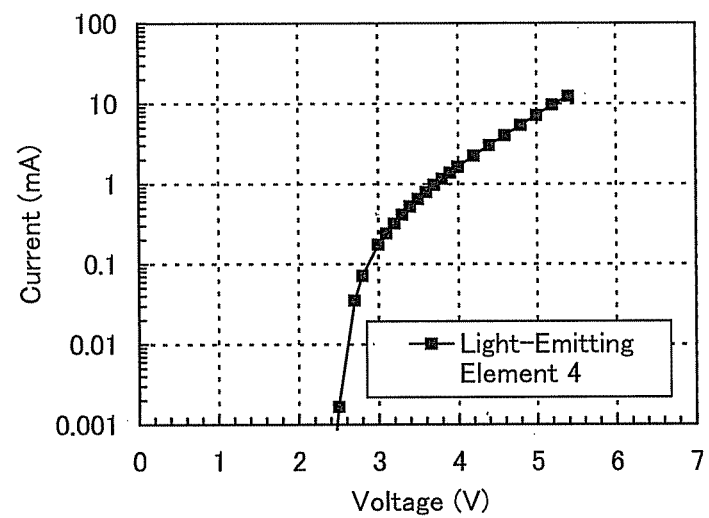
FIG. 68 shows current versus voltage characteristics of the light-emitting element 4.
Figure 69:
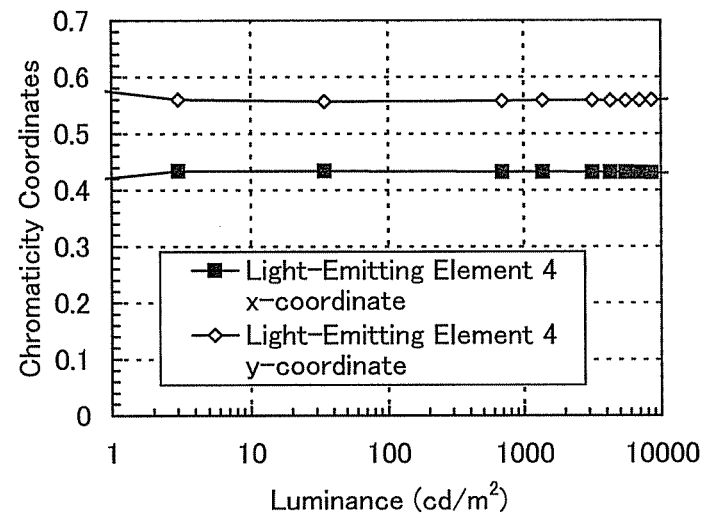
FIG. 69 shows chromaticity coordinates versus luminance characteristics of the light-emitting element 4.
Figure 70:
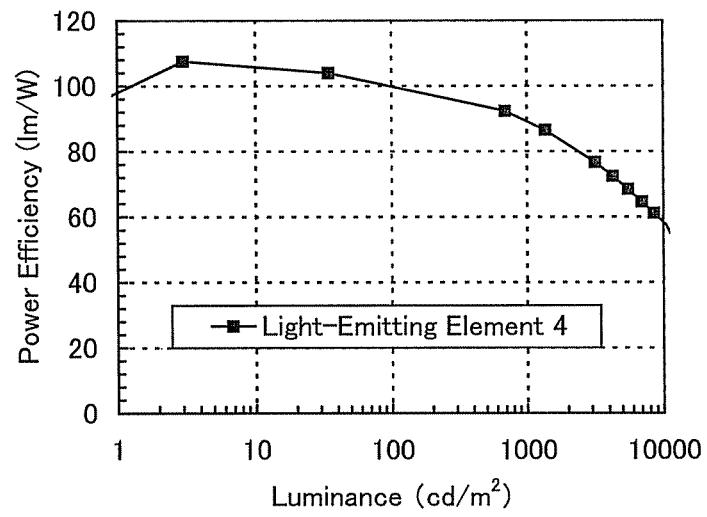
FIG. 70 shows power efficiency versus luminance characteristics of the light-emitting element 4.
Figure 71:
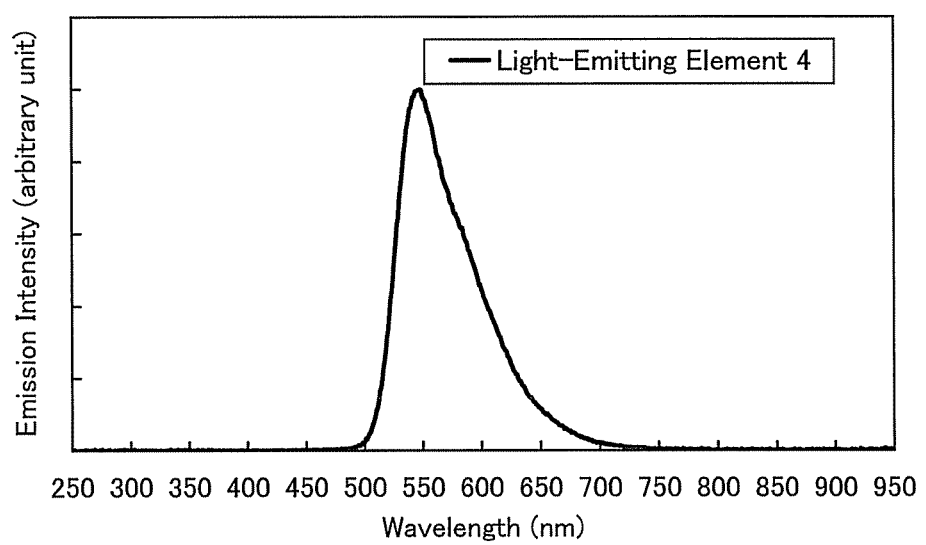
FIG. 71 shows an emission spectrum of the light-emitting element 4.
Figure 72:
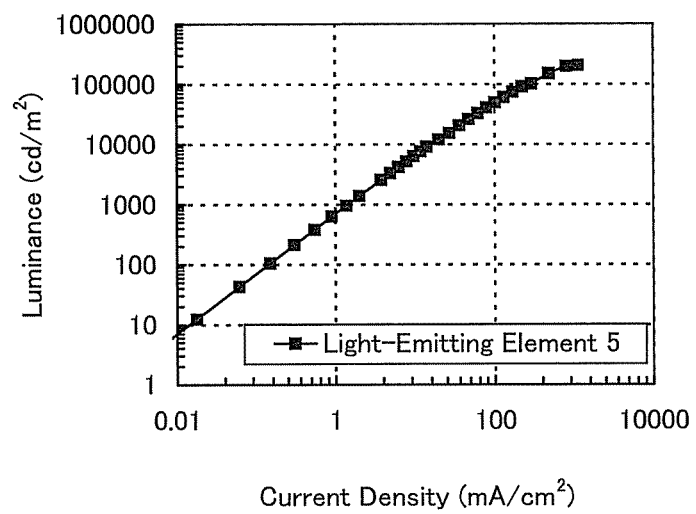
FIG. 72 shows luminance versus current density characteristics of the light-emitting element 5.
Figure 73:
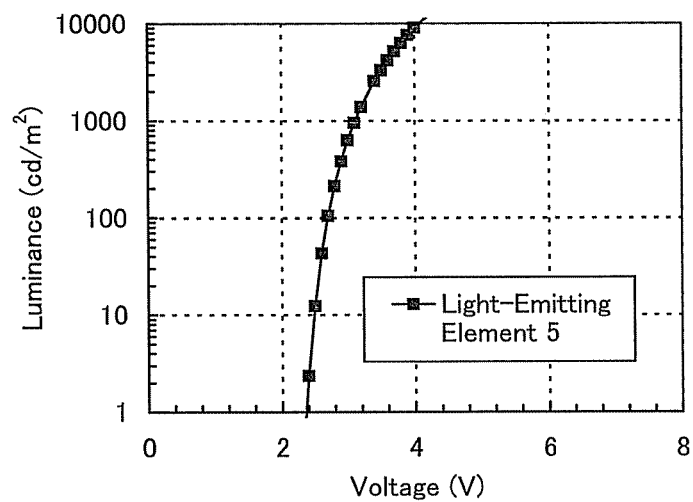
FIG. 73 shows luminance versus voltage characteristics of the light-emitting element 5.
Figure 74:
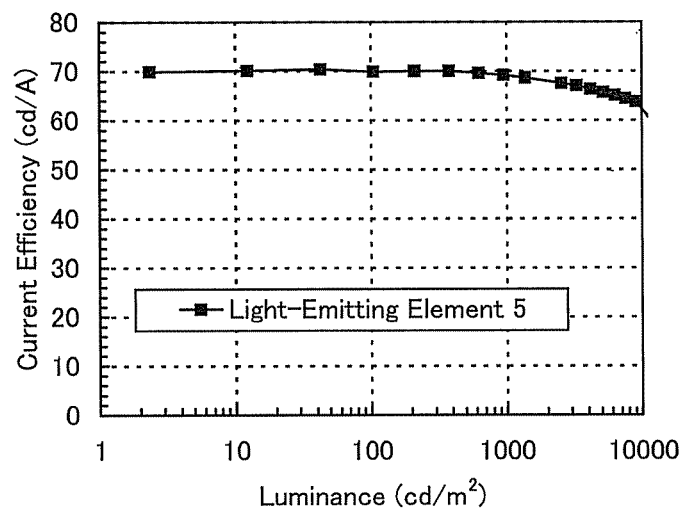
FIG. 74 shows current efficiency versus luminance characteristics of the light-emitting element 5.
Figure 75:
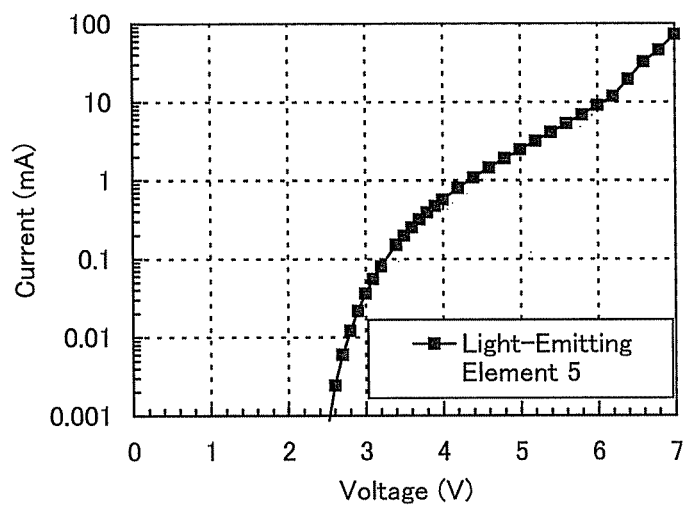
FIG. 75 shows current versus voltage characteristics of the light-emitting element 5.
Figure 76:
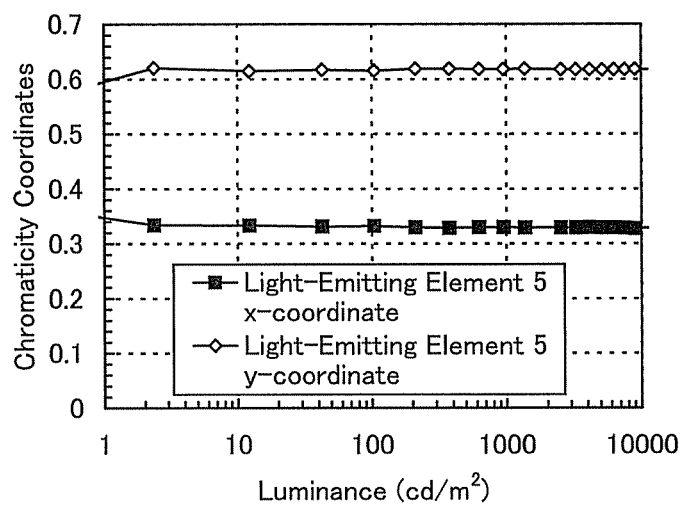
FIG. 76 shows chromaticity coordinates versus luminance characteristics of the light-emitting element 5.
Figure 77:
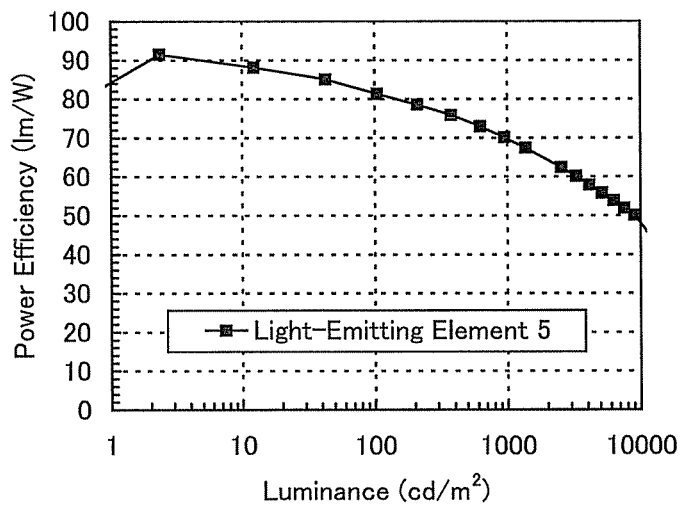
FIG. 77 shows power efficiency versus luminance characteristics of the light-emitting element 5.
Figure 78:
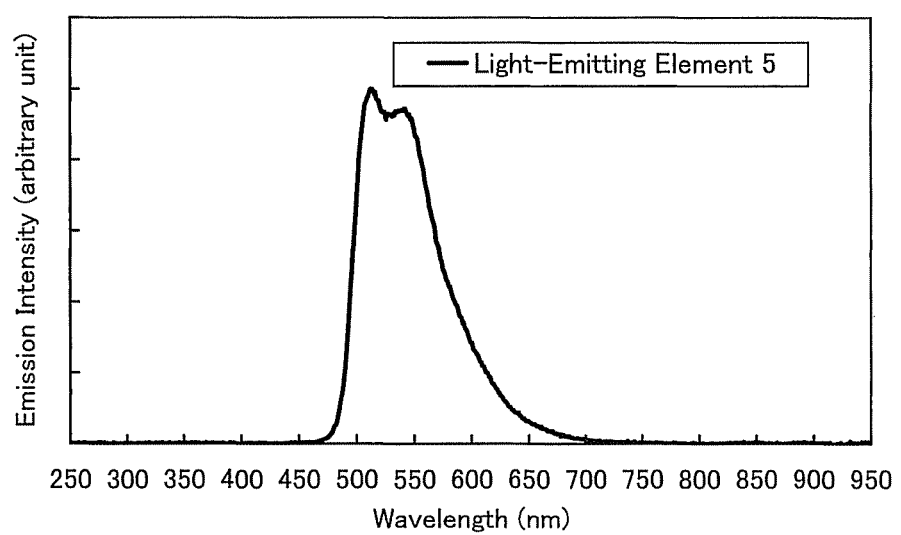
FIG. 78 shows an emission spectrum of the light-emitting element 5.
Figure 79:
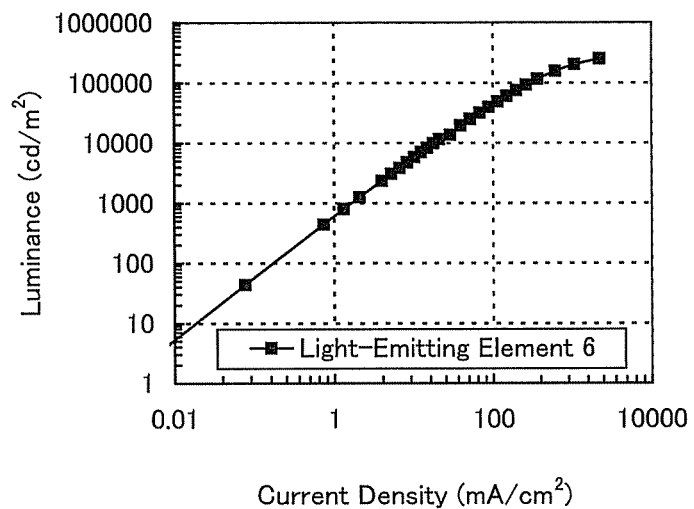
FIG. 79 shows luminance versus current density characteristics of the light-emitting element 6.
Figure 80:
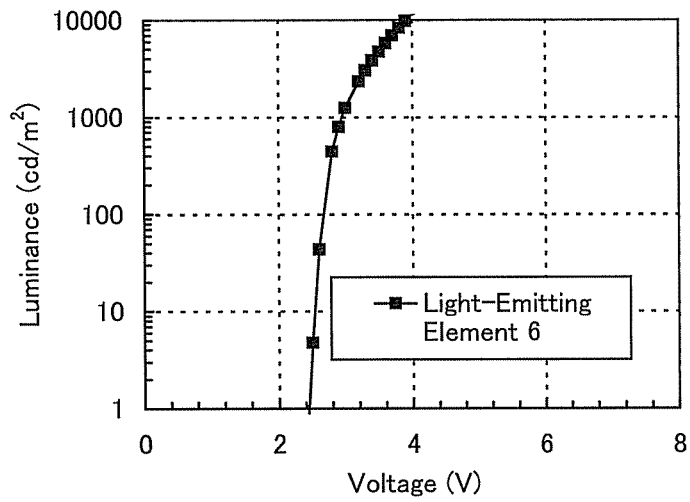
FIG. 80 shows luminance versus voltage characteristics of the light-emitting element 6.
Figure 81:
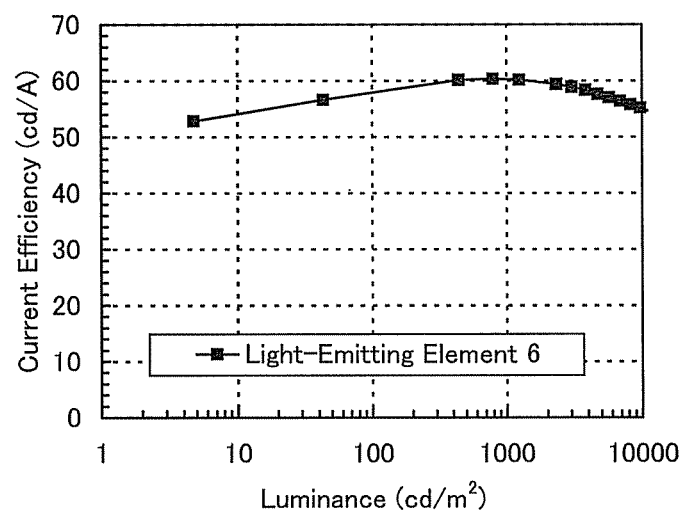
FIG. 81 shows current efficiency versus luminance characteristics of the light-emitting element 6.
Figure 82:
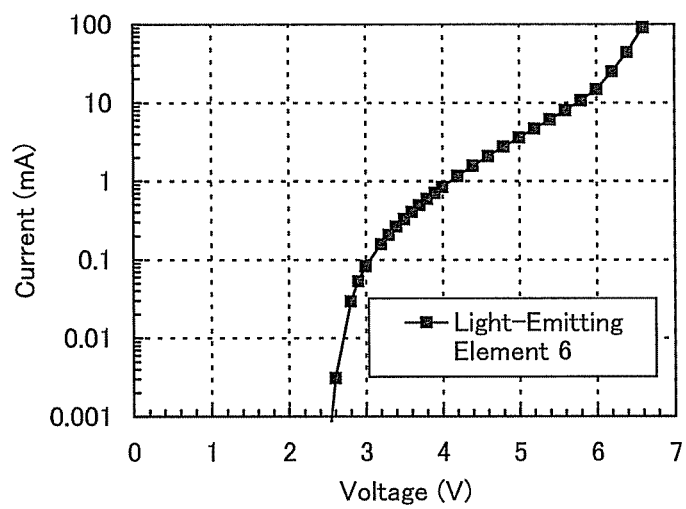
FIG. 82 shows current versus voltage characteristics of the light-emitting element 6.
Figure 83:
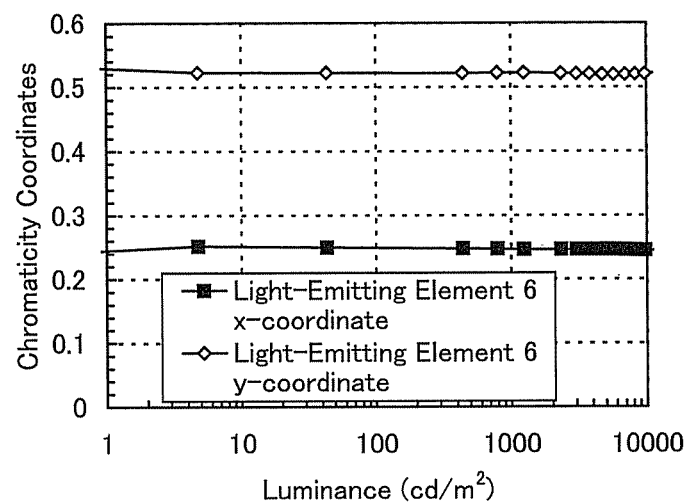
FIG. 83 shows chromaticity coordinates versus luminance characteristics of the light-emitting element 6.
Figure 84:
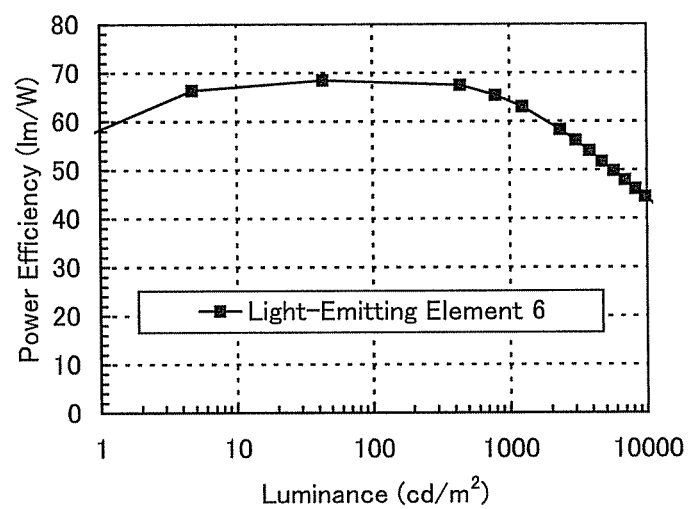
FIG. 84 shows power efficiency versus luminance characteristics of the light-emitting element 6.
Figure 85:
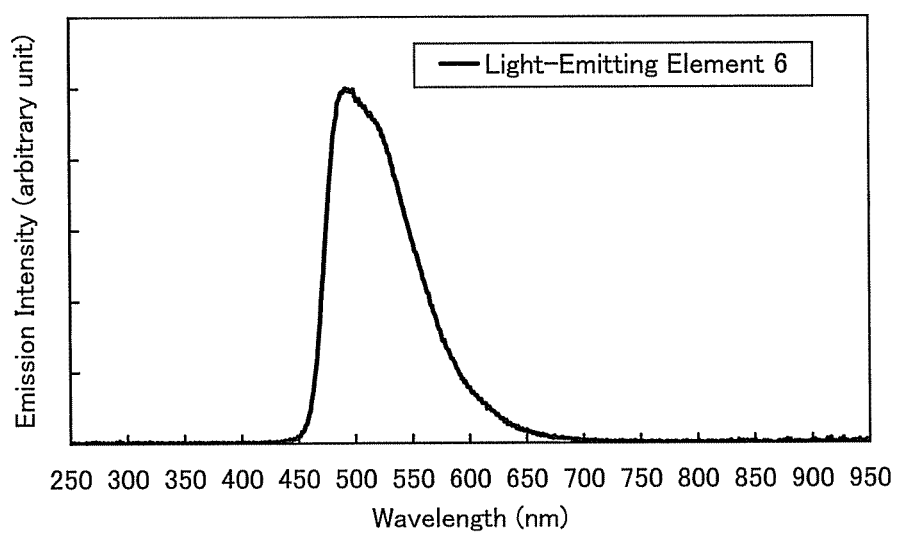
FIG. 85 shows an emission spectrum of the light-emitting element 6.
Figure 86:
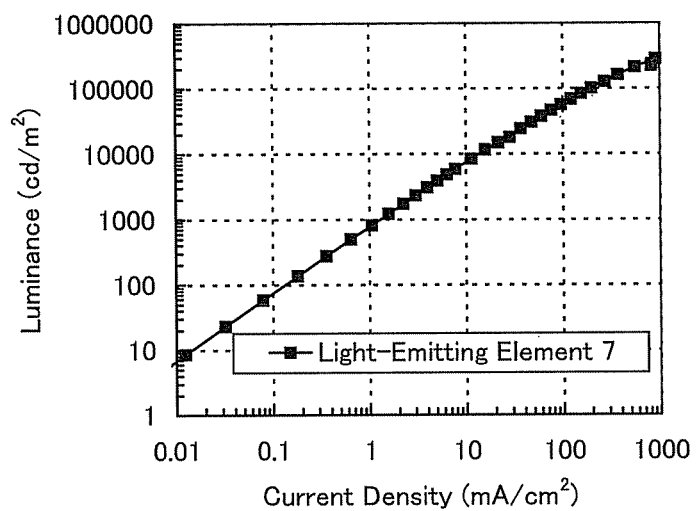
FIG. 86 shows luminance versus current density characteristics of the light-emitting element 7.
Figure 87:
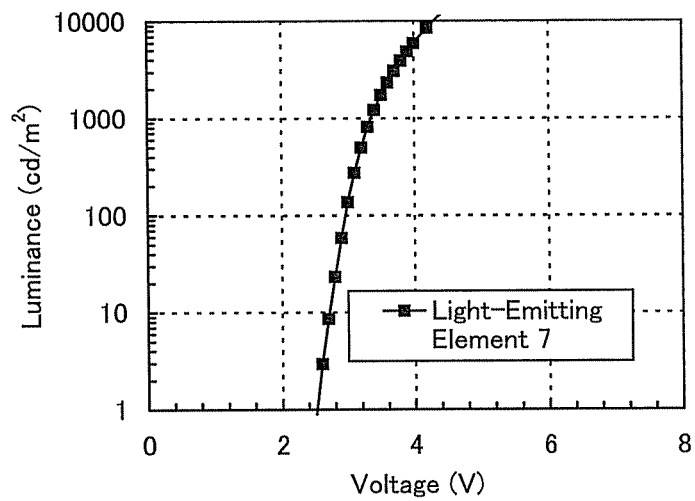
FIG. 87 shows luminance versus voltage characteristics of the light-emitting element 7.
Figure 88:
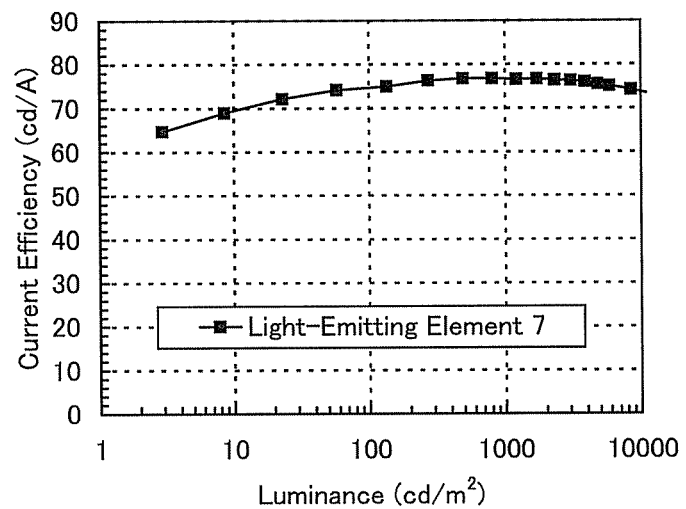
FIG. 88 shows current efficiency versus luminance characteristics of the light-emitting element 7.
Figure 89:
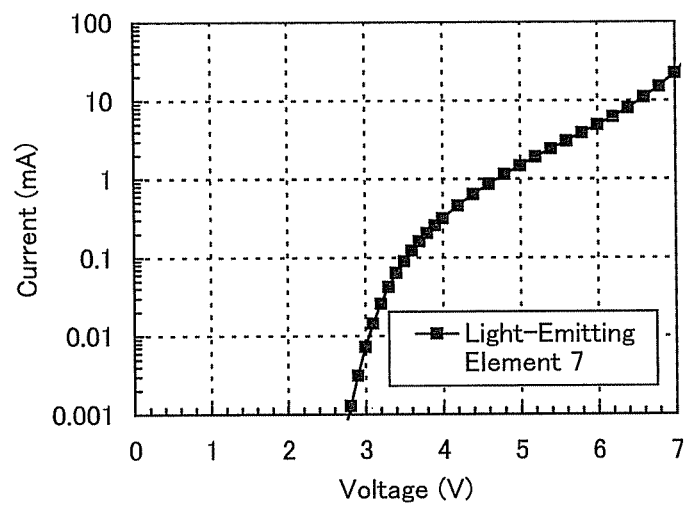
FIG. 89 shows current versus voltage characteristics of the light-emitting element 7.
Figure 90:
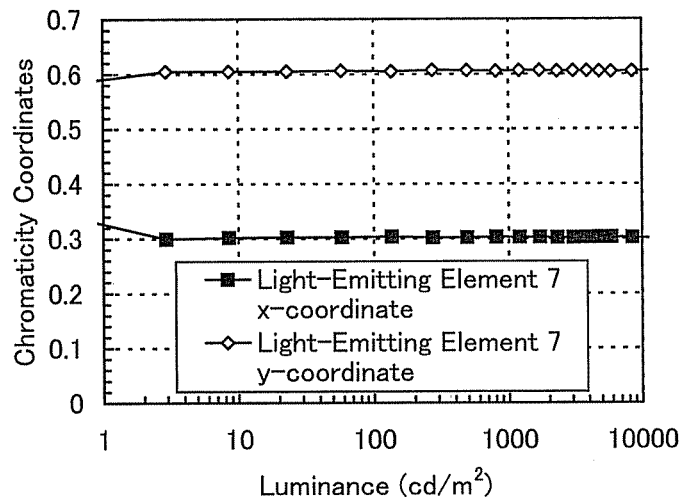
FIG. 90 shows chromaticity coordinates versus luminance characteristics of the light-emitting element 7.
Figure 91:
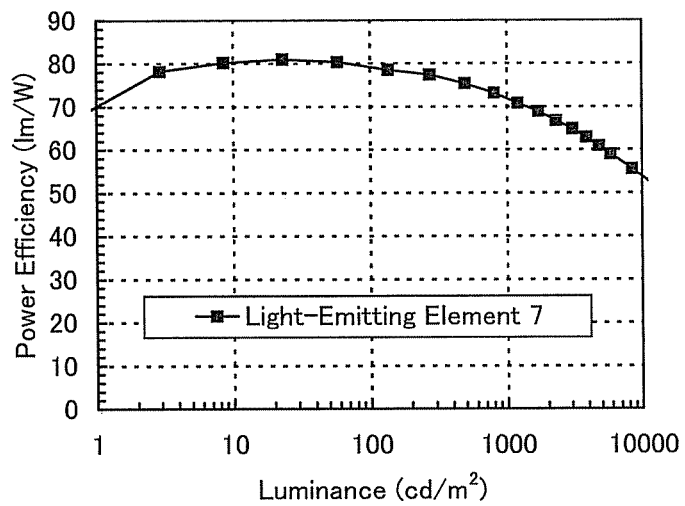
FIG. 91 shows power efficiency versus luminance characteristics of the light-emitting element 7.
Figure 92:
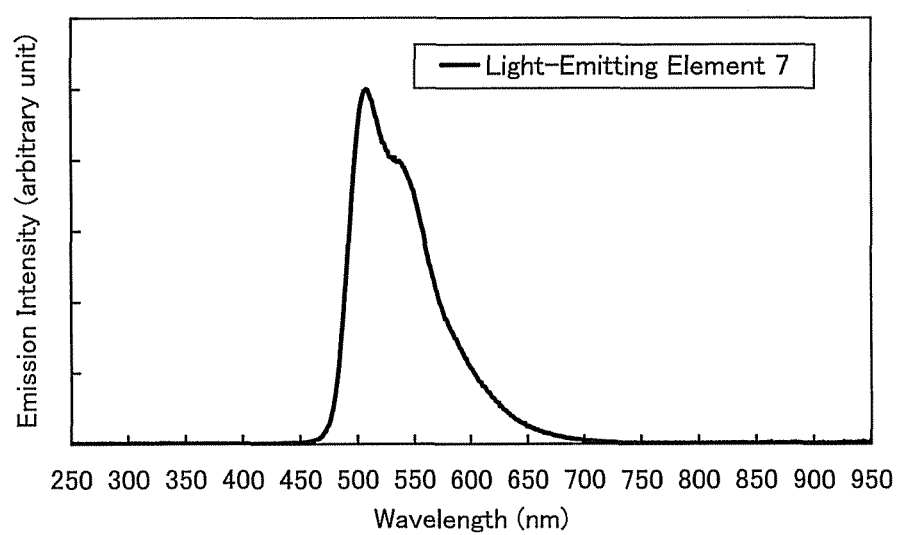
FIG. 92 shows an emission spectrum of the light-emitting element 7.

FIG. 57 and FIG. 64 show emission spectra of the light-emitting element 2 and the light-emitting element 3, respectively, at a current density of 2.5 mA/cm$^2$. As shown in FIG. 57 and FIG. 64, the emission spectrum of the light-emitting element 2 has a peak at 548 nm and the light-emitting element 3 has a peak at 472 nm.

As shown in Table 6, the CIE chromaticity coordinates of the light-emitting element 2 at a luminance of 723 cd/m$^2$ were (x, y)=(0.43, 0.56); the CIE chromaticity coordinates of the light-emitting element 3 at a luminance of 735 cd/m$^2$ were (x, y)=(0.20, 0.35). Thus, light emission derived from a dopant can be obtained from the light-emitting element 2 and the light-emitting element 3.

Thus, the light-emitting element 2 of one embodiment of the present invention can efficiently emit light in the yellow wavelength range; the light-emitting element 3 of one embodiment of the present invention can efficiently emit light in the blue wavelength range. In other words, 4,6mDBTP2Pm-II has a higher T1 level than blue light. Therefore, 4,6mDBTP2Pm-II is suitable as a host for a material emitting light in the visible light range (blue to red).

EXAMPLE 14

In this example, evaluation was performed on a light-emitting element 4, a light-emitting element 5, and a light-emitting element 6 each of which includes the organic compound of one embodiment of the present invention, which is represented by Structural Formula (400) and synthesized in Example 4, and on a light-emitting element 7 which includes 4,6-bis[3-(9H-carbazol-9-yl)phenyl]pyrimidine (abbreviation: 4,6-mCzP2Pm).

Chemical formulae of materials for the light-emitting element 4 of this example are shown below.

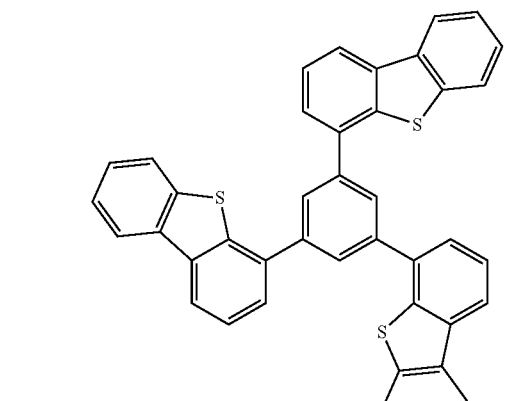

DBT3P-II

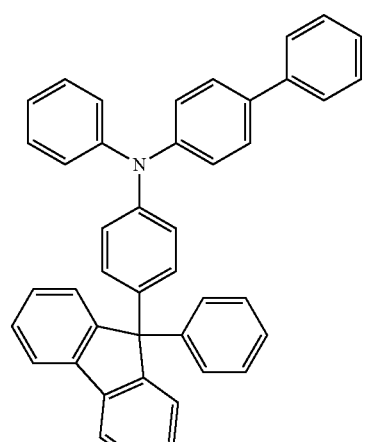

BPAFLP

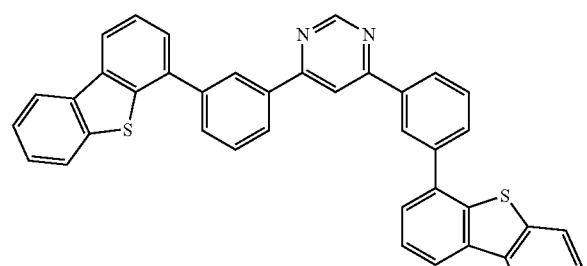

4,6mDBTP2Pm-II

-continued

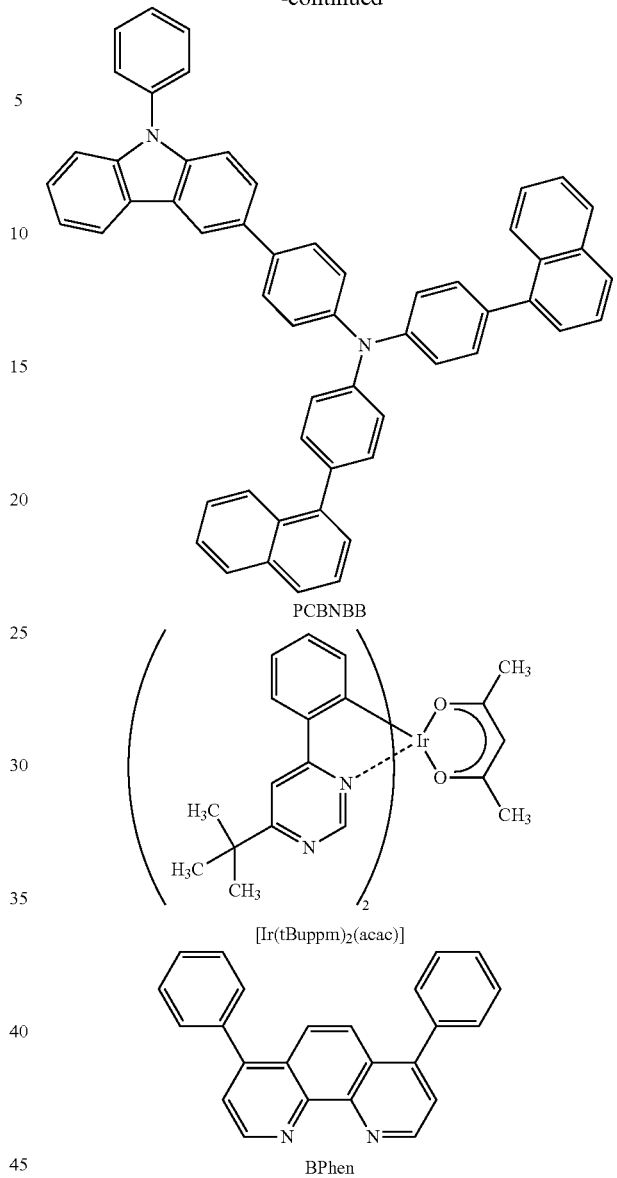

PCBNBB

[Ir(tBuppm)$_2$(acac)]

BPhen

The light-emitting element 4 is described with reference to FIG. 50A. A manufacturing method of the light-emitting element 4 of this example is described below.

(Light-Emitting Element 4)

First, over a substrate 2100, an indium oxide-tin oxide compound containing silicon or silicon oxide (ITSO) was deposited by a sputtering method, so that a first electrode 2101 was formed. Note that the composition ratio of $In_2O_3$ to $SnO_2$ and $SiO_2$ in the target used was 85:10:5 [wt %]. The thickness of the first electrode 2101 was 110 nm and the electrode area was 2 mm×2 mm. Here, the first electrode 2101 functions as an anode of the light-emitting element.

Next, as pretreatment for forming the light-emitting element over the substrate 2100, the surface of the substrate was washed, baked at 200° C. for 1 hour, and then subjected to UV ozone treatment for 370 seconds.

After that, the substrate 2100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 2100 was cooled down for about 30 minutes.

Next, the substrate 2100 provided with the first electrode 2101 was fixed to a substrate holder in the vacuum evaporation apparatus so that a surface on which the first electrode 2101 was provided faced downward. The pressure in the vacuum evaporation apparatus was reduced to about $10^{-4}$ Lastly, by evaporation, a film of aluminum was formed to a thickness of 200 nm as a second electrode 2103 functioning as a cathode. Through the above-steps, the light-emitting element 4 was manufactured.

Table 7 shows an element structure of the light-emitting element 4 obtained as described above.

TABLE 7

| | First electrode | Hole-injection layer | Hole-transport layer | First light-emitting layer | | Second light-emitting layer |
|---|---|---|---|---|---|---|
| Light-emitting element 4 | ITSO 110 nm | DBT3P-II:MoOx (=4:2) 40 nm | BPAFLP 20 nm | 4,6mDBTP2Pm-II:PCBNBB:Ir(tBuppm)₂acac = (0.5:0.5:0.05) 20 nm | | 4,6mDBTP2Pm-II:PCBNBB:Ir(tBuppm)₂acac = (0.8:0.2:0.05) 20 nm |

| | | First electron-transport layer | Second electron-transport layer | Electron-injection layer | Second electrode |
|---|---|---|---|---|---|
| | Light-emitting element 4 | 4,6mDBTP2Pm-II 10 nm | BPhen 20 nm | LiF 1 nm | Al 200 nm |

Pa. After that, on the first electrode 2101, DBT3P-II and molybdenum oxide were co-evaporated, so that a hole-injection layer 2111 was formed. The thickness of the hole-injection layer 2111 was set to 40 nm, and the weight ratio of DBT3P-II to molybdenum oxide was adjusted to 4:2 (=DBT3P-II: molybdenum oxide).

Next, on the hole-injection layer 2111, BPAFLP (abbreviation) was deposited to a thickness of 20 nm, so that the hole-transport layer 2112 was formed.

Further, 4,6-bis[3-(dibenzothiophen-4-yl)phenyl]pyrimidine (abbreviation: 4,6mDBTP2Pm-II) synthesized in Example 4, 4,4'-di(1-naphthyl)-4''-(9-phenyl-9H-carbazol-3-yl)triphenylamine (abbreviation: PCBNBB) and (acetylacetonato)bis(6-tert-butyl-4-phenylpyrimidinato)iridium (III) (abbreviation: [Ir(tBuppm)₂(acac)]) were co-evaporated, so that a first light-emitting layer 2113a was formed on the hole-transport layer 2112. Here, the weight ratio of 4,6mDBTP2Pm-II to PCBNBB and [Ir(tBuppm)₂(acac)] was adjusted to 0.5:0.5:0.05 (=4,6mDBTP2Pm-II: PCBNBB: [Ir(tBuppm)₂(acac)]). The thickness of the first light-emitting layer 2113a was set to 20 nm.

After that, 4,6mDBTP2Pm-II, PCBNBB, and [Ir(tBuppm)₂(acac)] were co-evaporated on the first light-emitting layer 2113a, so that a second light-emitting layer 2113b was formed on the first light-emitting layer 2113a. Here, the weight ratio of 4,6mDBTP2Pm-II to PCBNBB and [Ir(tBuppm)₂(acac)] was adjusted to 0.8:0.2:0.05 (=4,6mDBTP2Pm-II: PCBNBB: [Ir(tBuppm)₂(acac)]). The thickness of the second light-emitting layer 2113b was set to 20 nm.

Then, on the second light-emitting layer 2113b, a film of 4,6mDBTP2Pm-II was formed to a thickness of 10 nm, so that a first electron-transport layer 2114a was formed.

Then, on the first electron-transport layer 2114a, a film of BPhen (abbreviation) was formed to a thickness of 20 nm, so that a second electron-transport layer 2114b was formed.

Further, a film of lithium fluoride (LiF) was formed to a thickness of 1 nm on the second electron-transport layer 2114b by evaporation, so that an electron-injection layer 2115 was formed.

Chemical formulae of materials for the light-emitting element 5 of this example are shown below.

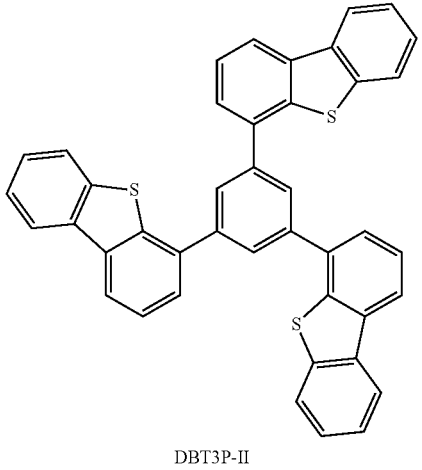

DBT3P-II

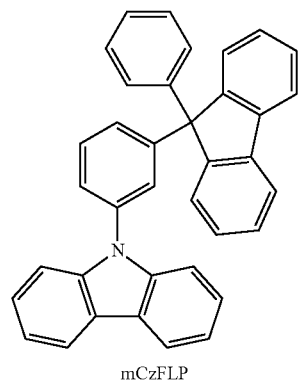

mCzFLP

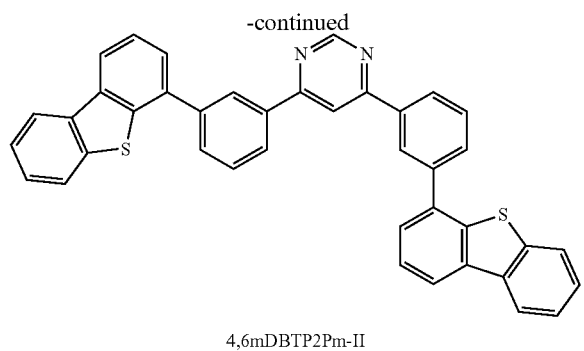

4,6mDBTP2Pm-II

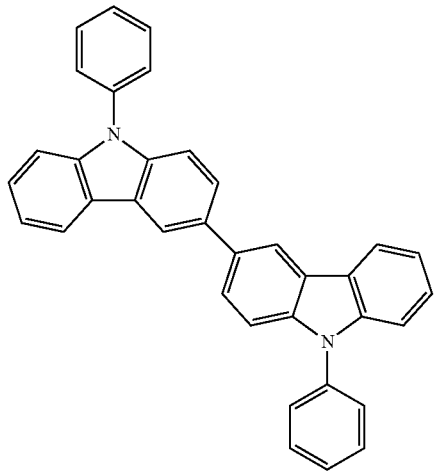

PCCP

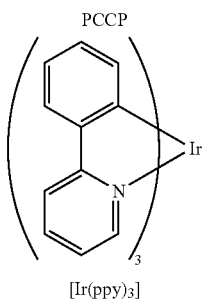

[Ir(ppy)₃]

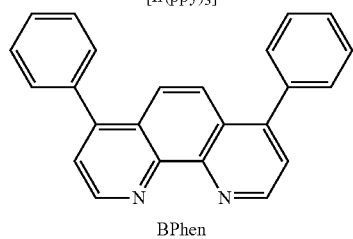

BPhen

Figure 50C:
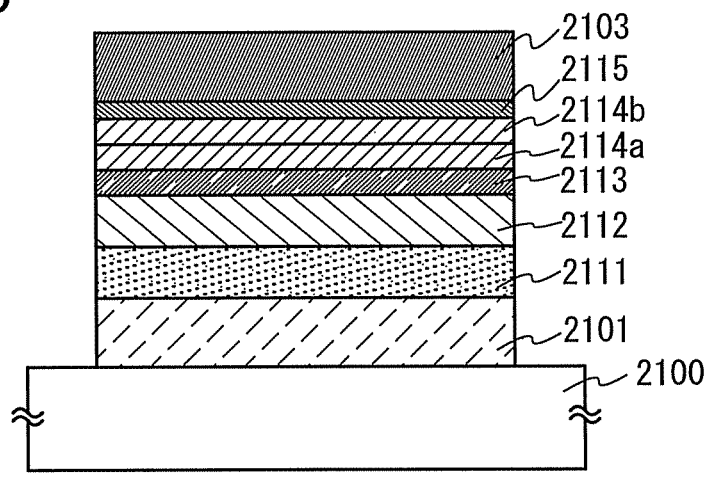

The light-emitting element 5 is described with reference to FIG. 50C. A manufacturing method of the light-emitting element 5 of this example is described below.
(Light-Emitting Element 5)

First, over a substrate 2100, an indium oxide-tin oxide compound containing silicon or silicon oxide (ITSO) was deposited by a sputtering method, so that a first electrode 2101 was formed. Note that the composition ratio of $In_2O_3$ to $SnO_2$ and $SiO_2$ in the target used was 85:10:5 [wt %]. The thickness of the first electrode 2101 was 110 nm and the electrode area was 2 mm×2 mm. Here, the first electrode 2101 functions as an anode of the light-emitting element.

Next, as pretreatment for forming the light-emitting element over the substrate 2100, the surface of the substrate was washed, baked at 200° C. for 1 hour, and then subjected to UV ozone treatment for 370 seconds.

After that, the substrate 2100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 2100 was cooled down for about 30 minutes.

Next, the substrate 2100 provided with the first electrode 2101 was fixed to a substrate holder in the vacuum evaporation apparatus so that a surface on which the first electrode 2101 was provided faced downward. The pressure in the vacuum evaporation apparatus was reduced to about $10^{-4}$ Pa. After that, on the first electrode 2101, DBT3P-II (abbreviation) and molybdenum oxide were co-evaporated, so that a hole-injection layer 2111 was formed. The thickness of the hole-injection layer 2111 was set to 40 nm, and the weight ratio of DBT3P-II to molybdenum oxide was adjusted to 4:2 (=DBT3P-II: molybdenum oxide).

Next, on the hole-injection layer 2111, 9-[3-(9-phenyl-9H-fluoren-9-yl)phenyl]-9H-carbazole (abbreviation: mCzFLP) and PCCP (abbreviation) were co-evaporated, so that a hole-transport layer 2112 was formed. The thickness of the hole-transport layer 2111 was set to 20 nm. The weight ratio of mCzFLP to PCCP was adjusted to 1:1 (=mCzFLP: PCCP).

Further, 4,6mDBTP2Pm-II synthesized in Example 4, PCCP, and tris(2-phenylpyridinato-N,C²')iridium(III) (abbreviation: [Ir(ppy)₃] were co-evaporated, so that a light-emitting layer 2113 was formed on the hole-transport layer 2112. Here, the weight ratio of 4,6mDBTP2Pm-II to PCCP and [Ir(ppy)₃] was adjusted so as to be 0.8:0.2:0.05 (=4, 6mDBTP2Pm-II: PCCP: [Ir(ppy)₃]). The thickness of the light-emitting layer 2113 was set to 40 nm.

Then, on the light-emitting layer 2113, a film of 4,6mDBTP2Pm-II was formed to a thickness of 10 nm, so that a first electron-transport layer 2114a was formed.

Then, on the first electron-transport layer 2114a, a film of BPhen (abbreviation) was formed to a thickness of 20 nm, so that a second electron-transport layer 2114b was formed.

Further, a film of lithium fluoride (LiF) was formed to a thickness of 1 nm on the second electron-transport layer 2114b by evaporation, so that an electron-injection layer 2115 was formed.

Lastly, by evaporation, a film of aluminum was formed to a thickness of 200 nm as a second electrode 2103 functioning as a cathode. Through the above-steps, the light-emitting element 5 was manufactured.

Table 8 shows an element structure of the light-emitting element 5 obtained as described above.

TABLE 8

| | First electrode | Hole-injection layer | Hole-transport layer | Light-emitting layer | First electron-transport layer | Second electron-transport layer | Electron-injection layer | Second electrode |
|---|---|---|---|---|---|---|---|---|
| Light-emitting element 5 | ITSO 110 nm | DBT3P-II:MoOx (=4:2) 40 nm | mCzFLP:PCCP (1:1) 20 nm | 4,6mDBTP2Pm-II:PCCP:Ir(ppy)₃ = (0.8:0.2:0.05) 40 nm | 4,6mDBTP2Pm-II 10 nm | BPhen 20 nm | LiF 1 nm | Al 200 nm |

Chemical formulae of materials for the light-emitting element 6 of this example are shown below.

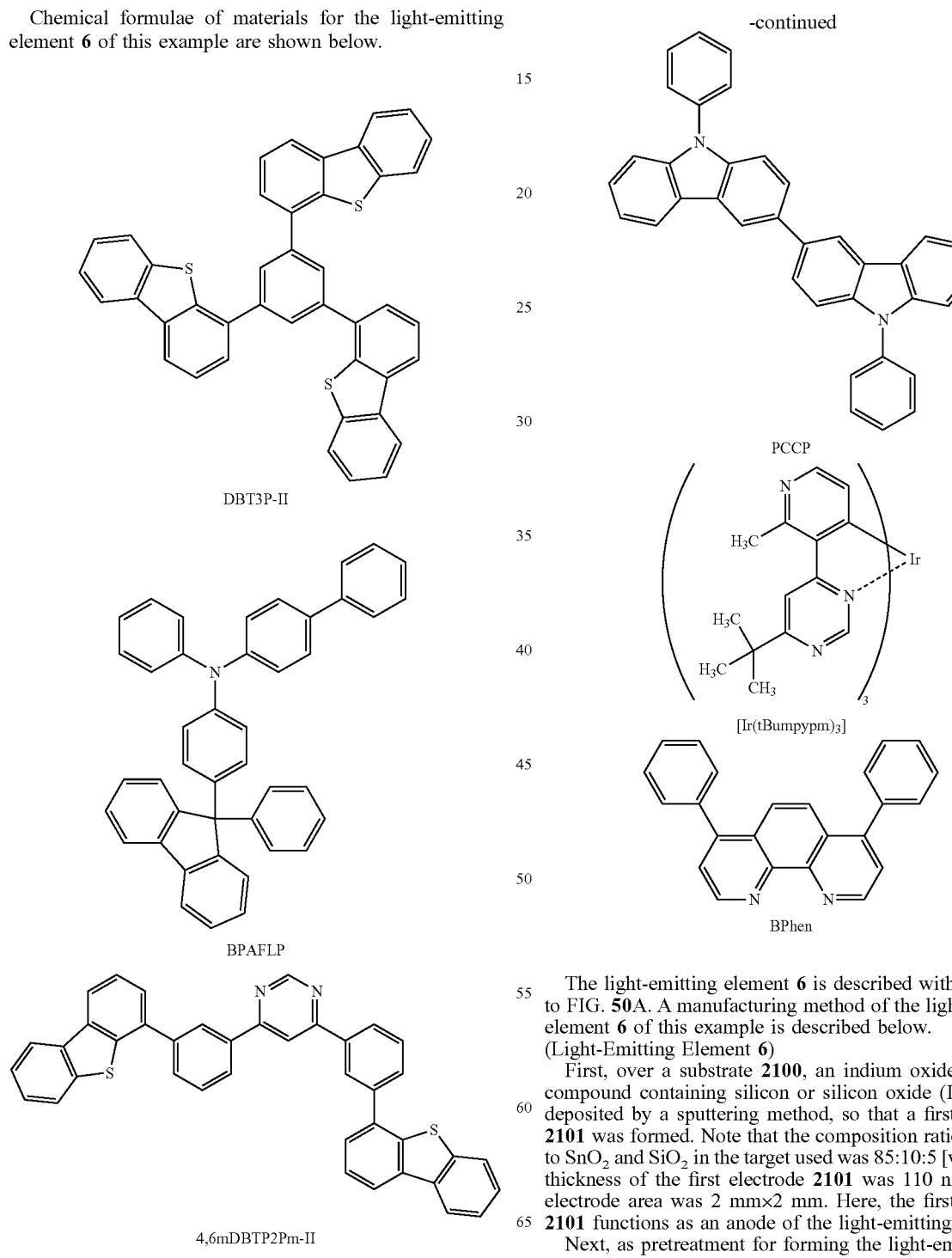

The light-emitting element 6 is described with reference to FIG. 50A. A manufacturing method of the light-emitting element 6 of this example is described below.

(Light-Emitting Element 6)

First, over a substrate 2100, an indium oxide-tin oxide compound containing silicon or silicon oxide (ITSO) was deposited by a sputtering method, so that a first electrode 2101 was formed. Note that the composition ratio of $In_2O_3$ to $SnO_2$ and $SiO_2$ in the target used was 85:10:5 [wt %]. The thickness of the first electrode 2101 was 110 nm and the electrode area was 2 mm×2 mm. Here, the first electrode 2101 functions as an anode of the light-emitting element.

Next, as pretreatment for forming the light-emitting element over the substrate 2100, the surface of the substrate was washed, baked at 200° C. for 1 hour, and then subjected to UV ozone treatment for 370 seconds.

After that, the substrate 2100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 2100 was cooled down for about 30 minutes.

Next, the substrate 2100 provided with the first electrode 2101 was fixed to a substrate holder in the vacuum evaporation apparatus so that a surface on which the first electrode 2101 was provided faced downward. The pressure in the vacuum evaporation apparatus was reduced to about $10^{-4}$ Pa. After that, on the first electrode 2101, DBT3P-II (abbreviation) and molybdenum oxide were co-evaporated, so that a hole-injection layer 2111 was formed. The thickness of the hole-injection layer 2111 was set to 30 nm, and the weight ratio of DBT3P-II to molybdenum oxide was adjusted to 4:2 (=DBT3P-II: molybdenum oxide).

Next, on the hole-injection layer 2111, BPAFLP (abbreviation) was deposited to a thickness of 20 nm, so that the hole-transport layer 2112 was formed.

Further, 4,6-bis[3-(dibenzothiophen-4-yl)phenyl]pyrimidine (abbreviation: 4,6mDBTP2Pm-II) synthesized in Example 4, PCCP (abbreviation), and tris[2-methyl-3-(6-tert-butyl-4-pyrimidinyl-κN3)pyridyl-κC]iridium(III) (abbreviation: [Ir(tBumpypm)$_3$]) were co-evaporated, so that a first light-emitting layer 2113a was formed on the hole-transport layer 2112. Here, the weight ratio of 4,6mDBTP2Pm-II to PCCP (abbreviation) and [Ir(tBumpypm)$_3$](abbreviation) was adjusted to 0.5:0.5:0.05 (=4,6mDBTP2Pm-II: PCCP: [Ir(tBumpypm)$_3$]). The thickness of the first light-emitting layer 2113a was set to 20 nm.

Next, 4,6mDBTP2Pm-II, PCCP, and [Ir(tBumpypm)$_3$] were co-evaporated on the first light-emitting layer 2113a, so that a second light-emitting layer 2113b was formed on the first light-emitting layer 2113a. Here, the weight ratio of 4,6mDBTP2Pm-II to PCCP and [Ir(tBumpypm)$_3$] was adjusted to 0.8:0.2:0.05 (=4,6mDBTP2Pm-II: PCCP: [Ir(tBuppm)$_2$(acac)]). The thickness of the second light-emitting layer 2113b was set to 20 nm.

Then, on the second light-emitting layer 2113b, a film of 4,6mDBTP2Pm-II was formed to a thickness of 10 nm, so that a first electron-transport layer 2114a was formed.

Then, on the first electron-transport layer 2114a, a film of BPhen (abbreviation) was formed to a thickness of 15 nm, so that a second electron-transport layer 2114b was formed.

Further, a film of lithium fluoride (LiF) was formed to a thickness of 1 nm on the second electron-transport layer 2114b by evaporation, so that an electron-injection layer 2115 was formed.

Lastly, by evaporation, a film of aluminum was formed to a thickness of 200 nm as the second electrode 2103 functioning as a cathode. Through the above-steps, the light-emitting element 6 was manufactured.

Table 9 shows an element structure of the light-emitting element 6 obtained as described above.

TABLE 9

| | First electrode | Hole-injection layer | Hole-transport layer | First light-emitting layer | Second light-emitting layer |
|---|---|---|---|---|---|
| Light-emitting element 6 | ITSO 110 nm | DBT3P-II:MoOx (=4:2) 30 nm | BPAFLP 20 nm | 4,6mDBTP2Pm-II:PCCP:Ir(tBumpypm)$_3$ = (0.5:0.5:0.05) 20 nm | 4,6mDBTP2Pm-II:PCCP:Ir(tBumpypm)$_3$ = (0.8:0.2:0.05) 20 nm |

| | | First electron-transport layer | Second electron-transport layer | Electron-injection layer | Second electrode |
|---|---|---|---|---|---|
| | Light-emitting element 6 | 4,6mDBTP2Pm-II 10 nm | Bphen 15 nm | LiF 1 nm | Al 200 nm |

Chemical formulae of materials for the light-emitting element 7 of this example are shown below.

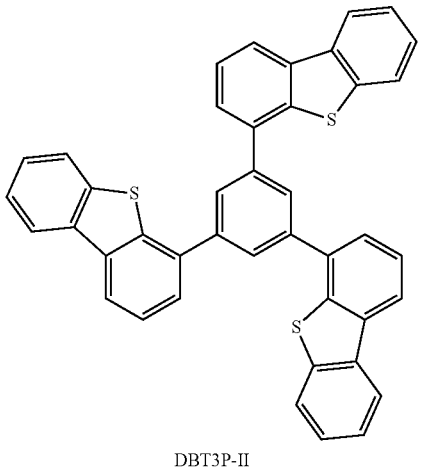

DBT3P-II

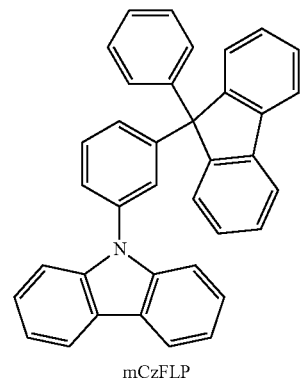

mCzFLP

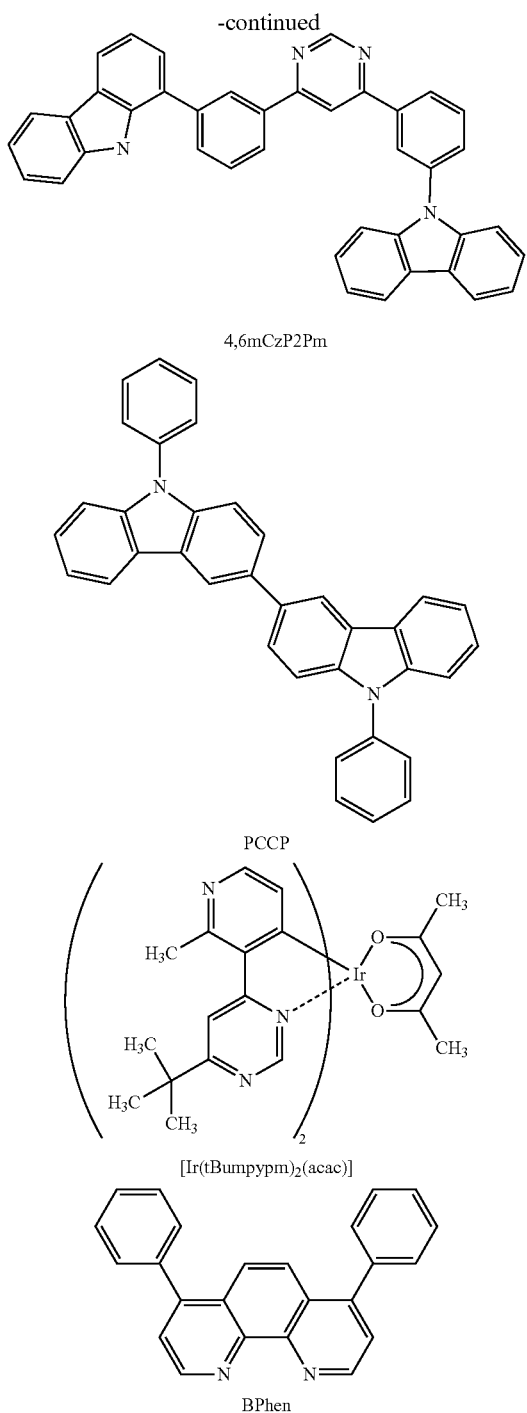

4,6mCzP2Pm

PCCP

[Ir(tBumpypm)₂(acac)]

BPhen

The light-emitting element 7 is described with reference to FIG. 50A. A manufacturing method of the light-emitting element 7 of this example is described below.

(Light-Emitting Element 7)

First, over a substrate 2100, an indium oxide-tin oxide compound containing silicon or silicon oxide (ITSO) was deposited by a sputtering method, so that a first electrode 2101 was formed. Note that the composition ratio of $In_2O_3$ to $SnO_2$ and $SiO_2$ in the target used was 85:10:5 [wt %]. The thickness of the first electrode 2101 was 110 nm and the electrode area was 2 mm×2 mm. Here, the first electrode 2101 functions as an anode of the light-emitting element.

Next, as pretreatment for forming the light-emitting element over the substrate 2100, the surface of the substrate was washed, baked at 200° C. for 1 hour, and then subjected to UV ozone treatment for 370 seconds.

After that, the substrate 2100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 2100 was cooled down for about 30 minutes.

Next, the substrate 2100 provided with the first electrode 2101 was fixed to a substrate holder in the vacuum evaporation apparatus so that a surface on which the first electrode 2101 was provided faced downward. The pressure in the vacuum evaporation apparatus was reduced to about $10^{-4}$ Pa. After that, on the first electrode 2101, DBT3P-II (abbreviation) and molybdenum oxide were co-evaporated, so that a hole-injection layer 2111 was formed. The thickness of the hole-injection layer 2111 was set to 40 nm, and the weight ratio of DBT3P-II (abbreviation) to molybdenum oxide was adjusted to 4:2 (=DBT3P-II: molybdenum oxide).

Next, on the hole-injection layer 2111, a film of mCzFLP (abbreviation) was formed to a thickness of 20 nm, so that a hole-transport layer 2112 was formed.

Further, 4,6-bis[3-(9H-carbazol-9-yl)phenyl]pyrimidine (abbreviation: 4,6mCzP2Pm), PCCP (abbreviation), and bis[2-methyl-3-(6-tert-butyl-4-pyrimidinyl-κN3)pyridyl-κC] (2,4-pentanedionato-κ²O,O')iridium(III) (abbreviation: [Ir(tBumpypm)₂(acac)]) were co-evaporated, so that a first light-emitting layer 2113a was formed on the hole-transport layer 2112. Here, the weight ratio of 4,6mCzP2Pm to PCCP and [Ir(tBumpypm)₂(acac)] was adjusted to 0.8:0.2:0.05 (=4,6mCzP2Pm: PCCP: [Ir(tBumpypm)₂(acac)]). The thickness of the first light-emitting layer 2113a was set to 20 nm.

Next, 4,6mCzP2Pm and [Ir(tBumpypm)₂(acac)] were co-evaporated on the first light-emitting layer 2113a, so that a second light-emitting layer 2113b was formed on the first light-emitting layer 2113a. Here, the weight ratio of 4,6mCzP2Pm to [Ir(tBumpypm)₂(acac)] was adjusted to 1:0.05 (=4,6mCzP2Pm: [Ir(tBumpypm)₂(acac)]). The thickness of the second light-emitting layer 2113b was set to 20 nm.

Then, on the second light-emitting layer 2113b, a film of 4,6mCzP2Pm was formed to a thickness of 10 nm, so that a first electron-transport layer 2114a was formed.

Then, on the first electron-transport layer 2114a, a film of BPhen (abbreviation) was formed to a thickness of 20 nm, so that a second electron-transport layer 2114b was formed.

Further, a film of lithium fluoride (LiF) was formed to a thickness of 1 nm on the second electron-transport layer 2114b by evaporation, so that an electron-injection layer 2115 was formed.

Lastly, by evaporation, a film of aluminum was formed to a thickness of 200 nm as a second electrode 2103 functioning as a cathode. Through the above-steps, the light-emitting element 7 was manufactured.

Table 9 shows an element structure of the light-emitting element 7 obtained as described above.

TABLE 10

|  | First electrode | Hole-injection layer | Hole-transport layer | First light-emitting layer | Second light-emitting layer |
|---|---|---|---|---|---|
| Light-emitting element 7 | ITSO 110 nm | DBT3P-II:MoOx (=4:2) 40 nm | mCzFLP 20 nm | 4,6-mCzP2Pm:PCCP:Ir(tBumpypm)$_2$acac = (0.8:0.2:0.05) 20 nm | 4,6-mCzP2Pm:Ir(tBumpypm)$_2$acac = (1:0.05) 20 nm |

|  |  | First electron-transport layer | Second electron-transport layer | Electron-injection layer | Second electrode |
|---|---|---|---|---|---|
|  | Light-emitting element 7 | 4,6-mCzP2Pm 10 nm | Bphen 20 nm | LiF 1 nm | Al 200 nm |

In a glove box containing a nitrogen atmosphere, the light-emitting elements 4 to 7 were sealed so as not to be exposed to the air (a sealant was applied onto an outer edge of each element and heat treatment was performed at 80° C. for 1 hour at the time of sealing). After that, operation characteristics of the light-emitting elements 4 to 7 were measured. Note that the measurement was carried out at room temperature (in an atmosphere kept at 25° C.).

FIG. 65, FIG. 72, FIG. 79, and FIG. 86 show luminance versus current density characteristics of the light-emitting elements 4, 5, 6, and 7, respectively. In each of FIG. 65, FIG. 72, FIG. 79, and FIG. 86, the horizontal axis represents current density (mA/cm$^2$) and the vertical axis represents luminance (cd/m$^2$). FIG. 66, FIG. 73, FIG. 80, and FIG. 87 show luminance versus voltage characteristics of the light-emitting elements 4, 5, 6, and 7, respectively. In each of FIG. 66, FIG. 73, FIG. 80, and FIG. 87, the horizontal axis represents voltage (V) and the vertical axis represents luminance (cd/m$^2$). FIG. 67, FIG. 74, FIG. 81, and FIG. 88 show current efficiency versus luminance characteristics of the light-emitting elements 4, 5, 6, and 7, respectively. In each of FIG. 67, FIG. 74, FIG. 81, and FIG. 88, the horizontal axis represents luminance (cd/m$^2$) and the vertical axis represents current efficiency (cd/A). FIG. 68, FIG. 75, FIG. 82, and FIG. 89 show current versus voltage characteristics of the light-emitting elements 4, 5, 6, and 7, respectively. In each of FIG. 68, FIG. 75, FIG. 82, and FIG. 89, the horizontal axis represents voltage (V) and the vertical axis represents current (mA). FIG. 69, FIG. 76, FIG. 83, and FIG. 90 show chromaticity coordinate versus luminance characteristics of the light-emitting elements 4, 5, 6, and 7, respectively. In each of FIG. 69, FIG. 76, FIG. 83, and FIG. 90, the horizontal axis represents luminance (cd/m$^2$) and the vertical axis represents chromaticity coordinates (x-coordinate and y-coordinate). FIG. 70, FIG. 77, FIG. 84, and FIG. 91 show power efficiency versus luminance characteristics of the light-emitting elements 4, 5, 6, and 7, respectively. In each of FIG. 70, FIG. 77, FIG. 84, and FIG. 91, the horizontal axis represents luminance (cd/m$^2$) and the vertical axis represents power efficiency (lm/W).

FIG. 70, FIG. 77, FIG. 84, and FIG. 91 show that the light-emitting elements 4 to 7 have high efficiency. FIG. 69, FIG. 76, FIG. 83, and FIG. 90 show that the light-emitting elements 4 to 7 have favorable carrier balance at any luminance. FIG. 68, FIG. 75, FIG. 82, and FIG. 89 show that the light-emitting elements 4 to 7 have low driving voltage and low power consumption.

Table 11 shows the voltage (V), current density (mA/cm$^2$), CIE chromaticity coordinates (x, y), luminance (cd/m$^2$), current efficiency (cd/A), and external quantum efficiency (%) of the light-emitting elements 4 to 7 at a luminance of around 1000 cd/m$^2$.

TABLE 11

|  | Voltage (V) | Current density (mA/cm$^2$) | Chromaticity x Chromaticity y | Luminance (cd/m$^2$) | Current efficiency (cd/A) | External quantum efficiency (%) |
|---|---|---|---|---|---|---|
| Light-emitting element 4 | 2.7 | 0.9 | 0.43 0.56 | 694 | 79 | 22 |
| Light-emitting element 5 | 3.1 | 1.4 | 0.33 0.62 | 954 | 69 | 20 |
| Light-emitting element 6 | 2.9 | 1.3 | 0.25 0.52 | 797 | 60 | 22 |
| Light-emitting element 7 | 3.3 | 1.1 | 0.30 0.61 | 810 | 77 | 24 |

FIG. 71, FIG. 78, FIG. 85, and FIG. 92 show emission spectra of the light-emitting elements 4, 5, 6, and 7, respectively, at a current density of 2.5 mA/cm$^2$ As shown in FIG. 71, FIG. 78, FIG. 85, and FIG. 92, the emission spectra of the light-emitting elements 4, 5, 6, and 7 have peaks at 548 nm, 513 nm, 493 nm, and 508 nm, respectively.

The above shows that light emission from each dopant material (iridium complex) is obtained. The organic compound having a pyrimidine skeleton that is the second compound, which is one embodiment of the present invention, has a high T1 level, and thus can be used as a host material for a material emitting blue-green phosphorescence or phosphorescence with a longer wavelength than blue-green phosphorescence.

As shown in Table 11, the CIE chromaticity coordinates of the light-emitting element 4 at a luminance of 694 cd/m$^2$ were (x, y)=(0.43, 0.56). The voltage, current-density, current efficiency, and external quantum efficiency of the light-emitting element 4 at a luminance of 694 cd/m$^2$ were 2.7 V, 0.9 mA/cm², 79 cd/A, and 22%, respectively. The CIE chromaticity coordinates of the light-emitting element 5 at a luminance of 954 cd/m² were (x, y)=(0.33, 0.62). The voltage, current-density, current efficiency, and external quantum efficiency of the light-emitting element 5 at a luminance of 954 cd/m² were 3.1 V, 1.4 mA/cm², 69 cd/A, and 20%, respectively. The CIE chromaticity coordinates of the light-emitting element 6 at a luminance of 797 cd/m² were (x, y)=(0.25, 0.52). The voltage, current-density, current efficiency, and external quantum efficiency of the light-emitting element 6 at a luminance of 797 cd/m² were 2.9 V, 1.3 mA/cm², 60 cd/A, and 24%, respectively. The CIE chromaticity coordinates of the light-emitting element 7 at a luminance of 810 cd/m² were (x, y)=(0.30, 0.61). The voltage, current-density, current efficiency, and external quantum efficiency of the light-emitting element 7 at a luminance of 810 cd/m² were 3.3 V, 1.1 mA/cm², 77 cd/A, and 24%, respectively.

The above results show that the light-emitting elements 4 to 7 of embodiments of the present invention have low driving voltage and favorable carrier balance.

The organic compound having a pyrimidine skeleton that is the second compound, which is one embodiment of the present invention, has a high electron-transport property; thus, when the organic compound is used for an electron-transport layer, an element with low driving voltage can be obtained.

Further, as in the description of the light-emitting elements 4 to 7, when the organic compound having a pyrimidine skeleton that is the second compound, which is one embodiment of the present invention, and the compound having a high hole-transport property (PCBNBB (abbreviation) or PCCP (abbreviation)) are included in the light-emitting layer, electrons and holes can be efficiently injected into dopants (iridium complex), which results in an element with high efficiency and low driving voltage.

Further, as in the description of the light-emitting element 5, when a hole-transport layer is formed using the material having a high hole-transport property (PCCP) and the material having a high T1 level (mCzFLP (abbreviation)), holes are efficiently injected into a light-emitting layer, and excited energy generated in the light-emitting layer can be probably prevented from being transmitted to the hole-transport layer, resulting in an element with lower driving voltage and higher efficiency.

Next, a reliability test was performed on the light-emitting elements 4 and 5. FIG. 93 to FIG. 96 show results of the reliability test.

Figure 93:
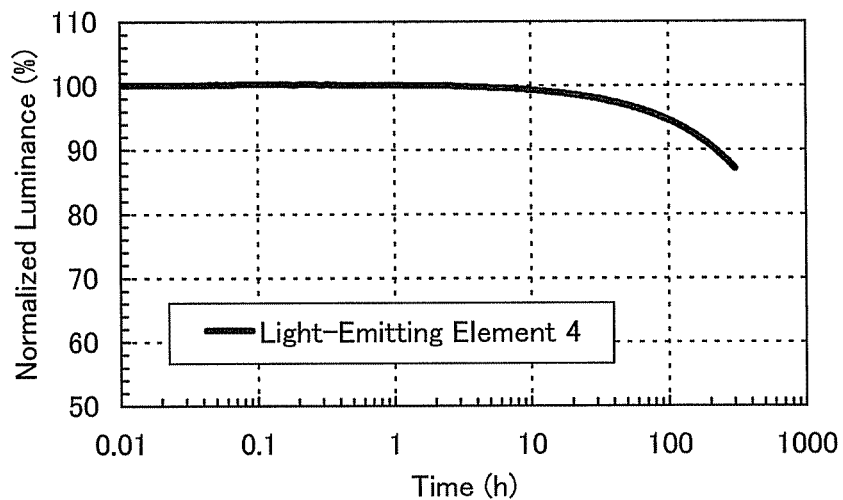
FIG. 93 shows normalized luminance versus time characteristics of the light-emitting element 4.
Figure 95:
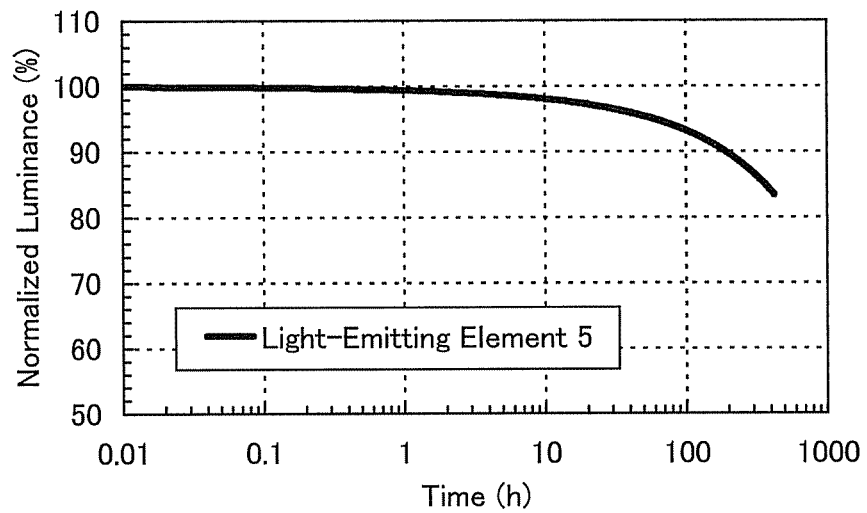
FIG. 95 shows normalized luminance versus time characteristics of the light-emitting element 5.

In the reliability test, the light-emitting elements 4 and 5 were driven under the conditions where the initial luminance was 5000 cd/m² and the current density was constant. The results are shown in FIG. 93 and FIG. 95. The horizontal axis represents driving time (h) of the element and the vertical axis represents normalized luminance (%) on the assumption that the initial luminance is 100%. FIG. 93 shows that the normalized luminance of the light-emitting element 4 after 300 hours is 87%. FIG. 95 shows that the normalized luminance of the light-emitting element 5 after 420 hours is 83%.

Figure 94:
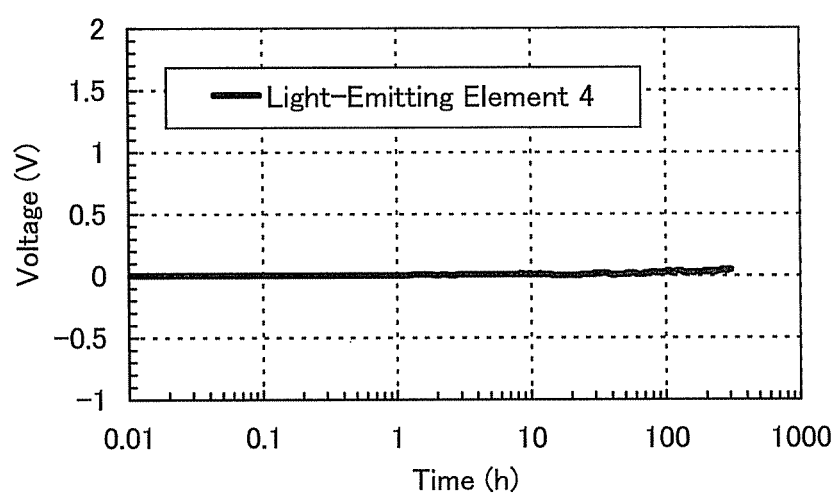
FIG. 94 shows voltage versus time characteristics of the light-emitting element 4.
Figure 96:
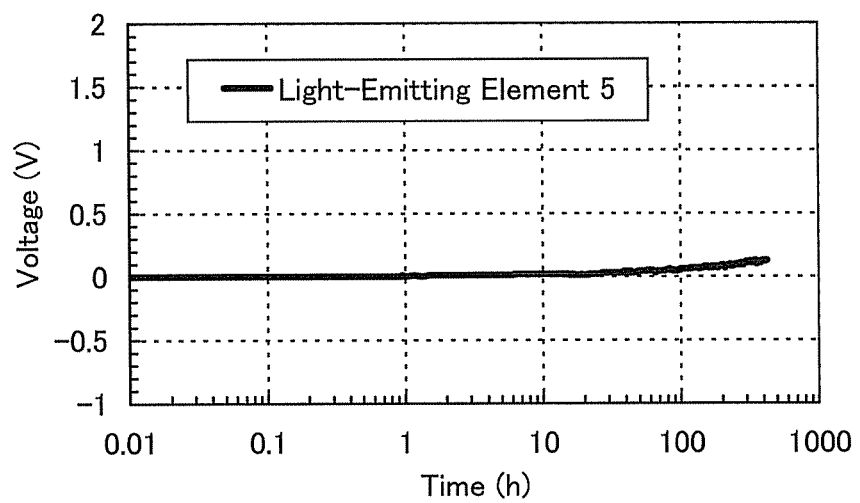
FIG. 96 shows voltage versus time characteristics of the light-emitting element 5.

Next, in the reliability test, changes in voltage of the light-emitting elements 4 and 5 over time were measured under the conditions where the initial luminance was 5000 cd/m² and the current density was constant. The results are shown in FIG. 94 and FIG. 96. The horizontal axis represents driving time (h) of the element and the vertical axis represents voltage (V). FIG. 94 and FIG. 96 show that the voltage rise of the light-emitting elements 4 and 5 over time is small.

The above results show that the light-emitting elements 4 and 5 each have a long lifetime.

REFERENCE EXAMPLE 1

A synthesis method of (acetylacetonato)bis(6-tert-butyl-4-phenylpyrimidinato)iridium(III) (abbreviation: [Ir(tBuppm)₂(acac)]) used in Examples 12 and 13 will be described in detail. A structure of [Ir(tBuppm)₂(acac)] is shown below.

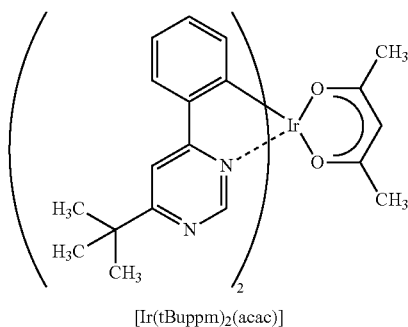

[Ir(tBuppm)₂(acac)]

Step 1: Synthesis of 4-tert-Butyl-6-phenylpyrimidine (abbreviation: HtBuppm)

First, in a recovery flask equipped with a reflux pipe were put 22.5 g of 4,4-dimethyl-1-phenylpentane-1,3-dione and 50 g of formamide, and the air in the flask was replaced with nitrogen. This reaction container was heated so that the reacted solution was refluxed for 5 hours. After that, this solution was poured into an aqueous solution of sodium hydroxide, and an organic layer was extracted with dichloromethane. The obtained organic layer was washed with water and saturated saline, and dried with magnesium sulfate. The solution which had been dried was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. A synthesis scheme of Step 1 is shown in (M-1).

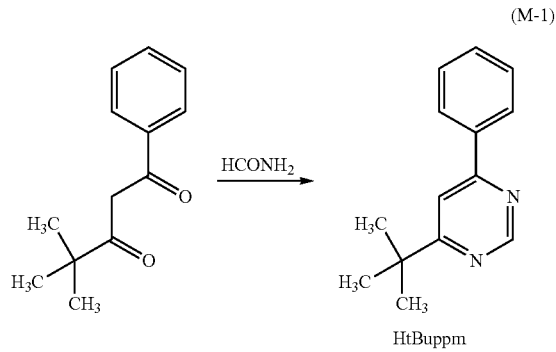

Step 2: Synthesis of Di-μ-chloro-bis[bis(6-tert-butyl-4-phenylpyrimidinato)iridium(III)](abbreviation: [Ir(tBuppm)₂Cl]₂)

Next, in a recovery flask equipped with a reflux pipe were put 15 mL of 2-ethoxyethanol, 5 mL of water, 1.49 g of HtBuppm obtained in Step 1, and 1.04 g of iridium chloride hydrate (IrCl₃.H₂O), and the air in the flask was replaced with argon. After that, irradiation with microwaves (2.45 GHz, 100 W) was performed for 1 hour to cause a reaction. The solvent was distilled off, and then the obtained residue was suction-filtered with ethanol and washed to give a dinuclear complex [Ir(tBuppm)₂Cl]₂ (yellow green powder, yield of 73%). A synthesis scheme of Step 2 is shown in (M-2).

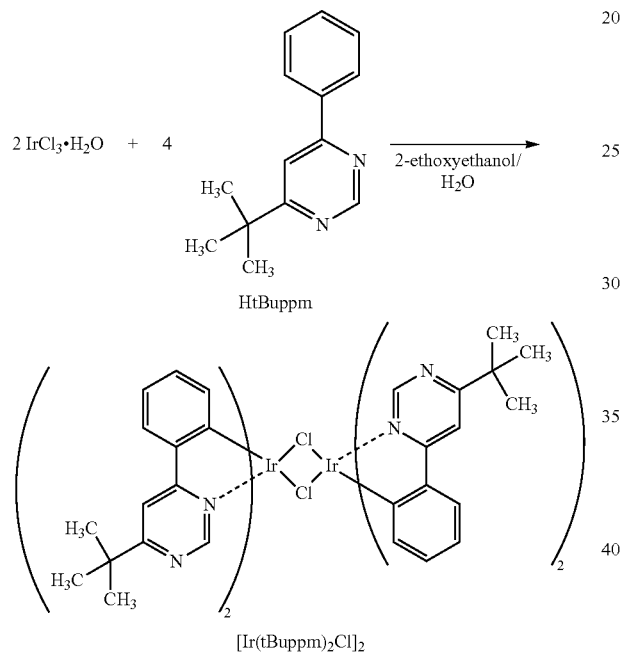

(M-2)

Step 3: Synthesis of (Acetylacetonato)bis(6-tert-butyl-4-phenylpyrimidinato)iridium(III) (abbreviation: [Ir(tBuppm)₂(acac)])

Further, in a recovery flask equipped with a reflux pipe were put 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate, and the air in the flask was replaced with argon. After that, irradiation with microwaves (2.45 GHz, 120 W) was performed for 1 hour to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized from a mixed solvent of dichloromethane and hexane, so that yellow powder was obtained as a target substance (yield of 68%). A synthesis scheme of Step 3 is shown in (M-3).

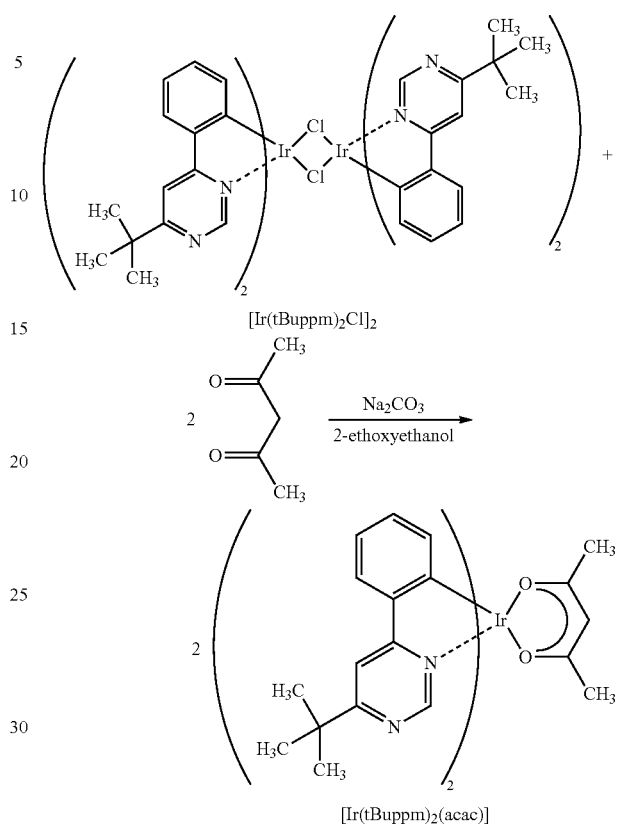

(M-3)

The yellow powder obtained in Step 3 was measured by nuclear magnetic resonance spectrometry (¹H-NMR). The measurement data are shown below. These measurement results show that [Ir(tBuppm)₂(acac)] was obtained.

¹H NMR data of the obtained substance are as follows:
¹H-NMR. δ (CDCl₃): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

REFERENCE EXAMPLE 2

A synthesis method of tris[3-methyl-1-(2-methylphenyl)-5-phenyl-1H-1,2,4-triazolato]iridium(III) (abbreviation: [Ir(Mptz1-mp)₃]) used in Example 13 will be described in detail. A structure of [Ir(Mptz1-mp)₃] is shown below.

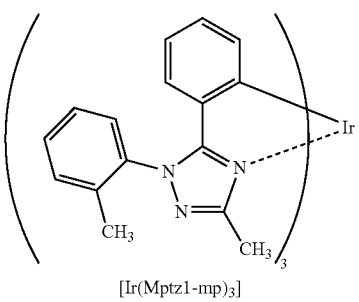

[Ir(Mptz1-mp)₃]

Step 1: Synthesis of N-(1-Ethoxyethylidene)benzamide

First, in a 500 mL three-neck flask were put 15.5 g of ethyl acetimidate hydrochloride, 150 mL of toluene, and 31.9 g of triethylamine (Et$_3$N), and the mixture was stirred at room temperature for 10 minutes. With a 50-mL dropping funnel, a mixed solution of 17.7 g of benzoyl chloride and 30 mL of toluene were added dropwise to this mixture, and the mixture was stirred at room temperature for 24 hours. After a predetermined time elapsed, the reaction mixture was suction-filtered, and the solid was washed with toluene. The obtained filtrate was concentrated to give N-(1-ethoxyethylidene)benzamide (red oily substance, yield of 82%). A synthesis scheme of Step 1 is shown in (N-1).

(N-1)

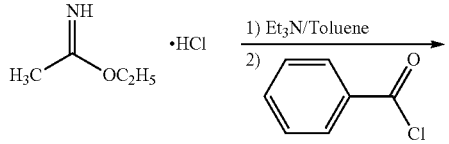

Step 2: Synthesis of 3-Methyl-1-(2-methylphenyl)-5-phenyl-1H-1,2,4-triazole (abbreviation: HMptz1-mp)

Next, in a 300 mL recovery flask were put 8.68 g of o-tolyl hydrazine hydrochloride, 100 mL of carbon tetrachloride, and 35 mL of triethylamine (Et$_3$N), and the mixture was stirred at room temperature for 1 hour. After a predetermined time elapsed, 8.72 g of N-(1-ethoxyethylidene) benzamide obtained in Step 1 was added to this mixture, and the mixture was stirred at room temperature for 24 hours. After a predetermined time elapsed, water was added to the reaction mixture, and the aqueous layer was subjected to extraction with chloroform. The organic layer was washed with saturated saline, and dried with anhydrous magnesium sulfate added thereto. The obtained mixture was gravity-filtered, and the filtrate was concentrated to give an oily substance. The obtained oily substance was purified by silica gel column chromatography. Dichloromethane was used as a developing solvent. The obtained fraction was concentrated to give 3-methyl-1-(2-methylphenyl)-5-phenyl-1H-1,2,4-triazole (abbreviation: HMptz1-mp) (orange oily substance, yield of 84%). A synthesis scheme of Step 2 is shown in (N-2).

(N-2)

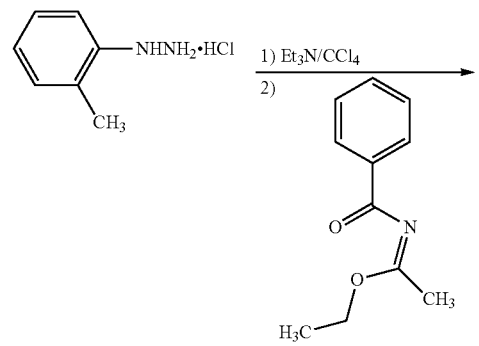

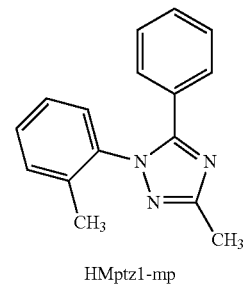

HMptz1-mp

Step 3: Synthesis of Tris[3-methyl-1-(2-methylphenyl)-5-phenyl-1H-1,2,4-triazolato]iridium(III) (abbreviation: [Ir(Mptz1-mp)$_3$])

Next, 2.71 g of the ligand HMptz1-mp obtained in Step 2 and 1.06 g of tris(acetylacetonato)iridium(III) were put in a reaction container provided with a three-way cock. The air in this reaction container was replaced with argon, and heating at 250° C. was performed for 48 hours to cause a reaction. This reaction mixture was dissolved in dichloromethane and purified by silica gel column chromatography. As a developing solvent, dichloromethane was used first, and then a mixed solvent of dichloromethane and ethyl acetate in a ratio of 10:1 (v/v) was used. The obtained fraction was concentrated to give a solid. This solid was washed with ethyl acetate, and recrystallized from a mixed solvent of dichloromethane and ethyl acetate to give an organometallic complex [Ir(Mptz1-mp)$_3$], which is one embodiment of the present invention (yellow powder, yield of 35%). A synthesis scheme of Step 3 is shown in (N-3).

(N-3)

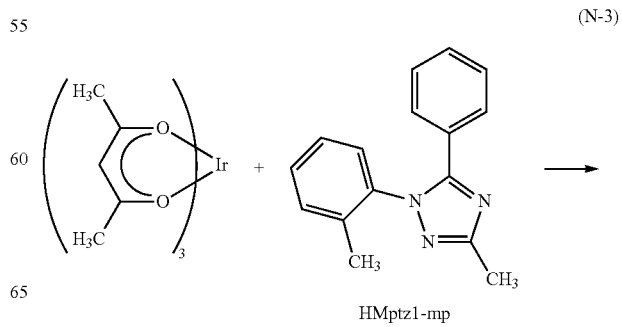

HMptz1-mp

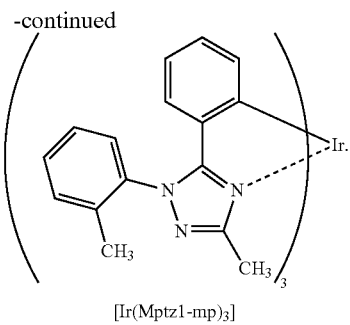

[Ir(Mptz1-mp)₃]

The yellow powder obtained in Step 3 was measured by nuclear magnetic resonance spectrometry (¹H-NMR). These measurement results show that [Ir(Mptz1-mp)₃] was obtained.

¹H NMR data of the obtained substance are as follows: ¹H NMR. δ (CDCl₃): 1.94-2.21 (m, 18H), 6.47-6.76 (m, 12H), 7.29-7.52 (m, 12H).

REFERENCE EXAMPLE 3

A synthesis method of tris[2-methyl-3-(6-tert-butyl-4-pyrimidinyl-κN3)pyridyl-κC]iridium(II) (abbreviation: [Ir(tBumpypm)₃]) used in Example 14 will be described. A structure of [Ir(tBumpypm)₃] is shown below.

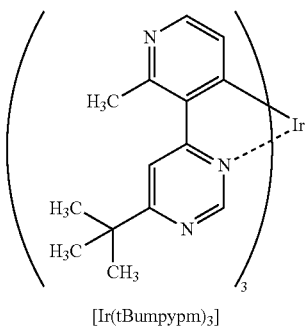

[Ir(tBumpypm)₃]

Step 1: Synthesis of
4-Hydroxy-6-tert-butylpyrimidine

First, 7.2 g of formamidine acetate, 7.5 g of sodium methoxide, and 70 mL of methanol were put in a 100 mL three-neck flask. Then, 10 g of methyl 4,4-dimethyloxovalerate was added to this mixed solution. The mixture was stirred at room temperature for 24 hours. After a predetermined time elapsed, a mixed solution of 17 mL of water and 7.2 mL of acetic acid was added to the mixture, and the mixture was stirred at room temperature. This mixture was concentrated, and the given residue was dissolved in water. The solution was subjected to extraction with ethyl acetate. The obtained solution of the extract was washed with saturated saline, and anhydrate magnesium sulfate was added to the organic layer for drying. The obtained mixture was subjected to gravity filtration, and the filtrate was concentrated to give a solid. This solid was washed with ethyl acetate to give 4-hydroxy-6-tert-butylpyrimidine (white solid, yield of 49%). A synthesis scheme of Step 1 is shown in (P-1).

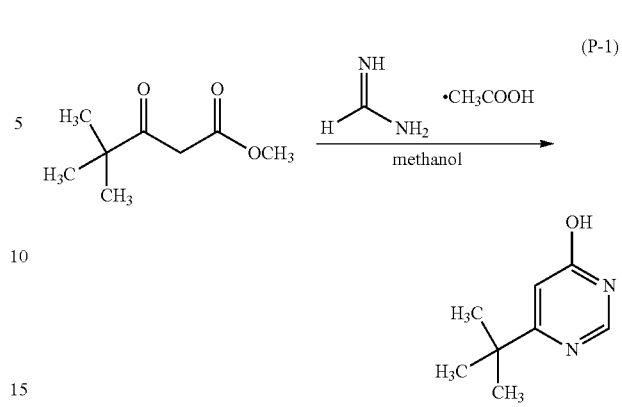

(P-1)

Step 2: Synthesis of
4-Chloro-6-tert-butylpyrimidine

Next, 4.7 g of 4-hydroxy-6-tert-butylpyrimidine obtained in Step 1 and 14 mL of phosphoryl chloride were put in a 50 mL three-neck flask, and the mixture was heated and refluxed for 1.5 hours. After the reflux, phosphoryl chloride was distilled off under reduced pressure. The obtained residue was dissolved in dichloromethane, and washed with water and then a saturated aqueous solution of sodium hydrogen carbonate. Anhydrate magnesium sulfate was added to the obtained organic layer for drying. This mixture was subjected to gravity filtration, and the filtrate was concentrated to give a solid. This solid was purified by silica gel column chromatography. As a developing solvent, a mixed solvent of hexane and ethyl acetate in a ratio of 10:1 (v/v) was used. The obtained fraction was concentrated to give 4-chloro-6-tert-butylpyrimidine (white solid, yield of 78%). A synthesis scheme of Step 2 is shown in (P-2).

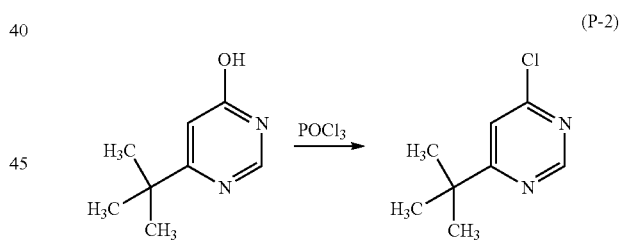

(P-2)

Step 3: Synthesis of 4-(2-Methylpyridin-3-yl)-6-
tert-butylpyrimidine (abbreviation: HtBumpypm)

Next, in a 100 mL round-bottom flask were put 2.0 g of 4-chloro-6-tert-butylpyrimidine obtained in Step 2, 3.0 g of 2-methylpyridine-3-boronic acid pinacol ester, 17 mL of 1M potassium acetate solution, 17 mL of 1M sodium carbonate solution, and 40 mL of acetonitrile, and the air in the flask was replaced with argon. To this mixture was added 0.78 g of tetrakis(triphenylphosphine)palladium(0), and the mixture was irradiated with microwaves under conditions of 100° C. and 100 W for 1 hour to cause a reaction. This reaction mixture was extracted with ethyl acetate, and washing with saturated saline was performed. Anhydrous magnesium sulfate was added to the obtained solution of the extract for drying, and the resulting mixture was gravity-filtered to give a filtrate. The resulting filtrate was dissolved in a mixed solvent of ethyl acetate and hexane, and the mixture was filtered through Celite, alumina, and Celite. The resulting filtrate was purified by silica gel column chromatography. As a developing solvent, a mixed solvent of hexane and ethyl acetate in a ratio of 3:2 (v/v) was used. The resulting fraction was concentrated to give an oily substance. This oily substance was dissolved in a mixed solvent of hexane and ethyl acetate, and the solution was filtered through a filter aid in which Celite, alumina, and Celite were stacked in this order. The resulting filtrate was concentrated to give 4-(2-methylpyridin-3-yl)-6-tert-butylpyrimidine (abbreviation: HtBumpypm) (light-yellow oily substance, yield of 92%). A synthesis scheme of Step 3 is shown in (P-3).

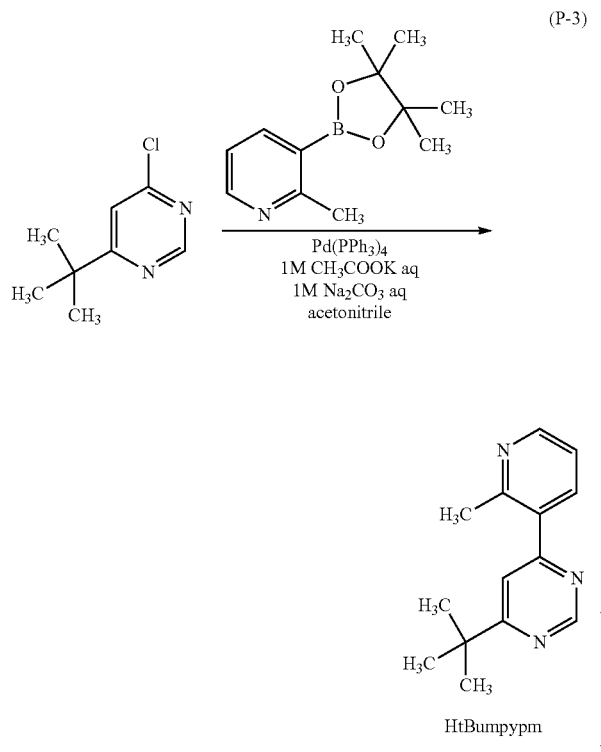

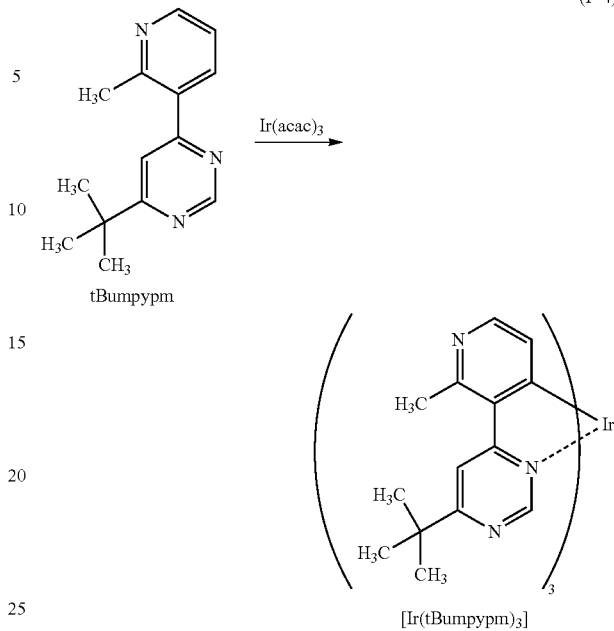

Step 4: Synthesis of Tris[2-methyl-3-(6-tert-butyl-4-pyrimidinyl-κN3)pyridyl-κC]iridium(III) (abbreviation: [Ir(tBumpypm)₃])

Next, 3.31 g of the ligand HtBumpypm obtained in Step 3, and 1.42 g of tris(acetylacetonato)iridium(III) were put in a reaction container provided with a three-way cock, and the air in the reaction container was replaced with argon. After that, the mixture was heated at 250° C. for 50.5 hours to cause a reaction. The obtained residue was purified by flash column chromatography using ethyl acetate and methanol as a developing solvent in a ratio of 4:1. The solvent of the resulting fraction was distilled off to give a solid. The resulting solid was recrystallized twice from a mixed solvent of dichloromethane and hexane to give [Ir(tBumpypm)₃] (yellow-brown powder, yield of 22%). A synthesis scheme of Step 4 is shown in (P-4).

The yellow-brown powder obtained in Step 4 was measured by nuclear magnetic resonance spectrometry ($^1$H-NMR). The measurement results show that [Ir(tBumpypm)₃] was obtained.

$^1$H NMR data of the obtained substance are as follows: $^1$H-NMR. δ (CDCl₃): 1.41 (s, 27H), 2.94 (s, 9H), 6.64 (d, 3H), 7.70 (d, 3H), 8.12 (s, 3H), 8.24 (s, 3H)

REFERENCE EXAMPLE 4

A synthesis method of bis[2-methyl-3-(6-tert-butyl-4-pyrimidinyl-κN3)pyridyl-κC](2,4-pentanedionato-κ²O,O')iridium(III)) (abbreviation: [Ir(tBumpypm)₂(acac)]) used in Example 14 will be described in detail. A structure of [Ir(tBumpypm)₂(acac)] is shown below.

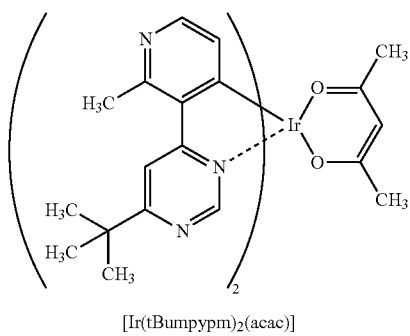

Step 1: Synthesis of 4-Hydroxy-6-tert-butylpyrimidine

First, 7.2 g of formamidine acetate, 7.5 g of sodium methoxide, and 70 mL of methanol were put in a 100 mL three-neck flask. Then, 10 g of methyl 4,4-dimethyloxovalerate was added to this mixed solution. The mixture was stirred at room temperature for 24 hours. After a predetermined time elapsed, a mixed solution of 17 mL of water and 7.2 mL of acetic acid was added to the mixture, and the resulting mixture was stirred at room temperature. This mixture was concentrated, and the resulting residue was dissolved in water. The solution was subjected to extraction with ethyl acetate. The obtained solution of the extract was washed with saturated saline, and anhydrate magnesium sulfate was added to the organic layer for drying. The obtained mixture was subjected to gravity filtration, and the filtrate was concentrated to give a solid. This solid was washed with ethyl acetate to give 4-hydroxy-6-tert-butylpyrimidine (white solid, yield of 49%). A synthesis scheme of Step 1 is shown in (Q-1).

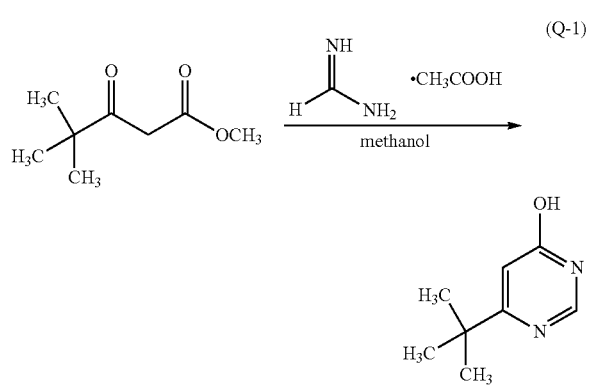

(Q-1)

Step 2: Synthesis of 4-Chloro-6-tert-butylpyrimidine

Next, 4.7 g of 4-hydroxy-6-tert-butylpyrimidine obtained in Step 1 and 14 mL of phosphoryl chloride were put in a 50 mL three-neck flask, and the mixture was heated and refluxed for 1.5 hours. After the reflux, phosphoryl chloride was distilled off under reduced pressure. The obtained residue was dissolved in dichloromethane, and washed with water and a saturated aqueous solution of sodium hydrogen carbonate. Anhydrate magnesium sulfate was added to the obtained organic layer for drying. This mixture was subjected to gravity filtration, and the filtrate was concentrated to give a solid. This solid was purified by silica gel column chromatography. As the developing solvent, a mixed solvent of hexane and ethyl acetate in a ratio of 10:1 (v/v) was used. The obtained fraction was concentrated to give 4-chloro-6-tert-butylpyrimidine (white solid, yield of 78%). A synthesis scheme of Step 2 is shown in (Q-2).

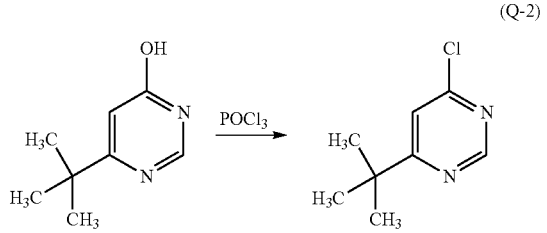

(Q-2)

Step 3: Synthesis of 4-(2-Methylpyridin-3-yl)-6-tert-butylpyrimidine (abbreviation: HtBumpypm)

Next, in a 100 mL round-bottom flask were put 2.0 g of 4-chloro-6-tert-butylpyrimidine obtained in Step 2, 3.0 g of 2-methylpyridine-3-boronic acid pinacol ester, 17 mL of 1M potassium acetate solution, 17 mL of 1M sodium carbonate solution, and 40 mL of acetonitrile, and the air in the flask was replaced with argon. To this mixture was added 0.78 g of tetrakis(triphenylphosphine)palladium(0), and the mixture was irradiated with microwaves under conditions of 100° C. and 100 W and for 1 hour to cause a reaction. This reaction mixture was extracted with ethyl acetate, and washing with saturated saline was performed. Anhydrous magnesium sulfate was added to the obtained solution of the extract for drying, and the resulting mixture was gravity-filtered to give a filtrate. The resulting filtrate was dissolved in a mixed solvent of ethyl acetate and hexane, and the mixture was filtered through Celite, alumina, and Celite. The resulting filtrate was purified by silica gel column chromatography. As a developing solvent, a mixed solvent of hexane and ethyl acetate in a ratio of 3:2 (v/v) was used. The resulting fraction was concentrated to give an oily substance. This oily substance was dissolved in a mixed solvent of hexane and ethyl acetate, and the solution was filtered through a filter aid in which Celite, alumina, and Celite were stacked in this order. The resulting filtrate was concentrated to give 4-(2-methylpyridin-3-yl)-6-tert-butylpyrimidine (abbreviation: HtBumpypm) (light-yellow oily substance, yield of 92%). A synthesis scheme of Step 3 is shown in (Q-3).

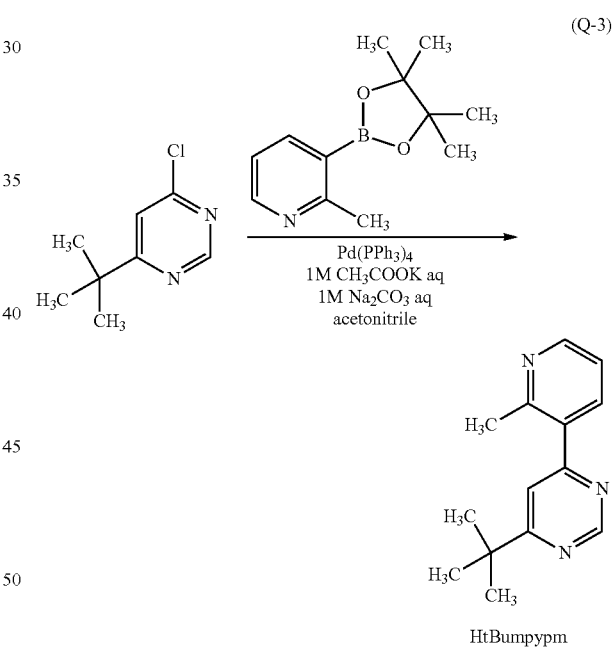

(Q-3)

Step 4: Synthesis of Di-µ-chloro-tetrakis[2-methyl-3-(6-tert-butyl-4-pyrimidinyl-κN3)pyridyl-κC]di-iridium(III) (abbreviation: [Ir(tBumpypm)₂Cl]₂)

Next, 2.0 g of the ligand HtBumpypm obtained in Step 3, 1.1 g of iridium chloride, 21 mL of 2-ethoxyethanol, and 7 mL of water were put in a 50 mL recovery flask, and the air in the flask was replaced with argon. This reaction container was heated by irradiation with microwaves under conditions of 100° C. and 100 W for 1 hour to cause a reaction. After a predetermined time elapsed, the obtained reacted solution was concentrated to give a dinuclear complex [Ir (tBumpypm)₂Cl]₂ (orange oily substance, yield of 100%). A synthesis scheme of Step 4 is shown in (Q-4).

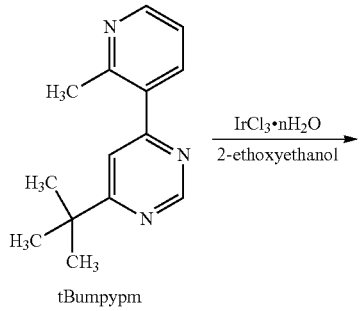

(Q-4)

tBumpypm

Step 5: Synthesis of Bis[2-methyl-3-(6-tert-butyl-4-pyrimidinyl-κN3)pyridyl-κC](2,4-pentanedionato-κ²O,O')iridium(III)) (abbreviation: [Ir(tBumpypm)₂(acac)])

Next, 2.5 g of the dinuclear complex [Ir(tBuppm)₂Cl]₂ obtained in Step 4, 1.9 g of sodium carbonate, 0.55 g of acetylacetone, and 20 mL of 2-ethoxyethanol were put in a 100 mL round-bottom flask, and the air in the flask was replaced with argon. This reaction container was irradiated with microwaves under conditions of 100° C. and 120 W for 1 hour to cause a reaction. After a predetermined time elapsed, the obtained reaction mixture was concentrated, and ethanol was added thereto to give a sediment. This mixture was suction-filtered, and the resulting solid was washed with ethanol to give [Ir(tBumpypm)₂(acac)](yellow substance, yield of 24%). A synthetic scheme of Step 5 is shown in (Q-5).

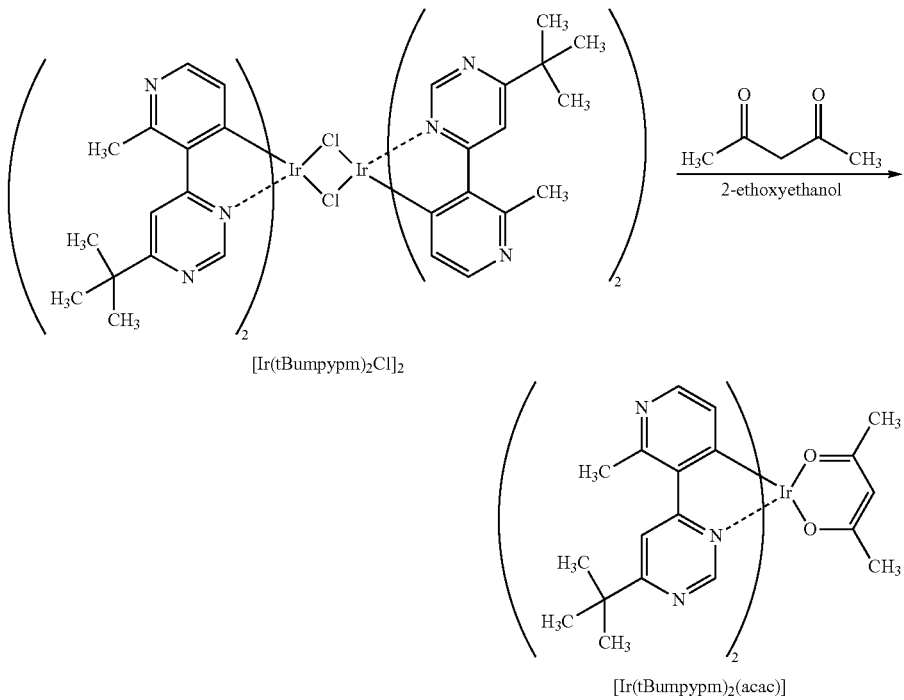

[Ir(tBumpypm)₂Cl]₂

[Ir(tBumpypm)₂(acac)]

-continued

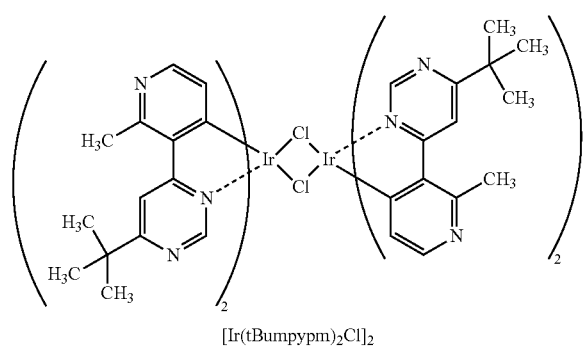

[Ir(tBumpypm)₂Cl]₂

The yellow powder obtained in Step 5 was measured by nuclear magnetic resonance spectrometry ($^1$H-NMR). The measurement results show that [Ir(tBumpypm)₂(acac)] was obtained.

$^1$H NMR data of the obtained substance are as follows: $^1$H-NMR. δ (CDCl₃): 1.52 (s, 18H), 1.81 (s, 6H), 2.89 (s, 6H), 5.3 (s, 1H), 6.09 (d, 2H), 6.54 (d, 2H), 8.08 (s, 2H), 9.06 (d, 2H).

REFERENCE EXAMPLE 5

A synthesis method of 9-[3-(9-phenyl-9H-fluoren-9-yl)phenyl]-9H-carbazole (abbreviation: mCzFLP) used in Example 14 will be described.

Synthesis Method of 9-[3-(9-Phenyl-9H-fluoren-9-yl)phenyl]-9H-carbazole (abbreviation: mCzFLP)

A structure of mCzFLP is shown below.

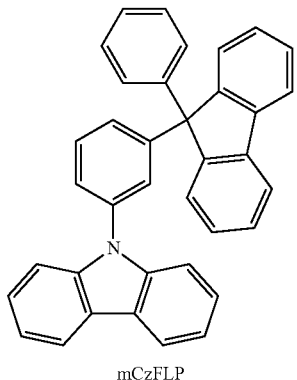 [SMILES: c1ccc(C2(c3cccc(-n4c5ccccc5c5ccccc54)c3)c3ccccc3-c3ccccc32)cc1]

mCzFLP

In a 100 mL three-neck flask were put 4.9 g (12.4 mmol) of 9-(3-bromophenyl)-9-phenylfluorene, 2.1 g (12.4 mmol) of carbazole, and 3.6 g (37.2 mmol) of sodium tert-butoxide, and the air in the flask was replaced with nitrogen. To this mixture were added 31.0 mL of xylene, 0.2 mL of a 10% hexane solution of tri(tert-butyl)phosphine, and 48.1 mg (0.1 mmol) of bis(dibenzylideneacetone)palladium(0), and the obtained mixture was stirred at 140° C. for 3.5 hours. After the stirring, 47.7 mg (0.1 mmol) of bis(dibenzylideneacetone)palladium(0) and 0.6 mL of a 10% hexane solution of tri(tert-butyl)phosphine were added, and the obtained mixture was stirred for 1.5 hours.

After the stirring, 70 mL of ethyl acetate and 150 mL of toluene were added, heating was performed, and suction filtration through Florisil, Celite, and alumina was performed to give a filtrate. The resulting filtrate was concentrated to give a solid. The resulting solid was purified by silica gel column chromatography (a developing solvent: hexane and toluene in a 7:3 ratio) to give a white solid which was a target substance. The resulting white solid was recrystallized from a mixed solvent of toluene and hexane to give 2.7 g of a white solid which was a target substance in a yield of 46%.

Then, 1.5 g of the resulting white solid was purified by a train sublimation method. In the purification by sublimation, the white solid was heated at 203° C. under a pressure of 2.7 Pa with an argon flow rate of 5.0 mL/min. After the purification by sublimation, 1.4 g of a white solid which was a target substance was obtained at a collection rate of 93%. A synthesis scheme of the synthesis method is shown in (R-1).

(R-1)

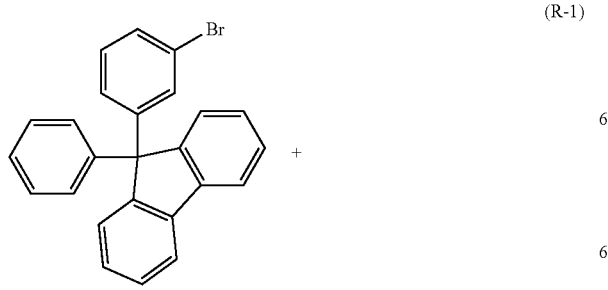

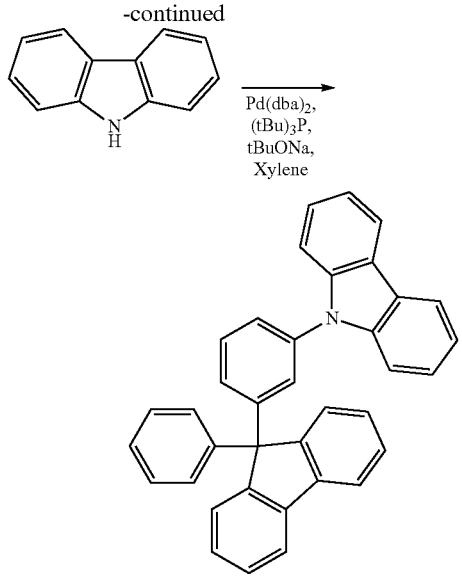

The compound obtained by Synthesis Scheme (R-1) was measured by a nuclear magnetic resonance method ($^1$H NMR). The measurement results show that mCzFLP (abbreviation) was obtained.

$^1$H NMR data of the obtained substance are as follows: $^1$H NMR (CDCl$_3$, 300 MHz): δ=7.19-7.49 (m, 21H), 7.77 (d, J=7.5 Hz, 2H), 8.10 (d, J=7.0 Hz, 2H).

This application is based on Japanese Patent Application serial no. 2011-183538 filed with the Japan Patent Office on Aug. 25, 2011, Japanese Patent Application serial no. 2011-183541 filed with the Japan Patent Office on Aug. 25, 2011, and Japanese Patent Application serial no. 2012-144355 filed with the Japan Patent Office on Jun. 27, 2012, the entire contents of which are hereby incorporated by reference.

EXPLANATION OF REFERENCE

100: substrate, 101: first electrode, 102: EL layer, 103: second electrode, 111: hole-injection layer, 112: hole-transport layer, 113: light-emitting layer, 114: electron-transport layer, 115: electron-injection layer, 116: charge-generation layer, 201: first electrode, 202: second electrode, 203: EL layer, 204: light-emitting layer, 205: phosphorescent compound, 206: first organic compound, 207: second organic compound, 301: first electrode, 302(1): first EL layer, 302(2): second EL layer, 304: second electrode, 305: charge-generation layer, 401: source driver circuit, 402: pixel portion, 403: gate driver circuit, 404: sealing substrate, 405: sealant, 407: space, 408: wiring, 410: element substrate, 411: switching TFT, 412: current control TFT, 413: first electrode, 414: insulator, 416: light-emitting layer, 417: second electrode, 418: light-emitting element, 423: n-channel TFT, 424: p-channel TFT, 450R: first light-emitting element, 450G: second light-emitting element, 450B: third light-emitting element, 451: reflective electrode, 452: semi-transmissive and semi-reflective electrode, 453a: first transparent conductive layer, 453b: second transparent conductive layer, 454B: first light-emitting layer, 454G: second light-emitting layer, 454R: third light-emitting layer, 455: EL layer, 501: substrate, 502: first electrode, 503: second electrode, 504: EL layer, 505: insulating layer, 506: partition layer, 611: housing, 612: support, 613: display portion, 614: speaker portion, 615: video input terminal, 621: main body, 622: housing, 623: display portion, 624: keyboard, 625: external connection port, 626: pointing device, 631: main body, 632: housing, 633: display portion, 634: audio input portion, 635: audio output portion, 636: operation key, 637: external connection port, 638: antenna, 641: main body, 642: display portion, 643: housing, 644: external connection port, 645: remote control receiving portion, 646: image receiving portion, 647: battery, 648: audio input portion, 649: operation key, 650: eyepiece portion, 701: housing, 702: liquid crystal layer, 703: backlight, 704: housing, 705: driver IC, 706: terminal, 801: housing, 802: light source, 901: lighting device, 902: television set, 1000: substrate, 1010: first electrode, 1020: EL layer, 1030: second electrode, 1100: substrate, 1101: first electrode, 1103: second electrode, 1110: hole-injection layer, 1111: hole-injection layer, 1112: hole-transport layer, 1113a: first light-emitting layer, 1113b: second light-emitting layer, 1114a: first electron-transport layer, 1114b: second electron-transport layer, 1115: electron-injection layer, 1120: hole-transport layer, 1130: light-emitting layer, 1140: electron-transport layer, 1150: electron-injection layer, 2100: substrate, 2101: first electrode, 2103: second electrode, 2111: hole-injection layer, 2112: hole-transport layer, 2113a: first light-emitting layer, 2113b: second light-emitting layer, 2114: electron-transport layer, 2114a: first electron-transport layer, 2114b: second electron-transport layer, and 2115: electron-injection layer.

The invention claimed is:

1. A light-emitting device comprising a light-emitting element, the light-emitting element comprising:
an electroluminescent layer between a pair of electrodes,
wherein the electroluminescent layer comprises a first compound and a second compound,
wherein the first compound is a phosphorescent iridium metal complex including a-diazine skeleton,
wherein the phosphorescent iridium metal complex has a LUMO level of greater than or equal to −3.5 eV and less than or equal to −2.5 eV, and
wherein the second compound is an organic compound including a pyrimidine skeleton.

2. The light-emitting device according to claim 1, wherein the-diazine skeleton forms a coordinate bond to iridium included in the phosphorescent iridium metal complex.

3. The light-emitting device according to claim 1, wherein the phosphorescent iridium metal complex has a HOMO level of greater than or equal to −6.0 eV and less than or equal to −5.0 eV.

4. The light-emitting device according to claim 1, wherein the second compound is represented by General Formula (G4):

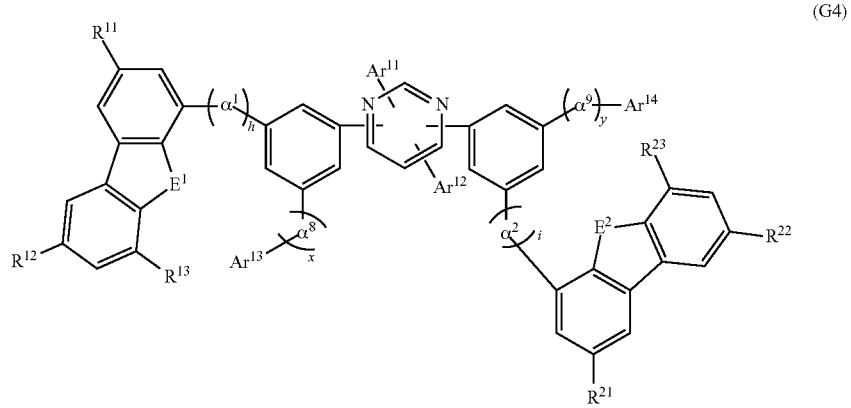

(G4)

wherein $Ar^{11}$, $Ar^{12}$, $R^{11}$ to $R^{13}$, and $R^{21}$ to $R^{23}$ separately represent any of hydrogen, an alkyl group including 1 to 4 carbon atoms, a substituted or unsubstituted phenyl group, and a substituted or unsubstituted biphenyl group,
wherein $Ar^{13}$ and $Ar^{14}$ separately represent any of hydrogen, an alkyl group including 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group,
wherein $\alpha^{1}$, $\alpha^{2}$, $\alpha^{8}$, and $\alpha^{9}$ separately represent a substituted or unsubstituted phenylene group,
wherein h, i, x, and y separately represent 0 or 1, and
wherein $E^{1}$ and $E^{2}$ separately represent sulfur or oxygen.

5. The light-emitting device according to claim 1, wherein the electroluminescent layer is a stacked layer comprising a light-emitting layer including the first compound and the second compound.

6. The light-emitting device according to claim 1, wherein the first compound is a guest and the second compound is a host.

7. An electronic device comprising the light-emitting device according to claim 1.

8. A lighting device comprising the light-emitting device according to claim claim 1.

9. A light-emitting device comprising a light-emitting element, the light-emitting element comprising:
an electroluminescent layer between a pair of electrodes,
wherein the electroluminescent layer comprises a first compound and a second compound,
wherein the first compound is a phosphorescent iridium metal complex including a-diazine skeleton,
wherein the phosphorescent iridium metal complex has a LUMO level of greater than or equal to −3.5 eV and less than or equal to −2.5 eV,
wherein the diazine skeleton forms a coordinate bond to iridium included in the phosphorescent iridium metal complex, and wherein the second compound is an organic compound including a pyrimidine skeleton.

10. The light-emitting device according to claim 9, wherein the phosphorescent iridium metal complex has a HOMO level of greater than or equal to −6.0 eV and less than or equal to −5.0 eV.

11. The light-emitting device according to claim 9, wherein the second compound has, as a substituent, at least one of a benzene skeleton, a biphenyl skeleton, a naphthalene skeleton, a carbazole skeleton, a phenanthrene skeleton, a triphenylene skeleton, a dibenzothiophene skeleton, and a dibenzofuran skeleton.

12. The light-emitting device according to claim 9, wherein the second compound is represented by General Formula (G4):

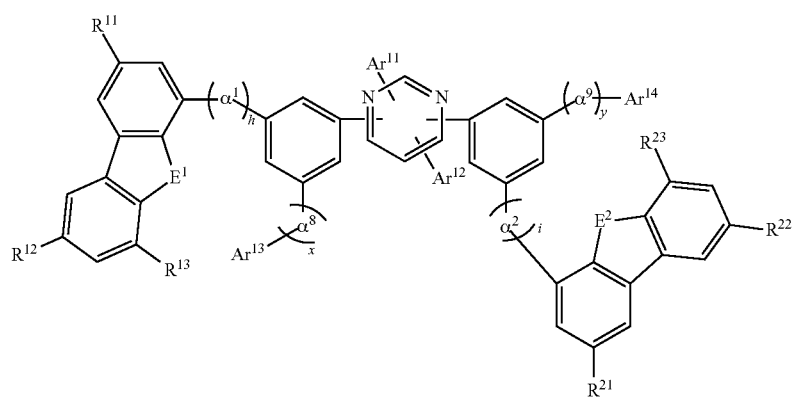

(G4)

wherein $Ar^{11}$, $Ar^{12}$, $R^{11}$ to $R^{13}$, and $R^{21}$ to $R^{23}$ separately represent any of hydrogen, an alkyl group including 1 to 4 carbon atoms, a substituted or unsubstituted phenyl group, and a substituted or unsubstituted biphenyl group, wherein $Ar^{13}$ and $Ar^{14}$ separately represent any of hydrogen, an alkyl group including 1 to 4 carbon atoms, a substituted or unsubstituted phenyl group, a substituted or unsubstituted biphenyl group, a substituted or unsubstituted dibenzothiophen-4-yl group, and a substituted or unsubstituted dibenzofuran-4-yl group, wherein $\alpha^1$, $\alpha^2$, $\alpha^8$, and $\alpha^9$ separately represent a substituted or unsubstituted phenylene group, wherein h, i, x, and y separately represent 0 or 1, and wherein $E^1$ and $E^2$ separately represent sulfur or oxygen.

13. The light-emitting device according to claim 9, wherein the electroluminescent layer is a stacked layer comprising a light-emitting layer including the first compound and the second compound.

14. The light-emitting device according to claim 9, wherein the first compound is a guest and the second compound is a host.

15. An electronic device comprising the light-emitting device according to claim 9.

16. A lighting device comprising the light-emitting device according to claim 9.

17. The light-emitting device according to claim 1, wherein the diazine skeleton is a pyrimidine skeleton.

18. The light-emitting device according to claim 9, wherein the diazine skeleton is a pyrimidine skeleton.

19. The light-emitting device according to claim 1, wherein the second compound has, as a substituent, at least one of a benzene skeleton, a biphenyl skeleton, a naphthalene skeleton, a carbazole skeleton, a phenanthrene skeleton, a triphenylene skeleton, a dibenzothiophene skeleton, and a dibenzofuran skeleton.

20. The light-emitting device according to claim 1, wherein the second compound is represented by General Formula (G2):

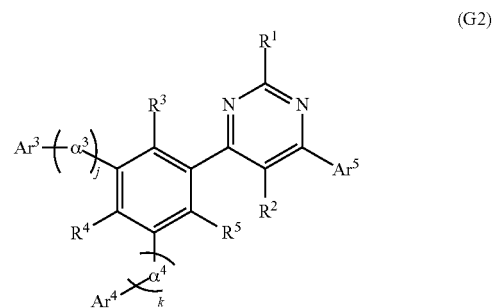

(G2)

wherein $R^1$ to $R^5$ separately represent any of hydrogen, an alkyl group including 1 to 4 carbon atoms, a substituted or unsubstituted phenyl group, and a substituted or unsubstituted biphenyl group, wherein $Ar^3$ represents any of a substituted or unsubstituted naphthyl group, a substituted or unsubstituted phenanthryl group, and a substituted or unsubstituted triphenylyl group, wherein $Ar^4$ represents any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group, wherein $Ar^5$ represents any one of hydrogen, an alkyl group including 1 to 4 carbon atoms, a substituted or unsubstituted phenyl group, and a substituted or unsubstituted biphenyl group, wherein α³ and α⁴ separately represent a substituted or unsubstituted phenylene group, and wherein j and k separately represent 0 or 1.

21. The light-emitting device according to claim 9, wherein the second compound is represented by General Formula (G2):

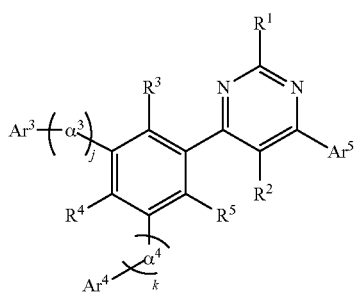

(G2)

wherein R¹ to R⁵ separately represent any of hydrogen, an alkyl group including 1 to 4 carbon atoms, a substituted or unsubstituted phenyl group, and a substituted or unsubstituted biphenyl group, wherein Ar³ represents any of a substituted or unsubstituted naphthyl group, a substituted or unsubstituted phenanthryl group, and a substituted or unsubstituted triphenylyl group, wherein Ar⁴ represents any of hydrogen, a substituted or unsubstituted phenyl group, a substituted or unsubstituted biphenyl group, a substituted or unsubstituted naphthyl group, a substituted or unsubstituted phenanthryl group, and a substituted or unsubstituted triphenylyl group, wherein Ar⁵ represents any one of hydrogen, an alkyl group including 1 to 4 carbon atoms, a substituted or unsubstituted phenyl group, and a substituted or unsubstituted biphenyl group, wherein α³ and α⁴ separately represent a substituted or unsubstituted phenylene group, and wherein j and k separately represent 0 or 1.

* * * * *